(12) United States Patent
Nishikawa et al.

(10) Patent No.: US 7,355,126 B2
(45) Date of Patent: Apr. 8, 2008

(54) ELECTRONIC PARTS PACKAGING METHOD AND ELECTRONIC PARTS PACKAGE

(75) Inventors: Hidenobu Nishikawa, Ikoma (JP); Kazuto Nishida, Katano (JP); Kazumichi Shimizu, Toyonaka (JP); Shuji Ono, Kobe (JP); Hiroyuki Otani, Ikoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 255 days.

(21) Appl. No.: 10/311,476

(22) PCT Filed: Jun. 14, 2001

(86) PCT No.: PCT/JP01/05050

§ 371 (c)(1),
(2), (4) Date: Dec. 16, 2002

(87) PCT Pub. No.: WO01/97277

PCT Pub. Date: Dec. 20, 2001

(65) Prior Publication Data
US 2003/0092326 A1    May 15, 2003

(30) Foreign Application Priority Data
Jun. 16, 2000 (JP) ............................ 2000-181618
Oct. 26, 2000 (JP) ............................ 2000-326879

(51) Int. Cl.
*H05K 1/16* (2006.01)
(52) U.S. Cl. ...................... 174/260; 174/259; 361/767; 361/768

(58) Field of Classification Search ................ 174/260, 174/259, 52.4, 524, 539, 564; 361/767, 768
See application file for complete search history.

(56) References Cited

U.S. PATENT DOCUMENTS

| | | | |
|---|---|---|---|
| 5,539,153 A * | 7/1996 | Schwiebert et al. ......... 174/260 |
| 5,700,715 A * | 12/1997 | Pasch .......................... 438/613 |
| 5,804,882 A * | 9/1998 | Tsukagoshi et al. ......... 257/783 |
| 6,560,122 B2 * | 5/2003 | Weber .......................... 361/783 |
| 2001/0030057 A1* | 10/2001 | Ichihara et al. .............. 174/250 |
| 2004/0108135 A1* | 6/2004 | Ashida ......................... 174/260 |
| 2005/0139389 A1* | 6/2005 | Yamamoto et al. .......... 174/260 |

FOREIGN PATENT DOCUMENTS

| | | |
|---|---|---|
| JP | 63-239826 | * 10/1988 |
| JP | 3-94437 | 4/1991 |
| JP | 5-55303 | 3/1993 |
| JP | 5-67639 | 3/1993 |

(Continued)

*Primary Examiner*—Dean A. Reichard
*Assistant Examiner*—Yuriy Semenenko
(74) *Attorney, Agent, or Firm*—Wenderoth, Lind & Ponack, L.L.P.

(57) ABSTRACT

An electronic component and a circuit formation article are bonded together with a bonding material containing resin interposed therebetween. In a state that bumps of an electronic-component bonding region and electrodes of the circuit formation article are in mutual electrical contact, the electronic component and the circuit formation article are thermocompression-bonded to each other upon curing of the bonding material. A bonding-material flow regulating member of the electronic-component bonding region regulates flow of the bonding material toward a peripheral portion of the electronic-component bonding region during bonding of the circuit formation article to the electronic component.

19 Claims, 72 Drawing Sheets

FOREIGN PATENT DOCUMENTS

| | | |
|---|---|---|
| JP | 06-005735 | 1/1994 |
| JP | 06-021144 | 1/1994 |
| JP | 06-349890 | 12/1994 |
| JP | 09-045731 | 2/1997 |
| JP | 9-120975 | 5/1997 |
| JP | 9-153519 | 6/1997 |
| JP | 9-213745 | 8/1997 |
| JP | 09-260435 | * 10/1997 |
| JP | 9-260435 | 10/1997 |
| JP | 10-144725 | * 5/1998 |
| JP | 11-186322 | 7/1999 |
| JP | 11-214586 | 8/1999 |

* cited by examiner

Fig. 2
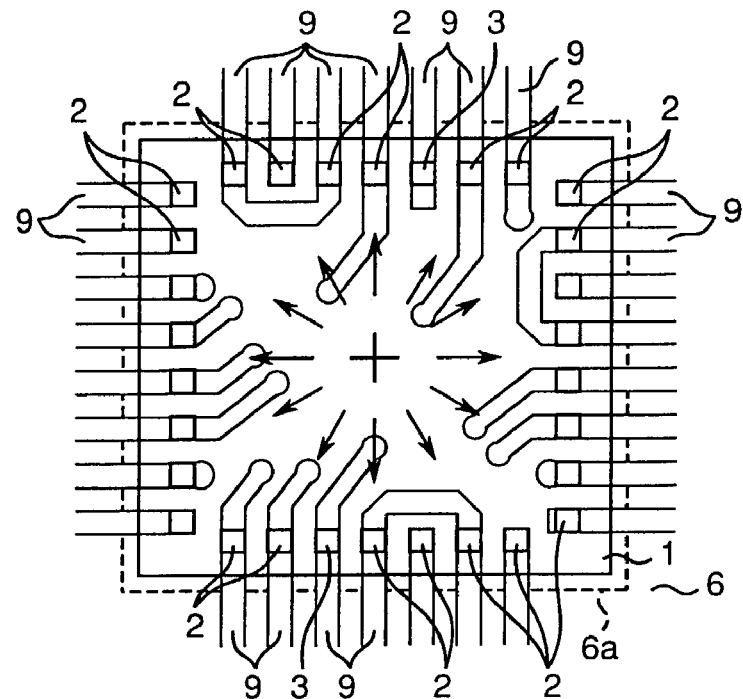
Fig. 3A
Fig. 3B
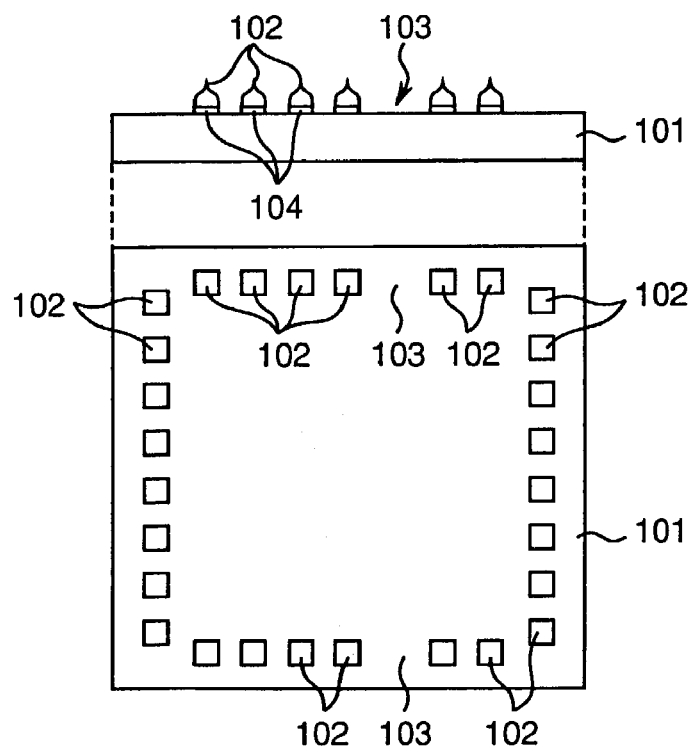

Fig. 6A
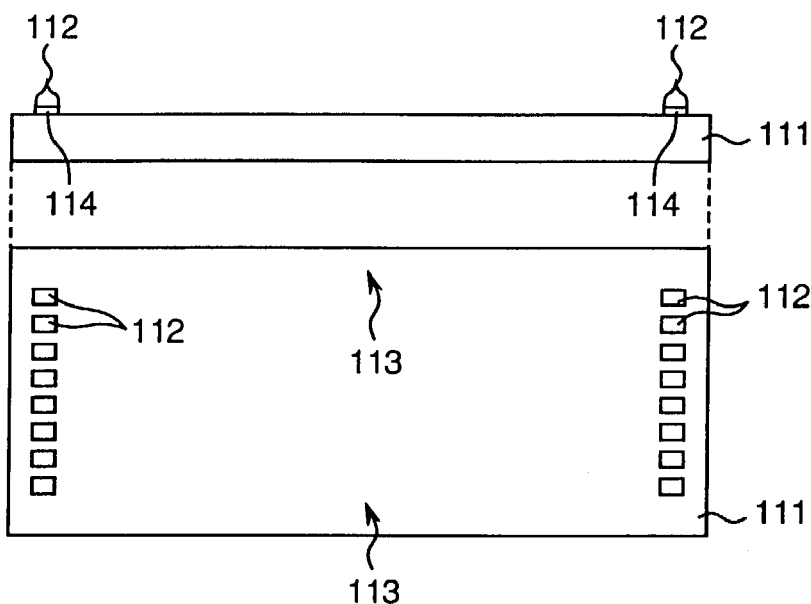
Fig. 6B
Fig. 6C
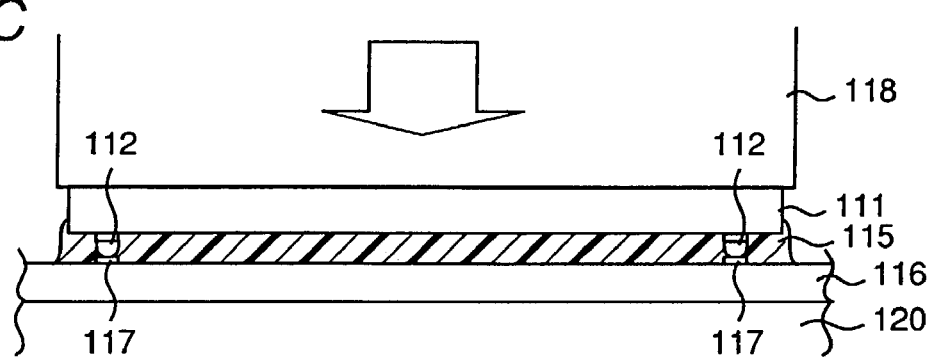
Fig. 6D
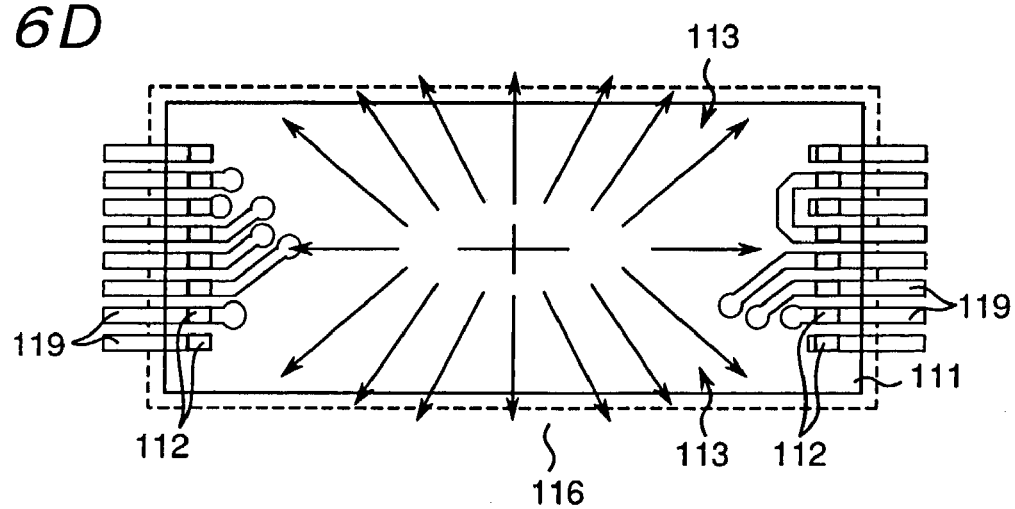

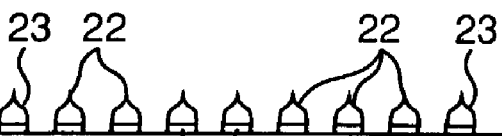
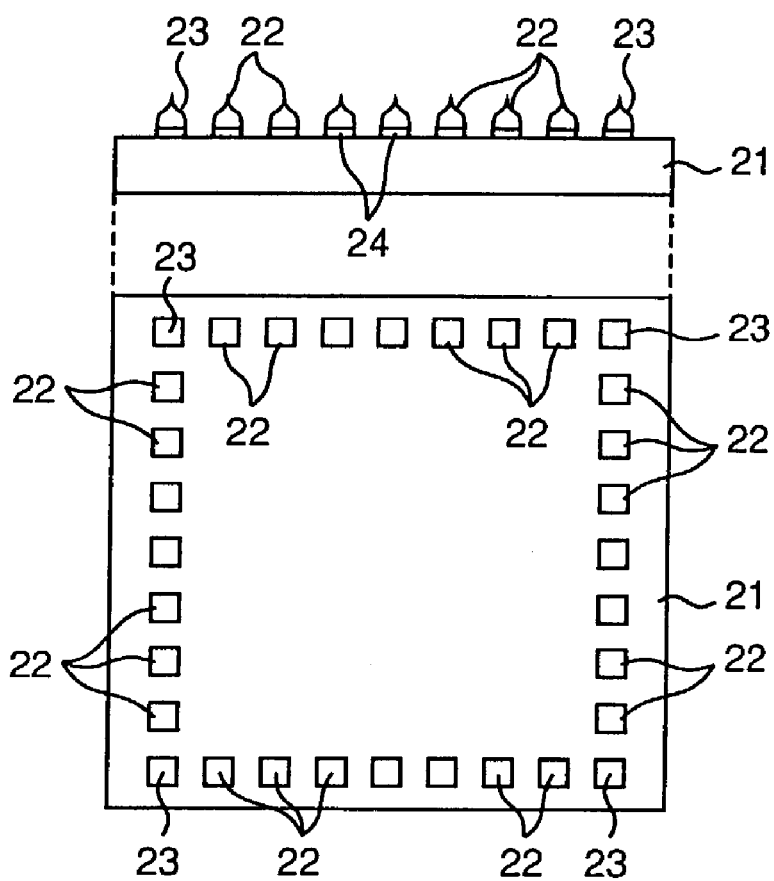
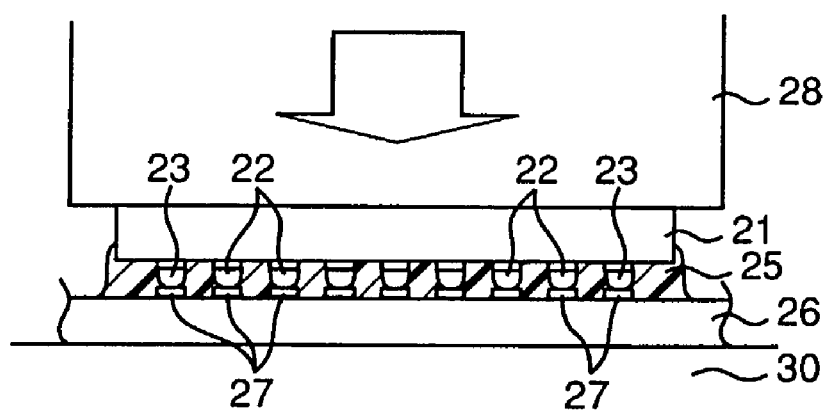

Fig. 9A
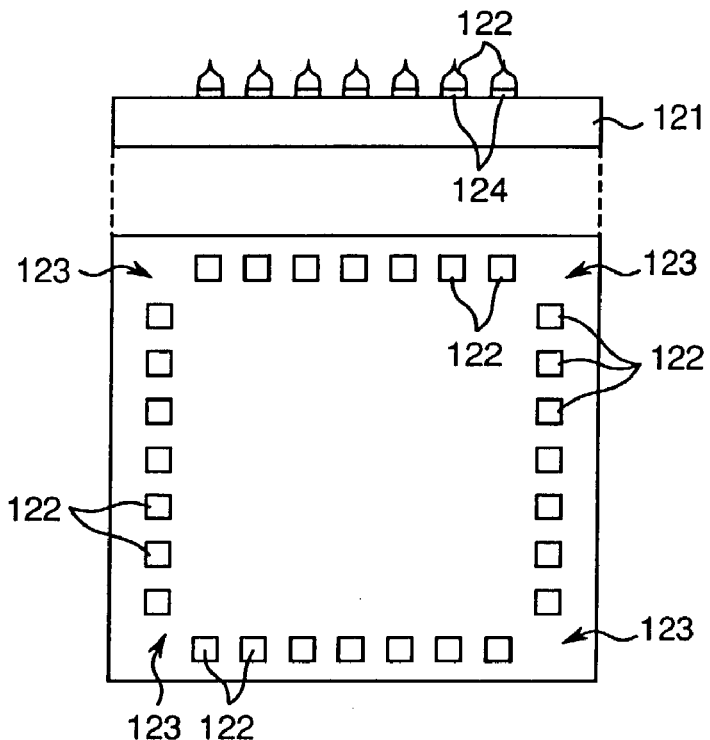
Fig. 9B
Fig. 9C
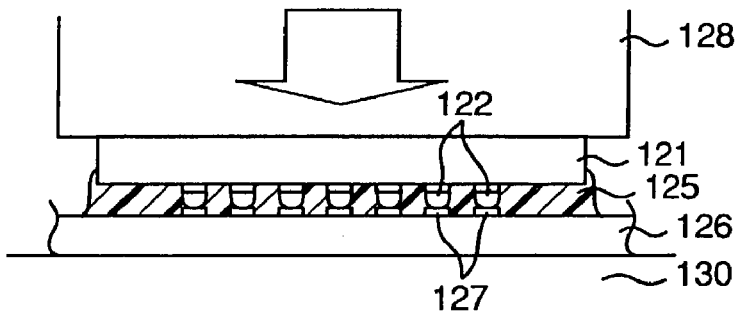
Fig. 9D
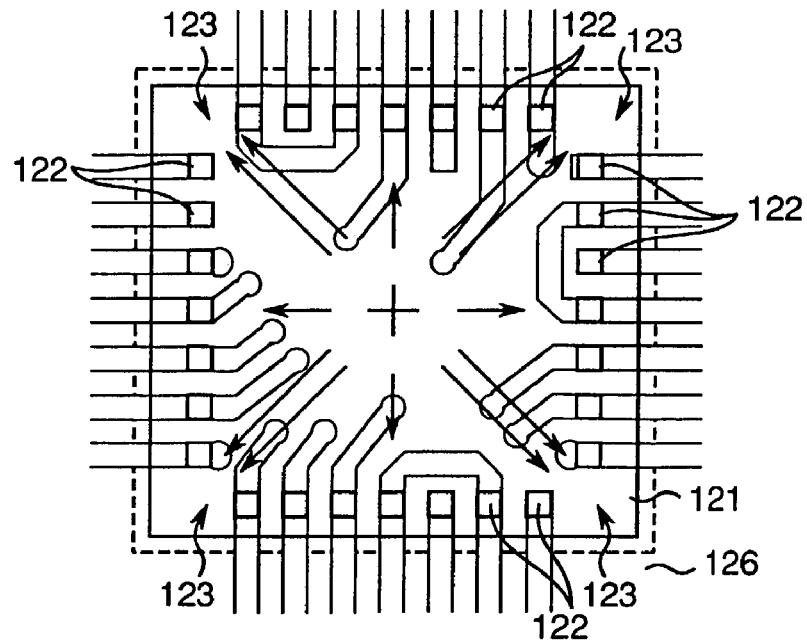

Fig. 13
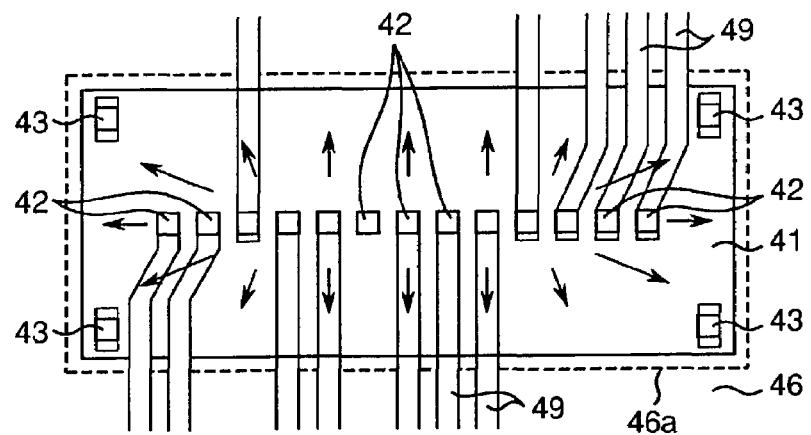
Fig. 14A
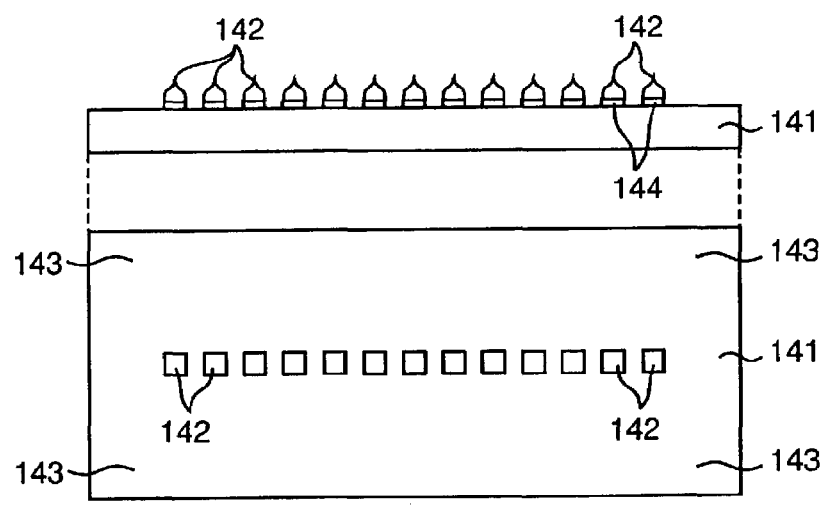
Fig. 14B
Fig. 14C
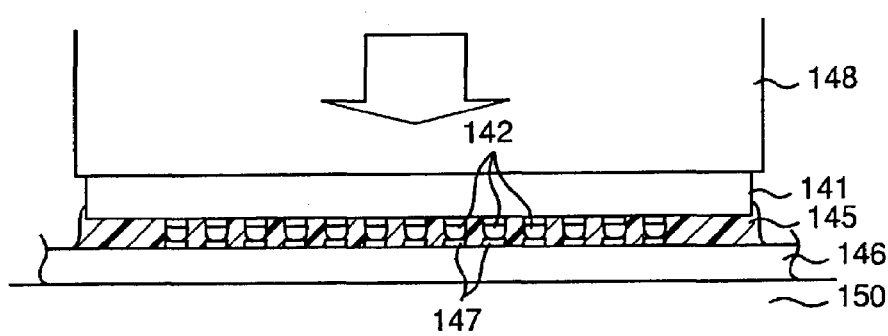

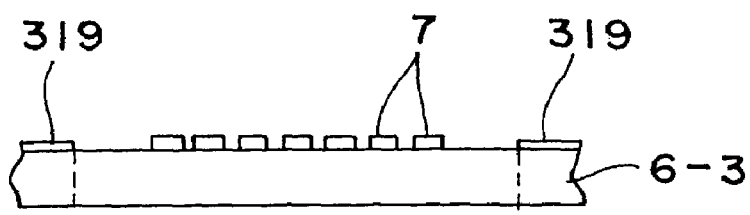
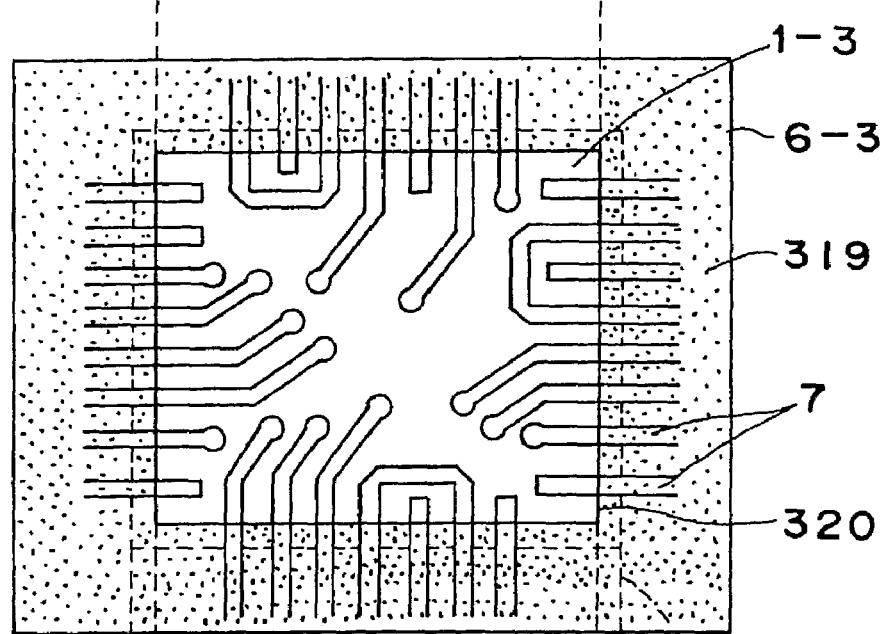
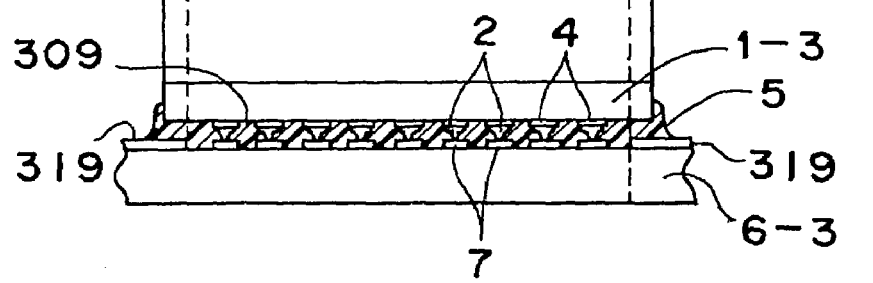

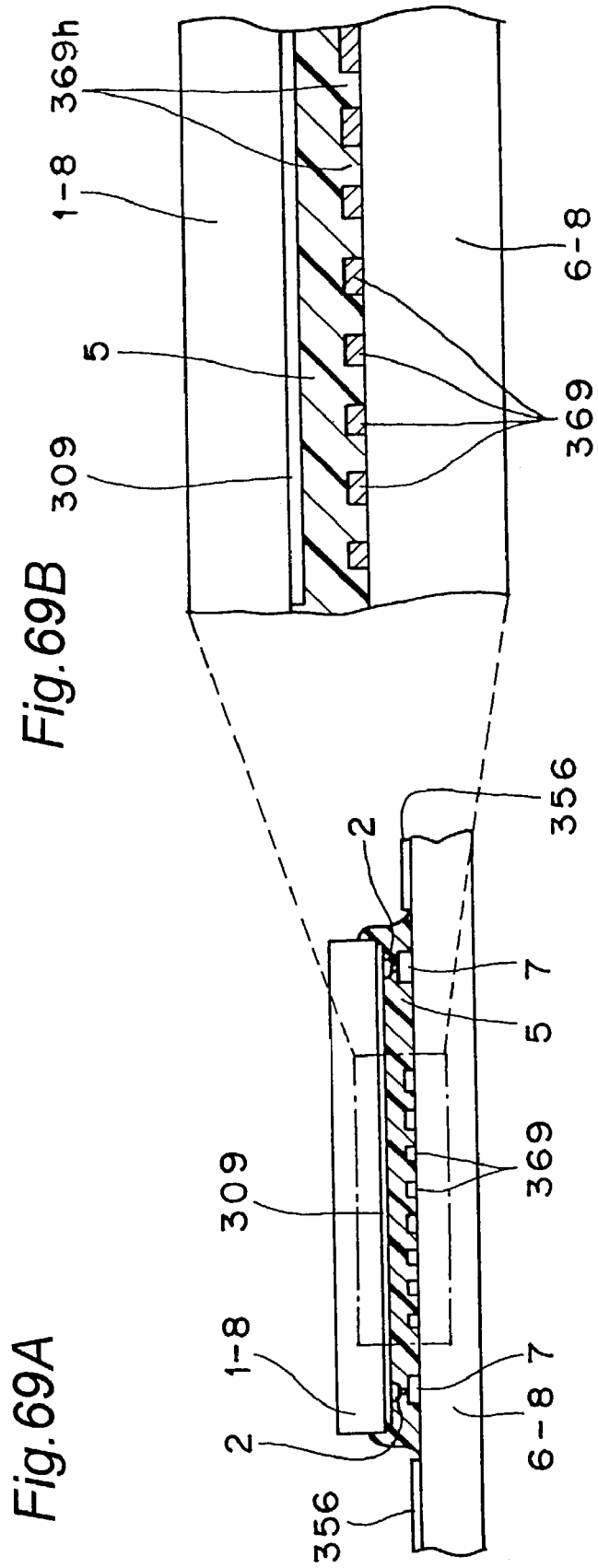

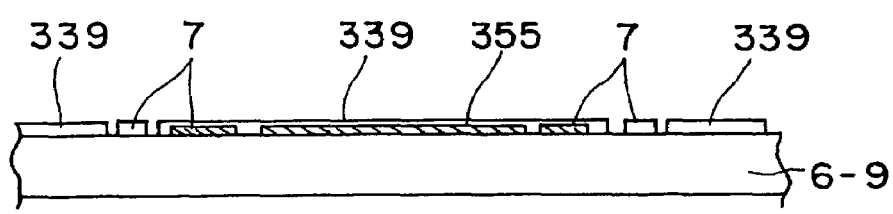
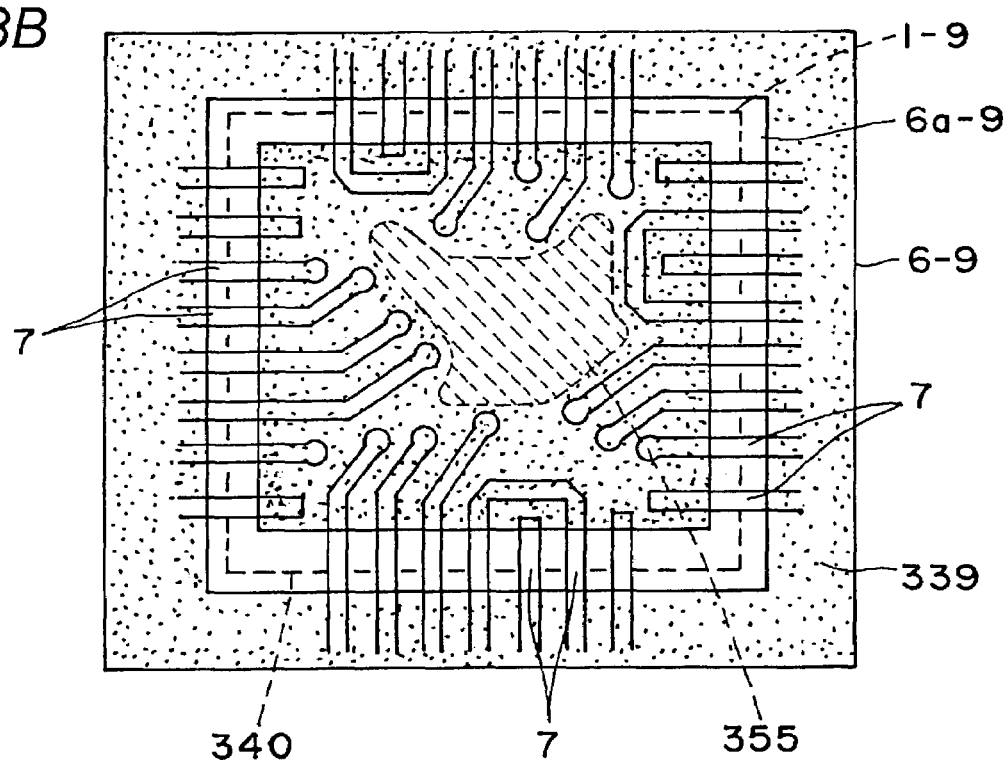

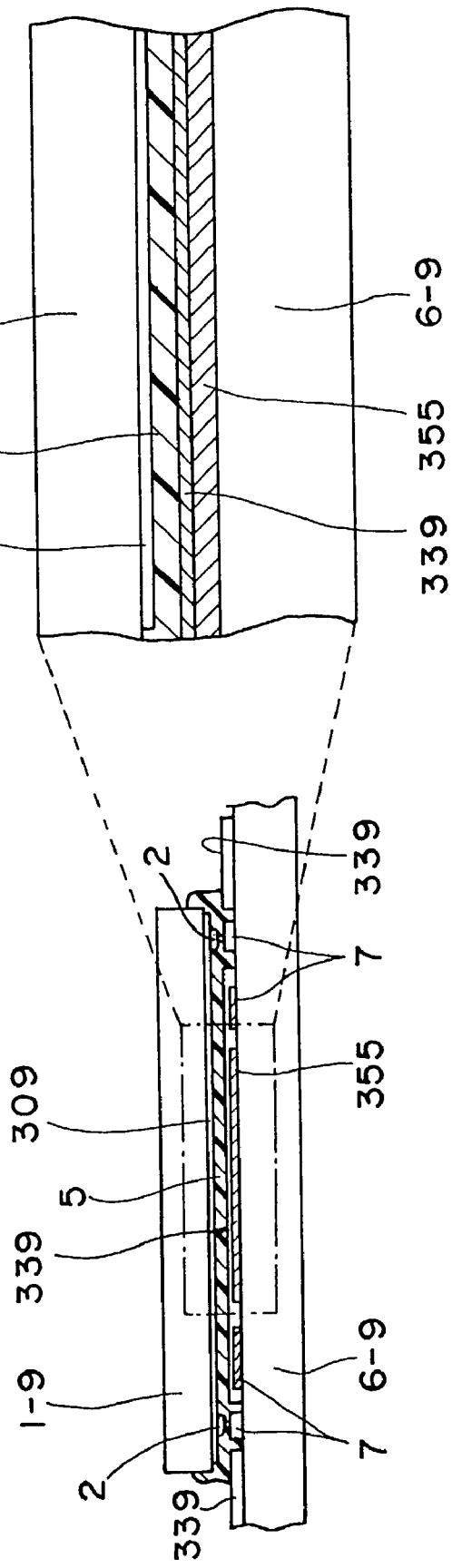

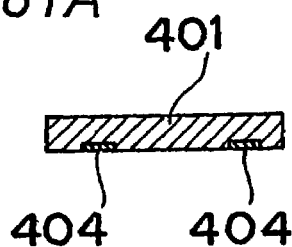
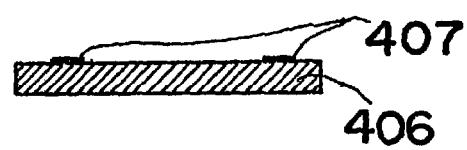
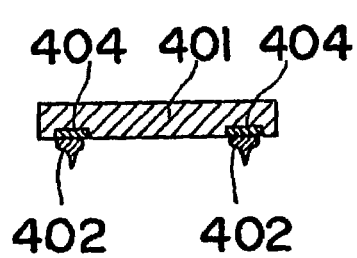
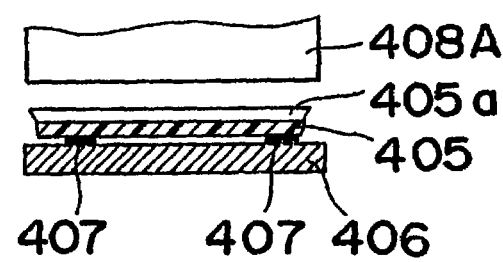
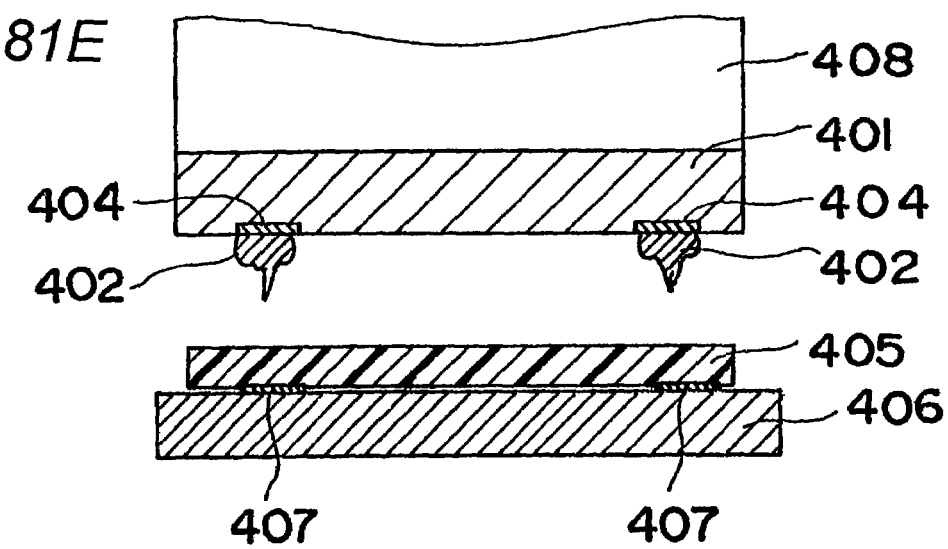

ELECTRONIC PARTS PACKAGING METHOD AND ELECTRONIC PARTS PACKAGE

TECHNICAL FIELD

The present invention relates to an electronic component mounting method by which an electronic component, such as a semiconductor device, is bonded and fixed on a circuit formation article, such as a board, with a bonding material containing at least resin, and also relates to an electronic component-mounted unit manufactured by the method.

BACKGROUND ART

Conventionally, it is practiced that bumps formed on electrodes of a bonding surface of a quadrilateral IC chip are brought into contact with electrodes of a circuit board while a bonding material is disposed between the IC chip and the circuit board, by which the IC chip is bonded and held on the circuit board with the bonding material.

However, with the above structure, at large gaps between the bumps arrayed on the bonding surface of the quadrilateral IC chip, or at gaps of corner portions where bumps are not arrayed in a case where the bumps are arrayed on side portions of the quadrilateral shape, or at other like portions, the bonding material sandwiched between the IC chip and the circuit board would escape to peripheral portions of the IC chip through such gaps between the bumps of the IC chip during a process of bonding the IC chip to the circuit board via the bonding material. This would cause the bonding material to easily become sparser in density at central portions of the IC chip, so that bonding power and sealing power might be lowered.

Accordingly, an object of the present invention is to solve the above-described issues and to provide an electronic component mounting method, as well as an electronic component-mounted unit, capable of achieving a uniform distribution of bonding material within a bonding surface of an electronic component during bonding to a circuit formation article and thus enhancing reliability of bonding and sealing.

SUMMARY OF THE INVENTION

In order to achieve the above object, the present invention is constituted as follows.

According to a first aspect of the present invention, there is provided an electronic component mounting method comprising:

feeding a bonding material containing at least resin to a circuit formation article or an electronic component;

positioning the electronic component and the circuit formation article with the bonding material interposed therebetween so that a plurality of bump-shaped electrodes of a bonding surface of the electronic component and electrodes of the circuit formation article can be brought into electrical contact with each other; and thermocompression-bonding the electronic component by heating and pressurization so that the bonding material interposed between the bonding surface of the electronic component and the circuit formation article is cured while the bump-shaped electrodes of the electronic component and the electrodes of the circuit formation article are kept in mutual electrical contact, whereby final compression-bonding is fulfilled, wherein during the final compression-bonding, flow of the bonding material toward a peripheral portion of the bonding surface of the electronic component is regulated by a bonding-material flow regulating member provided on the bonding surface of the electronic component.

According to a second aspect of the present invention, there is provided an electronic component mounting method comprising:

feeding a bonding material containing at least resin to a circuit formation article or an electronic component;

positioning the electronic component and the circuit formation article with the bonding material interposed therebetween so that a plurality of bumps on a plurality of electrodes of a bonding surface of the electronic component and electrodes of the circuit formation article can be brought into electrical contact with each other; and thermocompression-bonding the electronic component by heating and pressurization so that the bonding material interposed between the bonding surface of the electronic component and the circuit formation article is cured while the bumps on the electrodes of the electronic component and the electrodes of the circuit formation article are kept in mutual electrical contact, whereby final compression-bonding is fulfilled, wherein during the final compression-bonding, flow of the bonding material toward a peripheral portion of the bonding surface of the electronic component is regulated by a bonding-material flow regulating member provided on the bonding surface of the electronic component.

According to a third aspect of the present invention, there is provided the electronic component mounting method according to the second aspect, wherein the bonding-material flow regulating member is a dummy bump provided at a larger-width interval portion of the bonding surface of the electronic component where intervals of neighboring bumps are larger than intervals of other neighboring bumps, and flow of the bonding material toward a peripheral portion of the bonding surface of the electronic component in the larger-width interval portion is regulated by the dummy bump during the final compression-bonding.

According to a fourth aspect of the present invention, there is provided the electronic component mounting method according to the second aspect, wherein the bonding-material flow regulating member is a plurality of dummy bumps which, in a case where the plurality of bumps is formed in arrays at two opposing sides, respectively, of a quadrilateral bonding surface of the electronic component, are provided in arrays at the other opposing two sides where bumps are absent, respectively, and flow of the bonding material toward a peripheral portion of the bonding surface of the electronic component at the other opposing two sides is regulated by the dummy bumps during the final compression-bonding.

According to a fifth aspect of the present invention, there is provided the electronic component mounting method according to the second aspect, wherein the bonding-material flow regulating member is dummy bumps which, in a case where a plurality of bumps are formed at two pairs of opposing sides, respectively, of a quadrilateral bonding surface of the electronic component, are provided at corner portions where bumps are absent, and flow of the bonding material toward a peripheral portion of the bonding surface of the electronic component at the corner portions is regulated by the dummy bumps during the final compression-bonding.

According to a sixth aspect of the present invention, there is provided the electronic component mounting method according to the second aspect, wherein the bonding-material flow regulating member is dummy bumps which, in a case where a plurality of bumps are formed in one array at a center of a quadrilateral bonding surface of the electronic component, are provided at corner portion where a bump is absent, and flow of the bonding material toward a peripheral portion of the bonding surface of the electronic component at the corner portion is regulated by the dummy bumps during the final compression-bonding.

According to a seventh aspect of the present invention, there is provided the electronic component mounting method according to any one of the second to sixth aspects, wherein the plurality of bumps on the bonding surface of the electronic component is formed before feeding the bonding material to the circuit formation article, and during bump formation, a dummy bump is provided as the bonding-material flow regulating member at a larger-width interval portion of the bonding surface of the electronic component where an interval of neighboring bumps is larger than intervals of other neighboring bumps.

According to an eighth aspect of the present invention, there is provided the electronic component mounting method according to any one of the second to seventh aspects, wherein each dummy bump is provided so that a relationship between a maximum pitch Pmax and a minimum pitch Pmin out of pitches between the bumps of the electronic component, or a pitch between a bump and a corresponding dummy bump, satisfies that Pmax≦(Pmin× 2α), where α is an arbitrary value of 1 to 6.

According to a ninth aspect of the present invention, there is provided the electronic component mounting method according to any one of the second to eighth aspects, wherein in a case where a passivation film is provided over a quadrilateral region inward of the arrays of the plurality of bumps placed in vicinities of individual side verges of the bonding surface of the electronic component, the bonding-material flow regulating member is a bonding-material flow regulating film provided at portions of the bonding surface of the electronic component where the passivation film is absent, and any increase in flow speed of the bonding material at a portion of the bonding surface of the electronic component where the passivation film is absent is regulated by the bonding-material flow regulating film during the final compression-bonding.

According to a 10th aspect of the present invention, there is provided the electronic component mounting method according to any one of the second to eighth aspects, wherein in a case where a passivation film is provided over a quadrilateral region inward of the arrays of the plurality of bumps placed in vicinities of individual side verges of the bonding surface of the electronic component, the bonding-material flow regulating member is an auxiliary passivation film provided over a quadrilateral frame region in a peripheral portion outward of the arrays of bumps placed in the vicinities of the individual side verges of the bonding surface of the electronic component, and any increase in flow speed of the bonding material in the quadrilateral frame region of the peripheral portion of the bonding surface of the electronic component outward of the arrays of the bumps placed in the vicinities of the individual side verges of the bonding surface of the electronic component is regulated by the auxiliary passivation film during the final compression-bonding.

According to an 11th aspect of the present invention, there is provided the electronic component mounting method according to any one of the second to eighth aspects, wherein in a case where a passivation film is provided over a quadrilateral region inward of the arrays of the plurality of bumps placed in vicinities of individual side verges of the bonding surface of the electronic component, the bonding-material flow regulating member is a generally quadrilateral auxiliary passivation film provided at only individual corner portions of peripheral portions of the bonding surface of the electronic component outward of the arrays of the bumps placed in the vicinities of the side verges, and any increase in flow speed of the bonding material at the individual corner portions of the peripheral portion outward of the arrays of the bumps placed in the vicinities of the individual side verges of the bonding surface of the electronic component is regulated by the auxiliary passivation film during the final compression-bonding.

According to a 12th aspect of the present invention, there is provided the electronic component mounting method according to any one of the second to eighth aspects, wherein in a case where a passivation film is provided over a quadrilateral region inward of the arrays of the plurality of bumps placed in vicinities of individual side verges of the bonding surface of the electronic component, the bonding-material flow regulating member is a generally quadrilateral auxiliary passivation film provided over a peripheral portion of the bonding surface of the electronic component outward of the arrays of the bumps placed in the vicinities of the side verges as well as over regions extending from corner portions of the passivation film region to corner portions of the outer peripheral portion, and any increase in flow speed of the bonding material in the peripheral portion of the bonding surface of the electronic component outward of the arrays of the bumps placed in the vicinities of the side verges as well as in the regions extending from the corner portions of the passivation film region to the corner portions of the outer peripheral portion is regulated by the auxiliary passivation film during the final compression-bonding.

According to a 13th aspect of the present invention, there is provided the electronic component mounting method according to any one of the second to eighth aspects, wherein in a case where a passivation film is provided over a quadrilateral region inward of the arrays of the plurality of bumps placed in vicinities of individual side verges of the bonding surface of the electronic component, the bonding-material flow regulating member is an auxiliary passivation film provided over all regions of the bonding surface of the electronic component other than the bumps, and any increase in flow speed of the bonding material in all the regions of the bonding surface of the electronic component other than the bumps is regulated by the auxiliary passivation film during the final compression-bonding.

According to a 14th aspect of the present invention, there is provided the electronic component mounting method according to any one of the 10th to 13th aspects, wherein the passivation film is formed on the bonding surface of the electronic component before feeding the bonding material to the circuit formation article, and during passivation film formation, the auxiliary passivation film is formed as the bonding-material flow regulating member over a region of the bonding surface of the electronic component where the passivation film is not formed.

According to a 15th aspect of the present invention, there is provided an electronic component-mounted unit which is formed by bonding an electronic component to a circuit formation article with interposition of a bonding material containing at least resin while a plurality of bumps of a plurality of electrodes of a bonding surface of the electronic component are kept in electrical contact with electrodes of the circuit formation article, wherein the electronic component-mounted unit has, on the bonding surface of the electronic component, a bonding-material flow regulating member for regulating flow of the bonding material toward a peripheral portion of the bonding surface of the electronic component.

According to a 16th aspect of the present invention, there is provided the electronic component-mounted unit according to the 15th aspect, wherein the bonding-material flow regulating member is a dummy bump provided at a larger-width interval portion of the bonding surface of the electronic component where intervals of neighboring bumps are larger than intervals of other neighboring bumps.

According to a 17th aspect of the present invention, there is provided the electronic component-mounted unit according to the 15th aspect, wherein the bonding-material flow regulating member is a plurality of dummy bumps which, in a case where the plurality of bumps are formed in arrays at two opposing sides, respectively, of a quadrilateral bonding surface of the electronic component, are provided in arrays at the other opposing two sides where bumps are absent, respectively.

According to an 18th aspect of the present invention, there is provided the electronic component-mounted unit according to the 15th aspect, wherein the bonding-material flow regulating member is dummy bumps which, in a case where a plurality of bumps are formed at two pairs of opposing sides, respectively, of a quadrilateral bonding surface of the electronic component, are provided at corner portions where bumps are absent.

According to a 19th aspect of the present invention, there is provided the electronic component-mounted unit according to the 15th aspect, wherein the bonding-material flow regulating member is dummy bumps which, in a case where a plurality of bumps are formed in one array at a center of a quadrilateral bonding surface of the electronic component, are provided at corner portions where bumps are absent.

According to a 20th aspect of the present invention, there is provided the electronic component-mounted unit according to any one of the 15th to 19th aspects, wherein each dummy bump is provided so that a relationship between a maximum pitch Pmax and a minimum pitch Pmin out of pitches between the bumps of the electronic component, or a pitch between a bump and a corresponding dummy bump, satisfies that Pmax≦(Pmin×2α), where α is an arbitrary value of 1 to 6.

According to a 21st aspect of the present invention, there is provided the electronic component-mounted unit according to any one of the 15th to 20th aspects, wherein a passivation film is provided over a quadrilateral region inward of the arrays of the plurality of bumps placed in vicinities of individual side verges of the bonding surface of the electronic component, and wherein at a portion of the bonding surface of the electronic component where the passivation film is absent, a bonding-material flow regulating film is provided as the bonding-material flow regulating member for regulating any increase in flow speed of the bonding material at the portion of the bonding surface of the electronic component where the passivation film is absent.

According to a 22nd aspect of the present invention, there is provided the electronic component-mounted unit according to the 21st aspect, wherein the bonding-material flow regulating film as the bonding-material flow regulating member is an auxiliary passivation film provided over a quadrilateral frame region in a peripheral portion outward of the arrays of bumps in the vicinities of the individual side verges of the bonding surface of the electronic component.

According to a 23rd aspect of the present invention, there is provided the electronic component-mounted unit according to the 21st aspect, wherein the bonding-material flow regulating film as the bonding-material flow regulating member is generally quadrilateral auxiliary passivation films provided at only individual corner portions of a peripheral portion of the bonding surface of the electronic component outward of the arrays of the bumps placed in the vicinities of the side verges.

According to a 24th aspect of the present invention, there is provided the electronic component-mounted unit according to the 21st aspect, wherein the bonding-material flow regulating film as the bonding-material flow regulating member is a generally quadrilateral auxiliary passivation film provided over a peripheral portion of the bonding surface of the electronic component outward of the arrays of the bumps placed in the vicinities of the side verges as well as over regions extending from corner portions of the passivation film region to corner portions of the outer peripheral portion.

According to a 25th aspect of the present invention, there is provided the electronic component-mounted unit according to the 21st aspect, wherein the bonding-material flow regulating film as the bonding-material flow regulating member is an auxiliary passivation film provided over all regions of the bonding surface of the electronic component other than the bumps.

According to a 26th aspect of the present invention, there is provided the electronic component-mounted unit according to the 21st aspect, wherein the bonding-material flow regulating film is the bonding-material flow regulating member.

According to a 27th aspect of the present invention, there is provided an electronic component-mounted unit manufactured by the electronic component mounting method according to any one of the second to 14th aspects.

According to a 28th aspect of the present invention, there is provided an electronic component comprising:

a plurality of bumps provided on a plurality of electrodes of a bonding surface of an electric component; and a bonding-material flow regulating member provided on the bonding surface for regulating flow of a bonding material toward peripheral portions of the bonding surface of the electronic component, wherein the electronic component is bonded to a circuit formation article with interposition of the bonding material containing at least resin in a state that the plurality of bumps of the plurality of electrodes of the bonding surface is kept in electrical contact with electrodes of the circuit formation article, to form an electronic component-mounted unit.

According to a 29th aspect of the present invention, there is provided the electronic component according to the 28th aspect, wherein the bonding-material flow regulating member is a dummy bump provided at a larger-width interval portion of the bonding surface of the electronic component where an interval of neighboring bumps is larger than intervals of other neighboring bumps.

According to a 30th aspect of the present invention, there is provided the electronic component according to the 28th or 29th aspect, wherein a passivation film is provided over a quadrilateral region inward of the arrays of the plurality of bumps placed in vicinities of individual side verges of the bonding surface of the electronic component, and wherein at a portion of the bonding surface of the electronic component where the passivation film is absent, a bonding-material flow regulating film is provided as the bonding-material flow regulating member for regulating any increase in flow speed of the bonding material at the portion of the bonding surface of the electronic component where the passivation film is absent.

According to a 31st aspect of the present invention, there is provided an electronic component mounting method comprising:

feeding a bonding material containing at least resin to a circuit formation article or an electronic component;

positioning the electronic component and the circuit formation article with the bonding material interposed therebetween so that a plurality of bump-shaped electrodes of a bonding surface of the electronic component and electrodes of an electronic-component bonding region of the circuit formation article can be brought into electrical contact with each other; and thermocompression-bonding the electronic component by heating and pressurization, so that the bonding material interposed between the bonding surface of the electronic component and the circuit formation article is cured while the bump-shaped electrodes of the electronic component and the electrodes of the circuit formation article are kept in mutual electrical contact, whereby final compression-bonding is fulfilled, wherein during the final compression-bonding, flow of the bonding material toward peripheral portions of the electronic-component bonding region of the circuit formation article is regulated by a bonding-material flow regulating member provided at a portion where the bonding material flows out nonuniformly over the electronic-component bonding region of the circuit formation article.

According to a 32nd aspect of the present invention, there is provided an electronic component mounting method comprising:

feeding a bonding material containing at least resin to a circuit formation article or an electronic component;

positioning the electronic component and the circuit formation article with the bonding material interposed therebetween so that a plurality of bumps on a plurality of electrodes of a bonding surface of the electronic component and electrodes of an electronic-component bonding region of the circuit formation article can be brought into electrical contact with each other; and thermocompression-bonding the electronic component by heating and pressurization, so that the bonding material interposed between the bonding surface of the electronic component and the circuit formation article is cured while the bumps on the electrodes of the electronic component and the electrodes of the circuit formation article are kept in mutual electrical contact, whereby final compression-bonding is fulfilled, wherein during the final compression-bonding, flow of the bonding material toward peripheral portions of the electronic-component bonding region of the circuit formation article is regulated by a bonding-material flow regulating member provided at a portion where the bonding material flows out nonuniformly over the electronic-component bonding region of the circuit formation article.

According to a 33rd aspect of the present invention, there is provided the electronic component mounting method according to the 32nd aspect, wherein the bonding-material flow regulating member is projective portions which, in a case where the electronic-component bonding region of the circuit formation article is quadrilaterally shaped and where the plurality of bumps are formed at two opposing sides, respectively, of the quadrilateral electronic-component bonding region, are provided at corner portions of the electronic-component bonding region of the circuit formation article corresponding to corner portions where the bumps are absent, and which do not need electrical bonding, and during the final compression-bonding, flow of the bonding material toward peripheral portions of the electronic-component bonding region of the circuit formation article in the corner portions is regulated by the projective portions.

According to a 34th aspect of the present invention, there is provided the electronic component mounting method according to the 32nd aspect, wherein the bonding-material flow regulating member is a projective portion which is provided at a larger-width interval portion of the electronic-component bonding region of the circuit formation article where an interval of neighboring electrodes is larger than intervals of other neighboring electrodes and which does not need electrical bonding, and flow of the bonding material toward peripheral portions of the electronic-component bonding region of the circuit formation article in the larger-width interval portion is regulated by the projective portion during the final compression-bonding.

According to a 35th aspect of the present invention, there is provided the electronic component mounting method according to the 33rd or 34th aspect, wherein during a bonding process, the projective portion, which is the bonding-material flow regulating member, is brought into contact with a dummy bump of the electronic component side which does not need electrical connection.

According to a 36th aspect of the present invention, there is provided the electronic component mounting method according to any one of the 32nd to 35th aspects, wherein during the final compression-bonding, flow of the bonding material toward peripheral portions of the electronic-component bonding region of the circuit formation article is regulated by an organic film disposed as the bonding-material flow regulating member outside the electronic-component bonding region of the circuit formation article and at the peripheral portions of the electronic-component bonding region.

According to a 37th aspect of the present invention, there is provided the electronic component mounting method according to any one of the 32nd to 35th aspects, further comprising a step of, before a bonding process, disposing an organic film as the bonding-material flow regulating member outside the electronic-component bonding region of the circuit formation article and at peripheral portions of the electronic-component bonding region.

According to a 38th aspect of the present invention, there is provided the electronic component mounting method according to any one of the 32nd to 37th aspects, wherein during the final compression-bonding, in a case where the electronic-component bonding region of the circuit formation article is quadrilaterally shaped and where one array of the plurality of bumps is disposed at a center of the quadrilateral electronic-component bonding region of the quadrilateral electronic-component bonding region, flow of the bonding material toward peripheral portions of the electronic-component bonding region of the circuit formation article is regulated by a solder resist film disposed as the bonding-material flow regulating member over a range from outside of the electronic-component bonding region of the circuit formation article to vicinities of the one array of the plurality of electrodes of the center.

According to a 39th aspect of the present invention, there is provided the electronic component mounting method according to any one of the 32nd to 37th aspects, further comprising, in a case where the electronic-component bonding region of the circuit formation article is quadrilaterally shaped and where one array of the plurality of electrodes is disposed at a center of the electronic-component bonding region of the quadrilateral shape, disposing a solder resist film as the bonding-material flow regulating member over a range from outside of the electronic-component bonding region of the circuit formation article to vicinities of the one array of the plurality of electrodes of the center.

According to a 40th aspect of the present invention, there is provided the electronic component mounting method according to any one of the 32nd to 39th aspects, wherein during the final compression-bonding, in a case where the electronic-component bonding region of the circuit formation article is quadrilaterally shaped and where the plurality of bumps is formed in arrays at two opposing sides, respectively, of the quadrilateral bonding region, flow of the bonding material toward peripheral portions of the electronic-component bonding region of the circuit formation article is regulated by an organic film disposed as the bonding-material flow regulating member outside the electronic-component bonding region of the circuit formation article and over all the electronic-component bonding region, except bonding portions of the electrodes necessary for bonding with the electrodes of the electronic component.

According to a 41st aspect of the present invention, there is provided the electronic component mounting method according to any one of the 32nd to 39th aspects, further comprising, in a case where the electronic-component bonding region of the circuit formation article is quadrilaterally shaped and where the plurality of bumps are formed in arrays at two opposing sides, respectively, of the quadrilateral bonding region, disposing an organic film as the bonding-material flow regulating member outside the electronic-component bonding region of the circuit formation article and over all the electronic-component bonding regions, except bonding portions of the electrodes necessary for bonding with the electrodes of the electronic component.

According to a 42nd aspect of the present invention, there is provided the electronic component mounting method according to any one of the 32nd to 41st aspects, wherein during the final compression-bonding, a fillet that covers side faces of the electronic component is formed by regulating flow of the bonding material toward peripheral portions of the electronic-component bonding region of the circuit formation article by a fillet-forming projective portion disposed as the bonding-material flow regulating member at the peripheral portion outside the electronic-component bonding region of the circuit formation article.

According to a 43rd aspect of the present invention, there is provided the electronic component mounting method according to any one of the 32nd to 41st aspects, wherein the bonding-material flow regulating member is a fillet-forming projective portion disposed at a peripheral portion outside the electronic-component bonding region of the circuit formation article and serving for forming a fillet that covers side faces of the electronic component.

According to a 44th aspect of the present invention, there is provided the electronic component mounting method according to the 42nd or 43rd aspect, wherein the fillet-forming projective portion is formed of one or more layers of films.

According to a 45th aspect of the present invention, there is provided the electronic component mounting method according to the 42nd or 43rd aspect, wherein the fillet-forming projective portion is formed of one or more layers of board solder resist films.

According to a 46th aspect of the present invention, there is provided the electronic component mounting method according to the 42nd or 43rd aspect, wherein the fillet-forming projective portion is formed of a dummy electrode identical in structure to an electrode of the circuit formation article and thicker than this electrode.

According to a 47th aspect of the present invention, there is provided the electronic component mounting method according to any one of the 32nd to 46th aspects, wherein during the final compression-bonding, flow of the bonding material toward peripheral portions of the electronic-component bonding region of the circuit formation article is regulated by a projective portion which is generally equal in thickness to the electrodes and which is provided as the bonding-material flow regulating member over a region where the bonding material shows nonuniform flow within the electronic-component bonding region of the circuit formation article.

According to a 48th aspect of the present invention, there is provided the electronic component mounting method according to any one of the 32nd to 46th aspects, wherein a projective portion generally equal in thickness to the electrodes is provided over a region where the bonding material shows nonuniform flow within the electronic-component bonding region of the circuit formation article.

According to a 49th aspect of the present invention, there is provided the electronic component mounting method according to the 47th or 48th aspect, wherein the projective portion is mesh-like dummy electrodes which are not involved in electrical connections of the electronic-component bonding region of the circuit formation article.

According to a 50th aspect of the present invention, there is provided the electronic component mounting method according to the 47th or 48th aspect, wherein the projective portion is dummy electrodes which are not involved in electrical connections of the electronic-component bonding region of the circuit formation article and which have through holes which allow the bonding material to pass therethrough.

According to a 51st aspect of the present invention, there is provided an electronic component-mounted unit manufactured by the electronic component mounting method according to any one of the 31st to 50th aspects.

According to a 52nd aspect of the present invention, there is provided an electronic component-mounted unit which is made by bonding an electronic component to a circuit formation article with interposition of a bonding material containing at least resin while a plurality of bumps of a plurality of electrodes of a bonding surface of the electronic component are kept in electrical contact with electrodes of the electronic-component bonding region of the circuit formation article,
  wherein a bonding-material flow regulating member for regulating flow of the bonding material toward a peripheral portion of the electronic-component bonding region of the circuit formation article is provided at a portion where the bonding material flows out nonuniformly over the electronic-component bonding region of the circuit formation article.

According to a 53rd aspect of the present invention, there is provided the electronic component-mounted unit according to the 52nd aspect, wherein the bonding-material flow regulating member has a projective portion which, in a case where the electronic-component bonding region of the circuit formation article is quadrilaterally shaped and where the plurality of bumps is formed at two opposing sides, respectively, of the quadrilateral electronic-component bonding region, is provided at a corner portion of the electronic-component bonding region of the circuit formation article corresponding to a corner portion where a bump is absent, and which does not need electrical bonding and further which serves for regulating flow of the bonding material toward a peripheral portion of the electronic-component bonding region of the circuit formation article in the corner portion.

According to a 54th aspect of the present invention, there is provided the electronic component-mounted unit according to the 52nd aspect, wherein the bonding-material flow regulating member has a projective portion which is provided at a larger-width interval portion of the electronic-component bonding region of the circuit formation article where an interval of neighboring electrodes is larger than intervals of other neighboring electrodes, and which does not need electrical bonding and further which serves for regulating flow of the bonding material toward a peripheral portion of the electronic-component bonding region of the circuit formation article in the larger-width interval portion.

According to a 55th aspect of the present invention, there is provided the electronic component-mounted unit according to the 53rd or 54th aspect, wherein during a bonding process, the projective portion, which is the bonding-material flow regulating member, is brought into contact with a dummy bump of the electronic component side which does not need electrical connection.

According to a 56th aspect of the present invention, there is provided the electronic component-mounted unit according to any one of the 52nd to 55th aspects, wherein an organic film for regulating flow of the bonding material toward a peripheral portion of the electronic-component bonding region of the circuit formation article is provided as the bonding-material flow regulating member outside the electronic-component bonding region of the circuit formation article and at the peripheral portion of the electronic-component bonding region.

According to a 57th aspect of the present invention, there is provided the electronic component-mounted unit according to any one of the 52nd to 56th aspects, wherein in a case where the electronic-component bonding region of the circuit formation article is quadrilaterally shaped and where one array of the plurality of electrodes is disposed at a center of the quadrilateral electronic-component bonding region, a solder resist film for regulating flow of the bonding material toward peripheral portions of the electronic-component bonding region of the circuit formation article is provided as the bonding-material flow regulating member over a range from outside of the electronic-component bonding region of the circuit formation article to vicinities of the one array of the plurality of electrodes of the center.

According to a 58th aspect of the present invention, there is provided the electronic component-mounted unit according to any one of the 52nd to 57th aspects, wherein in a case where the electronic-component bonding region of the circuit formation article is quadrilaterally shaped and where the plurality of bumps is formed in arrays at two opposing sides, respectively, of the quadrilateral bonding region, an organic film for regulating flow of the bonding material toward peripheral portions of the electronic-component bonding region of the circuit formation article is provided as the bonding-material flow regulating member outside the electronic-component bonding region of the circuit formation article and over all the electronic-component bonding region, except bonding portions of the electrodes necessary for bonding with the electrodes of the electronic component.

According to a 59th aspect of the present invention, there is provided the electronic component-mounted unit according to any one of the 52nd to 58th aspects, wherein a fillet-forming projective portion for forming a fillet that cover side faces of the electronic component by regulating flow of the bonding material toward a peripheral portion of the electronic-component bonding region of the circuit formation article is provided as the bonding-material flow regulating member at a peripheral portion outside the electronic-component bonding region of the circuit formation article.

According to a 60th aspect of the present invention, there is provided the electronic component-mounted unit according to the 59th aspect, wherein the fillet-forming projective portion is formed of one or more layers of films.

According to a 61st aspect of the present invention, there is provided the electronic component-mounted unit according to the 59th aspect, wherein the fillet-forming projective portion is formed of one or more layers of board solder resist films.

According to a 62nd aspect of the present invention, there is provided the electronic component-mounted unit according to the 59th aspect, wherein the fillet-forming projective portion is formed of a dummy electrode identical in structure to an electrode of the circuit formation article and thicker than the electrode.

According to a 63rd aspect of the present invention, there is provided the electronic component-mounted unit according to any one of the 52nd to 62nd aspects, wherein a projective portion which is generally equal in thickness to an electrode and which serves for regulating flow of the bonding material toward a peripheral portion of the electronic-component bonding region of the circuit formation article is provided as the bonding-material flow regulating member over a region where the bonding material shows nonuniform flow within the electronic-component bonding region of the circuit formation article.

According to a 64th aspect of the present invention, there is provided the electronic component-mounted unit according to the 63rd aspect, wherein the projective portion is a mesh-like dummy electrode which is not involved in electrical connection of the electronic-component bonding region of the circuit formation article.

According to a 65th aspect of the present invention, there is provided the electronic component-mounted unit according to the 63rd aspect, wherein the projective portion is a dummy electrode which is not involved in electrical connection of the electronic-component bonding region of the circuit formation article and which has a through hole which allows the bonding material to pass therethrough.

According to a 66th aspect of the present invention, there is provided an electronic component mounting method comprising:

feeding a bonding material containing at least resin to a circuit formation article or an electronic component;

positioning the electronic component and the circuit formation article with the bonding material interposed therebetween so that a plurality of bump-shaped electrodes of a bonding surface of the electronic component and electrodes of an electronic-component bonding region of the circuit formation article can be brought into electrical contact with each other; and thermocompression-bonding the electronic component by heating and pressurization, so that the bonding material interposed between the bonding surface of the electronic component and the circuit formation article is cured while the bump-shaped electrodes of the electronic component and the electrodes of the circuit formation article are kept in mutual electrical contact, whereby final compression-bonding is fulfilled, wherein during the final compression-bonding, flow of the bonding material toward a peripheral portion of the bonding surface of the electronic component or the electronic-component bonding region of the circuit formation article is regulated by a bonding-material flow regulating member provided at a portion where the bonding material flows out nonuniformly along the bonding surface of the electronic component or from the electronic-component bonding region of the circuit formation article. This 66th aspect can be appropriately combined with the aforementioned various aspects.

BRIEF DESCRIPTION OF DRAWINGS

These and other aspects and features of the present invention will become clear from the following description taken in conjunction with the preferred embodiments thereof with reference to the accompanying drawings, in which:

FIG. 2 is an explanatory view which explains steps of the electronic component mounting method according to the first embodiment of the present invention following FIG. 1C, and which is a perspective plan view showing a flow state of a bonding material between an electronic component and a circuit board during a mounting process of this electronic component mounting method;

FIGS. 3A and 3B are explanatory views for explaining steps of an electronic component mounting method according to a prior art example for explaining the first embodiment of the present invention;

FIGS. 6A, 6B and 6C are explanatory views for explaining steps of an electronic component mounting method according to a prior art example for explaining the second embodiment of the present invention, and FIG. 6D is a perspective plan view showing a flow state of a bonding material between an electronic component and a circuit board during a mounting process of this electronic component mounting method;

FIGS. 9A, 9B and 9C are explanatory views for explaining steps of an electronic component mounting method according to a prior art example for explaining the third embodiment of the present invention, and FIG. 9D is a perspective plan view showing a flow state of a bonding material between an electronic component and a circuit board during a mounting process of this electronic component mounting method;

FIG. 13 is a perspective plan view showing a flow state of a bonding material between an electronic component and a circuit board during a mounting process by the electronic component mounting method according to the fifth embodiment of the present invention, following FIG. 12D;

FIGS. 14A, 14B and 14C are explanatory views for explaining steps of an electronic component mounting method according to a prior art example for explaining the fifth embodiment of the present invention;

FIGS. 46A and 46B are a side view and a plan view of a circuit board prior to a bonding step of an IC chip mounting method according to a twelfth embodiment of the present invention, and FIG. 46C is a partial cross-sectional side view of an IC chip, the circuit board, and a bonding material during a compression-bonding step;

FIGS. 69A and 69B are a partial cross-sectional side view and a partially enlarged and partial cross-sectional side view, respectively, of an IC chip, the circuit board, and a bonding material during a compression-bonding step of the IC chip mounting method according to the seventeenth embodiment;

FIG. 71 is a partially enlarged and partial cross-sectional side view of an IC chip, a circuit board, and a bonding material during a compression-bonding step of an IC chip mounting method according to a comparative example for explaining the sixteenth embodiment;

FIG. 72 is a partially enlarged and partial cross-sectional side view of the IC chip, the circuit board, and the bonding material during the compression-bonding step of the IC chip mounting method according to the comparative example for explaining the sixteenth embodiment;

FIGS. 73A and 73B are a side view and a plan view of a circuit board prior to a bonding step of an IC chip mounting method according to an eighteenth embodiment of the present invention;

FIGS. 74A and 74B are a partial cross-sectional side view and a partially enlarged partial cross-sectional side view, respectively, of an IC chip, the circuit board, and a bonding material during a compression-bonding step of the IC chip mounting method according to the eighteenth embodiment;

FIGS. 81A, 81B, 81C, 81D and 81E are, respectively, explanatory views showing a case where a non-stud bump (NSD) type mounting method is specified as one example of the IC chip mounting methods according to the above embodiments;

DETAILED DESCRIPTION OF THE PREFERRED EMBODIMENTS

Figure 1A:
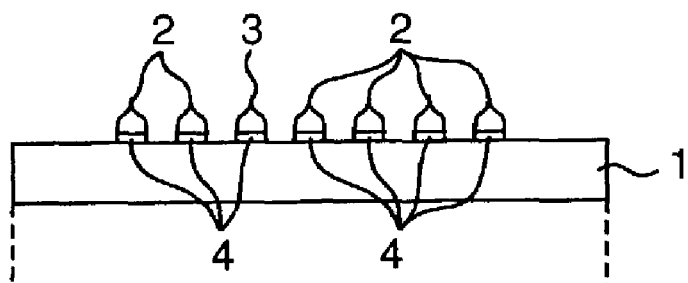
FIGS. 1A, 1B and 1C are explanatory views explaining steps of an electronic component mounting method according to a first embodiment of the present invention.

Before the description of the present invention proceeds, it is to be noted that like parts are designated by like reference numerals throughout the accompanying drawings.

Embodiments of the present invention are described in detail with reference to the accompanying drawings. Although each of bumps and each of dummy bumps are represented by quadrilateral shapes in each plan view for simplification, the shapes are actually not limited to these quadrilateral shape.

First Embodiment

Figure 1B:
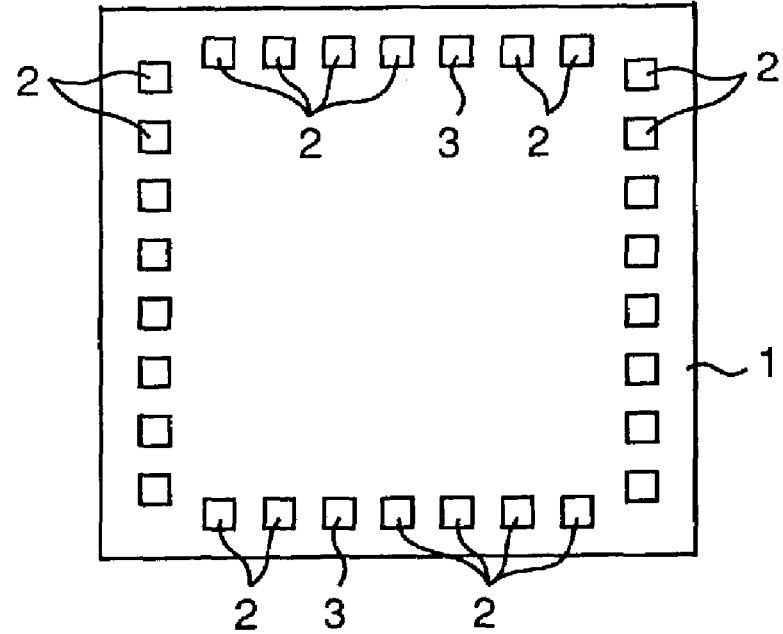
Figure 1C:
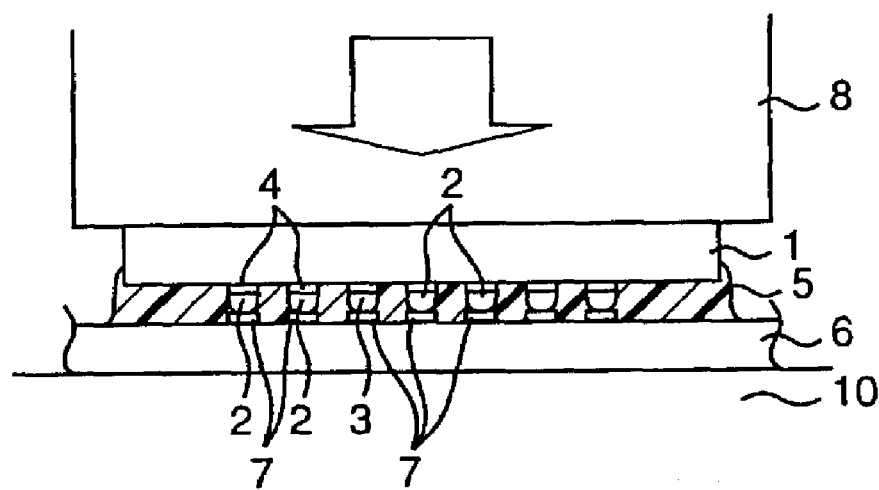
Figure 4A:
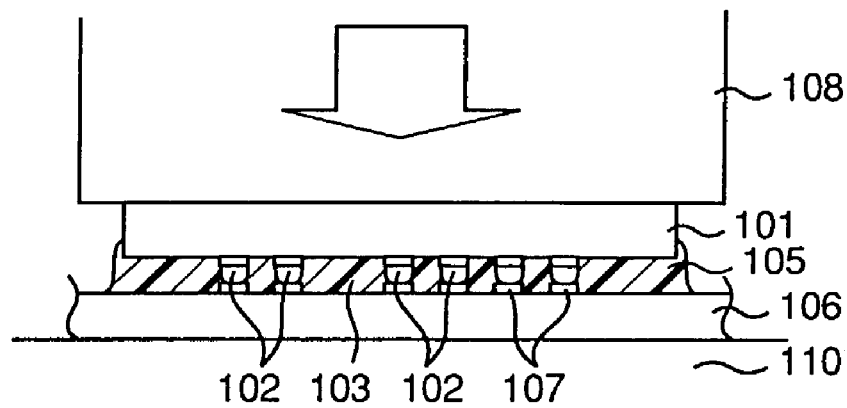
FIGS. 4A and 4B are an explanatory view for explaining steps of the electronic component mounting method according to the prior art example following FIG. 3B and a perspective plan view showing a flow state of a bonding material between an electronic component and a circuit board during a mounting process of this electronic component mounting method, respectively.

An IC chip mounting method and an IC chip-mounted unit manufactured by the method, as an example of an electronic component mounting method and an electronic component-mounted unit manufactured by the method according to a first embodiment of the present invention are explained with reference to FIGS. 1A, 1B and 1C to FIG. 2. FIGS. 1A and 1B are a side view and a rear view of the IC chip prior to a bonding step of the IC chip mounting method according to the first embodiment. FIG. 1C is a side view of an IC chip, a circuit board, and a bonding material during the bonding step. FIG. 2 is a plan view showing a flow state of bonding material during a compression-bonding step and showing movement of the bonding material on a circuit board by seeing through the IC chip. Furthermore, FIGS. 3A and 3B are a side view and a rear view of an IC chip prior to a bonding step of an electronic component mounting method according to a prior art example for explaining the first embodiment. FIG. 4A is a side view of the IC chip, a circuit board, and bonding material during the bonding step of the prior art, and FIG. 4B is a plan view showing a flow state of the bonding material during a compression-bonding step and showing movement of the bonding material on the circuit board by seeing through the IC chip.

In this IC chip mounting method, as shown in FIGS. 1A, 1B, 1C and 2, a bonding surface of a square or rectangular IC chip 1 (square IC chip 1 in FIGS. 1A, 1B and 1C) as an example of the electronic component has an array of bumps 2, . . . , 2 which are formed at portions in vicinities of side-verge portions of four individual sides except for four corner portions of the bonding surface so as to be generally parallel to the sides and generally equidistant, where dummy bump(s) 3, as one example of a bonding-material flow regulating member, are formed at site(s) with no bump(s) 2 out of the side-verge vicinities of the bonding surface of the IC chip 1 (sites where the bumps 2 are absent from the vicinities of upper and lower two sides out of the four sides of the IC chip 1 in FIG. 1B), so that flow of a bonding material 5 is regulated by the dummy bumps 3.

Figure 4B:
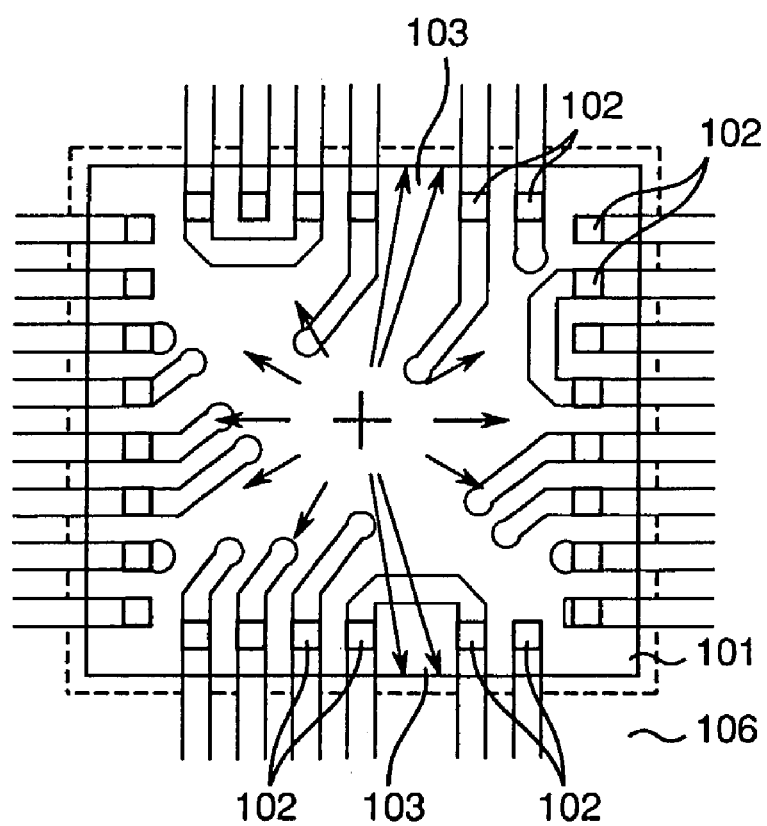

Conventionally, as shown in FIGS. 3A, 3B, 4A and 4B, it is assumed that bumps 102, . . . , 102 are generally equidistantly arrayed on electrodes 104, . . . , 104 in each of vicinities of side verges of two opposing sides (upper and lower two sides in FIG. 3B) of a square IC chip 101, in which arrangement there are positions 103 where the bumps 102 are lacking, i.e. larger-width interval portions 103 where intervals between neighboring bumps 102, 102 are larger than other intervals. In the state that the bumps 102, . . . , 102 are disposed on the IC chip 101 as shown above, bonding material 105 is fed to a circuit board 106, and then, as shown in FIGS. 4A and 4B, the bumps 102 on the electrodes 104 of the IC chip 101 and electrodes 107 of the circuit board 106 are bonded together so as to be brought into electrical contact with each other via the bonding material 105 interposed between a bonding surface of the IC chip 101, on which the bumps 102 are formed on the electrodes 104 of the bonding surface, and the circuit board 106. By placing the circuit board 106 on a base 110, and bringing a heated pressurizing member 108 into contact with the IC chip 101 and applying pressure thereto, the IC chip 101 is compression-bonded in a heated and pressurized state so that the bonding material 105 between the bonding surface of the IC chip 101 and the circuit board 106 is cured. In such a case, the bonding material 105 would flow out greatly from the larger-width interval portions 103, where the bumps 102 are lacking, to peripheral portions of the bonding surface of the IC chip 101, more than from gaps between the bumps 102, . . . , 102 arrayed generally equidistantly. As a result, a density of the bonding material 105 would become lower in central portions of the IC chip 101 than in other portions, so that bonding power and sealing power would be deteriorated.

In order to prevent such deteriorations of the bonding power and the sealing power, in the first embodiment, prior to a bonding material feeding step, as shown in FIGS. 1A and 1B, in the arrangement that the bumps 2, . . . , 2 are arrayed generally equidistantly in each of the vicinities of side verges of two opposing sides (upper and lower two sides in FIG. 1B) out of the four sides of the IC chip 1, dummy bumps 3 are formed in the same manner as other bumps 2 generally equidistantly at larger-width interval portions where the bumps 2 are lacking (see 103 in FIGS. 3A, 3B, 4A and 4B); that is, at positions where intervals between neighboring bumps 2, 2 are larger than other intervals, so that the bumps 2 are arrayed generally equidistantly. As a result, the two opposing sides (upper and lower two sides in FIG. 1B) of the IC chip 1 are in the same state as the state that the bumps 2, . . . , 2 are arrayed generally equidistantly without lacking of the bumps 2 in each of the vicinities of the side verges of the other two opposing sides (right and left two sides in FIG. 1B) of the IC chip 1.

Examples of the method for forming the bumps 2 and the dummy bumps 3 include a bump forming method shown in FIGS. 30A to 30G as described later and so forth.

In the state that the bumps 2, . . . , 2 are formed as shown above, bonding material 5 containing at least an insulative thermosetting resin is fed to at least either one of the bonding surface of the IC chip 1 or an IC chip bonding region 6a of the circuit board 6 as one example of a circuit formation article in the bonding material feeding step. As a method of feeding the bonding material 5, when the bonding material 5 is a liquid, the bonding material 5 is applied, and, when the bonding material 5 is a solid such as a sheet, the bonding material 5 is placed or pasted.

Examples of the bonding material include anisotropic conductive paste, sealing resin paste, and so forth when the bonding material is a liquid, and a sheet-like anisotropic conductive film, a sealing resin film, and so forth when the bonding material is a solid.

It is noted here that the terms, circuit formation article, herein refer to an object on which a circuit is formed, including such circuit boards as resin board, paper-phenol board, ceramic board, film board, glass-epoxy board, or film substrate (film board), such circuit boards as single-layer board or multilayer board, and component parts, casings, frames, or the like.

Next, during the bonding step, the bonding surface of the IC chip 1 is laid on the IC chip bonding region 6a of the circuit board 6 with the bonding material 5 interposed therebetween. Then, these members are so positioned that the bumps 2 on electrodes 4 of the IC chip 1 and electrodes 7 of the circuit board 6 come into mutual electrical contact via the bonding material 5 interposed between the bonding surface of the IC chip 1, on which the bumps 2 are formed on the electrodes 4, respectively, and the IC chip bonding region 6a of the circuit board 6. Thereafter, the two members are bonded together. This bonding step may be performed in a state that the circuit board 6 is placed on a base 10, or may be performed in two steps, i.e., a bonding step to be performed at a different place in the state that the IC chip 1 is laid on the circuit board 6 with the bonding material 5 interposed therebetween, and a final compression-bonding step to be subsequently performed in which the circuit board 6 having the IC chip 1 laid thereon with the bonding material 5 interposed therebetween is placed on the base 10.

Next, during a final compression-bonding step, a pressurizing member 8 is brought into contact with the IC chip 1, so that a pressurizing force acts from the pressurizing member 8 toward the base 10, on which the circuit board 6 having the IC chip 1 laid thereon with the bonding material 5 interposed therebetween is placed, and moreover heat of a heater contained in the pressurizing member 8 is transferred from the pressurizing member 8 to the IC chip 1. As a result of this, by a specified pressurizing force being exerted under application of a specified temperature, the bonding surface of the IC chip 1 is pressed against the IC chip bonding region 6a of the circuit board 6, causing the bumps 2 on the individual electrodes 4 of the bonding surface of the IC chip 1 to be put into greater contact with the individual electrodes 7 within the IC chip bonding region 6a of the circuit board 6, than during the bonding step. In this state, the bonding material 5 between the bonding surface of the IC chip 1 and the IC chip bonding region 6a of the circuit board 6 tends to be pressed out from central portions towards peripheral portions of the bonding surface of the IC chip 1. In this connection, since the dummy bumps 3 are disposed in the larger-width interval portions where the bumps 2 are lacking as described above, the bumps 2, . . . , 2 and the dummy bumps 3 are disposed generally equidistantly in the vicinities of side verges of the individual sides of the bonding surface of the IC chip 1, uniformly among the vicinities of all the sides. Therefore, flow of the bonding material 5 from the central portions towards the peripheral portions is regulated uniformly in the vicinities of the side verges of the individual sides, as shown by arrows in FIG. 2, so that the bonding material 5 can be prevented from flowing nonuniformly. Thus, the bonding material 5 is cured by heat, while being held generally uniformly distributed, over at least an entire bonding surface of the IC chip 1, thereby achieving manufacture of an IC chip-mounted unit. That is, during this final compression-bonding step, nonuniform pressing out of the bonding material 5 from the central portion to the peripheral portions of the bonding surface of the IC chip 1 during compression-bonding can be regulated by the dummy bumps 3 provided on the IC chip 1.

Height of each dummy bump 3 as an example of the bonding-material flow regulating member is preferably 10 to 30% of an interval between the IC chip 1 and the circuit board 6 after the bonding of the IC chip 1 and the circuit board 6, and is preferably 20% as an example. As specific numerical value examples, when the height of the interval between the IC chip 1 and the circuit board 6 after the bonding is 30 to 40 μm, the height of the dummy bump 3 is about 7 μm.

The dummy bumps 3 preferably have thermal resistance. For example, thermal resistance means a property of withstanding heat at 200° C. for 20 seconds when a reflow step is unnecessary, or heat at 250° C. for 10 seconds when a reflow step is performed.

Furthermore, the bonding material 5 is not limited to the one constituted by only an insulative thermosetting resin, but may contain electrically conductive materials containing electrically conductive particles or inorganic fillers in the insulative resin. Even in a case where the bonding material 5 contains electrically conductive materials or inorganic fillers, flow of the resin is uniformized within the bonding surface of the IC chip 1 by the dummy bumps 3 during compression bonding, so that the conductive materials or the inorganic fillers can be disposed uniformly. In contrast to this, without the dummy bump(s) 3, in a resin having inorganic fillers added thereto, nonuniform flow of the resin during the compression bonding would cause the inorganic fillers to become denser or sparser, making it more likely that quality deterioration occurs due to partial differences in physical properties of the resin in some cases. In a resin having electrically conductive materials added thereto, nonuniform flow of the resin during the compression bonding would cause the electrically conductive material to become denser or sparser, which might cause partial short-circuits in some cases.

In the above description, it has been described that the bumps 2 of the IC chip 1 and the electrodes 7 of the circuit board 6 are brought into contact with each other, respectively, during the bonding step. However, this is not limitative, and it is also possible that the bumps 2 of the IC chip 1 and the electrodes 7 of the circuit board 6 are not brought into contact with each other, respectively, during the bonding step, but that the bumps 2 of the IC chip 1 and the electrodes 7 of the circuit board 6 are brought into contact with each other, respectively, for the first time during the final compression-bonding step.

According to the first embodiment, the bonding surface of the square or rectangular IC chip 1 has an array of bumps 2, . . . , 2 generally equidistantly in vicinities of side verges of the four sides except for its four corners. Then, by forming the dummy bump(s) 3 at site(s) where the bump(s) 2 are absent in the vicinities of the side verges of the sides of the bonding surface of the IC chip 1, an array state of the arrayed bumps 2, . . . , 2 can be made generally identical among the vicinities of the side verges of the individual sides of the IC chip 1, and, when the bonding material 5 between the bonding surface of the IC chip 1 and the IC chip bonding region 6a of the circuit board 6 flows from the central portion to the peripheral portions during the compression-bonding step, the dummy bump(s) 3 function as a bonding-material flow regulating member. Thus, the flow of the bonding material 5 from the central portion to the peripheral portions in the vicinities of the side verges of the individual sides of the IC chip 1 can be made generally uniform, and moreover, a distribution of the bonding material 5 within the bonding surface of the IC chip 1 can be made uniform, thus allowing adhesion to be improved, so that reliability of bonding and sealing can be enhanced.

Positions at which the dummy bumps as one example of the bonding-material flow regulating member are disposed on the bonding surface of the IC chip 1 are not limited to the vicinities of one pair of opposing sides as described above. It is sufficient that dummy bumps 3 are formed, in the same manner as other bumps 2 are formed, at positions at which intervals between neighboring bumps 2, 2 are larger than other intervals in the array of the bumps 2, 2 in the vicinity of the side verge of any one side, so that the bumps 2 are arrayed generally equidistantly.

It is noted that the present invention is not limited to the above embodiment and can be performed in other various modes as described below.

Second Embodiment

Figure 5A:
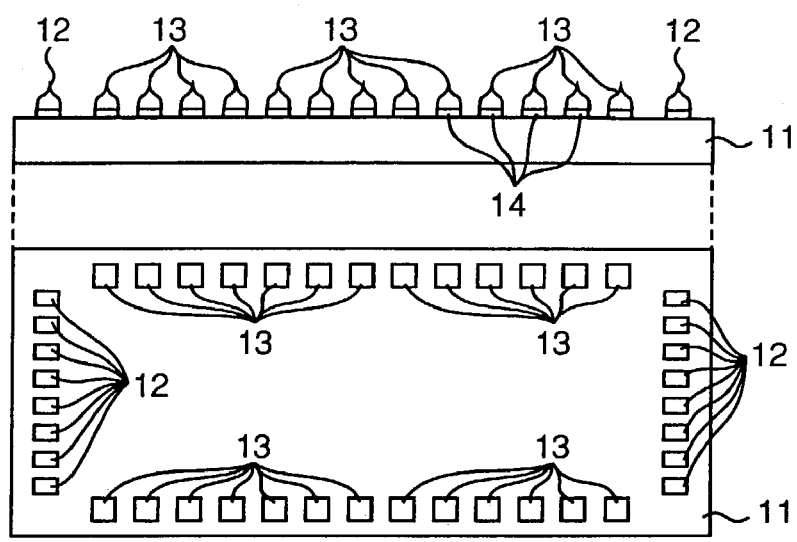
FIGS. 5A, 5B and 5C are explanatory views explaining steps of an electronic component mounting method according to a second embodiment of the present invention.
Figure 5B:
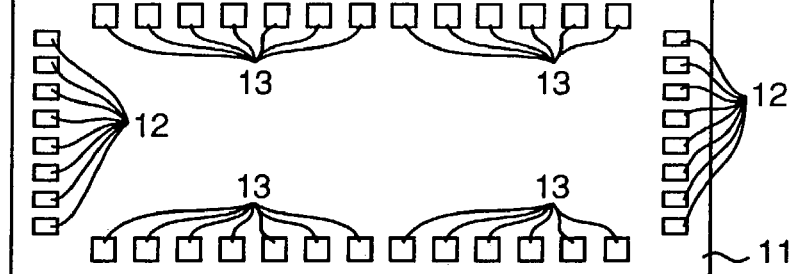
Figure 5C:
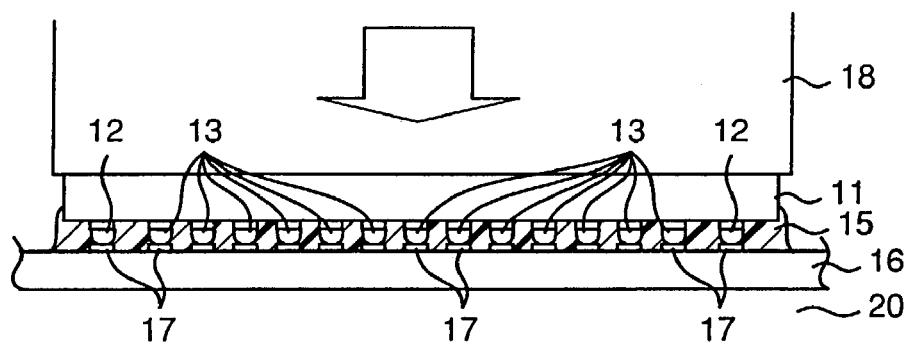
Figure 5D:
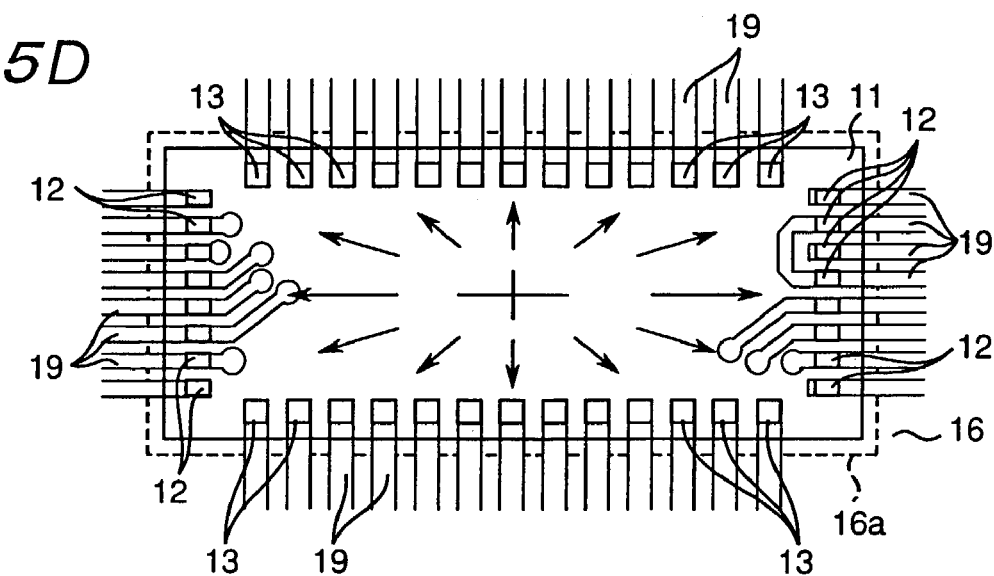
FIG. 5D is a perspective plan view showing a flow state of a bonding material between an electronic component and a circuit board during a mounting process of this electronic component mounting method.

An IC chip mounting method and an IC chip-mounted unit manufactured by the method as an example of an electronic component mounting method and an electronic component-mounted unit manufactured by the method according to a second embodiment of the present invention are explained with reference to FIGS. 5A, 5B, 5C and 5D. FIGS. 5A and 5B are a side view and a rear view of an IC chip prior to a bonding step of the IC chip mounting method according to the second embodiment. FIG. 5C is a side view of the IC chip, a circuit board, and bonding material during the bonding step. FIG. 5D is a plan view showing a flow state of the bonding material during the compression-bonding step and showing movement of the bonding material on the circuit board by seeing through the IC chip. Also, FIGS. 6A and 6B are a side view and a rear view, respectively, of an IC chip prior to a bonding step of an IC chip mounting method according to a prior art example for explaining the second embodiment, FIG. 6C is a side view of the IC chip, a circuit board and bonding material during the bonding step, and FIG. 6D is a plan view showing a flow state of the bonding material during the compression-bonding step and showing movement of the bonding material on the circuit board by seeing through the IC chip.

In the first embodiment, an array of bumps 2, . . . , 2 is provided in each of the vicinities of side verges of the four sides of a square or rectangular IC chip 1. However, this is not limitative. For example, in the second embodiment, as shown in FIGS. 5A to 5D, an array of bumps 12, . . . , 12 are provided only in the vicinities of the verges of two opposing sides (right and left two sides in FIG. 5B) out of the four sides of a bonding surface of a rectangular IC chip 11 as one example of the electronic component so that the arrays of bumps 12, . . . , 12 are generally parallel to the sides, respectively, and generally equidistantly, while an array of dummy bumps 13, . . . , 13 is formed as one example of a bonding-material flow regulating member only in the vicinities of the verges of the remaining two sides (upper and lower two sides in FIG. 5B) of the bonding surface of the IC chip 11; that is, only in portions where the bumps 12 are absent, so that the dummy bumps 13, . . . , 13 are generally parallel to the sides, respectively, and generally equidistantly, wherein flow regulation of a bonding material 15 is performed by the dummy bumps 13.

Conventionally, as shown in FIGS. 6A to 6D, it is assumed that bumps 112, . . . , 112 are generally equidistantly arrayed on electrodes 114, . . . , 114 in the vicinities of side verges of two opposing sides (right and left two sides in FIG. 6B), respectively, of a rectangular IC chip 111, while no bumps 112 are present in vicinities 113, 113 of side verges of the remaining two sides (upper and lower two sides in FIG. 6B) of the bonding surface of the IC chip 111. In a state that the bumps 112, . . . , 112 are disposed on the IC chip 111 as shown above, bonding material 115 is fed to a circuit board 116 and then the bumps 112 on the electrodes 114 of the IC chip 111 and electrodes 117 of the circuit board 116 are bonded together so as to be brought into electrical contact with each other via the bonding material 115 interposed between the bonding surface of the IC chip 111, on which the bumps 112 have been formed on the electrodes 114 of the bonding surface, and the circuit board 116. By placing the circuit board 116 on a base 120, and bringing a heated pressurizing member 118 into contact with the IC chip 111 and applying pressure thereto, the IC chip 111 is compression-bonded in a heated and pressurized state so that the bonding material 115 between the bonding surface of the IC chip 111 and the circuit board 116 is cured. In such a case, the bonding material 115 would flow out greatly from the vicinities of the side verges of the positions 113, where the bumps 112 are lacking, to peripheral portions of the bonding surface of the IC chip 111, more than from the vicinities of the side verges, where the generally equidistantly bumps 112, . . . , 112 are disposed. As a result, a density of the bonding material 115 would become lower in central portions of the IC chip 111, so that a bonding power and sealing power would be deteriorated.

In order to prevent such deteriorations of the bonding power and the sealing power, in the second embodiment, prior to a bonding material feeding step, as shown in FIGS. 5A and 5B, dummy bump(s) 13, . . . , 13 are formed in side-verge vicinities 113, 113, respectively, in the vicinities of the verges of two opposing sides (upper-and-lower longer two sides in FIGS. 5A and 5B) of a rectangular IC chip 11 where the bumps 12, . . . , 12 are absent, in one array and generally equidistantly in the same manner as other bumps 12, . . . , 12 are arrayed in side-verge vicinities of the shorter sides. As a result of this, there is no complete absence of bumps 12 either at the side-verge vicinities of the two opposing sides (right-and-left shorter sides in FIG. 5B) of the rectangular IC chip 11 or at the side-verge vicinities of the other two opposing sides (upper-and-lower longer two sides in FIG. 5B) of the rectangular IC chip 11, resulting in a state that the bumps 12, . . . , 12 or the dummy bumps 13, . . . , 13 are arrayed generally uniformly each in one array in the vicinities of all the side verges.

The method by which the bumps 12 and the dummy bumps 13 are formed is the same as that of the first embodiment.

In the state that arrays of the bumps 12, ..., 12 or the dummy bumps 13, ..., 13 are formed in the vicinities of the individual side verges of the rectangular IC chip 11 as shown above, during the bonding material feeding step, a bonding material 15 containing at least an insulative thermosetting resin is fed to at least either one of the bonding surface of the IC chip 11 or a IC chip bonding region 16*a* of a circuit board 16 as an example of a circuit formation article. The method of feeding the bonding material 15 is the same as that of the first embodiment.

Next, during the bonding step, the bonding surface of the IC chip 11 is laid on the IC chip bonding region 16*a* of the circuit board 16 with the bonding material 15 interposed therebetween. Then, these members are so positioned that the bumps 12 on electrodes 14 of the IC chip 11 and electrodes 17 of the circuit board 16 come into mutual electrical contact via the bonding material 15 interposed between the bonding surface of the IC chip 11, on which the bumps 12 are formed on the electrodes 14, respectively, and the IC chip bonding region 16*a* of the circuit board 16. Thereafter, the two members are bonded together. This bonding step may be performed in a state that the circuit board 16 is placed on a base 20, or may be performed in two steps, i.e., a bonding step to be performed at a different place in the state that the IC chip 11 is laid on the circuit board 16 with the bonding material 15 interposed therebetween, and a final compression-bonding step to be subsequently performed in which the circuit board 16 having the IC chip 11 laid thereon with the bonding material 15 interposed therebetween is placed on the base 20.

Next, during the final compression-bonding step, a pressurizing member 18 is brought into contact with the IC chip 11, so that a pressurizing force acts from the pressurizing member 18 toward the base 20, on which the circuit board 16 having the IC chip 11 laid thereon with the bonding material 15 interposed therebetween is placed, and moreover heat of a heater contained in the pressurizing member 18 is transferred from the pressurizing member 18 to the IC chip 11. As a result of this, by a specified pressurizing force being exerted under application of a specified temperature, the bonding surface of the IC chip 11 is pressed against the IC chip bonding region 16*a* of the circuit board 16, causing the bumps 12 on the individual electrodes 14 of the bonding surface of the IC chip 11 to come into contact with the individual electrodes 17 within the IC chip bonding region 16*a* of the circuit board 16. In this state, the bonding material 15 between the bonding surface of the IC chip 11 and the IC chip bonding region 16*a* of the circuit board 16 tends to be pressed out from central portions toward peripheral portions of the bonding surface of the IC chip 11. In this connection, since the dummy bumps 13 are disposed at positions where the bumps 12 are lacking as described above, the bumps 12, ..., 12 and the dummy bumps 13 are disposed generally equidistantly in the vicinities of side verges of the individual sides of the bonding surface of the IC chip 11, uniformly among the vicinities of all the sides. Therefore, flow of the bonding material 15 from the central portions toward the peripheral portions is regulated uniformly in the vicinities of the side verges of the individual sides, as shown by arrows in FIG. 5D, so that the bonding material 15 can be prevented from flowing nonuniformly. Thus, the bonding material 15 is cured by the heat, while being held generally uniformly distributed, over at least an entire bonding surface of the IC chip 11, achieving manufacture of an IC chip-mounted unit.

That is, during this final compression-bonding step, nonuniform pressing out of the bonding material 15 from the central portion to the peripheral portions of the bonding surface of the IC chip 11 during compression-bonding can be regulated by the dummy bumps 13, ..., 13 provided on the IC chip 11.

Height of the dummy bumps 13 as an example of the bonding-material flow regulating member, thermal resistance of each dummy bump 13 and examples of the bonding material 15 are the same as in the first embodiment.

In the above description, it has been described that the bumps 12 of the IC chip 11 and the electrodes 17 of the circuit board 16 are brought into contact with each other, respectively, during the bonding step. However, this is not limitative, and it is also possible that the bumps 12 of the IC chip 11 and the electrodes 17 of the circuit board 16 are not brought into contact with each other, respectively, during the bonding step, but that the bumps 12 of the IC chip 11 and the electrodes 17 of the circuit board 16 are brought into contact with each other, respectively, for the first time during the final compression-bonding step.

According to the second embodiment, while the bonding surface of the rectangular IC chip 11 has an array of bumps 12, ..., 12 generally equidistantly in vicinities of side verges of the four sides except for its four corners, the dummy bumps 13, ..., 13 are formed at sites where the bumps 12 are absent in the vicinities of the side verges of the bonding surface of the IC chip 11, by which an array state of the bumps 12, ..., 12 can be made generally identical among the vicinities of the side verges of the individual sides of the IC chip 11, and, when the bonding material 15 between the bonding surface of the IC chip 11 and the IC chip bonding region 16*a* of the circuit board 16 flows from the central portion to the peripheral portions during the compression-bonding step, the dummy bumps 13 function as a bonding-material flow regulating member. Thus, the flow of the bonding material 15 from the central portion to the peripheral portions in the vicinities of the side verges of the individual sides of the IC chip 11 can be made generally uniform, and moreover, distribution of the bonding material 15 within the bonding surface of the IC chip 11 can be made uniform, thus allowing adhesion to be improved so that reliability of bonding and sealing can be enhanced.

When the intervals between the dummy bumps 13, ..., 13 are made generally the same as the intervals between the bumps 12, ..., 12, a resulting state is as if the bumps 12, ..., 12 were similarly formed in the vicinities of the four side verges. Consequently, the flow of the bonding material 15 from the central portion toward the peripheral portions can be made further more generally uniform, and moreover, distribution of the bonding material 15 within the bonding surface of the IC chip 11 can be made even more uniform. However, the intervals are not limited to this, and, in order to increase uniformity in comparison with the case where no dummy bumps 13, ..., 13 are present, the interval between the dummy bumps 13, ..., 13 may be made larger than the interval between the bumps 12, ..., 12.

Third Embodiment

Figure 8:
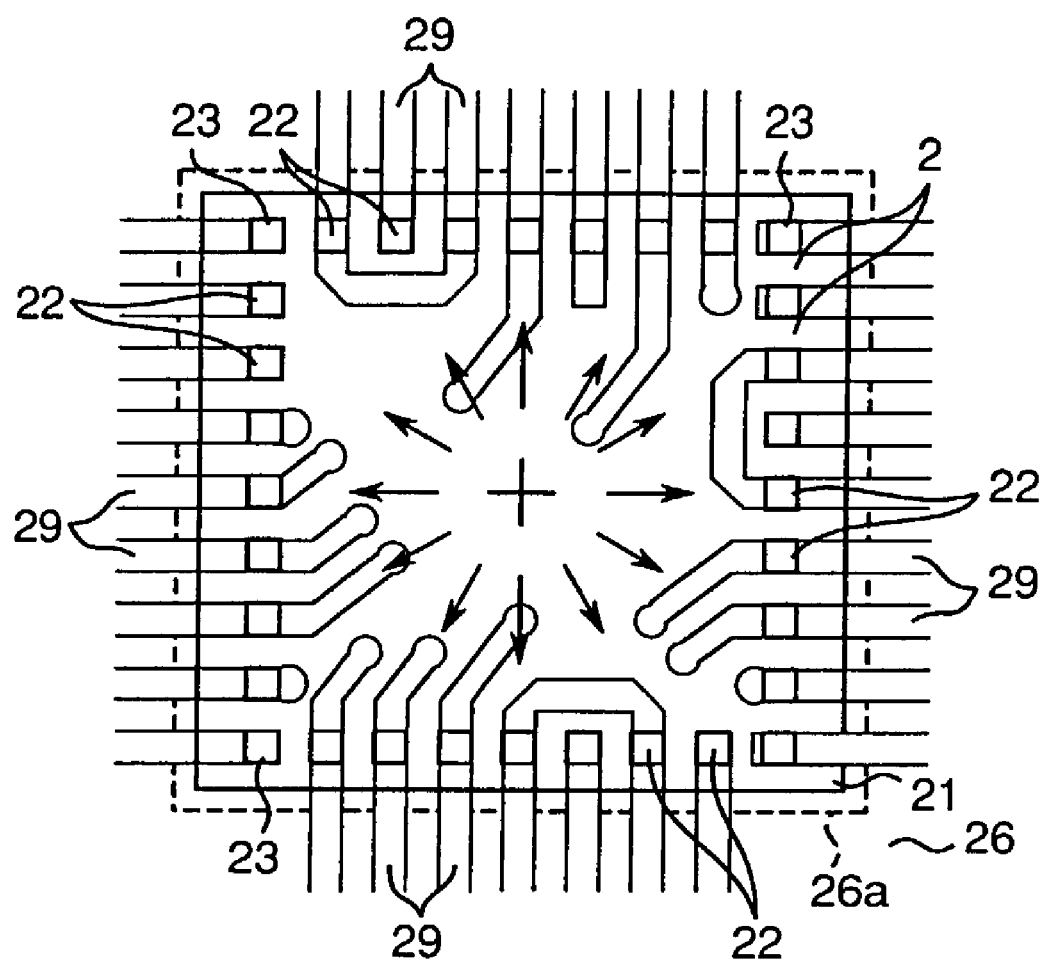
FIG. 8 is an explanatory view which shows steps of the electronic component mounting method according to the third embodiment of the present invention following FIG. 7C, and which is a perspective plan view showing a flow state of a bonding material between an electronic component and a circuit board during a mounting process of this electronic component mounting method.
Figure 7:
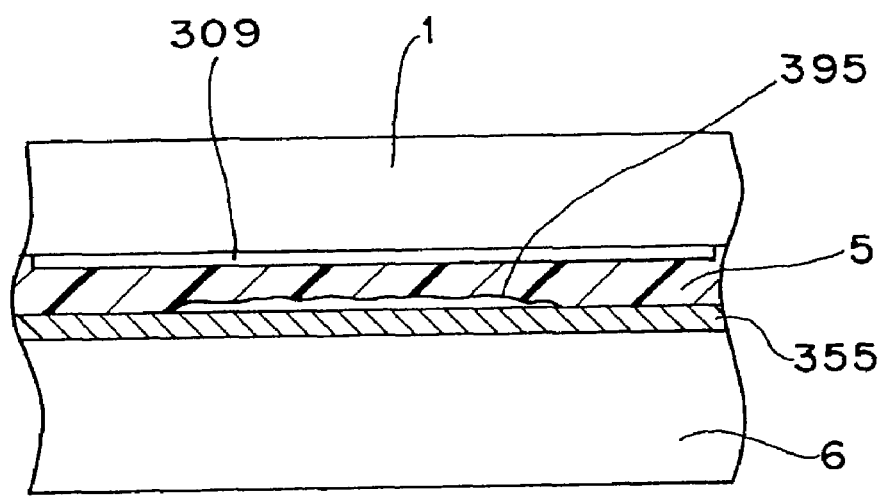
FIGS. 7A, 7B and 7C are explanatory views explaining steps of an electronic component mounting method according to a third embodiment of the present invention.
Figure 7:
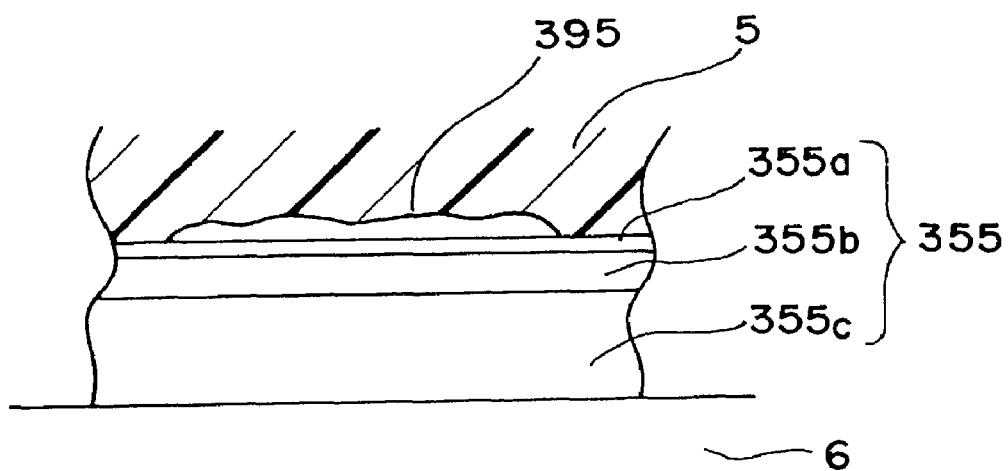

An IC chip mounting method and an IC chip-mounted unit manufactured by the method as an example of an electronic component mounting method and an electronic component-mounted unit manufactured by the method according to a third embodiment of the present invention are explained with reference to FIGS. 7A, 7B, 7C and 8. FIGS. 7A and 7B are a side view and a rear view of an IC chip prior to a bonding step of the IC chip mounting method according to the third embodiment. FIG. 7C is a side view of the IC chip, a circuit board, and a bonding material during the bonding step. FIG. 8 is a plan view showing a flow state of the bonding material during a compression-bonding step and showing movement of the bonding material on the circuit board by seeing through the IC chip. Furthermore, FIGS. 9A to 9B are a side view and a rear view of an IC chip prior to a bonding step of an IC chip component method according to a prior art example for explaining the third embodiment. FIG. 9C is a side view of the IC chip, a circuit board, and a bonding material during the bonding step of this prior art. FIG. 9D is a plan view showing a flow state of the bonding material during a compression-bonding step of the prior art, and showing movement of the bonding material on the circuit board by seeing through the IC chip.

In the first embodiment and the second embodiment, an array of bumps 2, ..., 2; 12, ..., 12 are provided in each of the vicinities of side verges of the four sides of a square or rectangular IC chip 1, 11, while dummy bumps 3, 13 are disposed at sites at which an array of bumps is lacking in the vicinities of side verges of the individual sides. However, this is not limitative. For example, in the third embodiment, as shown in FIGS. 7A and 7B, a bonding surface of a square IC chip 21 has an array of bumps 22, ..., 22 in each of vicinities of side verges of the four sides except the vicinities of its four corner portions, and dummy bumps 23 are formed as an example of a bonding-material flow regulating member in each of vicinities of the four corner portions of the bonding surface of the IC chip 21; that is, at portions where no bumps are originally provided, so that flow regulation of a bonding material 25 is performed by the dummy bumps 23.

Conventionally, it is assumed, as shown in FIGS. 9A to 9D, that bumps 122, ..., 122 are arranged in one array generally equidistantly on electrodes 124, ..., 124, respectively, in each of the vicinities of side verges of the individual sides of a bonding surface of a rectangular IC chip 121, while no bumps 122 are present in each of the vicinities of four corner portions of the bonding surface of the IC chip 121. In a state that the bumps 122, ..., 122 are disposed on the IC chip 121 as shown above, bonding material 125 is fed to a circuit board 126, and then the bumps 122 on the electrodes 124 of the IC chip 121 and electrodes 127 of the circuit board 126 are bonded together so as to be brought into electrical contact with each other via the bonding material 125 interposed between the bonding surface of the IC chip 121, on which the bumps 122 are formed on the electrodes 124 of the bonding surface, and the circuit board 126. By placing the circuit board 126 on a base 130, and then bringing a heated pressurizing member 128 into contact with the IC chip 121 and applying pressure thereto, the IC chip 121 is compression-bonded in a heated and pressurized state, so that the bonding material 125 between the bonding surface of the IC chip 121 and the circuit board 126 is cured. In such a case, the bonding material 125 would flow out greatly from positions where the bumps 122 are lacking, i.e. corner-portion vicinities 123 to peripheral portions of the bonding surface of the IC chip 121, more than from side-verge vicinities where the bumps 122, ..., 122 are arrayed generally equidistantly. As a result, a density of the bonding material 125 would become lower in central portions of the IC chip 121 than in other portions, so that a bonding power and sealing power would be deteriorated.

Figure 26:
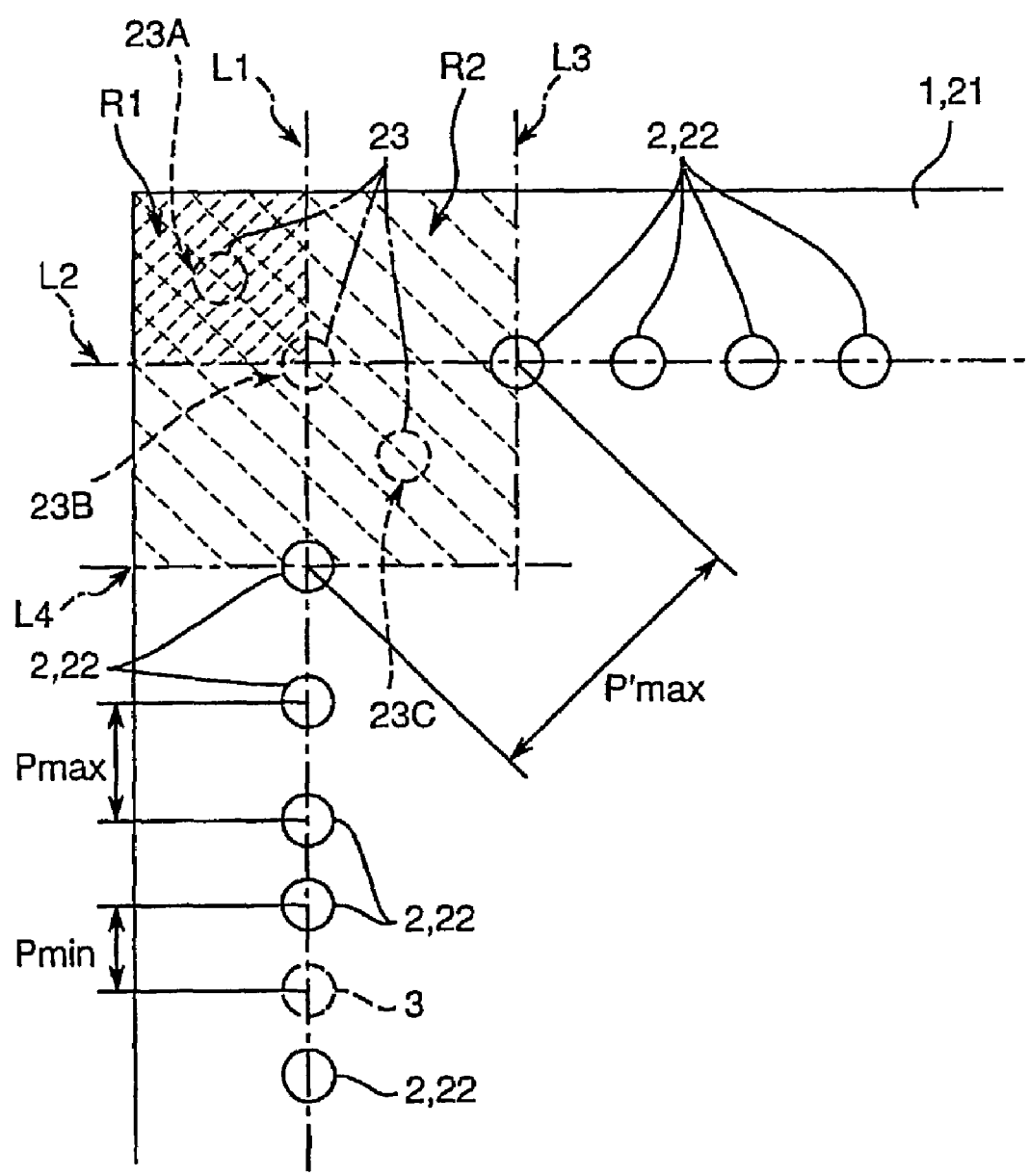
FIG. 26 is an explanatory view for explaining sites at which dummy bumps are positioned in the above embodiments.

In order to prevent such deterioration of the bonding power and the sealing power, in the third embodiment, prior to a bonding material feeding step, as shown in FIGS. 7A and 7B, a singularity or plurality of dummy bumps 23 is disposed in vicinities 123 of corner portions of the square IC chip 21 where the bumps 22 are absent. In this connection, the expression that a singularity or plurality of dummy bumps 23 is disposed in vicinities 123 of corner portions means that when extension lines L1 and L2 of array lines of the bumps 22, ..., 22 in the vicinities of side verges of the bonding surface of the IC chip 21 cross each other generally at 90° at a corner portion of the bonding surface of the IC chip 21 as shown in FIG. 26, the dummy bumps are disposed in a region R1 outside this crossing region as indicated by 23A and 23B or in a region R2 enclosed by reference lines L3 and L4, which pass the bumps 22 closest to the corner portion in their respective array lines and cross perpendicularly to the extension lines L1 and L2, respectively, as indicated by 23A, 23B and 23C. Consequently, a bump is present also in the vicinity of each corner portion of the square IC chip 21, resulting in a state that the bumps 22, ..., 22 or the dummy bumps 23, ..., 23 are arrayed generally uniformly in the vicinities of all the side verges and corner portions.

The method by which the bumps 22 and the dummy bumps 23 are formed is the same as that of the first embodiment.

In a state that arrays of the bumps 22, ..., 22 or the dummy bumps 23, ..., 23 are formed in the vicinities of the individual side verges of the square IC chip 21 as shown above, during the bonding material feeding step, a bonding material 25 containing at least an insulative thermosetting resin is fed to at least either one of the bonding surface of the IC chip 21 or the IC chip bonding region 26a of a circuit board 26 as an example of a circuit formation article. The method of feeding the bonding material 25 is the same as that of the first embodiment.

Next, during the bonding step, the bonding surface of the IC chip 21 is laid on the IC chip bonding region 26a of the circuit board 26 with the bonding material 25 interposed therebetween. Then, these members are so positioned that the bumps 22 on the electrodes 24 of the IC chip 21 and electrodes 27 of the circuit board 26 come into mutual electrical contact via the bonding material 25 interposed between the bonding surface of the IC chip 21, on which the bumps 22 are formed on the electrodes 24, respectively, and the IC chip bonding region 26a of the circuit board 26. Thereafter, the two members are bonded together. This bonding step may be performed in a state that the circuit board 26 is placed on a base 30, or may be performed in two steps, i.e., a bonding step to be performed at a different place in a state that the IC chip 21 is laid on the circuit board 26 with the bonding material 25 interposed therebetween, and a final compression-bonding step to be subsequently performed in which the circuit board 26 having the IC chip 21 laid thereon with the bonding material 25 interposed therebetween is placed on the base 30.

Next, during a final compression-bonding step, a pressurizing member 28 is brought into contact with the IC chip 21 so that a pressurizing force acts from the pressurizing member 28 toward the base 30, on which the circuit board 26 having the IC chip 21 laid thereon with the bonding material 25 interposed therebetween is placed, and moreover, heat of a heater contained in the pressurizing member 28 is transferred from the pressurizing member 28 to the IC chip 21. As a result of this, by a specified pressurizing force being exerted under application of a specified temperature, the bonding surface of the IC chip 21 is pressed against the IC chip bonding region 26a of the circuit board 26, causing the bumps 22 on the individual electrodes 24 of the bonding surface of the IC chip 21 to come into contact with the individual electrodes 27 within the IC chip bonding region 26a of the circuit board 26. In this state, the bonding material 25 between the bonding surface of the IC chip 21 and the IC chip bonding region 26a of the circuit board 26 tends to be pressed out from central portions toward peripheral portions of the bonding surface of the IC chip 21. In this connection, since the dummy bumps 23 are disposed at positions where the bumps 22 are lacking, i.e. vicinities of the corner portions, as described above, the bumps 22, . . . , 22 and the dummy bumps 23 are disposed generally equidistantly in the vicinities of the individual corner portions of the bonding surface of the IC chip 21, as they are in the vicinities of side verges of all the sides. Therefore, flow of the bonding material 25 from the central portions toward the peripheral portions is regulated similarly in the vicinities of the side verges of the individual sides as well as in the corner portions as shown by arrows in FIG. 8, so that the bonding material 25 can be prevented from flowing nonuniformly. Thus, the bonding material 25 is cured by the heat, while being held generally uniformly distributed, over at least an entire bonding surface of the IC chip 21, thereby achieving manufacture of an IC chip-mounted unit. That is, during this final compression-bonding step, nonuniform pressing out of the bonding material 25 from the central portion to the peripheral portions of the bonding surface of the IC chip 21 during compression-bonding can be regulated by the dummy bumps 23, . . . , 23 provided on the IC chip 21.

Height of each dummy bump 23 as an example of a bonding-material flow regulating member, thermal resistance of each dummy bump 23 and examples of the bonding material 25 are the same as in the first embodiment.

In the above description, it has been described that the bumps 22 of the IC chip 21 and the electrodes 27 of the circuit board 26 are brought into contact with each other, respectively, during the bonding step. However, this is not limitative, and it is also possible that the bumps 22 of the IC chip 21 and the electrodes 27 of the circuit board 26 are not brought into contact with each other, respectively, during the bonding step, but that the bumps 22 of the IC chip 21 and the electrodes 27 of the circuit board 26 are brought into contact with each other, respectively, for the first time during the final compression-bonding step.

According to the third embodiment, while the bonding surface of the square IC chip 21 has an array of bumps 22, . . . , 22 generally equidistantly in each of vicinities of side verges of the four sides except for its four corners, the dummy bumps 23, . . . , 23 are formed at sites where the bumps 22 are absent in the vicinities of the side verges of the bonding surface of the IC chip 21, by which an array state of the bumps 22, . . . , 22 can be made generally identical among the vicinities of the side verges of the respective sides of the IC chip 21 and the vicinities of the respective corner portions, and, when the bonding material 25 between the bonding surface of the IC chip 21 and the IC chip bonding region 26a of the circuit board 26 flows from the central portion to the peripheral portions during the compression-bonding step, the dummy bumps 23 function as a bonding-material flow regulating member. Thus, the flow of the bonding material 25 from the central portion to the peripheral portions in the vicinities of the side verges of the respective sides of the IC chip 21 as well as in the vicinities of the respective corner portions can be made generally uniform, and moreover, distribution of the bonding material 25 within the bonding surface of the IC chip 21 can be made uniform, thus allowing adhesion to be improved so that reliability of bonding and sealing can be enhanced.

When the intervals between the dummy bumps 23 disposed in the corner portions and the bumps 22, 22 neighboring the dummy bumps 23 are made generally the same as the array intervals between the bumps 22, . . . , 22, a resulting state is as if the bumps 22, . . . , 22 were formed similarly over a range of from the vicinities of the four side verges to the corner portions. Consequently, the flow of the bonding material 25 from the central portion toward the peripheral portions can be made further more generally uniform, and moreover, the distribution of the bonding material 25 within the bonding surface of the IC chip 21 can be even more uniform. However, the intervals are not limited to this, and, in order to increase uniformity in comparison with a case where no dummy bumps 23, . . . , 23 are present, the interval between the dummy bumps 23 and the bumps 22, 22 neighboring the dummy bumps 23 may be made larger than the interval between the bumps 22, . . . , 22.

Fourth Embodiment

Figure 10A:
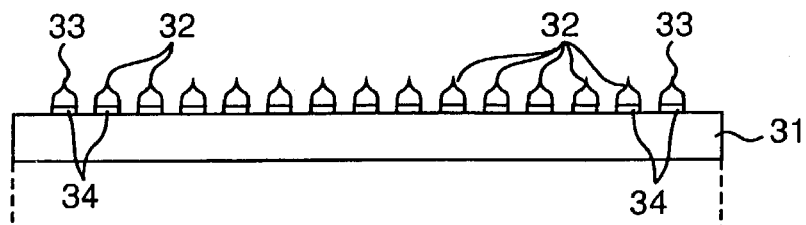
FIGS. 10A, 10B and 10C are explanatory views explaining steps of an electronic component mounting method according to a fourth embodiment of the present invention.
Figure 10B:
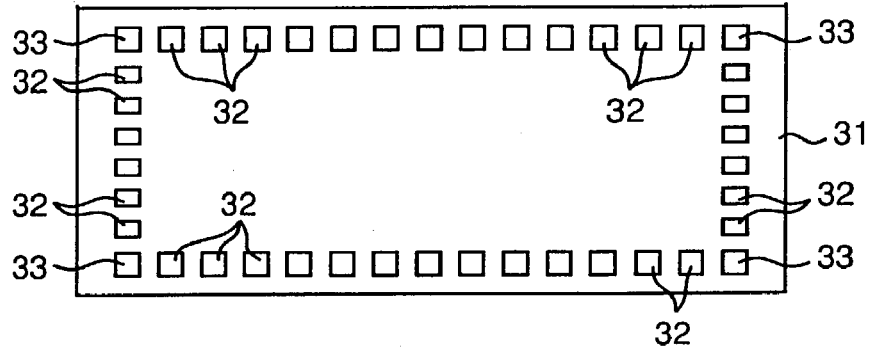
Figure 10C:
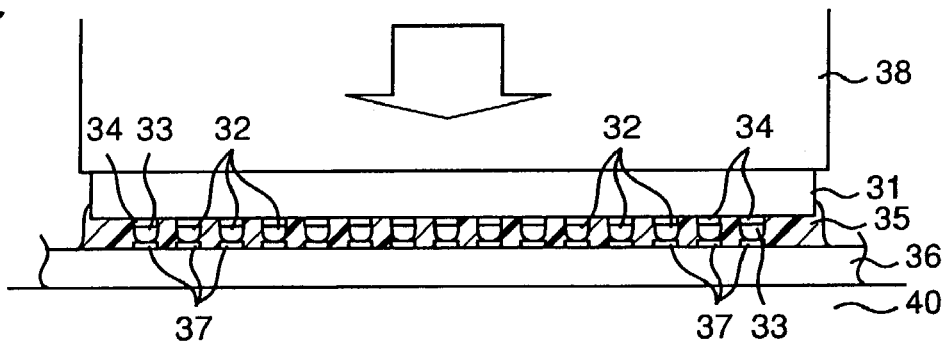
Figure 10D:
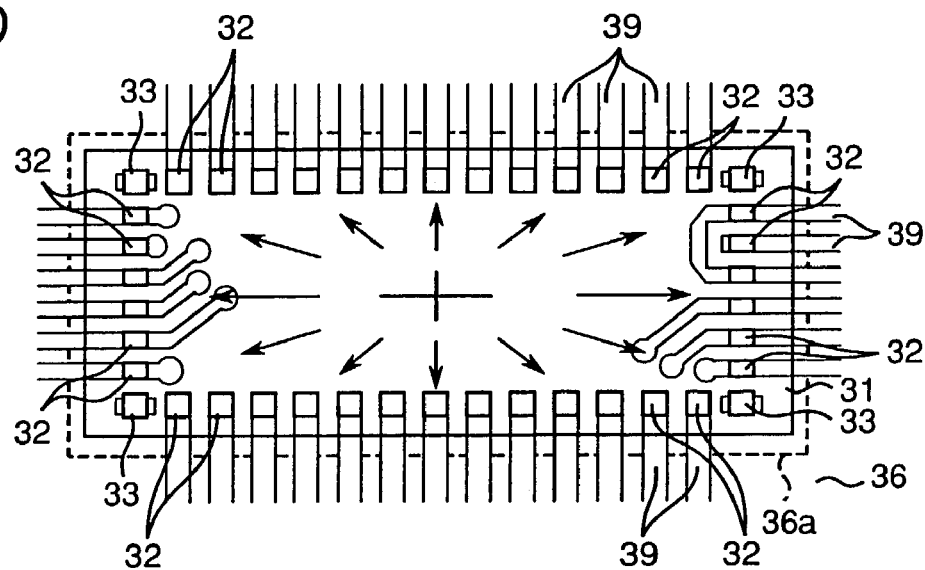
FIG. 10D is a perspective plan view showing a flow state of a bonding material between an electronic component and a circuit board during a mounting process of this electronic component mounting method.
Figure 11A:
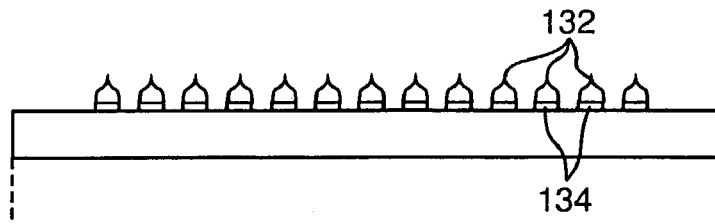
FIGS. 11A, 11B and 11C are explanatory views for explaining steps of an electronic component mounting method according to a prior art example for explaining the fourth embodiment of the present invention.
Figure 11B:
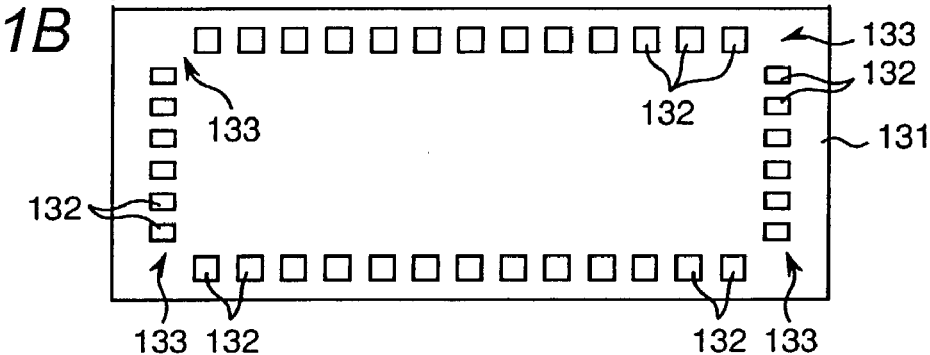
Figure 11C:
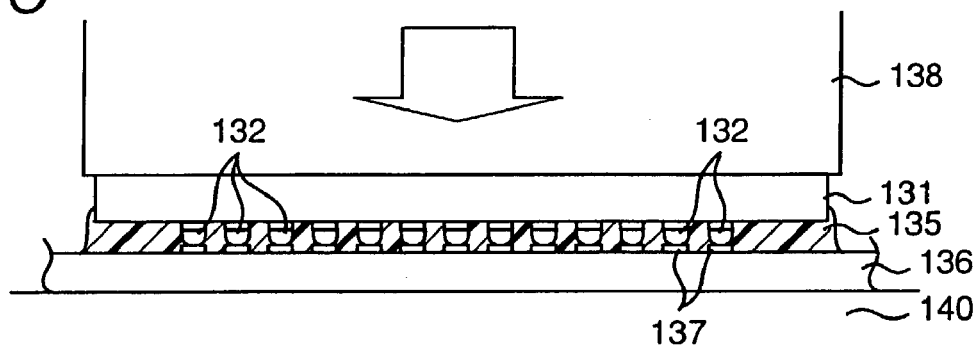
Figure 11D:
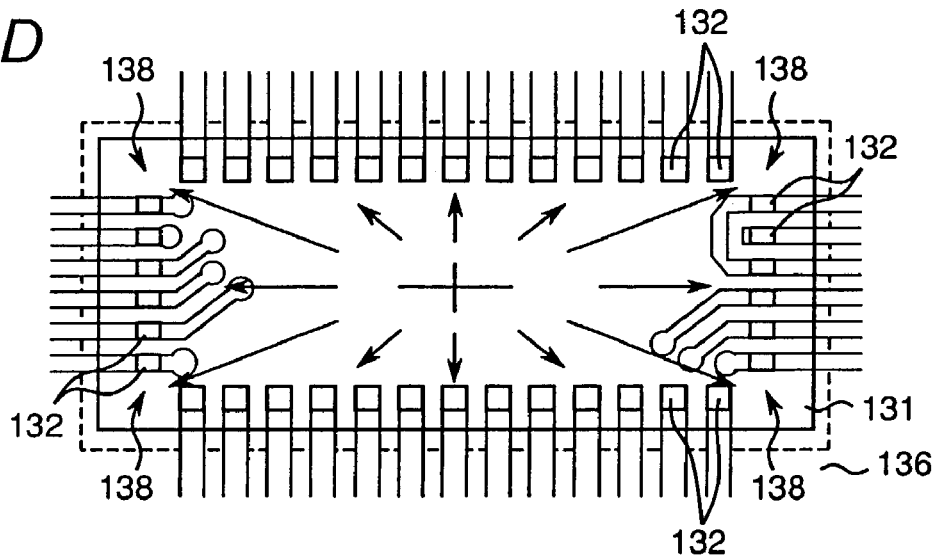
FIG. 11D is a perspective plan view showing a flow state of a bonding material between an electronic component and a circuit board during a mounting process of this electronic component mounting method.

An IC chip mounting method and an IC chip-mounted unit manufactured by the method as an example of an electronic component mounting method and an electronic component-mounted unit manufactured by the method according to a fourth embodiment of the present invention are explained with reference to FIGS. 10A to 10D. FIGS. 10A and 10B are a side view and a rear view of an IC chip prior to a bonding step of the IC chip mounting method according to the fourth embodiment. FIG. 10C is a side view of the IC chip, a circuit board, and bonding material during the bonding step. FIG. 10D is a plan view showing a flow state of the bonding material during a compression-bonding step and showing movement of the bonding material on the circuit board by seeing through the IC chip. Also, FIGS. 11A and 11B are a side view and a rear view of an IC chip prior to a bonding step of an IC chip mounting method according to a prior art example for explaining the fourth embodiment, FIG. 11C is a side view of the IC chip, a circuit board, and a bonding material during the bonding step, and FIG. 11D is a plan view showing a flow state of the bonding material during a compression-bonding step and showing movement of the bonding material on the circuit board by seeing through the IC chip.

In the third embodiment, the bumps 13 are provided in the vicinities of the corner portions of the four sides of a square IC chip 13. However, this is not limitative. For example, in the fourth embodiment, as shown in FIGS. 10A and 10B, a bonding surface of a rectangular IC chip 31 has an array of bumps 32, . . . , 32 in the vicinity of the verge of each of the four sides except for the vicinities of its four corner portions, and a dummy bump 33 as an example of a bonding-material flow regulating member is formed in the vicinity of each of the four corner portions of the bonding surface of the IC chip 31; that is, in portions where no bumps are originally provided, so that flow regulation of a bonding material 35 is performed by the dummy bumps 33.

Conventionally, it is assumed, as shown in FIGS. 11A to 11D, that bumps 132, . . . , 132 are arranged in one array generally equidistantly on electrodes 134, . . . , 134, respectively, in each of the vicinities of side verges of the individual sides of a rectangular IC chip 131, while no bumps 132 are present in each of the vicinities of four corner portions of the bonding surface of the IC chip 131. In a state that the bumps 132, . . . , 132 are disposed on the IC chip 131 as shown above, bonding material 135 is fed to a circuit board 136, and then the bumps 132 on the electrodes 134 of the IC chip 131 and electrodes 137 of the circuit board 136 are bonded together so as to be brought into electrical contact with each other via the bonding material 135 interposed between the bonding surface of the IC chip 131, on which the bumps 132 are formed on the electrodes 134 of the bonding surface, and the circuit board 136. By placing the circuit board 136 on a base 140, and then bringing a heated pressurizing member 138 into contact with the IC chip 131 and applying pressure thereto, the IC chip 131 is compression-bonded in a heated and pressurized state, so that the bonding material 135 between the bonding surface of the IC chip 131 and the circuit board 136 is cured. In such a case, the bonding material 135 would flow out greatly from positions where the bumps 132 are lacking, i.e. corner-portion vicinities 133 to peripheral portions of the bonding surface of the IC chip 131, more than from side-verge vicinities where the bumps 132, . . . , 132 are arrayed generally equidistantly. As a result, a density of the bonding material 135 would become lower in central portions of the IC chip 131 than in other portions, so that a bonding power and sealing power would be deteriorated.

In order to prevent such deterioration of the bonding power and the sealing power, in the fourth embodiment, prior to a bonding material feeding step, as shown in FIGS. 10A and 10B, a singularity or plurality of dummy bumps 33 is formed in vicinities 133 of respective corner portions of a rectangular IC chip 31 where the bumps 32 are absent. As a result, bump(s) are present also in the vicinity of each corner portion of the rectangular IC chip 31, resulting in a state that the bumps 32, . . . , 32 or the dummy bumps 33, . . . , 33 are arrayed generally uniformly in all the vicinities of the side verges and all the corner portions.

The method by which the respective bumps 32 and the respective dummy bumps 33 are formed is the same as that of the first embodiment.

In a state that arrays of the bumps 32, . . . , 32 or the dummy bumps 33, . . . , 33 are formed in the vicinities of the individual side verges of the rectangular IC chip 31 as shown above, during the bonding material feeding step, a bonding material 35 containing at least an insulative thermosetting resin is fed to at least either one of the bonding surface of the IC chip 31 or the IC chip bonding region 36a of a circuit board 36 as an example of a circuit formation article. The method of feeding the bonding material 35 is the same as that of the first embodiment.

Next, during the bonding step, the bonding surface of the IC chip 31 is laid on the IC chip bonding region 36a of the circuit board 36 with the bonding material 35 interposed therebetween. Then, these members are so positioned that the bumps 32 on electrodes 34 of the IC chip 31 and electrodes 37 of the circuit board 36 come into mutual electrical contact via the bonding material 35 interposed between the bonding surface of the IC chip 31, on which the bumps 32 are formed on the electrodes 34, respectively, and the IC chip bonding region 36a of the circuit board 36. Thereafter, the two members are bonded together. This bonding step may be performed in a state that the circuit board 36 is placed on a base 40, or may be performed in two steps, i.e., a bonding step to be performed at a different place in a state that the IC chip 31 is laid on the circuit board 36 with the bonding material 35 interposed therebetween, and a final compression-bonding step to be subsequently performed in which the circuit board 36 having the IC chip 31 laid thereon with the bonding material 35 interposed therebetween is placed on the base 40.

Next, during a final compression-bonding step, a pressurizing member 38 is brought into contact with the IC chip 31, so that a pressurizing force acts from the pressurizing member 38 toward the base 40, on which the circuit board 36 having the IC chip 31 laid thereon with the bonding material 35 interposed therebetween is placed, and moreover, heat of a heater contained in the pressurizing member 38 is transferred from the pressurizing member 38 to the IC chip 31. As a result of this, by a specified pressurizing force being exerted under application of a specified temperature, the bonding surface of the IC chip 31 is pressed against the IC chip bonding region 36a of the circuit board 36, causing the bumps 32 on the individual electrodes 34 of the bonding surface of the IC chip 31 to come into contact with the individual electrodes 37 within the IC chip bonding region 36a of the circuit board 36. In this state, the bonding material 35 between the bonding surface of the IC chip 31 and the IC chip bonding region 36a of the circuit board 36 tends to be pressed out from central portions toward peripheral portions of the bonding surface of the IC chip 31. In this connection, since the dummy bumps 33 are disposed at positions where the bumps 32 are lacking, i.e. in the vicinities of the corner portions, as described above, the bumps 32, . . . , 32 and the dummy bumps 33 are disposed generally equidistantly also in the vicinities of the individual corner portions of the bonding surface of the IC chip 31, uniformly among the vicinities of all the sides. Therefore, flow of the bonding material 35 from the central portions toward the peripheral portions is regulated uniformly in the vicinities of the side verges of the individual sides as well as in the vicinities of the individual corner portions, as indicated by arrows in FIG. 10D, so that the bonding material 35 can be prevented from flowing nonuniformly. Thus, the bonding material 35 is cured by the heat, while being held generally uniformly distributed, over at least an entire bonding surface of the IC chip 31, thereby achieving manufacture of an IC chip-mounted unit. That is, during this final compression-bonding step, nonuniform pressing out of the bonding material 35 from the central portion to the peripheral portions of the bonding surface of the IC chip 31 during compression-bonding can be regulated by the dummy bumps 33, . . . , 33 provided on the IC chip 31.

Height of each of the dummy bumps 33 as an example of the bonding-material flow regulating member, thermal resistance of each dummy bump 33 and examples of the bonding material 35 are the same as in the first embodiment.

In the above description, it has been described that the bumps 32 of the IC chip 31 and the electrodes 37 of the circuit board 36 are brought into contact with each other, respectively, during the bonding step. However, this is not limitative, and it is also possible that the bumps 32 of the IC chip 31 and the electrodes 37 of the circuit board 36 are not brought into contact with each other, respectively, during the bonding step, but that the bumps 32 of the IC chip 31 and the electrodes 37 of the circuit board 36 are brought into contact with each other, respectively, for the first time during the final compression-bonding step.

According to the fourth embodiment, while the bonding surface of the rectangular IC chip 31 has an array of bumps 32, . . . , 32 generally equidistantly in vicinities of side verges of the four sides except for its four corners, the dummy bumps 33, . . . , 33 are formed at sites where the bumps 32 are absent in the vicinities of the side verges of the bonding surface of the IC chip 31, by which an array state of the bumps 32, . . . , 32 can be made generally identical among the vicinities of the side verges of the individual sides of the IC chip 31 as well as the vicinities of the individual corner portions, and, when the bonding material 35 between the bonding surface of the IC chip 31 and the IC chip bonding region 36a of the circuit board 36 flows from the central portion to the peripheral portions during the compression-bonding step, the dummy bumps 33 function as a bonding-material flow regulating member. Thus, the flow of the bonding material 35 from the central portion to the peripheral portions in the vicinities of the side verges of the individual sides of the IC chip 31 as well as in the vicinities of its corner portions can be made generally uniform, and moreover, distribution of the bonding material 35 within the bonding surface of the IC chip 31 can be made uniform, thus allowing adhesion to be improved so that reliability of the bonding and sealing can be enhanced.

When the interval between the dummy bump 33 disposed in a corner portion and the bumps 32, 32 neighboring the bump 33 is made generally the same as the interval between the bumps 32, . . . , 32, a resulting state is as if the bumps 32, . . . , 32 were similarly formed over a range of from the vicinities of the four side verges to the corner portions. Consequently, the flow of the bonding material 35 from the central portion toward the peripheral portions can be made further more generally uniform, and moreover the distribution of the bonding material 35 within the bonding surface of the IC chip 31 can be made even more uniform. However, the interval is not limited to this, and, in order to increase uniformity in comparison with the case where no dummy bumps 33, . . . , 33 are present, the interval between the dummy bump 33 and the bumps 32, 32 neighboring the bump 33 may be made larger than the interval between the bumps 32, . . . , 32.

Fifth Embodiment

Figure 12A:
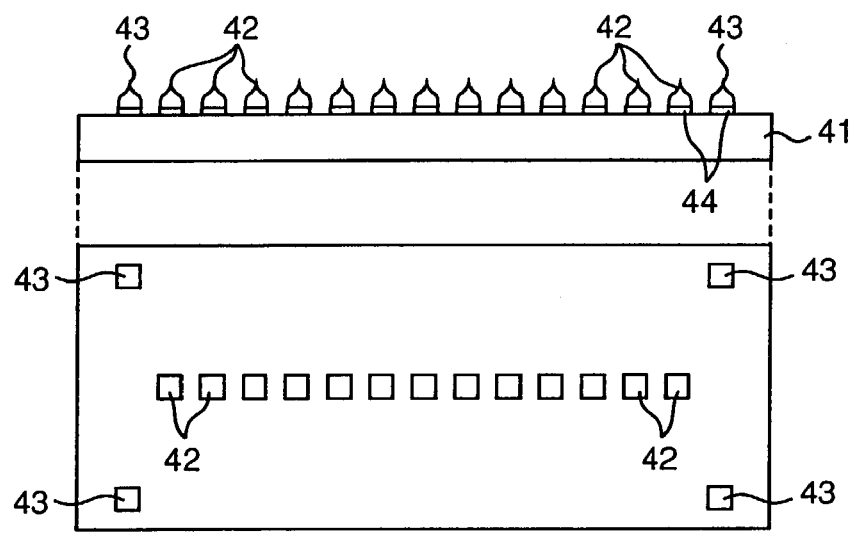
FIGS. 12A, 12B and 12C are explanatory views explaining steps of an electronic component mounting method according to a fifth embodiment of the present invention.
Figure 12B:
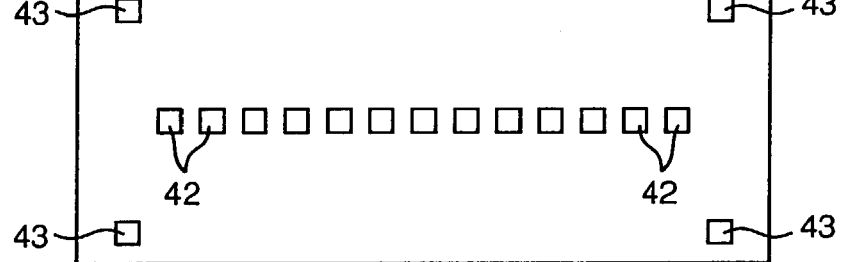
Figure 12C:
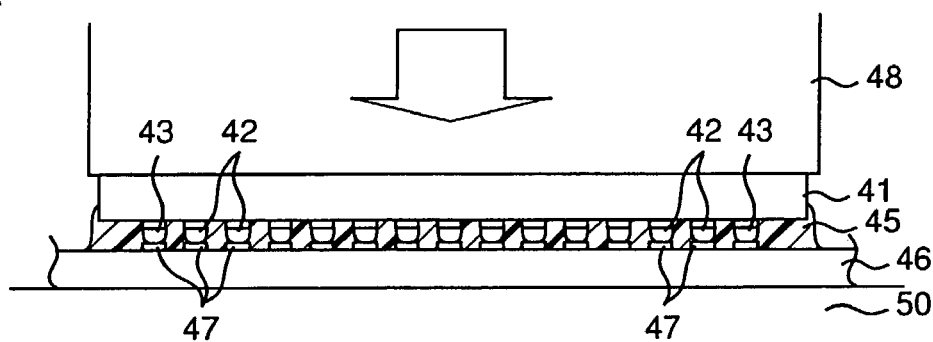
Figure 12D:
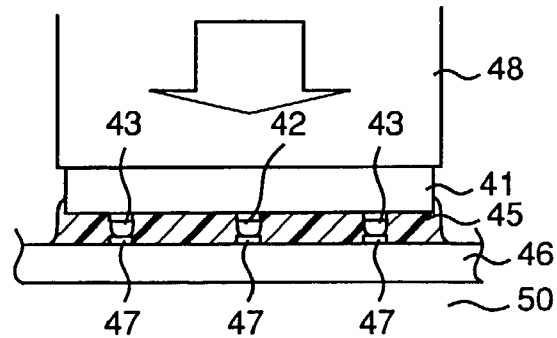
FIG. 12D is an explanatory view for explaining steps in a state of FIG. 12C viewed from a direction 90° different from a direction in FIG. 12C.
Figure 15A:
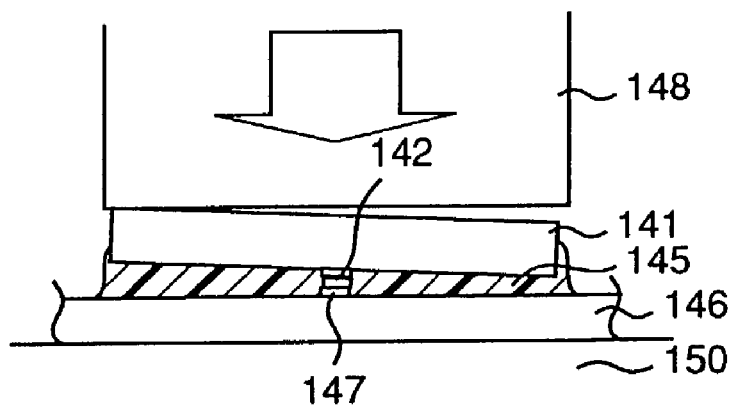
FIG. 15A is an explanatory view for explaining steps of the electronic component mounting method according to a prior art example for explaining the fifth embodiment of the present invention, following FIG. 14C.
Figure 15B:
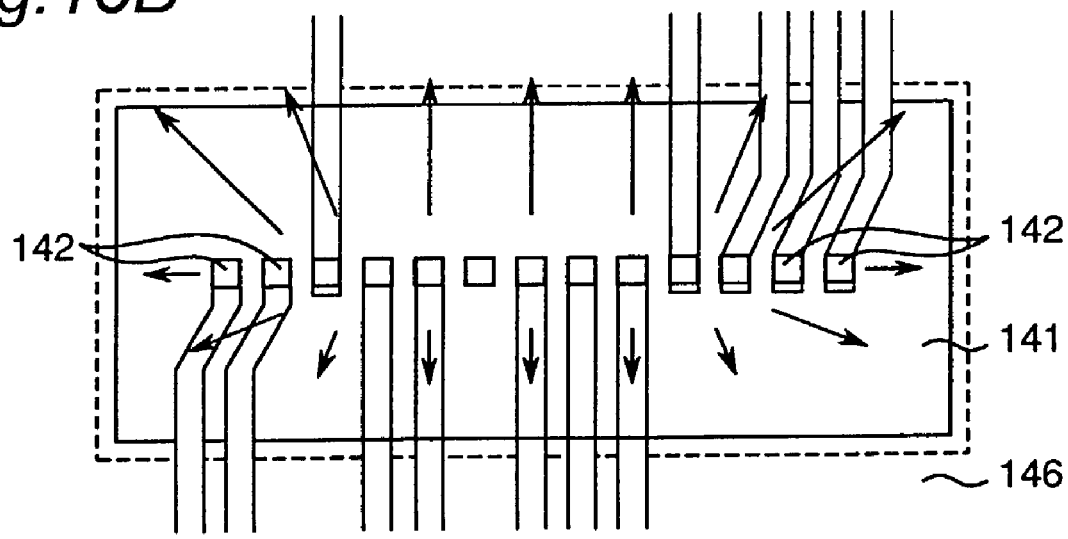
FIG. 15B is a perspective plan view showing a flow state of a bonding material between an electronic component and a circuit board during a mounting process of this electronic component mounting method.

An IC chip mounting method and an IC chip-mounted unit manufactured by the method as examples of an electronic component mounting method and an electronic component-mounted unit manufactured by the method according to a fifth embodiment of the present invention are explained with reference to FIGS. 12A to 12D and 13. FIGS. 12A and 12B are a side view and a rear view of an IC chip prior to a bonding step of the IC chip mounting method according to the fifth embodiment. FIGS. 12C and 12D are a side view and a front view of the IC chip, a circuit board, and a bonding material during the bonding step. FIG. 13 is a plan view showing a flow state of the bonding material during a compression-bonding step and showing movement of the bonding material on the circuit board by seeing through the IC chip. Furthermore, FIGS. 14A and 14B are a side view and a rear view of an IC chip prior to a bonding step of an IC chip mounting method according to a prior art example for explaining the fifth embodiment. FIGS. 14C and 15A are a side view and a front view of the IC chip, a circuit board, and a bonding material during the bonding step of the prior art. FIG. 15B is a plan view showing a flow state of the bonding material during a compression-bonding step of the prior art, and showing movement of the bonding material on the circuit board by seeing through the IC chip.

In the first embodiment, an array of bumps 2, . . . , 2 are provided in the vicinities of side verges of the four sides of a square or rectangular IC chip 1. However, this is not limitative. For example, in the fifth embodiment, as shown in FIGS. 12A to 12D, a bonding surface of a rectangular IC chip 41 as an example of an electronic component has bumps 42, . . . , 42, and dummy bumps 43 as an example of a bonding-material flow regulating member are formed only in vicinities of individual corner portions, i.e. portions where no bumps 42 are provided, of the bonding surface of the IC chip 41, so that flow regulation of bonding material 45 is performed by the dummy bumps 43.

Conventionally, as shown in FIGS. 14A, 14B and 14C and FIGS. 15A and 15B, it is assumed that a bonding surface of a rectangular IC chip 141 has bumps 142, . . . , 142 generally equidistantly in one array extending along a longitudinal direction at a central portion in a shorter direction, while no bumps 142 are provided in vicinities 143 of the individual corner portions of the bonding surface of the IC chip 141. In a state that the bumps 142, 142 are disposed on the IC chip 141 as shown above, bonding material 145 is fed to a circuit board 146, and then the bumps 142 on electrodes 144 of the IC chip 141 and electrodes 147 of the circuit board 146 are bonded together so as to be brought into electrical contact with each other via the bonding material 145 interposed between the bonding surface of the IC chip 141, on which the bumps 142 are formed on the electrodes 144 of the bonding surface, and the circuit board 146. By placing the circuit board 146 on a base 150, and bringing a heated pressurizing member 148 into contact with the IC chip 141 and applying pressure thereto, the IC chip 141 is compression-bonded in a heated and pressurized state, so that the bonding material 145 between the bonding surface of the IC chip 141 and the circuit board 146 is cured. In such a case, since the rectangular IC chip 141 is supported by the circuit board 146 at one point in the short direction, that is, in a widthwise direction on both sides of an array of the bumps 142, . . . , 142 extending generally equidistantly along a longitudinal direction in a central portion in the short direction with the array of the bumps 142, . . . , 142, as a center, as shown in FIGS. 15A and 15B, it is difficult to equally balance a bonding power between the IC chip 141 and the circuit board 146. Furthermore, the IC chip 141 is easily inclined with respect to the circuit board 146, and hence gaps between the IC chip 141 and the circuit board 146 easily become nonuniform on both sides of the array of the bumps 142, . . . , 142. As a result, since a larger amount of the bonding material 145 on either side of the array of the bumps 142, . . . , 142 flows out to peripheral portions of the bonding surface of the IC chip 141 as indicated by arrows in FIG. 15B, a density of the bonding material 145 becomes lower on this one side, and hence bonding power and sealing power are deteriorated.

In order to prevent such deterioration of the bonding power and the sealing power, in the fifth embodiment, prior to the bonding material feeding step, as shown in FIGS. 12A and 12B, at least one dummy bump 43 is formed in the vicinity of each corner portion, i.e. portions where no bumps 42 are provided, of the bonding surface of the rectangular IC chip 41. As a result, the rectangular IC chip 41 is supported against the circuit board 46 at three points in the shorter direction, i.e. in the widthwise direction, and bonding power can be generally equally balanced between the IC chip 41 and the circuit board 46 on both sides of the array of the bumps 42, . . . , 42 as shown in FIG. 12D. Thus, the IC chip 41 can be prevented from inclining with respect to the circuit board 46, and hence a gap between the IC chip 41 and the circuit board 46 can be made generally uniform on both sides of the array of the bumps 42, . . . , 42.

The method by which the respective bumps 42 and the respective dummy bump 43 are formed is the same as that of the first embodiment.

In a state that the bumps 42, . . . , 42 or the dummy bumps 43, . . . , 43 are formed on the rectangular IC chip 41 as shown above, during a bonding material feeding step, a bonding material 45 containing at least an insulative thermosetting resin is fed to at least either one of the bonding surface of the IC chip 41 or an IC chip bonding region 46a of the circuit board 46 as an example of a circuit formation article. The method of feeding the bonding material 45 is the same as in the first embodiment.

Next, during the bonding step, the bonding surface of the IC chip 41 is laid on the IC chip bonding region 46a of the circuit board 46 with the bonding material 45 interposed therebetween. Then, these members are so positioned that the bumps 42 on electrodes 44 of the IC chip 41 and electrodes 47 of the circuit board 46 come into mutual electrical contact via the bonding material 45 interposed between the bonding surface of the IC chip 41, on which the bumps 42 are formed on the electrodes 44, respectively, and the IC chip bonding region 46a of the circuit board 46. Thereafter, the two members are bonded together. This bonding step may be performed in a state that the circuit board 46 is placed on a base 50, or may be performed in two steps, i.e., a bonding step to be performed at a different place in a state that the IC chip 41 is laid on the circuit board 46 with the bonding material 45 interposed therebetween, and a final compression-bonding step to be subsequently performed in which the circuit board 46 having the IC chip 41 laid thereon with the bonding material 45 interposed therebetween is placed on the base 50.

Next, during a final compression-bonding step, a pressurizing member 48 is brought into contact with the IC chip 41 so that a pressurizing force acts from the pressurizing member 48 toward the base 50, on which the circuit board 46 having the IC chip 41 laid thereon with the bonding material 45 interposed therebetween is placed, and moreover heat of a heater contained in the pressurizing member 48 is transferred from the pressurizing member 48 to the IC chip 41. As a result of this, by a specified pressurizing force being exerted under application of a specified temperature, the bonding surface of the IC chip 41 is pressed against the IC chip bonding region 46a of the circuit board 46, causing the bumps 42 on the individual electrodes 44 of the bonding surface of the IC chip 41 to come into contact with the individual electrodes 47 within the IC chip bonding region 46a of the circuit board 46. In this state, the rectangular IC chip 41 is supported against the circuit board 46 at three points in the shorter direction, i.e. in the widthwise direction, and bonding power can be generally equally balanced between the IC chip 41 and the circuit board 46 on both sides of the array of the bumps 42, ..., 42 as shown in FIG. 12D. Thus, the gap between the IC chip 141 and the circuit board 146 can be made generally uniform on both sides of the array of the bumps 142, ..., 142. The flow of the bonding material 45 from central portions toward peripheral portions is similarly regulated in the vicinities of the side verges of the individual sides as indicated by arrows in FIG. 13, so that the bonding material 45 can be prevented from flowing nonuniformly. Thus, the bonding material 45 is cured by the heat, while being held generally uniformly distributed, over at least an entire bonding surface of the IC chip 41, thereby achieving the manufacture of an IC chip-mounted unit. That is, during this final compression-bonding step, nonuniform pressing out of the bonding material 45 from the central portions to the peripheral portions of the bonding surface of the IC chip 41 in the compression-bonding can be regulated by the dummy bumps 43, ..., 43 provided on the IC chip 41.

Height of the respective dummy bumps 43 as an example of the bonding-material flow regulating member, thermal resistance of the respective dummy bumps 43 and examples of the bonding material 45 are the same as in the first embodiment.

In the above description, it has been described that the bumps 42 of the IC chip 41 and the electrodes 47 of the circuit board 46 are brought into contact with each other, respectively, during the bonding step. However, this is not limitative, and it is also possible that the bumps 42 of the IC chip 41 and the electrodes 47 of the circuit board 46 are not brought into contact with each other, respectively, during the bonding step, but that the bumps 42 of the IC chip 41 and the electrodes 47 of the circuit board 46 are brought into contact with each other, respectively, for the first time during the final compression-bonding step.

According to the fifth embodiment, the rectangular IC chip 41 is supported against the circuit board 46 at three points in the shorter direction, i.e. in the widthwise direction in the bonding surface of the rectangular IC chip 41, and the bonding power can be generally equally balanced between the IC chip 41 and the circuit board 46 on both sides of the array of the bumps 42, ..., 42. The IC chip 41 can be prevented from inclining with respect to the circuit board 46, and hence the gap between the IC chip 41 and the circuit board 46 can be made generally uniform on both sides of the array of the bumps 42, ..., 42. When the bonding material 45 between the bonding surface of the IC chip 41 and the IC chip bonding region 46a of the circuit board 46 flows from the central portion to the peripheral portions during the compression-bonding step, the dummy bump 43 functions as a bonding-material flow regulating member. Thus, the flow of the bonding material 45 from the central portion to the peripheral portions can be made generally uniform and moreover, distribution of the bonding material 45 within the bonding surface of the IC chip 41 can be made uniform, thus allowing adhesion to be improved so that reliability of bonding and sealing can be enhanced.

Sixth Embodiment

Figure 16A:
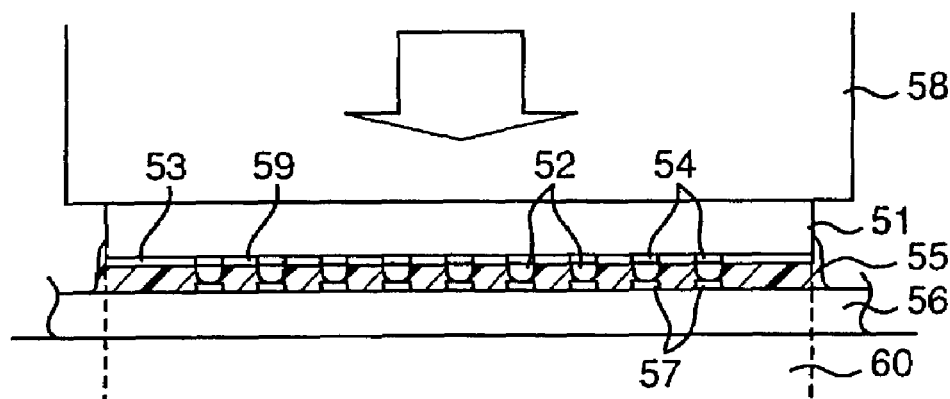
FIGS. 16A and 16B are explanatory views for explaining steps of an electronic component mounting method according to a sixth embodiment of the present invention.
Figure 16B:
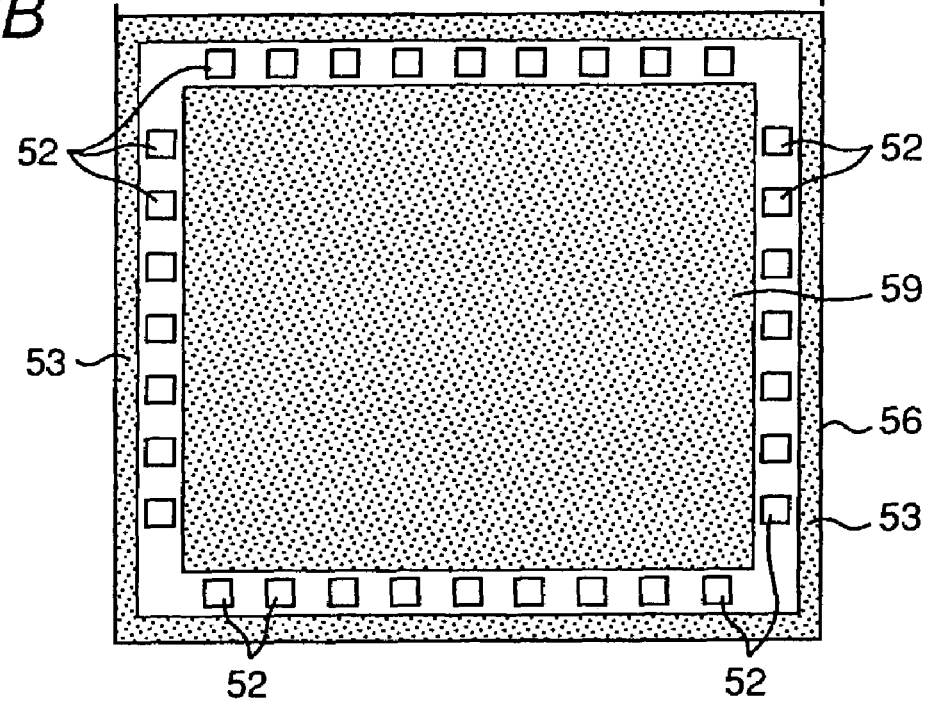
Figure 17:
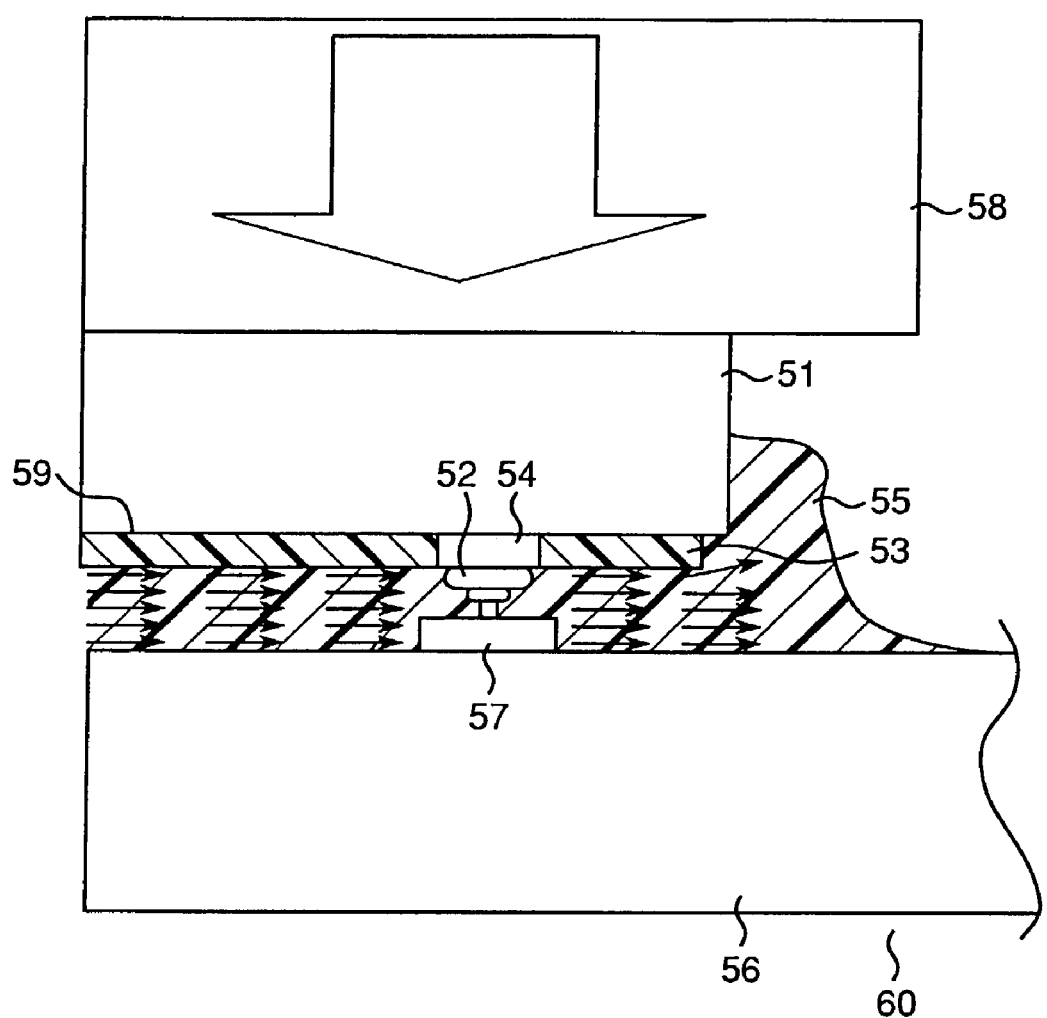
FIG. 17 is a side view showing a flow state of a bonding material between an electronic component and a circuit board during a mounting process of the electronic component mounting method according to the sixth embodiment of the present invention, following FIG. 16B.
Figure 18A:
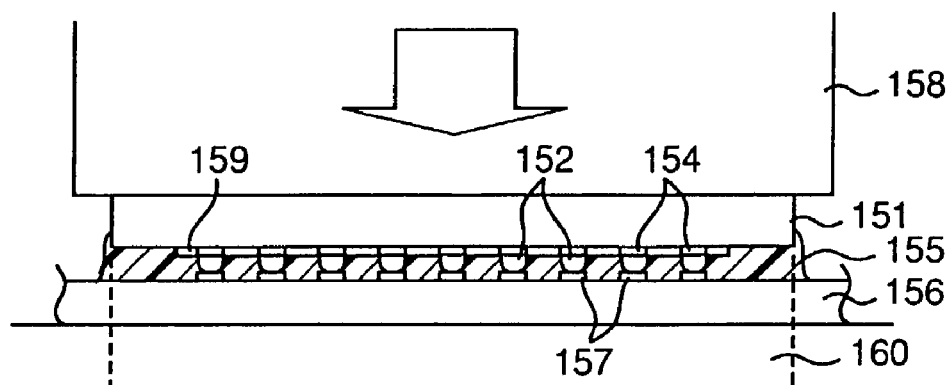
FIGS. 18A and 18B are explanatory views for explaining steps of an electronic component mounting method according to a prior art example for explaining the sixth to ninth embodiments of the present invention.
Figure 18B:
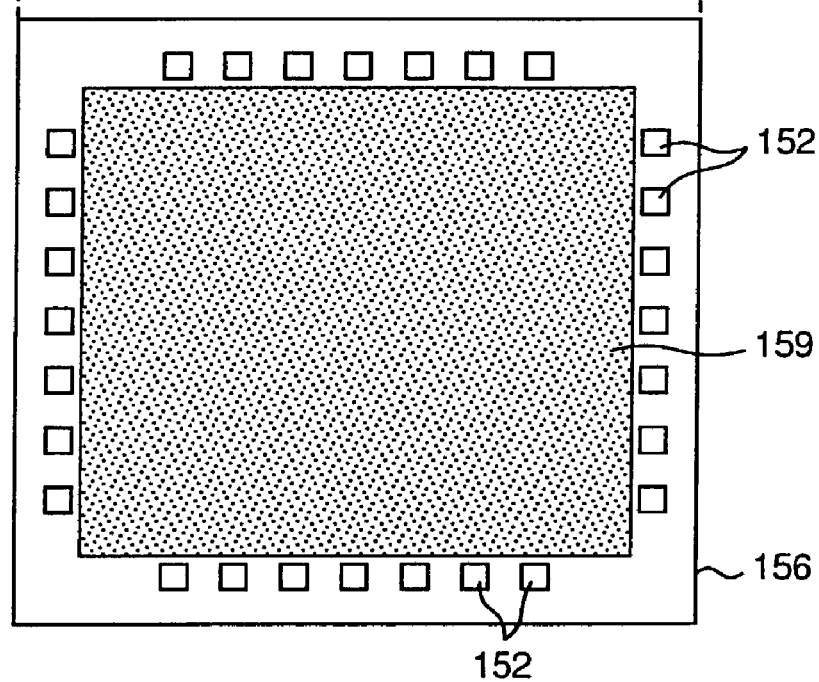
Figure 19:
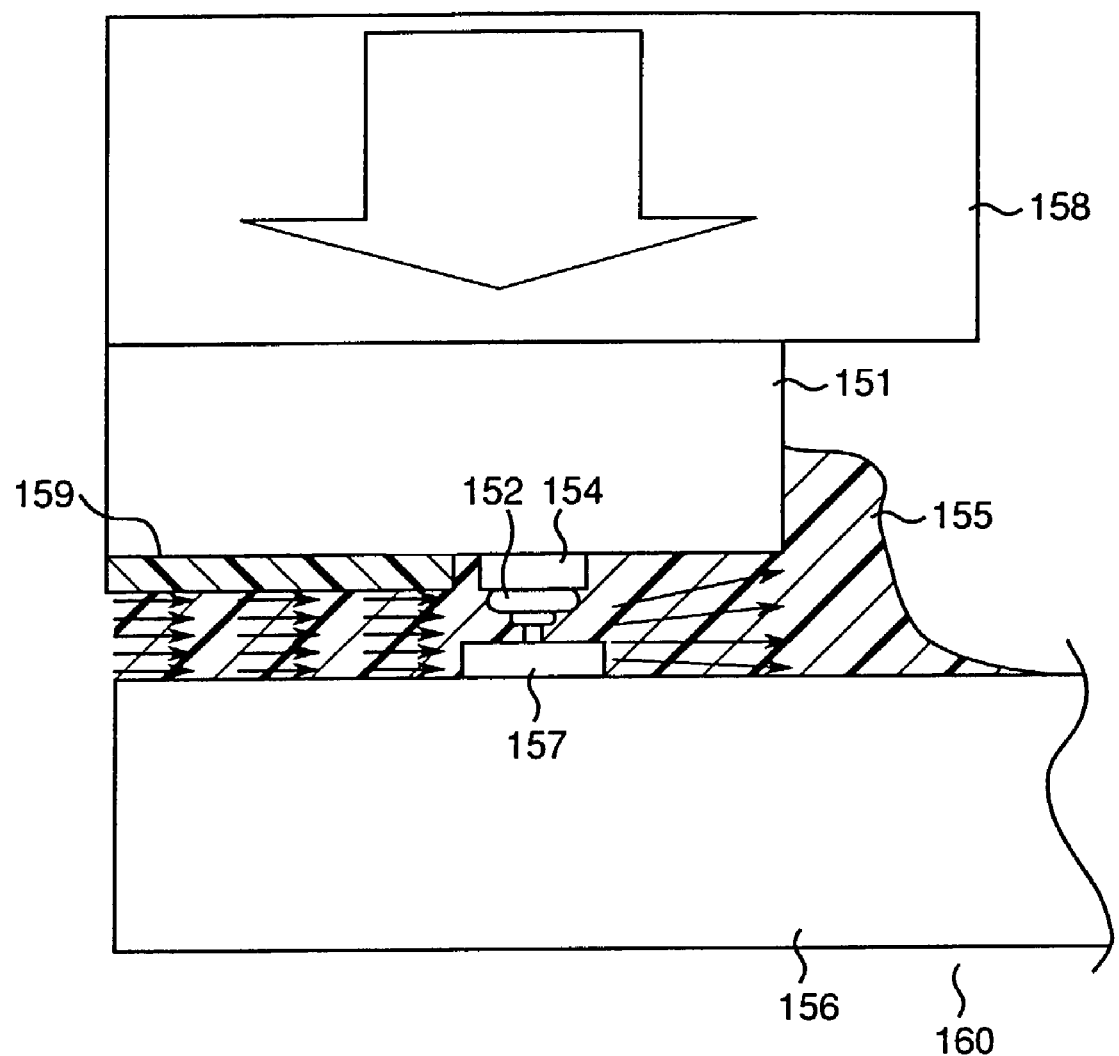
FIG. 19 is a side view showing a flow state of a bonding material between an electronic component and a circuit board during a mounting process by the electronic component mounting method according to the prior art example for explaining the sixth to ninth embodiments of the present invention, following FIG. 18B.

An IC chip mounting method and an IC chip-mounted unit manufactured by the method as an example of an electronic component mounting method and an electronic component-mounted unit manufactured by the method according to a sixth embodiment of the present invention are explained with reference to FIGS. 16A, 16B and 17. FIGS. 16A and 16B are a side view and a rear view of an IC chip prior to a bonding step of the IC chip mounting method according to the sixth embodiment. FIG. 17 is a side view of the IC chip, a circuit board, and a bonding material during the bonding step. Furthermore, FIGS. 18A and 18B are a side view and a rear view of an IC chip prior to a bonding step of an IC chip mounting method according to a prior art example for explaining the sixth embodiment. FIG. 19 is a side view of an IC chip, a circuit board, and a bonding material during the bonding step of the prior art example.

In the above embodiments, dummy bumps as an example of the bonding-material flow regulating member are disposed at positions where no bumps are disposed. However, this is not limitative. For example, when a passivation film 59 for protecting an active surface (wiring surface) of an IC chip is provided in a quadrilateral region inside arrays of bumps 52, ..., 52 placed in the vicinities of side verges of individual sides of a bonding surface of an IC chip 51, it is also possible that an auxiliary passivation film 53 (satin region in FIG. 16B) as a bonding-material flow regulating film, which is an example of a bonding-material flow regulating member, is provided in quadrilateral frame regions of peripheral portions outside the arrays of bumps 52, ..., 52 placed in vicinities of side verges of individual sides of the bonding surface of the IC chip 51, so that flow regulation of a bonding material 55 is performed by the auxiliary passivation film 53.

Conventionally, as shown in FIGS. 18A and 18B, it is assumed that bumps 152, ..., 152 are provided each in one array and generally equidistantly in the vicinities of side verges of individual sides of a bonding surface of a square IC chip 151, and that a passivation film 159 (satin region in FIG. 18B) is disposed over a square region surrounded by the bumps 152, ..., 152 on the four sides. In a state that the passivation film 159 is disposed on the IC chip 151 as shown above, a bonding material 155 is fed to a circuit board 156, and then the bumps 152 on electrodes 154 of the IC chip 151 and electrodes 157 of the circuit board 156 are bonded together so as to be brought into electrical contact with each other via the bonding material 155 interposed between the bonding surface of the IC chip 151, on which the bumps 152 are formed on the electrodes 154 of the bonding surface, and the circuit board 156. By placing the circuit board 156 on a base 160, and bringing a heated pressurizing member 158 into contact with the IC chip 151 and applying pressure thereto, the IC chip 151 is compression-bonded in a heated and pressurized state, so that the bonding material 155 between the bonding surface of the IC chip 151 and the circuit board 156 is cured. In such a case, more so than in the square region surrounded by the four-side bumps 152, ..., 152 within the bonding surface of the IC chip 151 on which the passivation film 159 is disposed, the bonding material 155 would flow at a higher flow speed at positions between the four-side bumps 152, ..., 152 as well as at positions outward of the four-side bumps 152, ..., 152, i.e., in peripheral portions of the bonding surface, where the passivation film 159 is absent, so that the bonding material 155 would lower in density at these portions, therefore lowering in adhesion, i.e. bonding power and sealing power, at the peripheral portions of the bonding surface, thus yielding occurrence of peeling. Such occurrence of peeling against the bonding material 155 at the peripheral portions of the bonding surface of the IC chip 151, if involved, would cause moisture to penetrate to the peeled portions, which would in turn lead to occurrence of corrosion or the like of the IC chip 151 or the like due to moisture absorption.

In order to prevent such deterioration of the bonding power and the sealing power, in the sixth embodiment, prior to a bonding material feeding step, as shown in FIGS. 16A and 16B, not only a passivation film 59 (satin region in FIG. 16B) is disposed over a square region surrounded by the bumps 52, ..., 52 disposed in one array and generally equidistantly in each of vicinities of the individual side verges of the bonding surface of the square IC chip 51, but also an auxiliary passivation film 53 (satin region in FIG. 16B) is disposed at positions outward of the four-side bumps 52, ..., 52, i.e., in peripheral portions of the bonding surface. As a result of this, a flow speed at which the bonding material 55 flows in the square region surrounded by the four-side bumps 52, ..., 52 within the bonding surface of the IC chip 51 on which the passivation film 59 is disposed, and a flow speed at which the bonding material 55 flows at positions outward of the four-side bumps 52, ..., 52 at which the auxiliary passivation film 53 is disposed, i.e. in peripheral portions of the bonding surface, become generally equal to each other, so that the bonding material 55 can be prevented from lowering in density, and therefore prevented from lowering in adhesion, i.e. a bonding power and sealing power, in the peripheral portions of the bonding surface.

The method by which the bumps 52 are formed is the same as that of the first embodiment. As for a method for disposing the passivation film 59 and the auxiliary passivation film 53, available is a method of applying a passivation-film formation resin. Application of the passivation-film formation resin may be performed either before or after formation of the bumps 52, but is preferably performed before the formation of the bumps 52 because the bumps 52 are kept from damage during the application of the passivation-film formation resin. Material and a formation method for the auxiliary passivation film 53 are the same as those for the passivation film 59. Examples of the passivation film 59 and the auxiliary passivation film 53, respectively, are polyimide as an organic material and $Si_3N_4$ as an inorganic material, wherein with the board formed of resin so that the board side is organic, it is preferable that the passivation film 59 and the auxiliary passivation film 53 are also formed of organic material, thereby maintaining an adhesive property. The polyimide is formed by spin coating of a liquid phase and by performing a photolithography process.

In a state that the passivation film 59 and the auxiliary passivation film 53 as well as the bumps 52, 52 have been formed on the IC chip 51 as shown above, during a bonding material feeding step, a bonding material 55 containing at least an insulative thermosetting resin is fed to at least either one of the bonding surface of the IC chip 51 or the IC chip bonding region of a circuit board 56 as an example of a circuit formation article. The method of feeding the bonding material 55 is the same as that of the first embodiment.

Next, during the bonding step, the bonding surface of the IC chip 51 is laid on the IC chip bonding region of the circuit board 56 with the bonding material 55 interposed therebetween. Then, these members are so positioned that the bumps 52 on electrodes 54 of the IC chip 51 and electrodes 57 of the circuit board 56 come into mutual electrical contact via the bonding material 55 interposed between the bonding surface of the IC chip 51, on which the bumps 52 are formed on the electrodes 54, respectively, and the IC chip bonding region of the circuit board 56. Thereafter, the two members are bonded together. This bonding step may be performed in a state that the circuit board 56 is placed on a base 60, or may be performed in two steps, i.e., a bonding step to be performed at a different place in a state that the IC chip 51 is laid on the circuit board 56 with the bonding material 55 interposed therebetween, and a final compression-bonding step to be subsequently performed in which the circuit board 56 having the IC chip 51 laid thereon with the bonding material 55 interposed therebetween is placed on the base 60.

Next, during a final compression-bonding step, a pressurizing member 58 is brought into contact with the IC chip 51 so that a pressurizing force acts from the pressurizing member 58 toward the base 60, on which the circuit board 56 having the IC chip 51 laid thereon with the bonding material 55 interposed therebetween is placed, and moreover, heat of a heater contained in the pressurizing member 58 is transferred from the pressurizing member 58 to the IC chip 51. As a result of this, by a specified pressurizing force being exerted under application of a specified temperature, the bonding surface of the IC chip 51 is pressed against the IC chip bonding region of the circuit board 56, causing the bumps 52 on the individual electrodes 54 of the bonding surface of the IC chip 51 to come into contact with the individual electrodes 57 within the IC chip bonding region of the circuit board 56. In this case, a flow speed at which the bonding material 55 flows in the square region surrounded by the four-side bumps 52, ..., 52 within the bonding surface of the IC chip 51 having the passivation film 59 disposed thereon, and a flow speed at which the bonding material 55 flows at positions outside the four-side bumps 52, . . . , 52 where the auxiliary passivation film 53 is disposed, i.e., in peripheral portions of the bonding surface, become generally equal to each other, so that the bonding material 55 can be prevented from lowering in density in the peripheral portions of the bonding surface, and therefore prevented from lowering in adhesion, i.e. bonding power and sealing power, in the peripheral portions of the bonding surface. Thus, the bonding material 55 is cured by heat, while being held generally uniformly distributed, over at least generally an entire bonding surface of the IC chip 51, thereby achieving manufacture of an IC chip-mounted unit. That is, during the final compression-bonding step, the auxiliary passivation film 53 provided in the peripheral portions of the bonding surface of the IC chip 51 functions to prevent any differences between the flow speed at which the bonding material 55 flows in the square region surrounded by the four-side bumps 52, . . . , 52 within the bonding surface on which the passivation film 59 is originally disposed, and the flow speed at which the bonding material 55 flows at the positions outward of the four-side bumps 52, . . . , 52, i.e., in the peripheral portions of the bonding surface, so that the bonding material 55 can be prevented from heightening in flow speed in the peripheral portions of the bonding surface of the IC chip 51.

In the above description, it has been described that the bumps 52 of the IC chip 51 and the electrodes 57 of the circuit board 56 are brought into contact with each other, respectively, during the bonding step. However, this is not limitative, and it is also possible that the bumps 52 of the IC chip 51 and the electrodes 57 of the circuit board 56 are not brought into contact with each other, respectively, during the bonding step, but that the bumps 52 of the IC chip 51 and the electrodes 57 of the circuit board 56 are brought into contact with each other, respectively, for the first time during the final compression-bonding step.

As an example, when the bumps 52 are 50 to 75 μm high, the passivation film 59 and the auxiliary passivation film 53 are preferably 30 to 40 μm thick.

According to this sixth embodiment, not only the passivation film 59 (satin region in FIG. 16B) is disposed over the square region surrounded by the bumps 52, . . . , 52 disposed in one array and generally equidistantly in each of the vicinities of the individual side verges of the bonding surface of the square IC chip 51, but also the auxiliary passivation film 53 (satin region in FIG. 16B) is disposed at the positions outward of the four-side bumps 52, . . . , 52, i.e., in the peripheral portions of the bonding surface. As a result of this, the flow speed at which the bonding material 55 flows in the square region and the flow speed at which the bonding material 55 flows at the peripheral portions of the bonding surface become generally equal to each other, so that the bonding material 55 can be prevented from lowering in density, and therefore prevented from lowering in adhesion, i.e. the bonding power and the sealing power, in the peripheral portions of the bonding surface, and from occurrence of peeling, which in turn prevents corrosion or the like of the IC chip 51 or the like due to moisture absorption as a result of penetration of moisture. Thus, it becomes implementable to achieve a uniform distribution of the bonding material 55 within the bonding surface of the IC chip 51, thereby allowing adhesion to be improved, so that reliability of bonding and sealing can be enhanced.

Seventh Embodiment

Figure 20A:
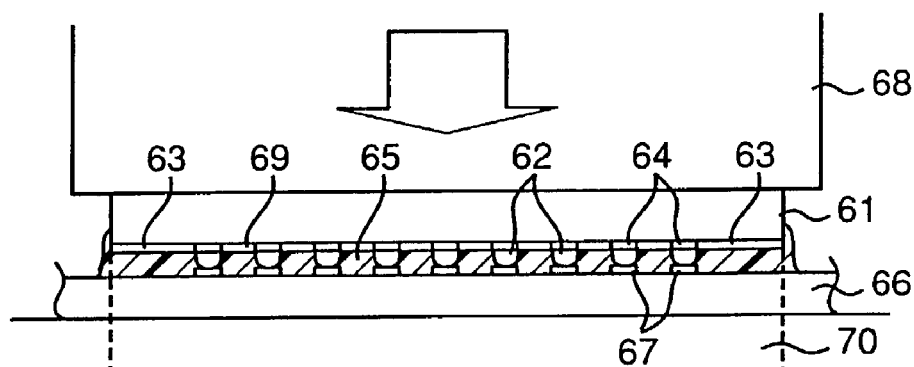
FIGS. 20A and 20B are respectively explanatory views for explaining steps of an electronic component mounting method according to a seventh embodiment of the present invention.
Figure 20B:
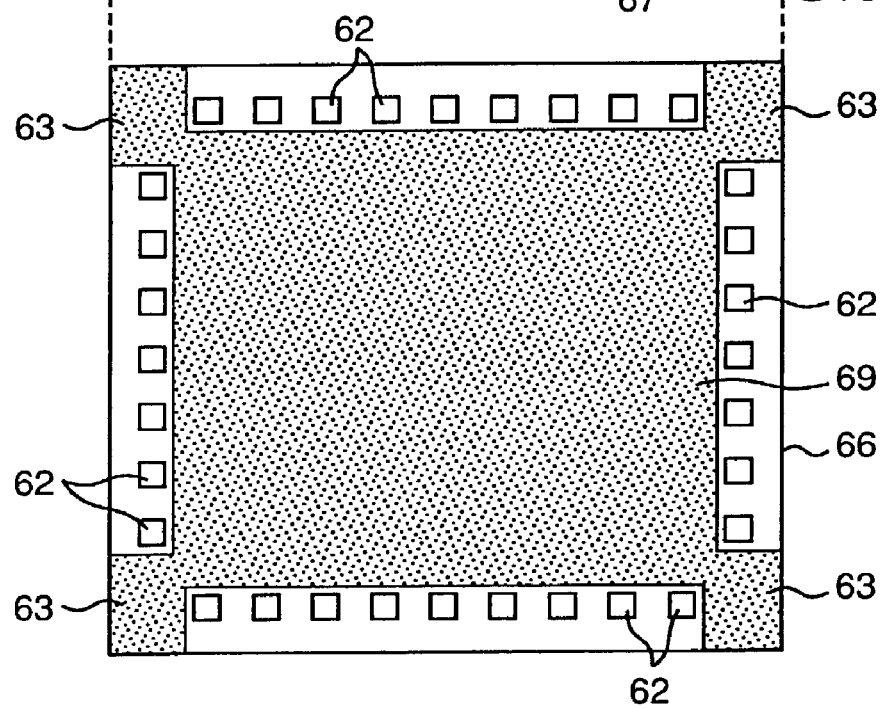
Figure 21:
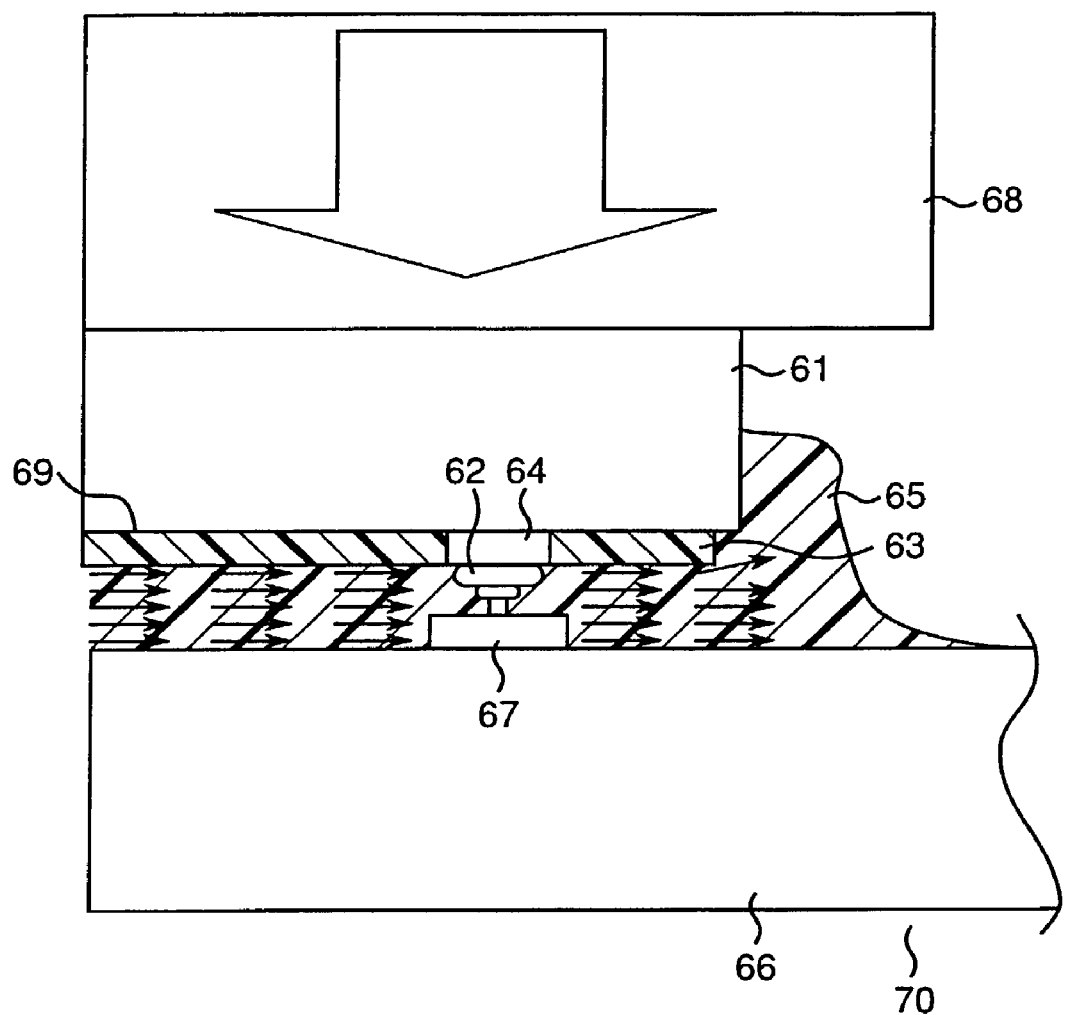
FIG. 21 is a side view showing a flow state of a bonding material between an electronic component and a circuit board during a mounting process of the electronic component mounting method according to the seventh embodiment of the present invention, following FIG. 20B.

An IC chip mounting method and an IC chip-mounted unit manufactured by the method as an example of an electronic component mounting method and an electronic component-mounted unit manufactured by the method according to a seventh embodiment of the present invention are explained with reference to FIGS. 20A, 20B and 21. FIGS. 20A and 20B are a side view and a rear view of an IC chip prior to a bonding step of the IC chip mounting method according to the seventh embodiment. FIG. 21 is a side view of the IC chip, a circuit board, and a bonding material during the bonding step. Furthermore, FIGS. 18A and 18B are a side view and a rear view of an IC chip prior to a bonding step of an IC chip mounting method according to a prior art example for explaining the seventh embodiment. FIG. 19 is a side view of the IC chip, a circuit board, and a bonding material during the bonding step of the prior art example.

In the sixth embodiment, a passivation film 53 (satin region in FIG. 16B) is disposed over a quadrilateral frame region in the peripheral portions outward of arrays of bumps 52, . . . , 52 in side-verge vicinities of the individual sides of the bonding surface of the IC chip 51, as a bonding-material flow regulating film which is an example of the bonding-material flow regulating member. However, this is not limitative. For example, in the seventh embodiment, it is also possible that a generally quadrilateral auxiliary passivation film 63 (satin region in FIG. 20B) as an example of the bonding-material flow regulating member is provided only at corner portions of peripheral portions outside arrays of bumps 62, . . . , 62 placed in vicinities of side verges of individual sides of the bonding surface of the IC chip 61, so that flow regulation of a bonding material 65 is performed by the auxiliary passivation films 63, . . . , 63.

Conventionally, as shown in FIGS. 18A and 18B, it is assumed that bumps 152, . . . , 152 are provided each in one array and generally equidistantly in the vicinities of side verges of individual sides of a bonding surface of a square IC chip 151, and that a passivation film 159 (satin region in FIG. 18B) is disposed over a square region surrounded by the bumps 152, . . . , 152 on the four sides. In a state that the passivation film 159 is disposed on the IC chip 151 as shown above, a bonding material 155 is fed to a circuit board 156, and then the bumps 152 on the electrodes 154 of the IC chip 151 and electrodes 157 of the circuit board 156 are bonded together so as to be brought into electrical contact with each other via the bonding material 155 interposed between the bonding surface of the IC chip 151, on which the bumps 152 are formed on the electrodes 154 of the bonding surface, and the circuit board 156. By placing the circuit board 156 on a base 170, and bringing a heated pressurizing member 158 into contact with the IC chip 151 and applying pressure thereto, the IC chip 151 is compression-bonded in a heated and pressurized state so that the bonding material 155 between the bonding surface of the IC chip 151 and the circuit board 156 is cured. In such a case, in the square region surrounded by the four-side bumps 152, . . . , 152 within the bonding surface of the IC chip 151 on which the passivation film 159 is disposed, the bonding material 155 would flow at a higher flow speed at positions between the four-side bumps 152, . . . , 152 as well as at positions outward of the four-side bumps 152, . . . , 152, i.e., in peripheral portions of the bonding surface, where the passivation film 159 is absent, so that the bonding material 155 would lower in density at these portions, therefore lowering in adhesion, i.e. bonding power and sealing power, at the peripheral portions of the bonding surface, thus yielding occurrence of peeling. Such occurrence of peeling against the bonding material 155 at the peripheral portions of the bonding surface of the IC chip 151, if involved, would cause moisture to penetrate to peeled portions, which would in turn lead to occurrence of corrosion or the like of the IC chip 151 or the like due to moisture absorption.

In order to prevent such deterioration of bonding power and sealing power, in the seventh embodiment, prior to a bonding material feeding step, as shown in FIGS. 20A and 20B, not only a passivation film 69 (satin region in FIG. 20B) is disposed over a square region surrounded by the bumps 62, . . . , 62 disposed in one array and generally equidistantly in each of vicinities of the individual side verges of the bonding surface of the square IC chip 61, but also auxiliary passivation films 63, . . . , 63 (satin region in FIG. 20B) continuing from the passivation film 69 are disposed over regions of from the square region to positions outward of the four-side bumps 62, . . . , 62, i.e., corner portions of peripheral portions of the bonding surface. A reason of disposition at the corner portions of the peripheral portions of the bonding surface is to fulfill a flow regulation of bonding material 65 by disposing the auxiliary passivation films 63, . . . , 63 at the corner portions of the peripheral portions of the bonding surface, because in these vicinities of the corner portions of the bonding surface, an array interval of the bumps 62, . . . , 62 is larger than in other portions so that the bonding material 65 tends more to flow out, and that its flow speed at the corner portions of the peripheral portions of the bonding surface tends to become higher than in other portions. As a result of this, a flow speed at which the bonding material 65 flows in the square region surrounded by the four-side bumps 62, . . . , 62 within the bonding surface of the IC chip 61 on which the passivation film 69 is disposed, and a flow speed at which the bonding material 55 flows at positions outward of the four-side bumps 62, . . . , 62 at which the auxiliary passivation films 63, . . . , 63 are disposed, i.e. at the corner portions of the peripheral portions of the bonding surface, become generally equal to each other, so that the bonding material 65 can be prevented from lowering in density, and therefore prevented from lowering in adhesion, i.e. bonding power and sealing power, at the corner portions of the peripheral portions of the bonding surface.

The method by which the bumps 62 are formed is the same as that of the first embodiment. As for the method for disposing the passivation film 69 and the auxiliary passivation films 63, . . . , 63, available is a method of applying a passivation-film formation resin. Application of the passivation-film formation resin may be performed either before or after formation of the bumps 62, but is preferably performed before the formation of the bumps 62 because the bumps 62 are kept from damage during the application of the passivation-film formation resin. Material and a formation method for the auxiliary passivation films 63, . . . , 63 are the same as those for the passivation film 69. Examples of the passivation film 69 and the auxiliary passivation films 63, respectively, are polyimide as an organic material and $Si_3N_4$ as an inorganic material, wherein with the board formed of resin so that the board side is organic, it is preferable that the passivation film 69 and the auxiliary passivation films 63 are also formed of organic material, thereby maintaining an adhesive property. The polyimide is formed by spin coating of a liquid phase and by performing a photolithography process.

In a state that the passivation film 69 and the auxiliary passivation films 63, . . . , 63 as well as the bumps 62, . . . , 62 have been formed on the IC chip 61 as shown above, during a bonding material feeding step, a bonding material 65 containing at least an insulative thermosetting resin is fed to at least either one of the bonding surface of the IC chip 61 or the IC chip bonding region of a circuit board 66 as an example of a circuit formation article. The method of feeding the bonding material 65 is the same as that of the first embodiment.

Next, during the bonding step, the bonding surface of the IC chip 61 is laid on the IC chip bonding region of the circuit board 66 with the bonding material 65 interposed therebetween. Then, these members are so positioned that the bumps 62 on electrodes 64 of the IC chip 61 and electrodes 67 of the circuit board 66 come into mutual electrical contact via the bonding material 65 interposed between the bonding surface of the IC chip 61, on which the bumps 62 are formed on the electrodes 64, respectively, and the IC chip bonding region of the circuit board 66. Thereafter, the two members are bonded together. This bonding step may be performed in a state that the circuit board 66 is placed on a base 70, or may be performed in two steps, i.e., a bonding step to be performed at a different place in a state that the IC chip 61 is laid on the circuit board 66 with the bonding material 65 interposed therebetween, and a final compression-bonding step to be subsequently performed in which the circuit board 66 having the IC chip 61 laid thereon with the bonding material 65 interposed therebetween is placed on the base 70.

Next, during a final compression-bonding step, a pressurizing member 68 is brought into contact with the IC chip 61 so that a pressurizing force acts from the pressurizing member 68 toward the base 70, on which the circuit board 66 having the IC chip 61 laid thereon with the bonding material 65 interposed therebetween is placed, and moreover, heat of a heater contained in the pressurizing member 68 is transferred from the pressurizing member 68 to the IC chip 61. As a result of this, by a specified pressurizing force being exerted under application of a specified temperature, the bonding surface of the IC chip 61 is pressed against the IC chip bonding region of the circuit board 66, causing the bumps 62 on the individual electrodes 64 of the bonding surface of the IC chip 61 to come into contact with the individual electrodes 67 within the IC chip bonding region of the circuit board 66. In this case, a flow speed at which the bonding material 65 flows in the square region surrounded by the four-side bumps 62, . . . , 62 within the bonding surface of the IC chip 61 having the passivation film 69 disposed thereon, and a flow speed at which the bonding material 65 flows in the regions of from the corner portions of the square region to positions outer than the four-side bumps 62, 62 i.e., corner portions of the peripheral portions of the bonding surface, where the auxiliary passivation films 63, . . . , 63 continuing from the passivation film 69 are disposed, become generally equal to each other, so that the bonding material 65 can be prevented from lowering in density at the corner portions of the peripheral portions of the bonding surface, and therefore prevented from lowering in adhesion, i.e. bonding power and sealing power, at the corner portions of the peripheral portions of the bonding surface. Thus, the bonding material 65 is cured by heat, while being held generally uniformly distributed, over at least a generally entire bonding surface of the IC chip 61, thereby achieving manufacture of an IC chip-mounted unit. That is, during the final compression-bonding step, the auxiliary passivation films 63, . . . , 63 provided at the corner portions of the peripheral portions of the bonding surface of the IC chip 61 function to prevent any differences between the flow speed at which the bonding material 65 flows in the square region surrounded by the four-side bumps 62, . . . , 62 within the bonding surface on which the passivation film 69 is originally disposed, and the flow speed at which the bonding material 65 flows at the positions outward of the four-side bumps 62, . . . , 62, i.e., at the corner portions of the peripheral portions of the bonding surface, so that the bonding material 65 can be prevented from heightening in flow speed at the corner portions of the peripheral portions of the bonding surface of the IC chip 61.

In the above description, it has been described that the bumps 62 of the IC chip 61 and the electrodes 67 of the circuit board 66 are brought into contact with each other, respectively, during the bonding step. However, this is not limitative, and it is also possible that the bumps 62 of the IC chip 61 and the electrodes 67 of the circuit board 66 are not brought into contact with each other, respectively, during the bonding step, but that the bumps 62 of the IC chip 61 and the electrodes 67 of the circuit board 66 are brought into contact with each other, respectively, for the first time during the final compression-bonding step.

As an example, when the bumps 62 are 50 to 75 μm high, the passivation film 69 and the auxiliary passivation films 63 are preferably 30 to 40 μm thick.

According to this seventh embodiment, not only the passivation film 69 (satin region in FIG. 20B) is disposed over the square region surrounded by the bumps 62, . . . , 62 disposed in one array and generally equidistantly in each of the vicinities of the individual side verges of the bonding surface of the IC chip 61, but also the generally quadrilateral auxiliary passivation films 63, . . . , 63 (satin region in FIG. 20B) are disposed at the positions outer than the four-side bumps 62, . . . , 62, i.e., at the corner portions of the peripheral portions of the bonding surface. As a result of this, the flow speed at which the bonding material 65 flows in the square region and the flow speed at which the bonding material 65 flows at the corner portions of the peripheral portions become generally equal to each other, so that the bonding material 65 can be prevented from lowering in density, and therefore prevented from lowering in adhesion, i.e. bonding power and sealing power, at the corner portions of the peripheral portions of the bonding surface, and from occurrence of peeling, which in turn prevents corrosion or the like of the IC chip 61 or the like due to moisture absorption as a result of penetration of moisture. Thus, it becomes implementable to achieve a uniform distribution of the bonding material 65 within the bonding surface of the IC chip 61, thereby allowing adhesion to be improved, so that reliability of bonding and sealing can be enhanced.

Eighth Embodiment

Figure 22A:
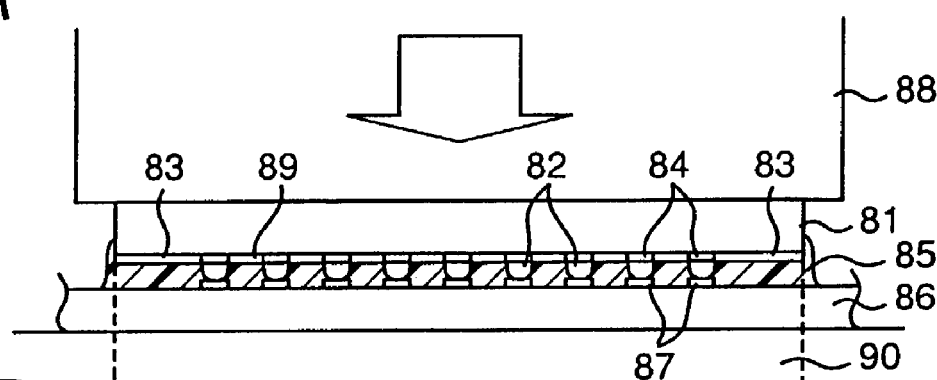
FIGS. 22A and 22B are respectively explanatory views for explaining steps of an electronic component mounting method according to an eighth embodiment of the present invention.
Figure 22B:
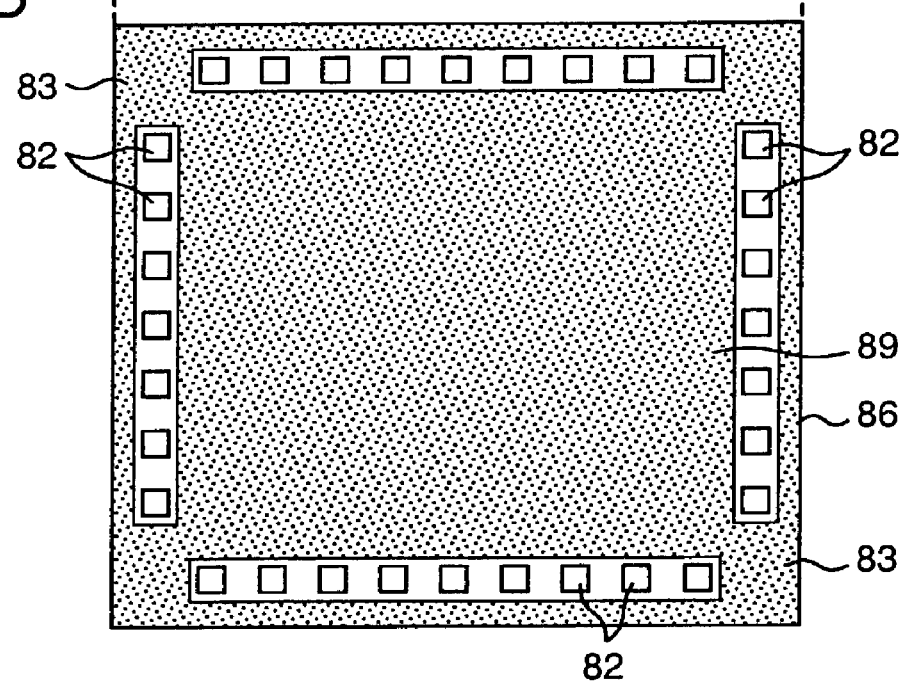
Figure 23:
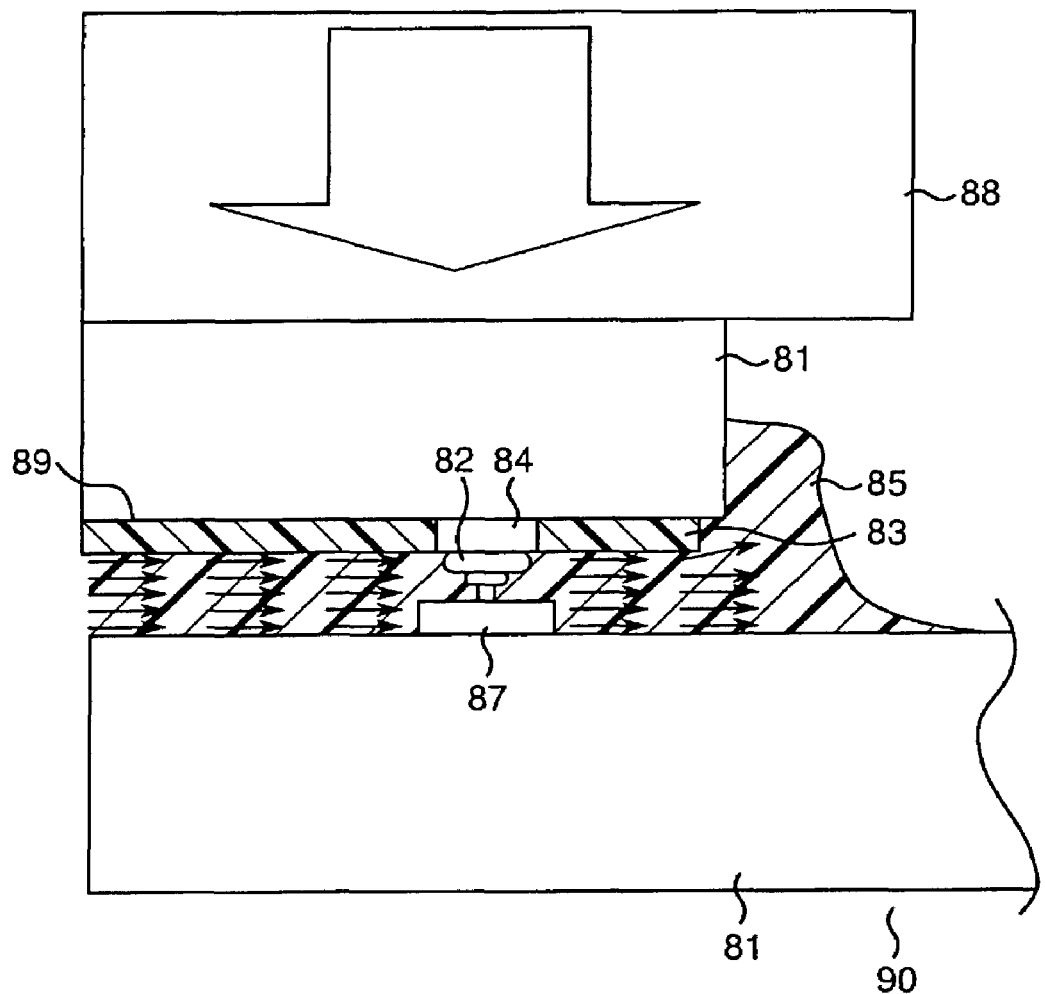
FIG. 23 is a side view showing a flow state of a bonding material between an electronic component and a circuit board during a mounting process of the electronic component mounting method according to the eighth embodiment of the present invention, following FIG. 22B.

An IC chip mounting method and an IC chip-mounted unit manufactured by the method as an example of an electronic component mounting method and an electronic component-mounted unit manufactured by the method according to an eighth embodiment of the present invention are explained based on FIGS. 22A, 22B and 23. FIGS. 22A and 22B are a side view and a rear view of an IC chip prior to a bonding step of the IC chip mounting method according to the eighth embodiment, and FIG. 23 is a side view of the IC chip, a circuit board, and a bonding material during the bonding step. Also, FIGS. 18A and 18B are a side view and a rear view of an IC chip prior to a bonding step of an IC chip mounting method according to a prior art example for explaining the eighth embodiment, and FIG. 19 is a side view of the IC chip, a circuit board, and a bonding, material during the bonding step of the prior art example.

In the foregoing sixth embodiment, over a quadrilateral frame region in the peripheral portions of the bonding surface of the IC chip 51 outward of arrays of bumps 52, . . . , 52 placed in vicinities of the individual side verges of the bonding surface is provided an auxiliary passivation film 53 (satin region in FIG. 16B) as a bonding-material flow regulating film, which is an example of the bonding-material flow regulating member. However, this is not limitative. For example, in the eighth embodiment, which is a combination of the sixth embodiment and the seventh embodiment, it is also possible that at peripheral portions of the bonding surface of an IC chip 81 outward of arrays of bumps 82, . . . , 82 placed in vicinities of the individual side verges of the bonding surface, as well as at regions of from corner portions of a square region to outer peripheral-portion corner portions of the passivation film 59, i.e. at regions including peripheral portions of the bonding surface as well as vicinities of its corner portions, an auxiliary passivation film 83 (satin region in FIG. 22B) is provided as an example of the bonding-material flow regulating member, so that flow of a bonding material 85 is regulated by the auxiliary passivation film 83.

Conventionally, as shown in FIGS. 18A and 18B, it is assumed that a passivation film 159 (satin region in FIG. 18B) is disposed over a square region which has bumps 152, . . . , 152 disposed in one array and generally equidistantly in each of vicinities of the individual side verges of the bonding surface of the square IC chip 151 and which is surrounded by the four-side bumps 152, . . . , 152. With the passivation film 159 disposed on the IC chip 151 as shown above, the bonding material 155 is fed to the circuit board 156. Thereafter, with the bonding material 155 interposed between the bonding surface of the IC chip 151 and the circuit board 156, the IC chip 151 having the bumps 152 formed on the electrodes 154 of the bonding surface, the bumps 152 on the electrodes 154 of the IC chip 151 and the electrodes 157 of the circuit board 156 are bonded together so as to be in mutual electrical contact. Further, with the circuit board 156 placed on a base 180, the heated pressurizing member 158 is brought into contact with the IC chip 151 and then pressurized. Thus, the IC chip 151 is compression-bonded in a heated and pressurized state, so that the bonding material 155 between the bonding surface of the IC chip 151 and the circuit board 156 is cured. In such a case, other than in the square region surrounded by the four-side bumps 152, . . . , 152 within the bonding surface of the IC chip 151 on which the passivation film 159 is disposed, the bonding material 155 would flow at a higher flow speed at positions between the four-side bumps 152, . . . , 152 as well as at positions outward of the four-side bumps 152, . . . , 152, i.e., in peripheral portions of the bonding surface, where the passivation film 159 is absent, so that the bonding material 155 would lower in density at these portions, therefore lowering in adhesion, i.e. bonding power and sealing power, at the peripheral portions of the bonding surface, thus yielding occurrence of peeling. Such occurrence of peeling against the bonding material 155 at the peripheral portions of the bonding surface of the IC chip 151, if involved, would cause moisture to penetrate to peeled portions, which would in turn lead to occurrence of corrosion or the like of the IC chip 151 or the like due to moisture absorption.

In order to prevent such deterioration of the bonding power and the sealing power, in the ninth embodiment, prior to a bonding material feeding step, as shown in FIGS. 22A and 22B, not only a passivation film 89 (satin region in FIG. 22B) is disposed over a square region surrounded by the bumps 82, . . . , 82 disposed in one array and generally equidistantly in each of vicinities of the individual side verges of the bonding surface of the square IC chip 81, but also an auxiliary passivation film 83 (satin region in FIG. 22B) is disposed at positions outer than the four-side bumps 82, ..., 82, i.e., in peripheral portions and corner portions of the bonding surface. A reason for disposition in the peripheral portions and the corner portions of the bonding surface is to produce working effects of both the sixth embodiment and the seventh embodiment simultaneously. As a result of this, a flow speed at which the bonding material 85 flows in the square region surrounded by the four-side bumps 82, ..., 82 within the bonding surface of the IC chip 81 on which the passivation film 89 is disposed, and a flow speed at which the bonding material 85 flows at positions outer than the four-side bumps 82, ..., 82 at which the auxiliary passivation film 83 is disposed, i.e. in the peripheral portions and the corner portions of the bonding surface, become generally equal to each other, so that the bonding material 85 can be prevented from lowering in density, and therefore prevented from lowering in adhesion, i.e. bonding power and sealing power, in the peripheral portions and the corner portions of the bonding surface.

The method by which the bumps 82 are formed is the same as that of the first embodiment. As for the method for disposing the passivation film 89 and the auxiliary passivation film 83, available is a method of applying a passivation-film formation resin. Application of the passivation-film formation resin may be performed either before or after the formation of the bumps 82, but is preferably performed before the formation of the bumps 82 because the bumps 82 are kept from damage during the application of the passivation-film formation resin. Material and a formation method for the auxiliary passivation film 83 are the same as those for the passivation film 89. Examples of the passivation film 89 and the auxiliary passivation film 83, respectively, are polyimide as an organic material and $Si_3N_4$ as an inorganic material, wherein with the board formed of resin so that the board side is organic, it is preferable that the passivation film 89 and the auxiliary passivation film 83 are also formed of organic material, thereby maintaining an adhesive property. The polyimide is formed by spin coating of a liquid phase and by performing a photolithography process.

In a state that the passivation film 89 and the auxiliary passivation film 83 as well as the bumps 82, 82 have been formed on the IC chip 81 as shown above, during the bonding material feeding step, a bonding material 85 containing at least an insulative thermosetting resin is fed to at least either one of the bonding surface of the IC chip 81 or the IC chip bonding region of a circuit board 86 as an example of a circuit formation article. The method of feeding the bonding material 85 is the same as that of the first embodiment.

Next, during the bonding step, the bonding surface of the IC chip 81 is laid on the IC chip bonding region of the circuit board 86 with the bonding material 85 interposed therebetween. Then, these members are so positioned that the bumps 82 on electrodes 84 of the IC chip 81 and electrodes 87 of the circuit board 86 come into mutual electrical contact via the bonding material 85 interposed between the bonding surface of the IC chip 81, on which the bumps 82 are formed on the electrodes 84, respectively, and the IC chip bonding region of the circuit board 86. Thereafter, the two members are bonded together. This bonding step may be performed in a state that the circuit board 86 is placed on a base 90, or may be performed in two steps, i.e., a bonding step to be performed at a different place in a state that the IC chip 81 is laid on the circuit board 86 with the bonding material 85 interposed therebetween, and a final compression-bonding step to be subsequently performed in which the circuit board 86 having the IC chip 81 laid thereon with the bonding material 85 interposed therebetween is placed on the base 90.

Next, during a final compression-bonding step, a pressurizing member 88 is brought into contact with the IC chip 81 so that a pressurizing force acts from the pressurizing member 88 toward the base 90, on which the circuit board 86 having the IC chip 81 laid thereon with the bonding material 85 interposed therebetween is placed, and moreover, heat of a heater contained in the pressurizing member 88 is transferred from the pressurizing member 88 to the IC chip 81. As a result of this, by a specified pressurizing force being exerted under application of a specified temperature, the bonding surface of the IC chip 81 is pressed against the IC chip bonding region of the circuit board 86, causing the bumps 82 on the individual electrodes 84 of the bonding surface of the IC chip 81 to come into contact with the individual electrodes 87 within the IC chip bonding region of the circuit board 86. In this case, the flow speed at which the bonding material 85 flows in the square region surrounded by the four-side bumps 82, ..., 82 within the bonding surface of the IC chip 81 having the passivation film 89 disposed thereon, and the flow speed at which the bonding material 85 flows at positions outer than the four-side bumps 82, ..., 82, where the auxiliary passivation film 83 is disposed, i.e., in peripheral portions and corner portions of the bonding surface, become generally equal to each other, so that the bonding material 85 can be prevented from lowering in density in the peripheral portions and the corner portions of the bonding surface, and therefore prevented from lowering in adhesion, i.e. bonding power and sealing power, in the peripheral portions and the corner portions of the bonding surface. Thus, the bonding material 85 is cured by heat, while being held generally uniformly distributed, over at least generally an entire bonding surface of the IC chip 81, thereby achieving manufacture of an IC chip-mounted unit. That is, during the final compression-bonding step, the auxiliary passivation film 83 provided in the peripheral portions and the corner portions of the bonding surface of the IC chip 81 functions to prevent any differences between the flow speed at which the bonding material 85 flows in the square region surrounded by the four-side bumps 82, ..., 82 within the bonding surface on which the passivation film 89 is originally disposed, and the flow speed at which the bonding material 85 flows at the positions outward of the four-side bumps 82, ..., 82, i.e., in the peripheral portions and the corner portions of the bonding surface, so that the bonding material 85 can be prevented from heightening in flow speed in the peripheral portions and the corner portions of the bonding surface of the IC chip 81.

In the above description, it has been described that the bumps 82 of the IC chip 81 and the electrodes 87 of the circuit board 86 are brought into contact with each other, respectively, during the bonding step. However, this is not limitative, and it is also possible that the bumps 82 of the IC chip 81 and the electrodes 87 of the circuit board 86 are not brought into contact with each other, respectively, during the bonding step, but that the bumps 82 of the IC chip 81 and the electrodes 87 of the circuit board 86 are brought into contact with each other, respectively, for the first time during the final compression-bonding step.

As an example, when the bumps 82 are 50 to 75 μm high, the passivation film 89 and the auxiliary passivation film 83 are preferably 30 to 40 μm thick.

According to this eighth embodiment, not only the passivation film 89 (satin region in FIG. 22B) is disposed over the square region surrounded by the bumps 82, 82 disposed in one array and generally equidistantly in each of the vicinities of the individual side verges of the bonding surface of the square IC chip 81, but also the generally quadrilateral-shaped auxiliary passivation film 83 (satin region in FIG. 22B) is disposed at the positions outer than the four-side bumps 82, . . . , 82, i.e., in the peripheral portions and the corner portions of the bonding surface. As a result of this, the flow speed at which the bonding material 85 flows in the square region and the flow speed at which the bonding material 85 flows at the peripheral portions and the corner portions of the bonding surface become generally equal to each other, so that the bonding material 85 can be prevented from lowering in density, and therefore prevented from lowering in adhesion, i.e. bonding power and sealing power, in the peripheral portions and corner portions of the bonding surface, and from occurrence of peeling, which in turn prevents corrosion or the like of the IC chip 81 or the like due to moisture absorption as a result of penetration of moisture. Thus, it becomes implementable to achieve a uniform distribution of the bonding material 85 within the bonding surface of the IC chip 81, thereby allowing adhesion to be improved, so that reliability of bonding and sealing can be enhanced.

Ninth Embodiment

Figure 24A:
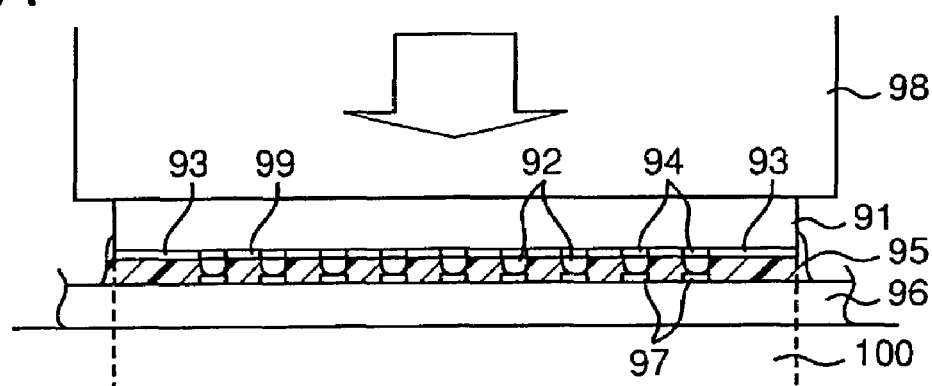
FIGS. 24A and 24B are respectively explanatory views for explaining steps of an electronic component mounting method according to a ninth embodiment of the present invention.
Figure 24B:
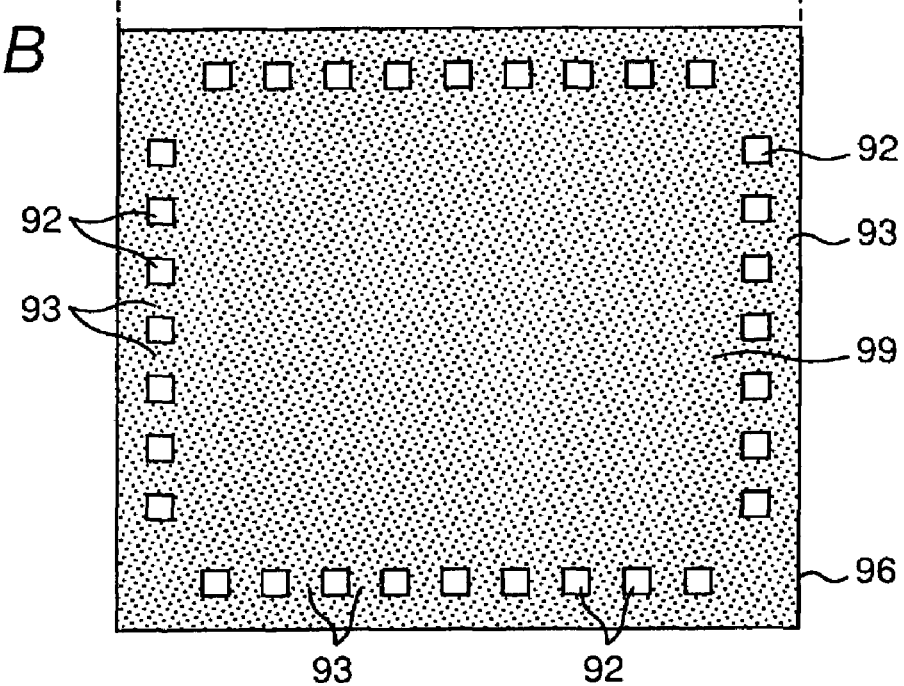
Figure 25:
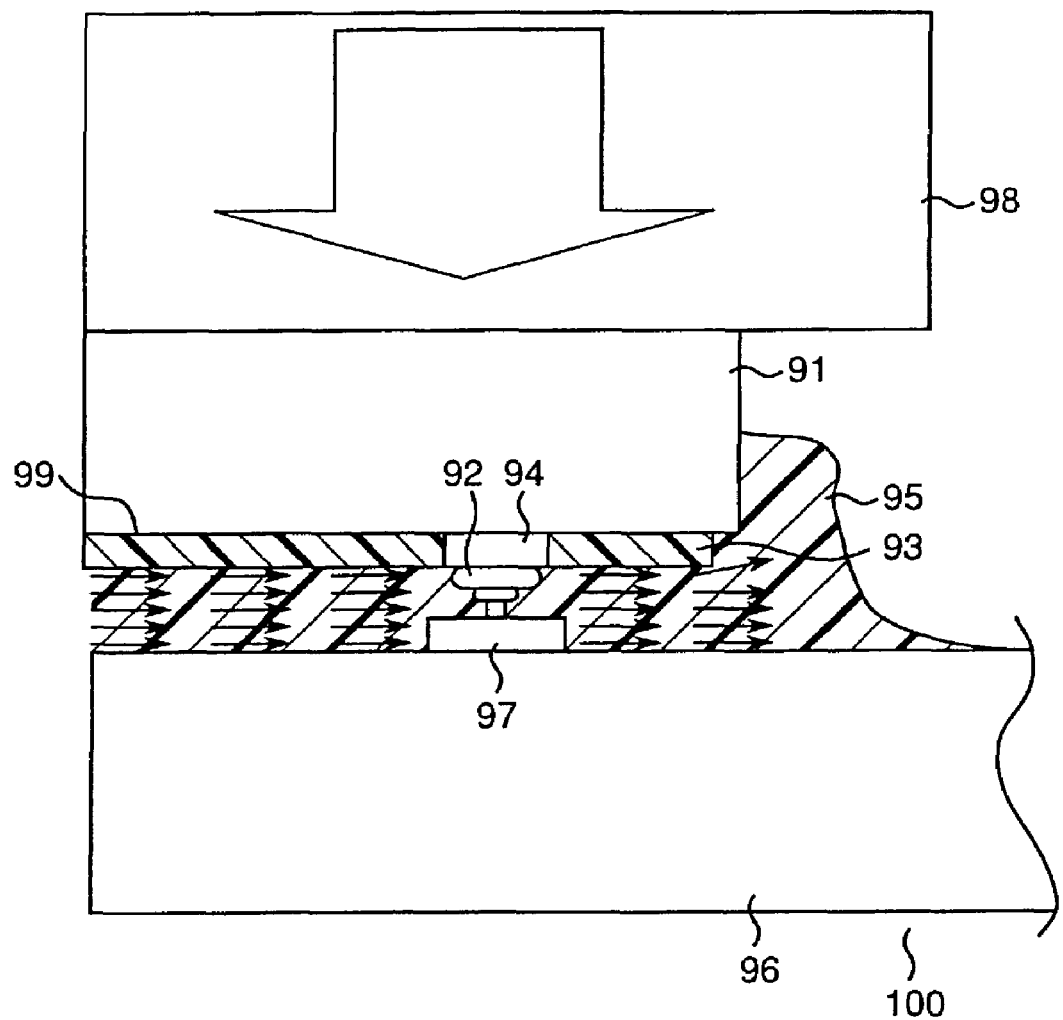
FIG. 25 is a side view showing a flow state of a bonding material between an electronic component and a circuit board during a mounting process of the electronic component mounting method according to the ninth embodiment of the present invention, following FIG. 24B.

An IC chip mounting method and an IC chip-mounted unit manufactured by the method as an example of an electronic component mounting method and an electronic component-mounted unit manufactured by the method according to a ninth embodiment of the present invention are explained based on FIGS. 24A, 24B and 25. FIGS. 24A and 24B are a side view and a rear view of an IC chip prior to a bonding step of the IC chip mounting method according to the ninth embodiment, and FIG. 25 is a side view of the IC chip, a circuit board, and a bonding material during the bonding step. Also, FIGS. 18A and 18B are a side view and a rear view of an IC chip prior to a bonding step of an IC chip mounting method according to a prior art example for explaining the ninth embodiment, and FIG. 19 is a side view of the IC chip, a circuit board, and a bonding material during the bonding step of this prior art example.

In the foregoing sixth embodiment, over a quadrilateral frame region in peripheral portions of the bonding surface of the IC chip 51 outward of arrays of bumps 52, . . . , 52 placed in vicinities of the individual side verges of the bonding surface is provided an auxiliary passivation film 53 (satin region in FIG. 16B) as a bonding-material flow regulating film which is an example of the bonding-material flow regulating member. However, this is not limitative. For example, in the ninth embodiment, in addition to the eighth embodiment which is a combination of the sixth embodiment and the seventh embodiment, it is possible that also at gap portions between bumps 92, . . . , 92 placed in vicinities of the individual side verges of the bonding surface of an IC chip 91, an auxiliary passivation film 93 (satin region in FIG. 24B) is provided as an example of a bonding-material flow regulating member, so that flow of a bonding material 95 is regulated by the auxiliary passivation film 93. In other words, it is also possible that the auxiliary passivation film 93 (satin region in FIG. 24B) is provided as an example of the bonding-material flow regulating member over all regions other than the bumps 92, . . . , 92 of the bonding surface of the IC chip 91, so that flow regulation of the bonding material 95 is fulfilled by the auxiliary passivation film 93.

Conventionally, as shown in FIGS. 18A and 18B, it is assumed that a passivation film 159 (satin region in FIG. 18B) is disposed over a square region which has bumps 152, . . . , 152 disposed in one array and generally equidistantly in each of vicinities of the individual side verges of the bonding surface of the square IC chip 151 and which is surrounded by the four-side bumps 152, . . . , 152. With the passivation film 159 disposed on the IC chip 151 as shown above, the bonding material 155 is fed to the circuit board 156. Thereafter, with the bonding material 155 interposed between the bonding surface of the IC chip 151 and the circuit board 156, the IC chip 151 having the bumps 152 formed on the electrodes 154 of the bonding surface, the bumps 152 on the electrodes 154 of the IC chip 151 and the electrodes 157 of the circuit board 156 are bonded together so as to be in mutual electrical contact. Further, with the circuit board 156 placed on a base 180, the heated pressurizing member 158 is brought into contact with the IC chip 151 and then pressurized. Thus, the IC chip 151 is compression-bonded in a heated and pressurized state, so that the bonding material 155 between the bonding surface of the IC chip 151 and the circuit board 156 is cured. In such a case, other than in the square region surrounded by the four-side bumps 152, . . . , 152 within the bonding surface of the IC chip 151 on which the passivation film 159 is disposed, the bonding material 155 flows at a higher flow speed at positions between the four-side bumps 152, . . . , 152 as well as at positions outer than the four-side bumps 152, . . . , 152, i.e., in the peripheral portions of the bonding surface, where the passivation film 159 is absent, so that the bonding material 155 lowers in density at these portions, therefore lowering in adhesion, i.e. bonding power and sealing power, at the peripheral portions of the bonding surface, thus yielding occurrence of peeling. Such occurrence of peeling against the bonding material 155 at the peripheral portions of the bonding surface of the IC chip 151, if involved, would cause moisture to penetrate peeled portions, which would in turn lead to occurrence of corrosion or the like of the IC chip 151 or the like due to moisture absorption.

In order to prevent such deterioration of the bonding power and the sealing power, in the ninth embodiment, prior to a bonding material feeding step, as shown in FIGS. 24A and 24B, not only a passivation film 99 (satin region in FIG. 24B) is disposed over a square region surrounded by the bumps 92, . . . , 92 disposed in one array and generally equidistantly in each of vicinities of the individual side verges of the bonding surface of the square IC chip 91, but also an auxiliary passivation film 93 (satin region in FIG. 24B) is disposed at positions outer than the four-side bumps 92, . . . , 92, i.e., in the peripheral portions and the corner portions of the bonding surface as well as at portions between neighboring bumps 92, 92. A reason for disposition in the portions between the neighboring bumps 92, 92 as well as in the peripheral portions and the corner portions of the bonding surface is to maintain the same flow speed of the bonding material 95 both in the portions between the neighboring bumps 92, . . . , 92 and even in the other portions, as well as to produce working effects of both the sixth embodiment and the seventh embodiment simultaneously. As a result of this, the flow speed at which the bonding material 95 flows in the regions other than the portions at which the bumps 92, . . . , 92 are disposed within the bonding surface of the IC chip 91 on which the passivation film 99 is disposed is maintained generally the same, so that the bonding material 95 can be prevented from lowering in density, and therefore prevented from lowering in adhesion, i.e. bonding power and sealing power, in the peripheral portions and the corner portions of the bonding surface as well as at the portions between the neighboring bumps 92, . . . , 92.

The method by which the respective bumps 92 are formed is the same as that of the first embodiment. As for a method for disposing the passivation film 99 and the auxiliary passivation film 93, available is a method of applying a passivation-film formation resin. Application of the passivation-film formation resin may be performed either before or after formation of respective bumps 92, but is preferably performed before the formation of the respective bumps 92 because the bumps 92 are kept from damage during the application of the passivation-film formation resin. Material and a formation method for the auxiliary passivation film 93 are the same as those for the passivation film 99. An example is an organic film of polyimide, polybenzoxazole (PBO) or the like, which is spin-coated to a thickness of, for example, about 3 to 7 µm so as to be applied all over the bonding surface of the IC chip 91. Thereafter, electrodes 94 necessary for the formation of the bumps 92 are exposed by dot-shaped removal.

In a state that the passivation film 99 and the auxiliary passivation film 93 as well as the bumps 92, . . . , 92 have been formed on the IC chip 91 as shown above, then at the bonding material feeding step, a bonding material 95 containing at least an insulative thermosetting resin is fed to at least either one of the bonding surface of the IC chip 91 or the IC chip bonding region of a circuit board 96 as an example of a circuit formation article. The method of feeding the bonding material 95 is the same as that of the first embodiment.

Next, during the bonding step, the bonding surface of the IC chip 91 is laid on the IC chip bonding region of the circuit board 96 with the bonding material 95 interposed therebetween. Then, these members are so positioned that the bumps 92 on electrodes 94 of the IC chip 91 and electrodes 97 of the circuit board 96 come into mutual electrical contact via the bonding material 95 interposed between the bonding surface of the IC chip 91, on which the bumps 92 are formed on the electrodes 94, respectively, and the IC chip bonding region of the circuit board 96. Thereafter, the two members are bonded together. This bonding step may be performed in a state that the circuit board 96 is placed on a base 100, or may be performed in two steps, i.e., a bonding step to be performed at a different place in a state that the IC chip 91 is laid on the circuit board 96 with the bonding material 95 interposed therebetween, and a final compression-bonding step to be subsequently performed in which the circuit board 96 having the IC chip 91 laid thereon with the bonding material 95 interposed therebetween is placed on the base 100.

Next, during a final compression-bonding step, a pressurizing member 98 is brought into contact with the IC chip 91, so that a pressurizing force acts from the pressurizing member 98 toward the base 100, on which the circuit board 96 having the IC chip 91 laid thereon with the bonding material 95 interposed therebetween is placed, and moreover heat of a heater contained in the pressurizing member 98 is transferred from the pressurizing member 98 to the IC chip 91. As a result of this, by a specified pressurizing force being exerted under application of a specified temperature, the bonding surface of the IC chip 91 is pressed against the IC chip bonding region of the circuit board 96, causing the bumps 92 on the individual electrodes 94 of the bonding surface of the IC chip 91 to come into contact with the individual electrodes 97 within the IC chip bonding region of the circuit board 96. In this case, a flow speed at which the bonding material 95 flows in the square region surrounded by the four-side bumps 92, . . . , 92 within the bonding surface of the IC chip 91 having the passivation film 99 disposed thereon, and a flow speed at which the bonding material 95 flows at positions outward of the four-side bumps 92, . . . , 92, where the auxiliary passivation film 93 is disposed, i.e., in peripheral portions and corner portions of the bonding surface as well as in portions between neighboring bumps 92, . . . , 92, become generally equal to each other, so that the bonding material 95 can be prevented from lowering in density in the peripheral portions and the corner portions of the bonding surface as well as at the portions between the neighboring bumps 92, . . . , 92, and therefore prevented from lowering in adhesion, i.e. bonding power and sealing power, in the peripheral portions and the corner portions of the bonding surface as well as at the portions between the neighboring bumps 92, . . . , 92. Thus, the bonding material 95 is cured by heat, while being held generally uniformly distributed, over at least the generally entire bonding surface of the IC chip 91, thereby achieving manufacture of an IC chip-mounted unit. That is, during the final compression-bonding step, the auxiliary passivation film 93 provided in the peripheral portions and the corner portions of the bonding surface of the IC chip 91 functions to prevent any differences between the flow speed of the bonding material 95 in the square region surrounded by the four-side bumps 92, . . . , 92 within the bonding surface on which the passivation film 99 is originally disposed, and the flow speed of the bonding material 95 at the positions outer than the four-side bumps 92, . . . , 92, i.e., in the peripheral portions and the corner portions of the bonding surface as well as at the portions between the neighboring bumps 92, . . . , 92, so that the bonding material 95 can be prevented from heightening in flow speed in the peripheral portions and the corner portions of the bonding surface of the IC chip 91 as well as at the portions between the neighboring bumps 92, . . . , 92.

In the above description, it has been described that the bumps 92 of the IC chip 91 and the electrodes 97 of the circuit board 96 are brought into contact with each other, respectively, during the bonding step. However, this is not limitative, and it is also possible that the bumps 92 of the IC chip 91 and the electrodes 97 of the circuit board 96 are not brought into contact with each other, respectively, during the bonding step, but that the bumps 92 of the IC chip 91 and the electrodes 97 of the circuit board 96 are brought into contact with each other, respectively, for the first time during the final compression-bonding step.

As an example, when the bumps 92 are 50 to 75 µm high, the passivation film 99 and the auxiliary passivation film 93 are preferably 30 to 40 µm thick.

According to this ninth embodiment, not only the passivation film 99 (satin region in FIG. 24B) is disposed over a square region surrounded by the bumps 92, 92 disposed in one array and generally equidistantly in each of vicinities of the individual side verges of the bonding surface of the IC chip 91, but also the auxiliary passivation film 93 (satin region in FIG. 24B) is disposed at positions outward of the four-side bumps 92, 92, i.e., in the peripheral portions and the corner portions of the bonding surface as well as at the portions between the neighboring bumps 92, . . . , 92. As a result of this, the flow speed at which the bonding material 95 flows in the square region and the flow speed at which the bonding material 95 flows in the peripheral portions and the corner portions as well as at the portions between the neighboring bumps 92, . . . , 92, becomes generally equal to each other, so that the bonding material 95 can be prevented from lowering in density, and therefore prevented from lowering in adhesion, i.e. the bonding power and the sealing power, in the peripheral portions and the corner portions of the bonding surface as well as at the portions between the neighboring bumps 92, . . . , 92, and from occurrence of peeling, which in turn prevents corrosion or the like of the IC chip 81 or the like due to moisture absorption as a result of penetration of moisture contents. Thus, it becomes implementable to achieve a uniform distribution of the bonding material 95 within the bonding surface of the IC chip 91, thereby allowing adhesion to be improved, so that reliability of bonding and sealing can be enhanced.

In the above-described first to ninth embodiments, even in a case where the bonding material contains electrically conductive materials or inorganic fillers, flow of the resin is uniformized within the bonding surface of the IC chip by dummy bump(s) during compression bonding, so that the conductive materials, or the inorganic fillers can be disposed uniformly, thereby allowing quality and reliability to be stabilized. Conversely, without the dummy bump(s), in a resin having inorganic fillers added thereto, nonuniform flow of the resin during the compression bonding would cause the inorganic fillers to become denser or sparser, making it more likely that quality deterioration occurs due to partial differences in physical properties of the resin in some cases. In a resin having electrically conductive materials added thereto, nonuniform flow of the resin during the compression bonding would cause the electrically conductive materials to become denser or sparser, which might cause partial short-circuits in some cases.

Also, in the above-described first to ninth embodiments, for the bumps 2, 12, 22, 32, 42, 52, 62, 82, 92, in addition to the method of preliminarily leveling the bumps into uniform height before putting the bumps into contact with individual electrodes of the circuit board, also adoptable is a mounting method of the so-called non-stud bump (NSD) type in which the bumps are not preliminarily leveled but put into contact with the individual electrodes of the circuit board and leveling is performed by the electrodes. This non-stud bump (NSD) type mounting method is explained below.

A mounting method of an IC chip (typically denoted by 401, hereinafter) onto a circuit board (typically denoted by 406, hereinafter) in each of the foregoing embodiments is described with reference to FIGS. 27A to 31C.

Figure 27A:
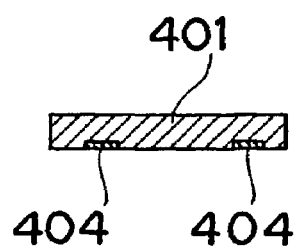
FIGS. 27A, 27B, 27C, 27D and 27E are respectively explanatory views showing a case where a non-stud bump (NSD) type mounting method is specified as one example of IC chip mounting methods in the above embodiments.
Figure 30A:
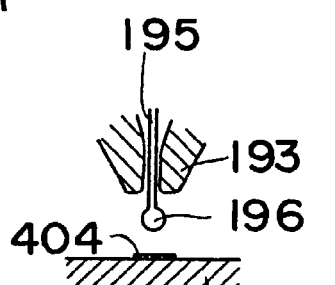
FIGS. 30A, 30B, 30C, 30D, 30E, 30F and 30G are respectively explanatory views showing steps of forming bumps of an IC chip using a wire bonder in the mounting method according to the above embodiments.
Figure 30B:
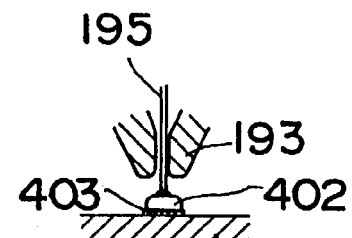
Figure 30C:
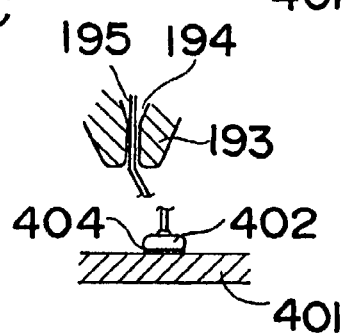
Figure 30D:
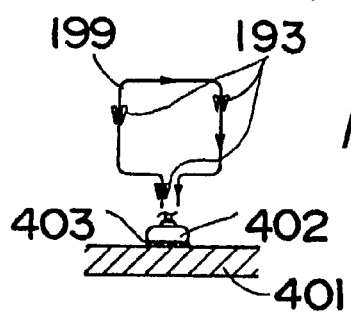
Figure 30E:
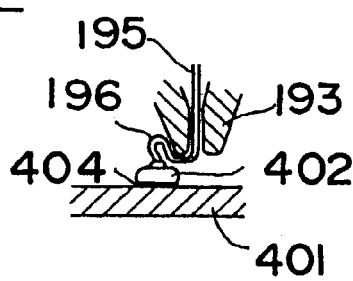
Figure 30G:
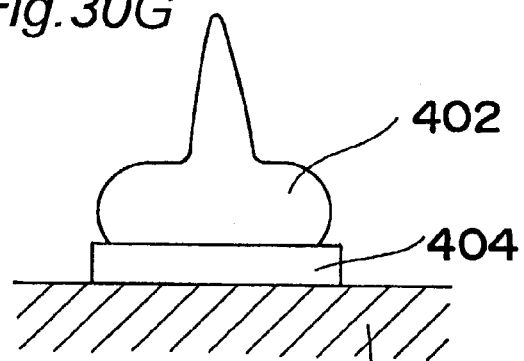
Figure 30F:
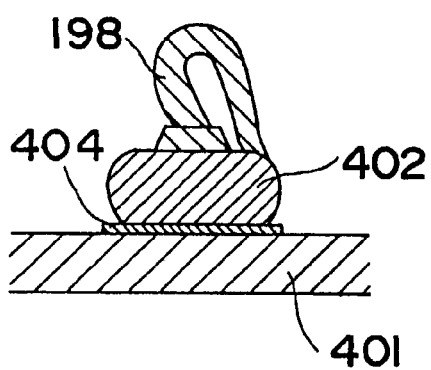

With regard to the IC chip 401 of FIG. 27A, bumps (projection electrodes) (typically denoted by 402, hereinafter) are formed on Al pad electrodes (typically denoted by 404, hereinafter) of the IC chip 401 by wire bonding equipment through operations as shown in FIGS. 30A to 30F. More specifically, in FIG. 30A, a ball 196 is formed at a lower end of a wire 195 protruding from a holder 193. In FIG. 30B, the holder 193 holding the wire 195 is moved down, so that the ball 193 is bonded to the electrode 404 of the IC chip 401 to form a shape of a bump 402 generally. In FIG. 30C, while the wire 195 is being fed downward, the holder 193 starts to move up. The holder 193 is moved in a generally quadrilateral loop 199 as shown in FIG. 30D, so that a curved portion 198 is formed on top of the bump 402 as shown in FIG. 30E, followed by tearing off the wire, by which a bump 402 as shown in FIG. 30F is formed. Otherwise, it is also possible that the wire 195 is clamped by the holder 193 in FIG. 30B, then pulled up by moving up the holder 193, so that the wire 195 is torn off, thereby forming a shape of the bump 402 as shown in FIG. 30G. A state that the bumps 402 are formed at individual electrodes 404 of the IC chip 401 as described above is shown in FIG. 27B. As an example, the dummy bumps are formed in the same way as the bumps 402.

Figure 27C:
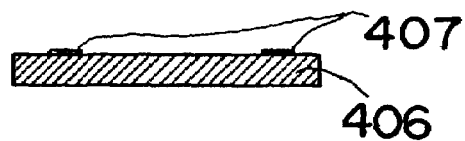
Figure 27B:
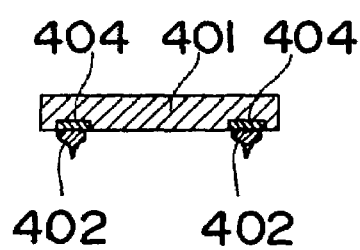
Figure 27D:
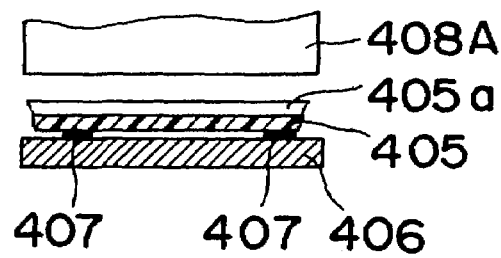

Next, on electrodes 407 of the circuit board 406 shown in FIG. 27C, is placed a thermosetting resin sheet (typically denoted by 405, hereinafter) as an example of bonding material cut into a size slightly larger than a size of the IC chip 401 as shown in FIG. 27D. Then, by a sticking tool 408A heated to, for example, 80 to 120° C., the thermosetting resin sheet 405 as a concrete example of the bonding material is stuck onto the electrodes 407 of the board 406 with a pressure of, for example, about 49 to 98 N (5-10 kgf/cm$^2$). Subsequently, a separator 405a removably disposed on one side of the thermosetting resin sheet 405 facing the tool 408A is separated from the sheet, where a preparation step of the board 406 is completed. This separator 405a is to prevent the thermosetting resin sheet 405 from sticking to the tool 408A. In this case, the thermosetting resin sheet 405 is preferably provided by those which contain silica or other inorganic fillers (e.g., epoxy resin, phenol resin, polyimide, and the like) or which do not contain any inorganic filler (e.g., epoxy resin, phenol resin, polyimide, and the like) and moreover which have such a thermal resistance as to withstand high temperatures during a later reflow step (e.g., such a thermal resistance as to withstand 240° C. for 10 seconds).

Figure 27E:
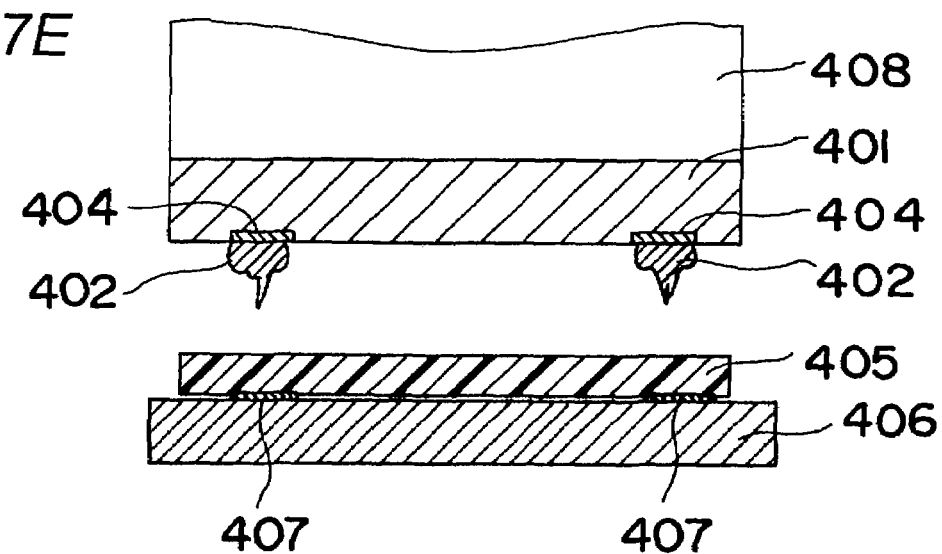
Figure 28F:
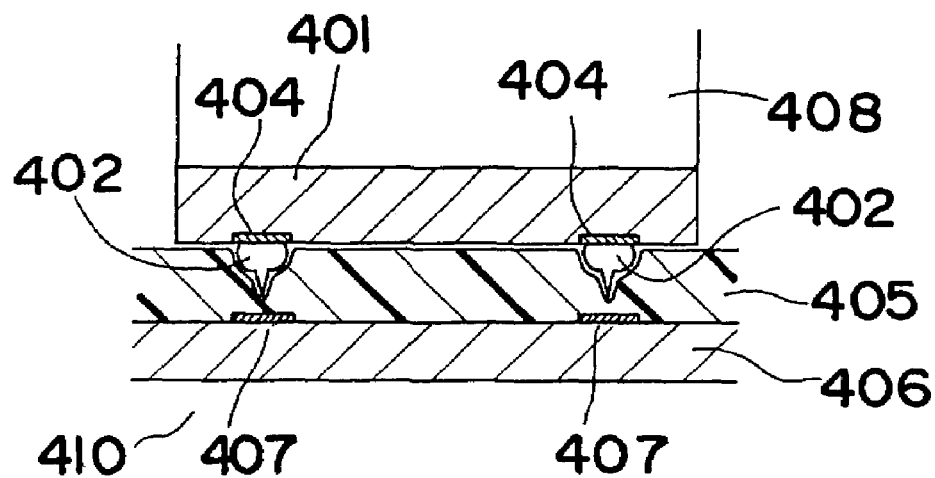
FIGS. 28F and 28G are respectively explanatory views showing the IC chip mounting method in the above embodiments, following FIG. 27E.
Figure 31A:
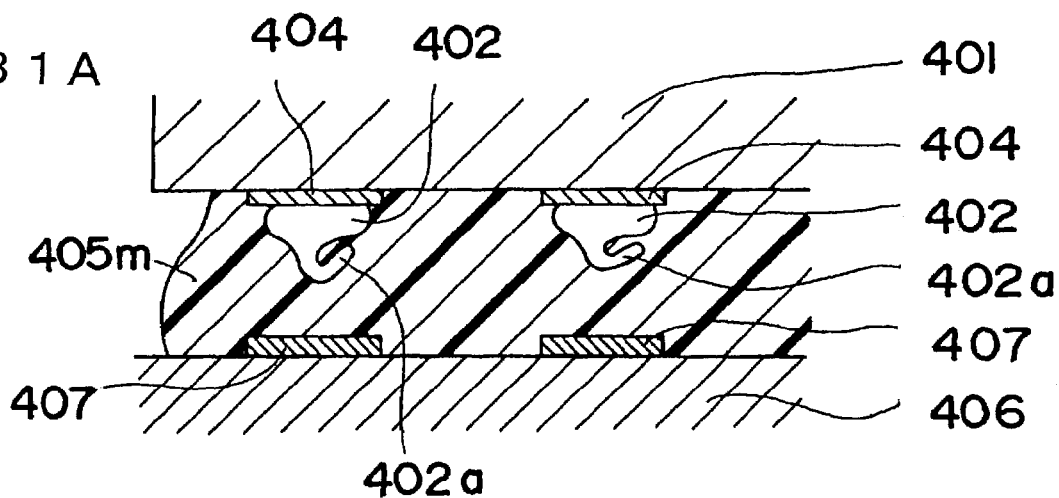
FIGS. 31A, 31B and 31C are respectively explanatory views showing a bonding step of the circuit board and the IC chip in the mounting method according to the above embodiments.
Figure 31B:
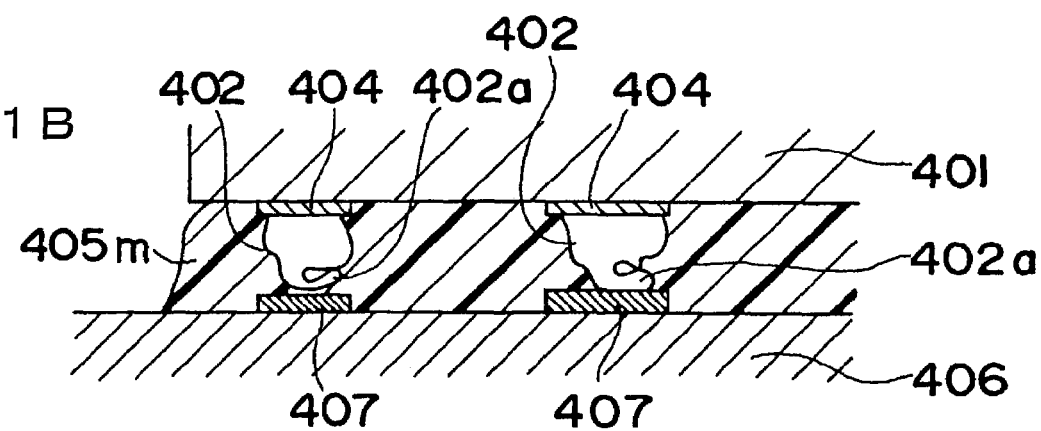
Figure 31C:
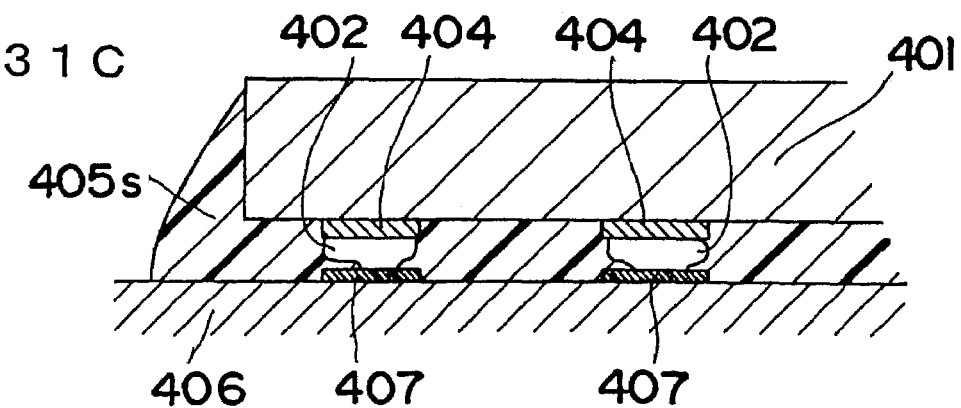
Figure 32A:
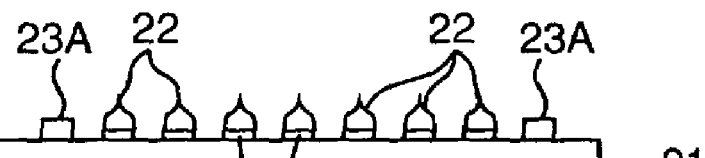
FIGS. 32A, 32B and 32C are respectively explanatory views for explaining steps of an electronic component mounting method according to a modification of the second embodiment of the present invention.
Figure 32B:
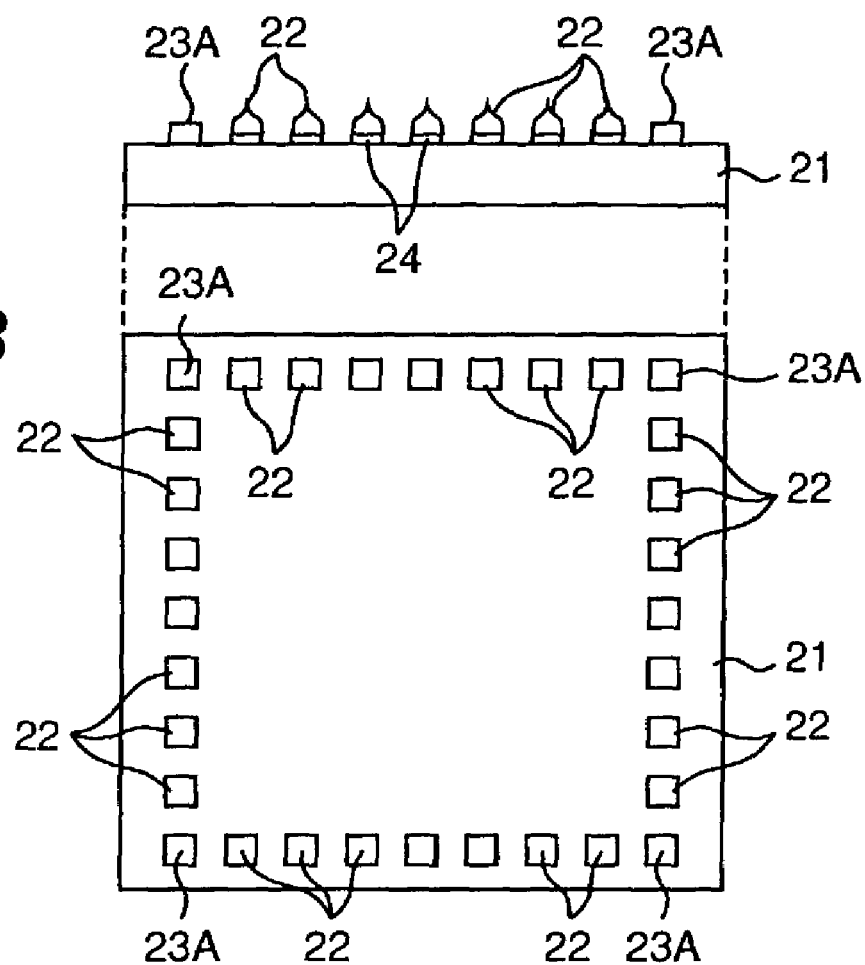
Figure 32C:
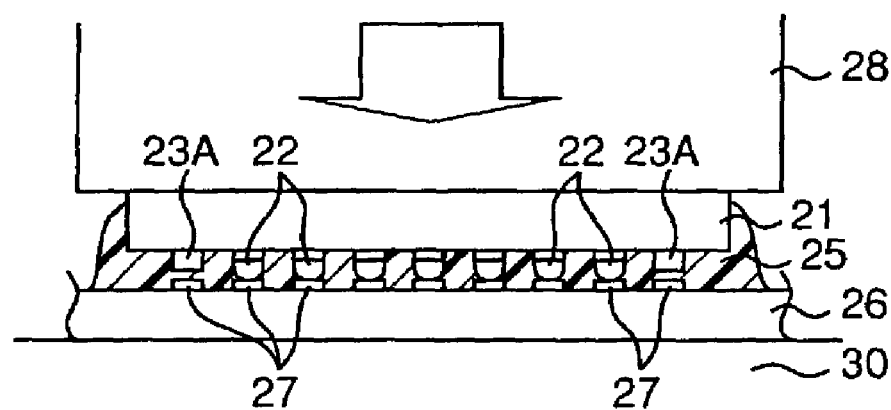
Figure 33:
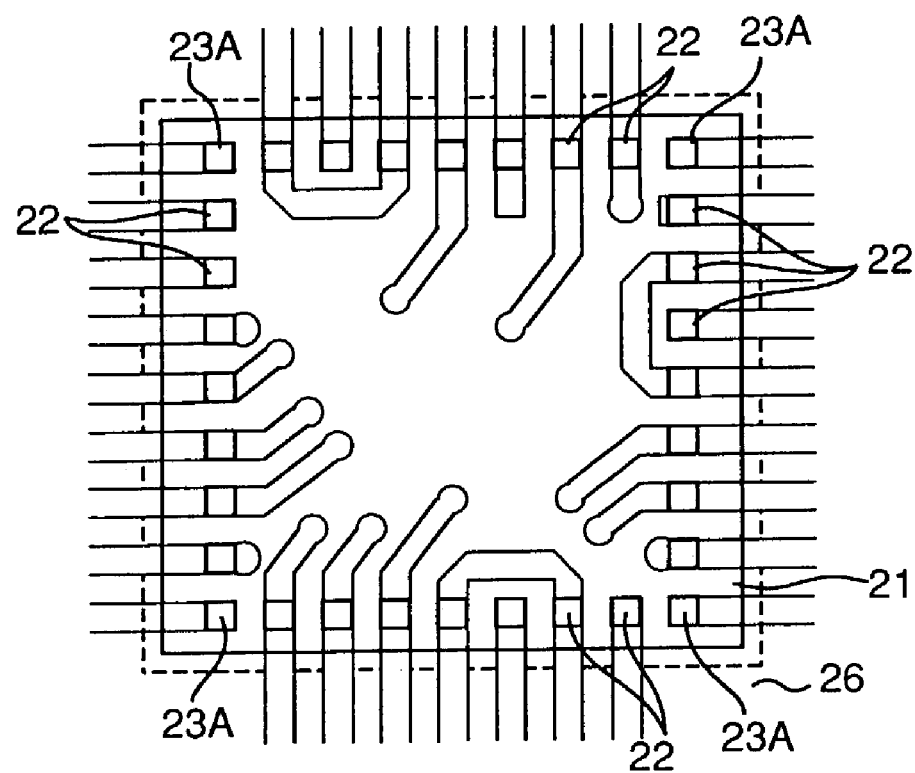
FIG. 33 is an explanatory view which explains steps of the electronic component mounting method according to the modification of the second embodiment of the present invention, following FIG. 5C, and which is a perspective plan view showing a flow state of a bonding material between an electronic component and a circuit board during mounting process of this electronic component mounting method.

Next, as shown in FIGS. 27E and 28F, the IC chip 401, on which the bumps 402 have been formed on the electrodes 404 in the preceding step, is positioned and then pressed onto the electrodes 407 of the board 406 prepared in the preceding step corresponding to the electrodes 404 of the IC chip 401, with a heated bonding tool 408. In this process, the bumps 402 are increasingly pressed at their head portions 402a on the electrodes 407 of the board 406 while being deformed as shown in FIGS. 31A to 31B, where a load to be applied to the bump 402 side via the IC chip 401, although differing depending on a diameter of the bumps 402, needs to be such a level that the head portions 402a of the bumps 402, which are bent so as to be overlapped, are necessarily deformed as shown in FIG. 31C. This load needs to be at least 196 mN (20 gf). An upper limit of the load is set to such a level that the IC chip 401, the bumps 402, the circuit board 406, and the like are not damaged. A maximum load, in some cases, may be over 980 mN (100 gf). It is noted that reference numerals 405m and 405s denote melting thermosetting resin resulting from melting of the thermosetting resin sheet 405 by heat of the bonding tool 408, and heat-cured resin after the melting, respectively.

In addition, the two steps comprising the positioning step for positioning the IC chip 401, on which the bumps 402 have been formed on the electrodes 404 in the preceding step, onto the electrodes 407 of the board 406 prepared in the preceding step corresponding to the electrodes 404 of the IC chip 401, with the bonding tool 408 heated by a built-in heater such as a ceramic heater or a pulse heater, and the step for performing a press-bonding process after positioning may be performed with one positioning and press-bonding device. However, it is yet also allowed to employ different devices, for example, to perform a positioning step by a positioning device and perform a press-bonding step by a bonding device with a view to improving productivity by simultaneously performing positioning work and press-bonding work for cases where a multiplicity of boards are continuously produced.

In this case, as an example, a glass-fabric laminated epoxy board (glass epoxy board), a glass-fabric laminated polyimide resin board, or the like is used the circuit board 406.

These boards 406 have undergone occurrence of warp or waviness caused by heat history, cutting, and machining, thus not being completely planar. Therefore, after warpage of the circuit board 406 is corrected as appropriate, heat of, for example, 140 to 230° C. is applied to the thermosetting resin sheet 405 interposed between the IC chip 401 and the circuit board 406 for, for example, a few to 20 seconds, by which the thermosetting resin sheet 405 is cured. In this process, at the beginning, the thermosetting resin forming the thermosetting resin sheet 405 flows and seals the IC chip 401 up to its edges. Also, because of its being a resin, the thermosetting resin, when heated, naturally softens in earlier stages, thereby yielding such a fluidity as flowing to the edges. Due to a volume of the thermosetting resin set larger than a volume of a space between the IC chip 401 and the circuit board, the thermosetting resin flows out of this space, and is thus enabled to produce a sealing effect. In this process, flow regulation is effected by the bonding-material flow regulating member of each of the foregoing embodiments, as appropriate.

Figure 28G:
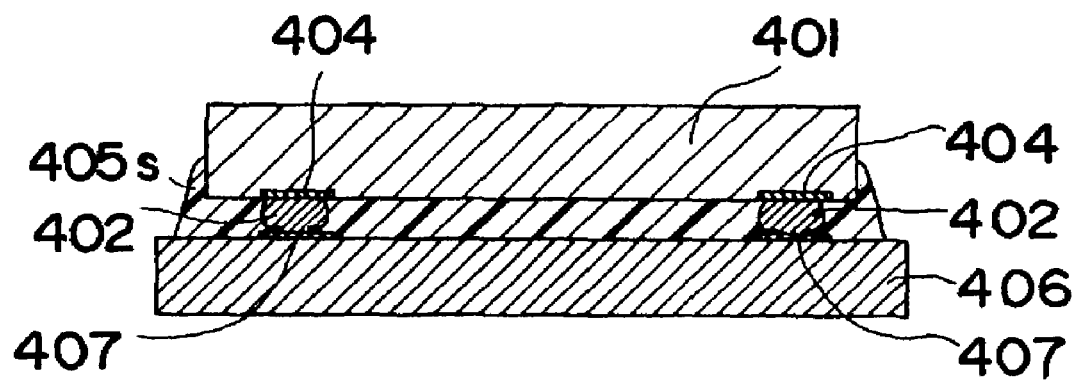

Thereafter, the heated bonding tool 408 is moved up, with a result that there is no heating source. Therefore, a temperature of the IC chip 401 and the thermosetting resin sheet 405 abruptly lowers, so that the thermosetting resin sheet 405 loses its fluidity, causing the IC chip 401 to be fixed onto the circuit board 406 by the cured thermosetting resin 405s as shown in FIG. 28G and FIG. 31C. Further, when the circuit board 406 side is preparatorily heated by a stage 410, it becomes allowable to set a lower temperature for the bonding tool 408.

Figure 29H:
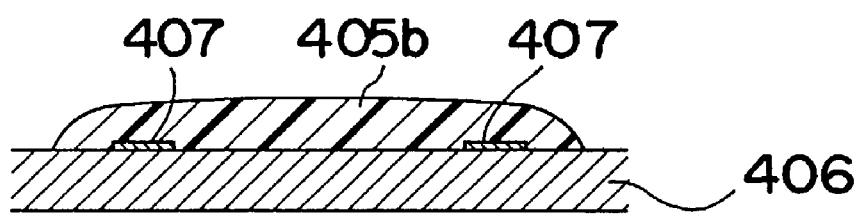
FIGS. 29H, 29I and 29J are respectively explanatory views showing the IC chip mounting method in the above embodiments, following FIG. 28G.

Furthermore, instead of sticking the thermosetting resin sheet 405, a thermosetting adhesive 405b may be applied by dispensing or the like, or printed, or transferred onto the circuit board 406 as shown in FIG. 29H. When the thermosetting adhesive 405b is used, basically, the same steps as those with the thermosetting resin sheet 405 being used are performed. When the thermosetting resin sheet 405 is used, there are such advantages as ease of handling by virtue of its being a solid, and moreover a capability of being formed of high molecules by virtue of its including no liquid components, so that the thermosetting resin sheet 405 can easily be formed so as to have a high glass transition point. In contrast to this, when the thermosetting adhesive 405b is used, the thermosetting adhesive 405b can be applied, printed, or transferred to an arbitrary position of the circuit board 406 and be of an arbitrary size.

Also, anisotropic conductive film (ACF) may be used instead of thermosetting resin, and further, more preferably, using conductive particles of gold-plated nickel powder as conductive particles contained in the anisotropic conductive film allows a connection resistance values between the electrodes 407 and the bumps 402 to be lowered.

Figure 29I:
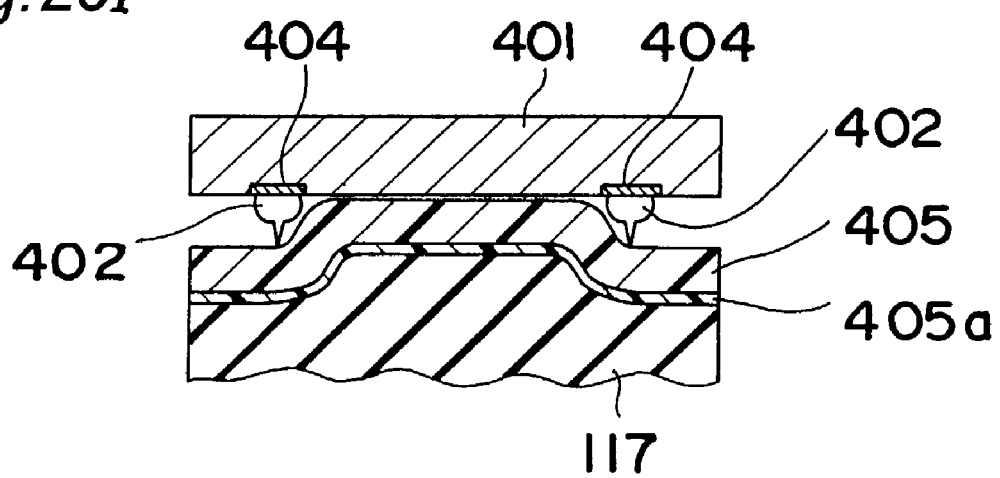
Figure 29J:
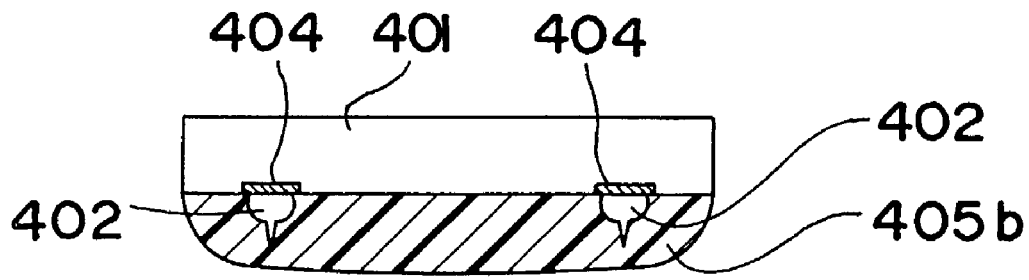

In addition, in FIGS. 27A to 27G, it has been described that the thermosetting resin sheet 405 is formed on the circuit board 406 side. In FIG. 29H, it has been described that the thermosetting adhesive 405b is formed on the circuit board 406 side. However, this is not limitative, and the thermosetting adhesive 405b may also be formed on the IC chip 401 side as shown in FIG. 29I or FIG. 29J. In this case, particularly with use of the thermosetting resin sheet 405, it is allowable to press the IC chip 401 against a rubber or other elastic member 117 together with a separator 405a which is removably disposed on the circuit board side of the thermosetting resin sheet 405 so that the thermosetting resin sheet 405 is stuck to the IC chip 401 along a configuration of the bumps 402.

In such a non-stud bump (NSD) type mounting method, since top end portions of the bumps are crushed on the electrodes of the circuit board, respectively, a quantity of pushing the IC chip inward (pressurization extent) against the circuit board is increased. Then, power for driving the bonding material into a flow toward the peripheral portions of the bonding surface of the IC chip is increased, so that a flow regulation function for the bonding material by the dummy bumps acts more effectively, where a regulation effect is even larger in the NSB (non-stud bump) method.

As an example, in the non-stud bump (NSD) type mounting method, when the bumps having a diameter of, for example, 75 µm are crushed by being pressed against electrodes of a circuit board for obtainment of their electrical bonding, the bumps are crushed so as to be shortened by 35 µm in their height. In this process, since pressing the IC chip toward the circuit board would cause the bonding material to be largely pushed out from therebetween, outflow of the bonding material is regulated by the bonding-material flow regulating member, by which the bonding material can effectively be prevented from lowering in density in a central portion of the IC chip. Thus, in the non-stud bump type mounting method like this, suppression power for the outflow of the bonding material can largely be expected.

In addition, in the first to fifth embodiments, indeed the bumps and the dummy bumps are preferably identical in configuration with each other with a view toward performing a generally uniform flow regulation of the bonding material. However, this is not limitative, and the bumps and the dummy bumps may be formed into different configurations or heights within permissible ranges. Also, the bumps and the dummy bumps may be different in material.

Also, in the first to fifth embodiments, description has been made primarily of a case where the intervals between bump and bump, or the intervals between bump and dummy bump, or the intervals between dummy bump and dummy bump are generally uniform. However, this is not limitative, and the intervals may be nonuniform within a permissible range. In this case, the dummy bumps are disposed at portions outside the permissible range.

This embodiment has been described on an example where as the bonding-material flow regulating member, the dummy bumps are formed on the electrodes of the IC chip. However, this is not limitative, and it is also possible that dummy-bump-like protruding portions 23A generally equal in height to the dummy bumps are formed directly on the IC chip by printing or dispensing of resin paste or the like as shown in FIGS. 32A, 32B, 32C and 33.

Further, although the bumps are formed on the electrodes of the bonding surface of the electronic component, convex-shaped electrodes may be formed instead of the bumps on the electrodes of the bonding surface of the electronic component so as to be projecting therefrom.

In addition, in the sixth to ninth embodiments, the passivation film and the auxiliary passivation film are preferably made generally equal in thickness to obtain a generally uniform flow speed of the bonding material. However, this is not limitative, and it is also possible that those films may be different in thickness within a permissible range. Besides, the passivation film and the auxiliary passivation film may be made different in material from each other, and moreover each film may be made multilayered without being limited to a single layer.

In the sixth to ninth embodiments, as the bonding-material flow regulating member, a singularity or plurality of layers of a film having a function other than that of the auxiliary passivation film may be formed instead of the auxiliary passivation film.

Also, with the arrangement of the bonding-material flow regulating member, for example, dummy bumps or an auxiliary passivation film, the bonding material that overflows from between the IC chip and the board to swell on the side faces of the IC chip during a process of bonding of the IC chip and the board will be subject to a flow regulation or flow-speed uprise regulation by the bonding-material flow regulating member. That is, the bonding material overflowing from between the IC chip and the board is subject to a flow regulation or flow-speed uprise regulation of a similarity common to portions where the bonding-material flow regulating member is disposed and portions where the bumps or passivation film is disposed. Therefore, fillets which are swollen portions against the side faces of the IC chip can be increased, so that the side faces of the IC chip can be swollen so as to be covered to about a half of their thickness from the board side. More specifically, in a conventional case, although the bonding material is subject to flow regulation or flow-speed uprise regulation at portions where the bumps or passivation film are disposed, the bonding material is not subject to such a regulation at portions where the bumps or passivation film are not disposed, so that the fillets could not be made large, where, for example, given a thickness of 0.4 mm of the IC chip, up to only about 0.1 mm of fillets could be formed. However, in the foregoing embodiments, by the subjection to the regulation as described above, for example, given a thickness of 0.4 mm of the IC chip, fillets are formed to a height of 0.2 to 0.3 mm, thus making it possible to enlarge the fillets. Consequently, when the fillets are small, moisture intrusion paths would more likely be formed at an interface between the IC chip and the bonding material or between the board and the bonding material, and moreover the paths would be short in length, poor in moisture-resistance reliability, and weak against warpage of the board during a heat cycle. However, as a result of enlarged fillets, moisture intrusion paths would hardly be formed at the interface between the IC chip and the bonding material or between the board and the bonding material, and moreover those paths can be elongated, becoming better in terms of moisture resistance reliability and additionally strong against warpage of the board due to heat during the heat cycle of, for example, −65° C. to 150° C.

Next, in contrast to improvements primarily on the electronic component side in the first to ninth embodiments, improvements on the circuit formation article side are described.

That is, conventionally, it is practiced that bumps formed on electrodes of a bonding surface of a quadrilateral IC chip are brought into contact with electrodes of a circuit board while a bonding material is disposed between the IC chip and the circuit board, by which the IC chip is bonded and held on the circuit board with the bonding material.

However, with the above structure, at portions where the bonding material would flow out nonuniformly in an IC-chip bonding region of a circuit board to which a quadrilateral IC chip is to be bonded, for example, at large array gaps between the electrodes or at gaps of corner portions where electrodes are not arrayed in a case where the electrodes are arrayed on side portions of the quadrilateral shape, or at other like portions, the bonding material sandwiched between the IC chip and the circuit board would flow out nonuniformly to peripheral portions of the IC-chip bonding region of the circuit board through the aforementioned gaps between the electrodes of the circuit board during a process of bonding the IC chip to the circuit board via the bonding material. This would cause the bonding material to easily become sparser in density at central portions of the IC-chip bonding region, so that bonding power and sealing power might be lowered.

Accordingly, an object of a tenth and following embodiments of the present invention is to solve the above-described issues and to provide electronic component mounting methods, as well as an electronic component-mounted unit, capable of achieving a uniform distribution of a bonding material in an electronic-component bonding region of a circuit formation article during bonding of the electronic component and the circuit formation article, and thus enhancing reliability of bonding and sealing.

Hereinbelow, the tenth and following embodiments according to the present invention are explained in detail with reference to the accompanying drawings. Although respective bumps and dummy bumps are represented by quadrilateral shapes in each plan view for simplification, the shapes are actually not limited to these shapes.

It is noted here that the term, circuit formation article, herein refers to an object on which a circuit(s) is formed, including a circuit board such as a resin board, paper-phenol board, ceramic board, film board, glass-epoxy board, or film substrate, a circuit board such as a single-layer board or multilayer board, and a component part, casing, frame, or the like.

Tenth Embodiment

Figure 34A:
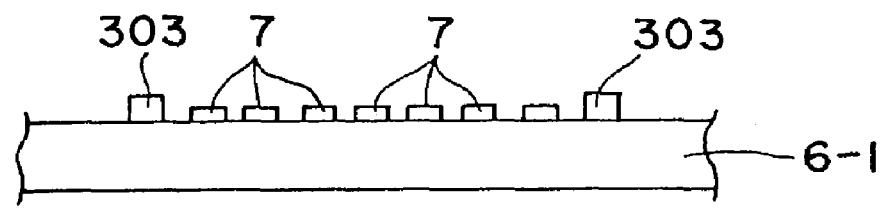
FIGS. 34A and 34B are a side view and a plan view, respectively, of a circuit board prior to a bonding step of an IC chip mounting method according to a tenth embodiment of the present invention.
Figure 34B:
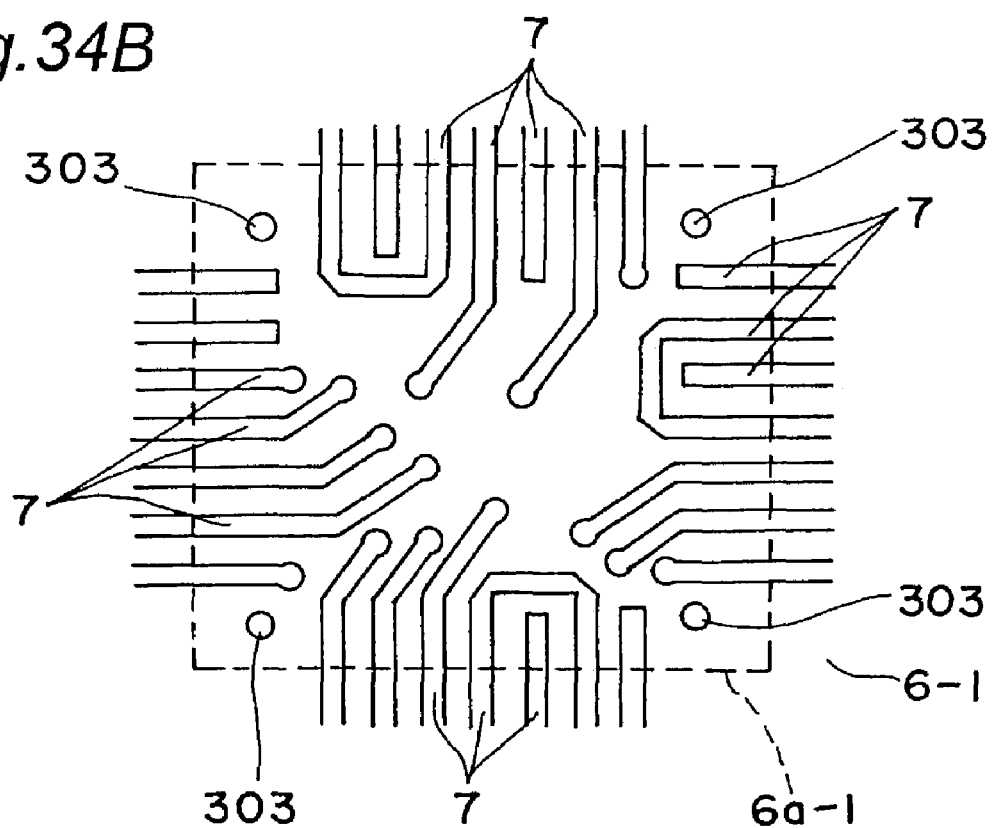
Figure 35A:
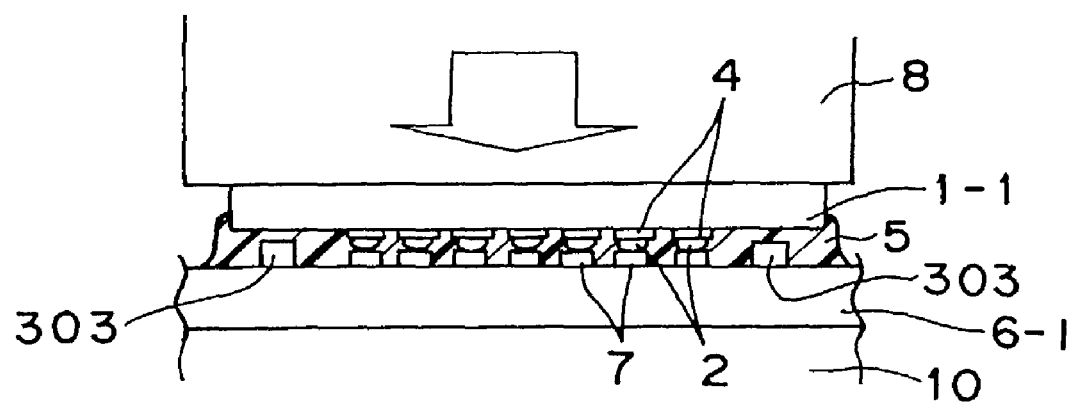
FIGS. 35A and 35B are a partial cross-sectional side view of an IC chip, a circuit board, and a bonding material during a compression-bonding step of the IC chip mounting method according to the tenth embodiment and a plan view showing movement of the bonding material on the circuit board by seeing through the IC chip, respectively.
Figure 35B:
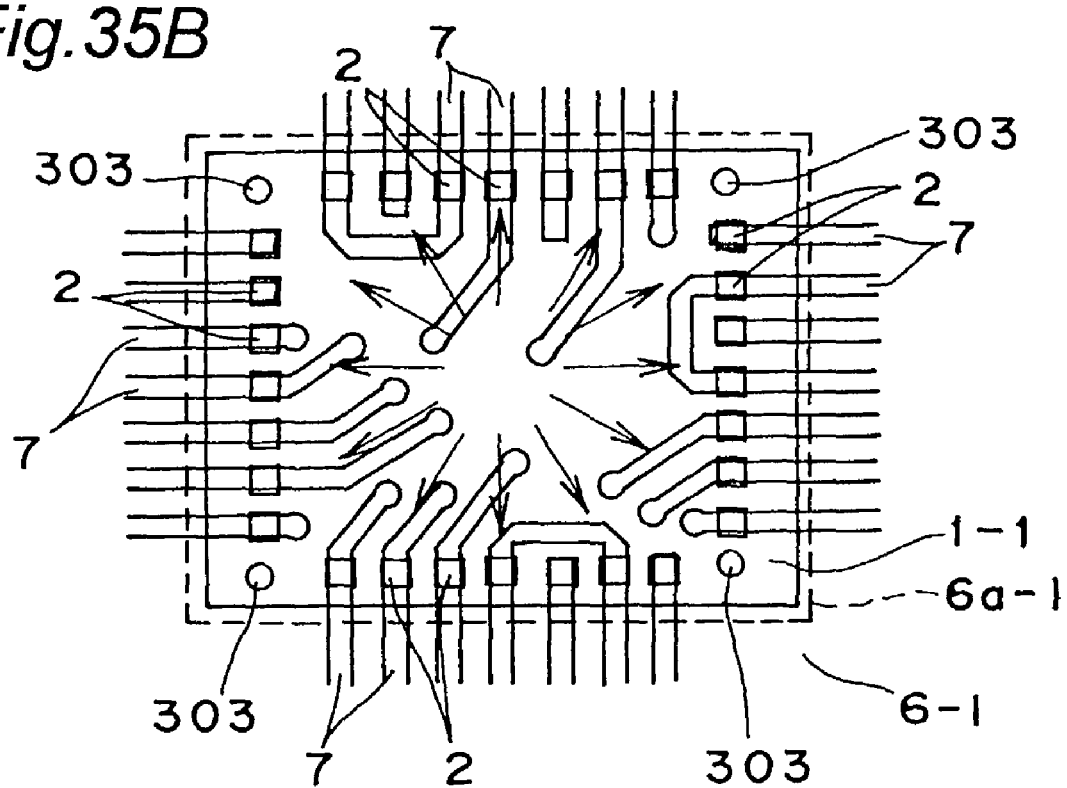
Figure 36:
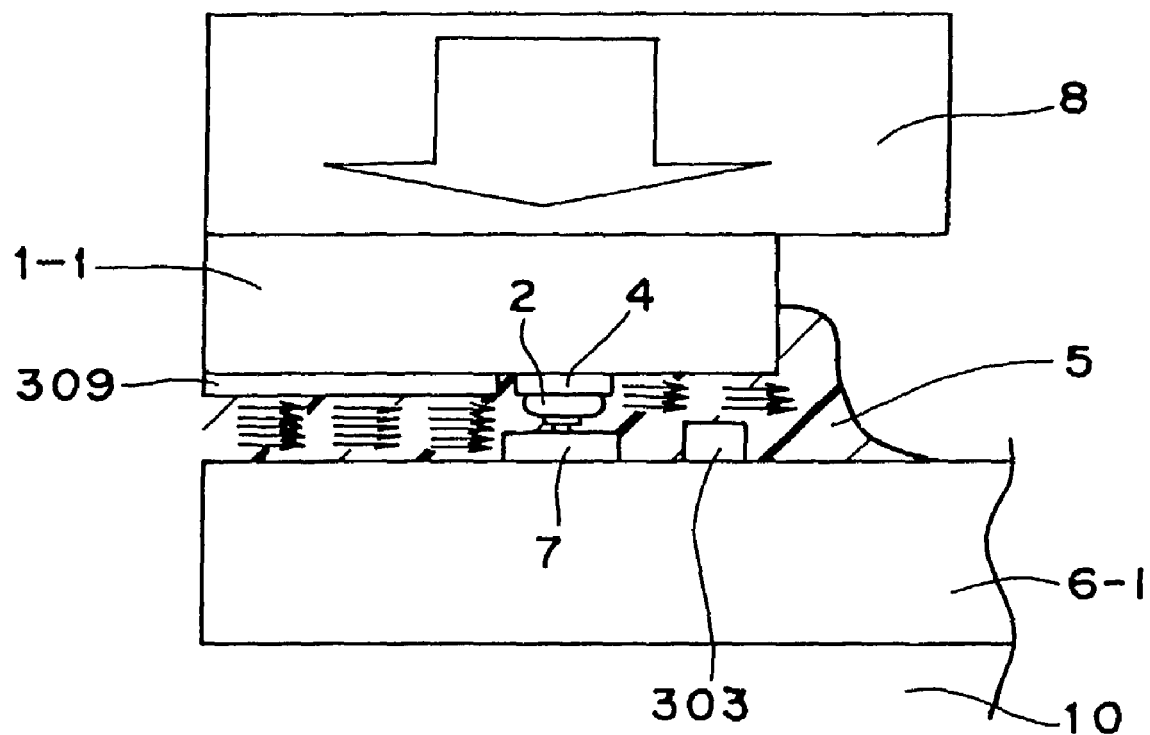
FIG. 36 is a partially enlarged and partially cross-sectional side view of the IC chip, the circuit board, and the bonding material during the compression-bonding step of the IC chip mounting method according to the tenth embodiment.
Figure 37A:
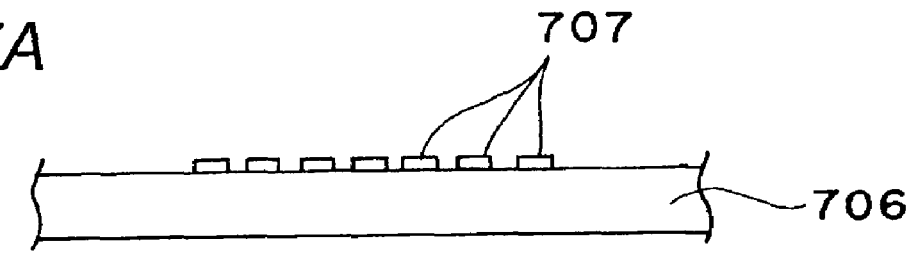
FIGS. 37A and 37B are a side view and a plan view, respectively, of a circuit board prior to a bonding step of an IC chip mounting method according to a prior art example for explaining the tenth embodiment of the present invention.
Figure 37B:
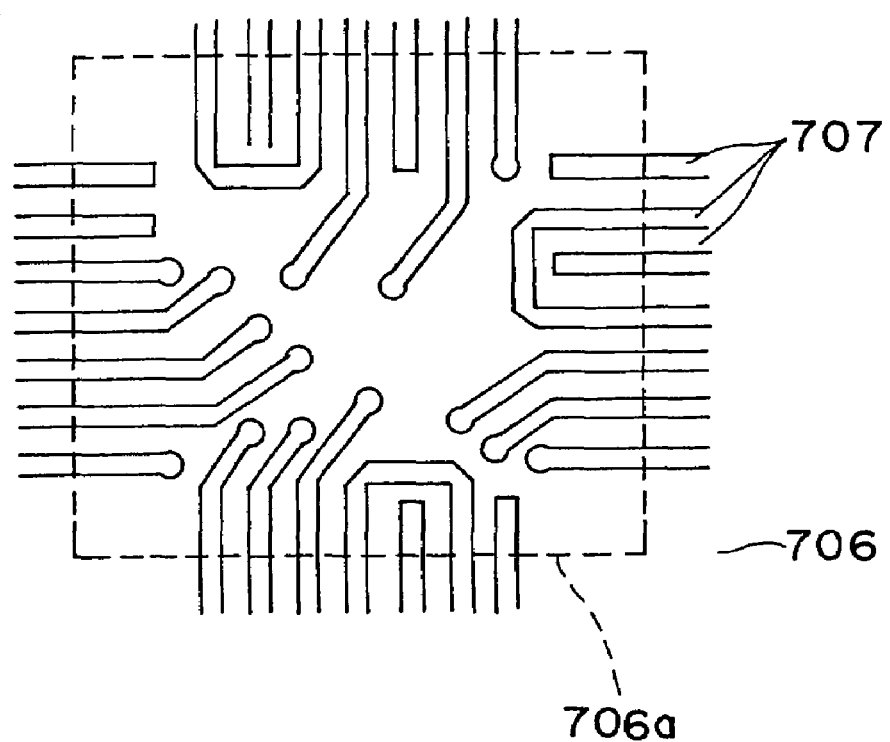
Figure 38A:
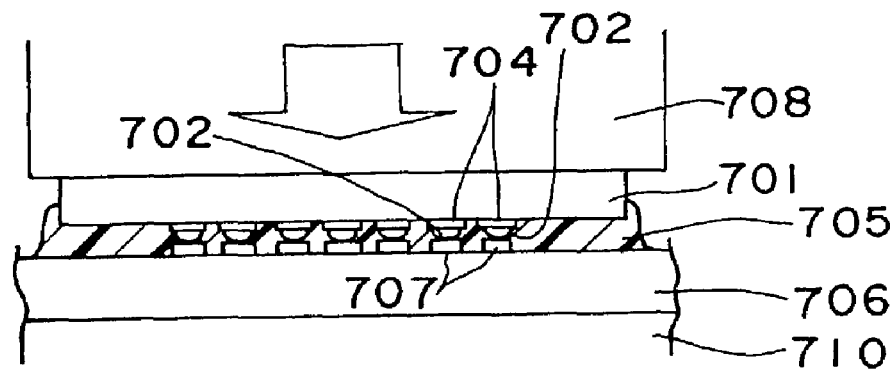
FIGS. 38A and 38B are a partial cross-sectional side view of an IC chip, the circuit board, and a bonding material during the compression-bonding step of the IC chip mounting method according to the prior art example, following FIG. 37B, and a plan view showing movement of the bonding material on the circuit board by seeing through the IC chip, respectively.
Figure 38B:
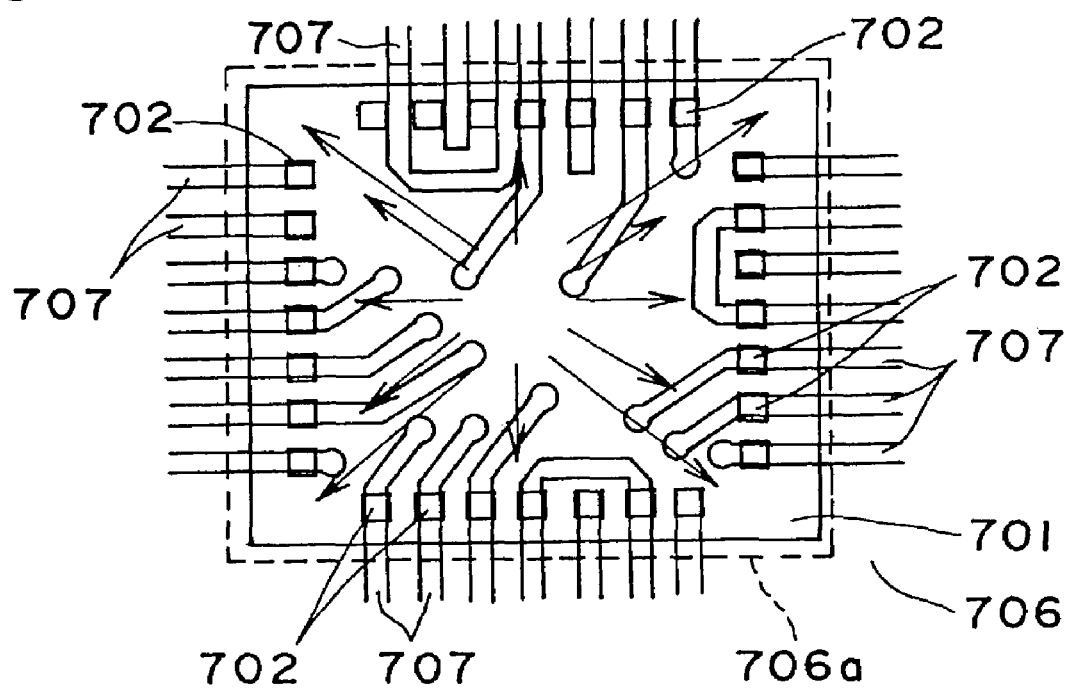
Figure 39:
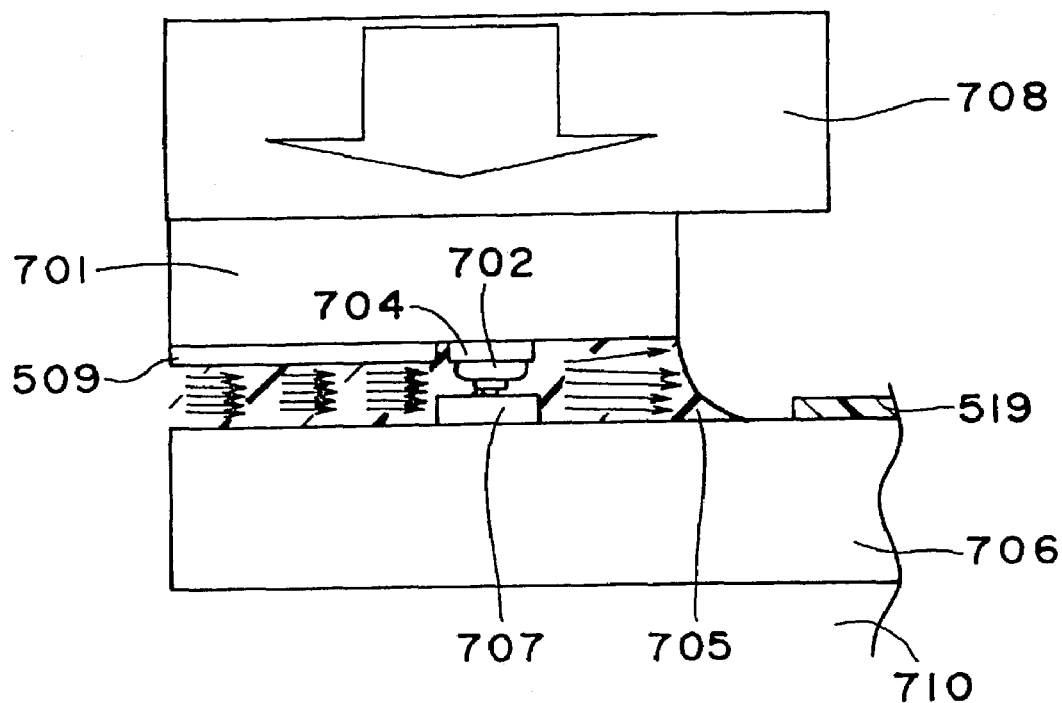
FIG. 39 is a partially enlarged and partial cross-sectional side view of the IC chip, the circuit board, and the bonding material during the compression-bonding step of the IC chip mounting method according to the prior art example, following FIG. 38B.

An IC chip mounting method and an IC chip-mounted unit manufactured by the method as an example of an electronic component mounting method and an electronic component-mounted unit manufactured by the method according to a tenth embodiment of the present invention are explained with reference to FIGS. 34A to FIG. 39. FIGS. 34A and 34B are a side view and a plan view of a circuit board prior to a bonding step of an IC chip mounting method according to the tenth embodiment. FIGS. 35A and 35B are a partial cross-sectional side view of the IC chip, a circuit board, and a bonding material during a compression-bonding step and a plan view showing movement of the bonding material on the circuit board by seeing through the IC chip. FIG. 36 is a partially enlarged partial cross-sectional side view of the IC chip, the circuit board, and the bonding material during the compression-bonding step. FIGS. 37A and 37B are a side view and a plan view of the circuit board prior to a bonding step of an IC chip mounting method according to a prior art example for explaining the tenth embodiment. FIGS. 38A and 38B are a partial cross-sectional side view of the IC chip, the circuit board, and the bonding material during a compression-bonding step according to the prior art example of FIGS. 37A and 37B, and a plan view showing movement of the bonding material on the circuit board by seeing through the IC chip. FIG. 39 is a partially enlarged partial cross-sectional side view of the IC chip, the circuit board, and the bonding material during the compression-bonding step according to the prior art example of FIGS. 37A and 37B.

In the tenth embodiment, as shown in FIGS. 34A and 34B, in a case where a square IC chip as an example of the electronic component to be bonded to a square IC chip bonding region 6a-1 of a circuit board 6-1, as an example the circuit formation article, has an array of bumps 2, 2 in each of the vicinities of side-verge portions of the four sides except the vicinities of its four corner portions, dummy electrodes 303 as projective portions which are one example of a bonding-material flow regulating member are formed in the vicinities of individual four corner portions of the IC chip bonding region 6a-1 of the circuit board 6-1, i.e., at portions of the IC chip 1-1 corresponding to the portions where bumps 2 are originally absent, so that flow of a bonding material 5 is regulated by the dummy electrodes 303.

It is noted here that the term, IC chip bonding region, herein refer to a region on a circuit board to which an IC chip is to be bonded, the region being identical in configuration to or slightly larger than the IC chip.

Conventionally, as shown in FIGS. 37A and 37B, it is assumed that electrodes 707, . . . , 707 are generally equidistantly arrayed on electrodes 704, . . . , 704 each in one array in each of the vicinities of side-verge portions of individual sides of a square IC chip bonding region 706a of a circuit board 706, while no electrodes 707 are present in each of the vicinities of individual four corner portions of the IC chip bonding region 706a of the circuit board 706. In a state that the electrodes 707, . . . , 707 are disposed on the IC chip 701 as shown above, bonding material 705 is fed to the circuit board 706, and then bumps 702 on the electrodes 704 of the IC chip 701 and electrodes 707 of the circuit board 706 are bonded together so as to be brought into electrical contact with each other via the bonding material 705 interposed between the bonding surface of the IC chip 701, on which the bumps 702 are formed on the electrodes 707 of the IC chip bonding region 706a of the circuit board 706, and the circuit board 706. By placing the circuit board 706 on a base 710, and bringing a heated pressurizing member 708 into contact with the IC chip 701 and applying pressure thereto, the IC chip 701 is compression-bonded in a heated and pressurized state, so that the bonding material 705 between the bonding surface of the IC chip 701 and the IC chip bonding region 706a of the circuit board 706 is cured. In such a case, with respect to the bonding material 705 interposed between the IC chip 701 and the circuit board 706 in performing final compression-bonding under heating by a heater, in a central portion of the IC chip bonding region 706a of the board 706, a flow speed at which the bonding material 705 flows between an SiN passivation film 509 formed on the bonding surface of the IC chip 701 and the IC chip bonding region 706a of the circuit board 706 is represented by SP1. On the other hand, in peripheral portions of the IC chip bonding region 706a of the board 706, a flow speed at which the bonding material 705 flows between Au plating of electrode surfaces of the IC chip bonding region 706a of the board 706 and the IC chip 701 is represented by SP2. Then, the flow speed SP2 in the peripheral portions of the IC chip bonding region 706a would be larger than the flow speed SP1 in the central portion of the IC chip bonding region 706a, and moreover the bonding material 705 would flow out along the board outward of the IC chip bonding region 706a at a higher flow speed from positions where the electrodes 707 are lacking, i.e. from the individual corner-portion vicinities 703, than from the peripheral portions of the IC chip bonding region 706a of the board 706, particularly than from the side-verge vicinities where the generally equidistantly arrayed electrodes 707, . . . , 707 are disposed. As a result, the bonding material 705 would lower in density, causing an insufficiency of a quantity of resin for sealing the side faces of the IC chip 701 as well as a decrease of a size of fillets for sealing the side faces of the IC chip 701, which might lead to occurrence of peeling between the IC chip 701 and the bonding material 705 in the peripheral portions of the IC chip bonding region, or occurrence of peeling between the electrodes 707 of the circuit board 706 and the bonding material 705.

Figure 79:
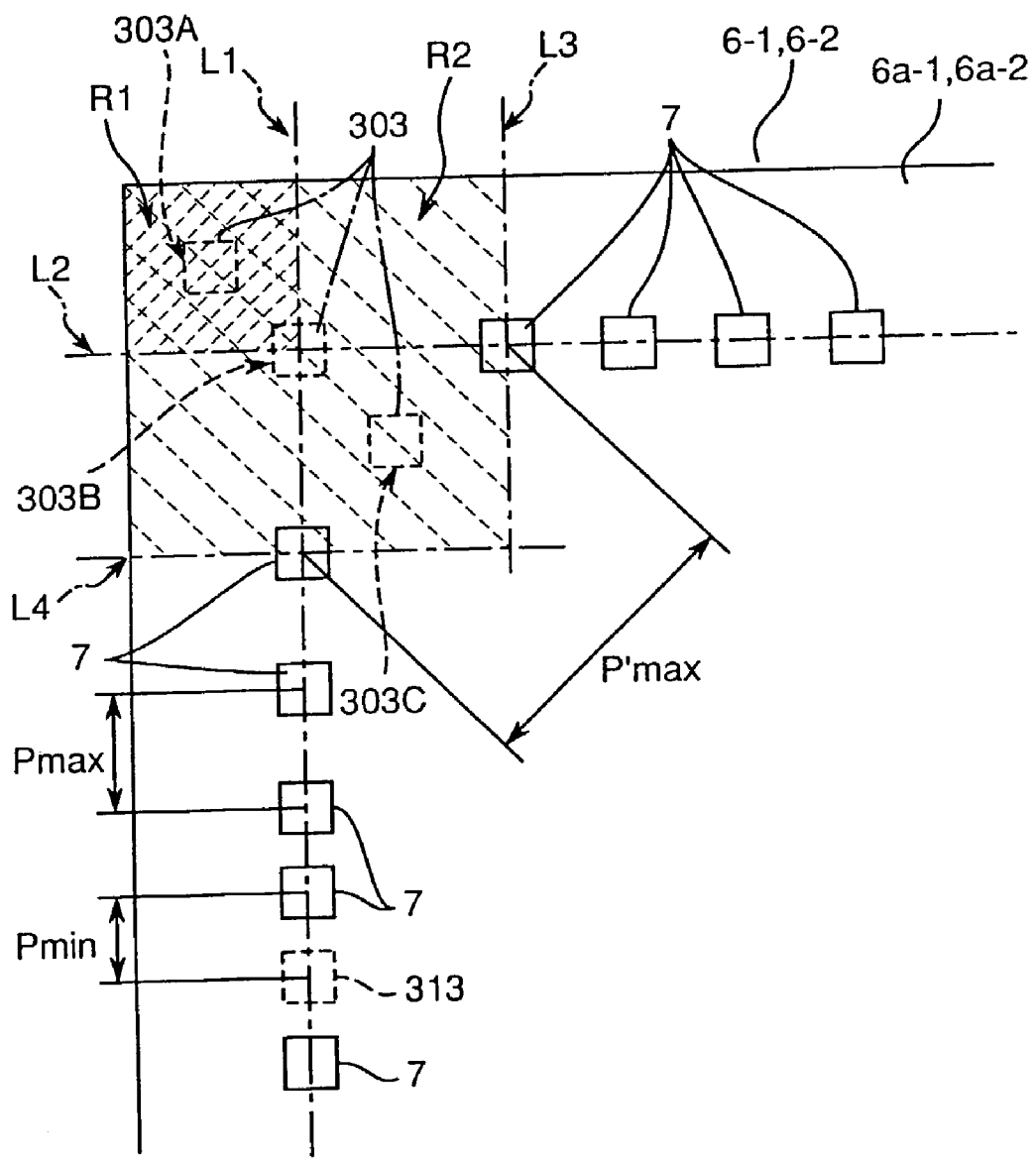
FIG. 79 is an explanatory view for explaining sites at which dummy bumps are disposed in the above embodiments.

In order to prevent such occurrence of peeling, in the tenth embodiment, prior to a bonding material feeding step, as shown in FIGS. 34A and 34B, a singularity or plurality of dummy electrodes 303 are disposed in the vicinities of individual corner portions of the square IC chip 1-1 where the electrodes 7 are absent. In this connection, the expression that a singularity or plurality of dummy electrodes 303 are disposed in the vicinities of corner portions means that when extension lines L1 and L2 of array lines of the electrodes 7, . . . , 7 in the vicinities of side verges of the bonding surface of the IC chip 1-1 cross each other generally at 90° at a corner portion of the bonding surface of the IC chip 1-1 as shown in FIG. 79, the dummy bumps are disposed in a region R1 outside a crossing region as indicated by 303A and 303B or in a region R2 enclosed by reference lines L3 and L4, which pass the electrodes 7 closest to the corner portion in their respective array lines and cross perpendicularly to the extension lines L1 and L2, respectively, as indicated by 303A, 303B, and 303C. Consequently, an electrode 303 is present also in the vicinity of each corner portion of the square IC chip bonding region 6a-1 of the circuit board 6-1, resulting in a state that the electrodes 7, . . . , 7 or the dummy electrodes 303, . . . , 303 are arrayed generally uniformly in the vicinities of all the side verges and all the corner portions.

The dummy electrodes 303 are preferably formed by the same method as that for the electrodes 7, but may also be formed by other methods.

In a state that arrays of the electrodes 7, . . . , 7 or the dummy electrodes 303, . . . , 303 are formed in the vicinities of the individual side verges of the square IC chip bonding region 6a-1 of the circuit board 6-1 as described above, during the bonding material feeding step, a bonding material 5 containing at least an insulative thermosetting resin is fed to at least either one of the bonding region of the IC chip 1-1 or the IC chip bonding region 6a-1 of a circuit board 6-1. As a method of feeding the bonding material 5, when the bonding material 5 is a liquid, it is applied, and, when the bonding material 5 is a solid such as a sheet, it is placed or pasted.

Examples of the bonding material include anisotropic conductive paste, sealing resin paste, and so forth when it is a liquid, and sheet-like anisotropic conductive film, sealing resin film, and so forth when it is a solid.

Next, during the bonding step, the bonding surface of the IC chip 1-1 is laid on the IC chip bonding region 6a-1 of the circuit board 6-1 with the bonding material 5 interposed therebetween. Then, these members are so positioned that the bumps 2 on electrodes 4 of the IC chip 1-1 and the electrodes 7 of the circuit board 6-1 come into mutual electrical contact via the bonding material 5 interposed between the bonding surface of the IC chip 1-1, on which the bumps 2 are formed on the electrodes 4, respectively, and the IC chip bonding region 6a-1 of the circuit board 6-1. Thereafter, the two members are bonded together. This bonding step may be performed in a state that the circuit board 6-1 is placed on a base 10, or may be performed in two steps, i.e., a bonding step to be performed at a different place in a state that the IC chip 1-1 is laid on the circuit board 6-1 with the bonding material 5 interposed therebetween, and a final compression-bonding step to be subsequently performed in which the circuit board 6-1 having the IC chip 1-1 laid thereon with the bonding material 5 interposed therebetween is placed on the base 10.

Next, during a final compression-bonding step, a pressurizing member 8 is brought into contact with the IC chip 1-1, so that a pressurizing force acts from the pressurizing member 8 toward the base 10, on which the circuit board 6-1 having the IC chip 1-1 laid thereon with the bonding material 5 interposed therebetween is placed, and moreover heat of a heater contained in the pressurizing member 8 is transferred from the pressurizing member 8 to the IC chip 1-1. As a result of this, by a specified pressurizing force being exerted under application of a specified temperature, the bonding surface of the IC chip 1-1 is pressed against the IC chip bonding region 6a-1 of the circuit board 6-1, causing the bumps 2 on the individual electrodes 4 of the bonding surface of the IC chip 1-1 to come into contact with the individual electrodes 7 within the IC chip bonding region 6a-1 of the circuit board 6-1. In this state, the bonding material 5 between the bonding surface of the IC chip 1-1 and the IC chip bonding region 6a-1 of the circuit board 6-1 tends to be pressed out from a central portion toward peripheral portions of the bonding surface of the IC chip 1-1. In this connection, since the dummy electrodes 303 are disposed at positions where the electrodes 7 are lacking, i.e. vicinities of the corner portions, as described above, the electrodes 7, . . . , 7 and the dummy electrodes 303 are disposed generally equidistantly in the vicinities of the individual corner portions of the bonding surface of the IC chip 1-1, similar to the vicinities of side verges of all the sides. Therefore, flow of the bonding material 5 from the central portion toward the peripheral portions is regulated similarly in the vicinities of the side verges of the individual sides as well as in the vicinities of the individual corner portions as shown by arrows in FIG. 38B, so that the flow speed SP1 in the central portion of the IC chip bonding region 6a-1 of the board 6-1 and the flow speed SP2 in the peripheral portions of the IC chip bonding region 6a-1 of the board 6-1 become generally equal to each other. As a result, adhesion between the IC chip 1-1 and the bonding material 5 in the central portion and the peripheral portions of the IC chip bonding region 6a-1 is increased, and moreover adhesion between the electrodes 7 or dummy electrodes 313 of the board 6-1 and the bonding material 5 is increased, so that the peeling as described above can be prevented, and furthermore, the bonding material 5 is cured by heat, while being held generally uniformly distributed, over at least the entire IC chip bonding region 6a-1 of the circuit board 6-1, thereby achieving manufacture of an IC chip-mounted unit. That is, during this final compression-bonding step, nonuniform pressing out of the bonding material 5 from the central portion to the peripheral portions of the IC chip bonding region 6a-1 of the circuit board 6-1 during compression-bonding for the corner portions can be regulated by the dummy electrodes 303, . . . , 303 provided on the IC chip 1-1.

Height of the dummy electrodes 303 as an example of the bonding-material flow regulating member is preferably generally equal to a height of the electrodes 7. In addition, generally, electrode height of the board is 12 to 25 μm (including Au/Ni plating) as an example for multilayer boards, for example, ALIVH, glass epoxy boards made by Matsushita Electronic Components Co., Ltd., and 2 to 15 μm (including Au/Ni plating) as an example for ceramic boards. Also, the dummy electrodes 303 preferably have thermal resistance. As an example of thermal resistance, for example, thermal resistance means a property of withstanding heat at 200° C. for 20 seconds when a reflow step is unnecessary, or heat at 250° C. for about 10 seconds when a reflow step is performed.

Furthermore, the bonding material 5 is not limited to the one constituted by only an insulative thermosetting resin, but may contain an electrically conductive material containing electrically conductive particles or inorganic fillers in the insulative resin. Even in a case where the bonding material 5 contains electrically conductive materials or inorganic fillers, flow of the resin is uniformized within the bonding surface of the IC chip 1-1 by the bonding-material flow regulating member during compression bonding, so that the conductive materials or the inorganic fillers can be disposed uniformly. In contrast to this, without the bonding-material flow regulating member, in a resin having inorganic fillers added thereto, nonuniform flow of the resin during the compression bonding would cause the inorganic fillers to become denser or sparser, making it more likely that quality deterioration occurs due to partial differences in physical properties of the resin in some cases. In a resin having electrically conductive materials added thereto, nonuniform flow of the resin during compression bonding would cause the electrically conductive materials to become denser or sparser, which might cause partial short-circuits in some cases.

In the above description, it has been described that the bumps 2 of the IC chip 1-1 and the electrodes 7 of the circuit board 6-1 are brought into contact with each other, respectively, during the bonding step. However, this is not limitative, and it is also possible that the bumps 2 of the IC chip 1-1 and the electrodes 7 of the circuit board 6-1 are not brought into contact with each other, respectively, during the bonding step, but that the bumps 2 of the IC chip 1-1 and the electrodes 7 of the circuit board 6-1 are brought into contact with each other, respectively, for the first time during the final compression-bonding step.

According to the tenth embodiment, while the square IC chip bonding region 6a-1 of the circuit board 6-1 has an array of electrodes 7, . . . , 7 arranged generally equidistantly in each of the vicinities of side verges of the four sides except the corner portions of the four corners, the dummy electrodes 303, . . . , 303 are formed at corner portions where the electrodes 7 are absent in the vicinities of the side verges of the IC chip bonding region 6a-1 of the circuit board 6-1, by which an array state of the electrodes 7, . . . , 7 can be made generally identical among the vicinities of the side verges of the individual sides of the IC chip 1-1 as well as in the corner portions, and, when the bonding material 5 between the bonding region of the IC chip 1-1 and the IC chip bonding region 6a-1 of the circuit board 6-1 flows from the central portion to the corner portions of the peripheral portions during the compression-bonding step, the dummy electrodes 303 function as a bonding-material flow regulating member, so that the flow speed SP1 in the central portion of the IC chip bonding region 6a-1 of the board 6-1 and the flow speed SP2 in the peripheral portions of the IC chip bonding region 6a-1 of the board 6-1 become generally equal to each other. Thus, the flow of the bonding material 5 from the central portion to the corner portions of the peripheral portions in the vicinities of the side verges of the individual sides as well as the vicinities of the respective corner portions in the IC chip bonding region 6a-1 can be made generally uniform, and moreover distribution of the bonding material 5 within the bonding surface of the IC chip 1-1, i.e., within the IC chip bonding region 6a-1 of the circuit board 6-1 can be made uniform. As a result of achievement that the distribution of the bonding material 5 within the bonding surface of the IC chip 1-1 as well as within the IC chip bonding region 6a-1 of the circuit board 6-1 can be made uniform as described above, the bonding material 5 can be prevented from lowering in density, and therefore adhesion between the IC chip 1-1 and the bonding material 5 in the central portion and the peripheral portions, particularly the corner portions, of the IC chip bonding region 6a-1 is increased, and moreover adhesion between the electrodes 7 or dummy electrodes 303 of the board 6-1 and the bonding material 5 is increased, so that the peeling described above can be prevented, and that reliability of bonding and sealing can be enhanced.

When the array intervals between the dummy electrodes 303 disposed in the corner portions and the electrodes 7, . . . , 7 neighboring the dummy electrodes 303 are made generally the same as the array intervals between the electrodes 7, . . . , 7, a resulting state is as if the electrodes 7, . . . , 7 were formed similarly over a range of from the vicinities of the four side verges to the corner portions. Consequently, the flow of the bonding material 5 from the central portion toward the peripheral portions can be made further more generally uniform, and moreover the distribution of the bonding material 5 within the IC chip bonding region 6a-1 of the circuit board 6-1 can be even more uniform. However, the intervals are not limited to this, and, in order to increase uniformity in comparison with a case where no dummy electrodes 303, . . . , 303 are present, the interval between the dummy electrodes 303 and the electrodes 7, 7 neighboring the dummy electrodes 303 may be made larger than the interval between the electrodes 7, . . . , 7.

Eleventh Embodiment

Figure 40A:
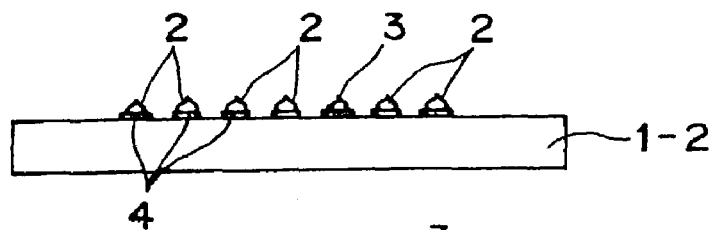
FIGS. 40A and 40B are a side view and a plan view, respectively, of an IC chip prior to a bonding step of an IC chip mounting method according to an eleventh embodiment of the present invention.
Figure 40B:
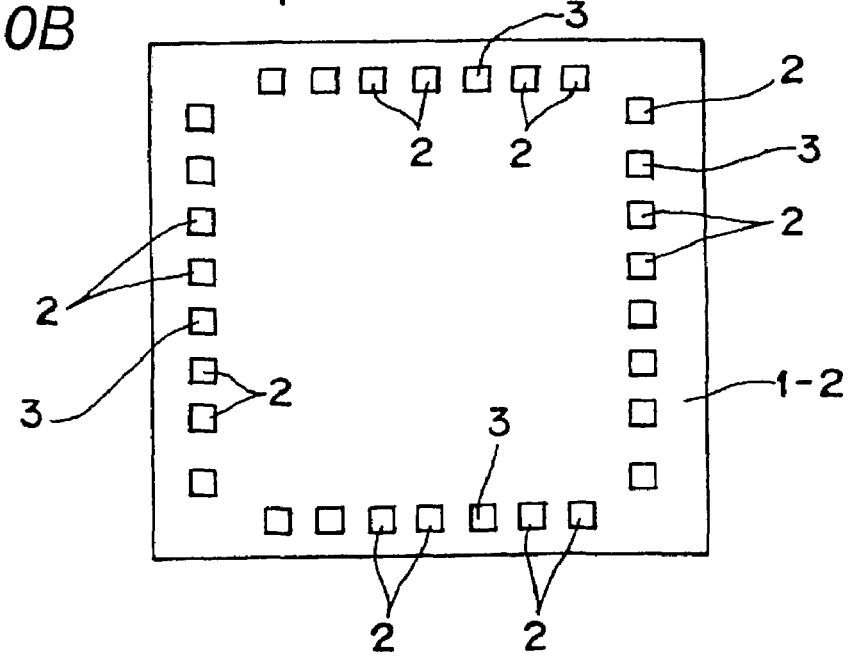
Figure 41A:
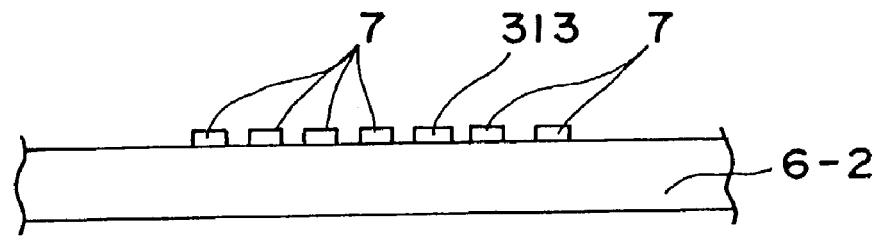
FIGS. 41A and 41B are a side view of a circuit board prior to the bonding step of the IC chip mounting method according to the eleventh embodiment and a plan view showing a flow state of a bonding material during a compression-bonding step and showing movement of the bonding material on the circuit board by seeing through the IC chip, respectively.
Figure 41B:
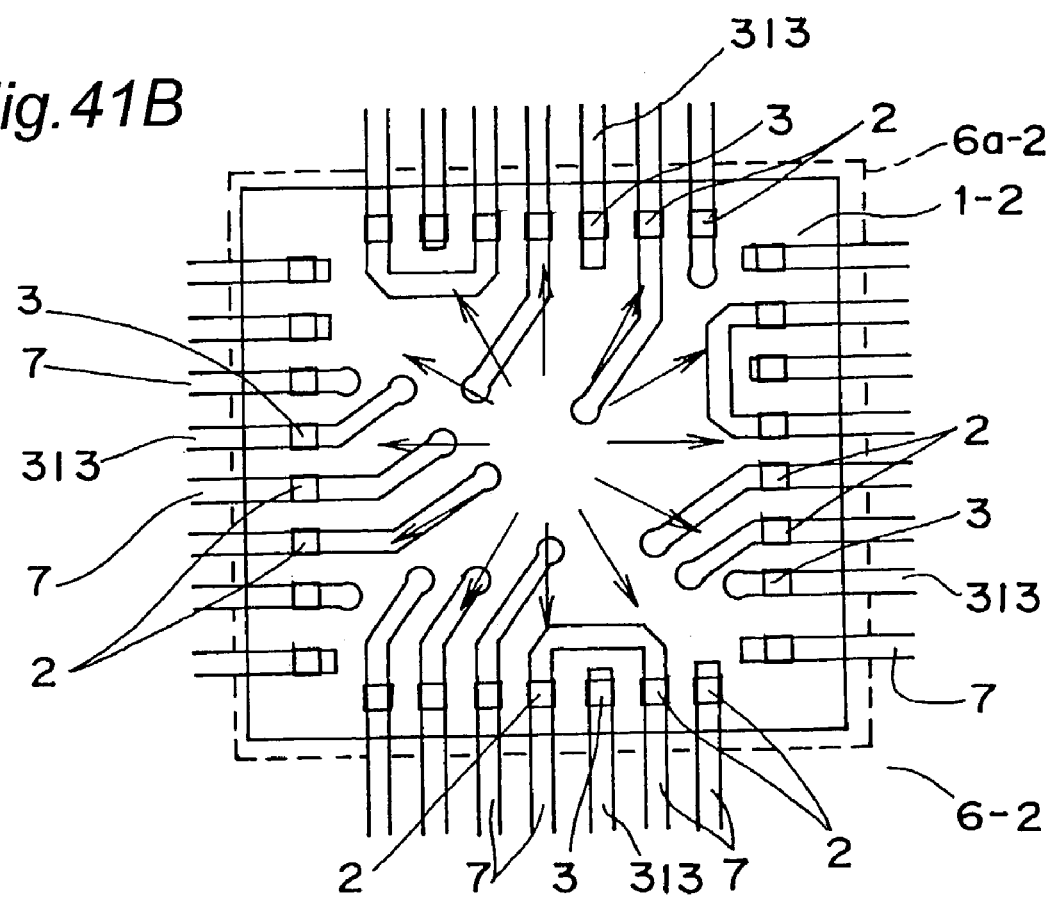
Figure 42:
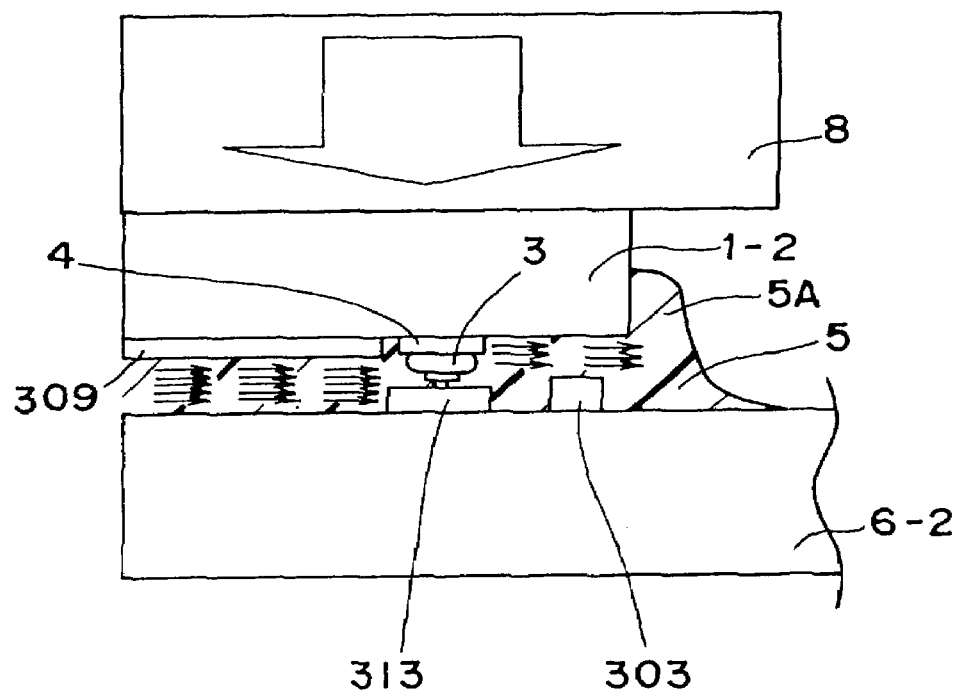
FIG. 42 is a partially enlarged and partial cross-sectional side view of the IC chip, the circuit board, and the bonding material during the compression-bonding step of the IC chip mounting method according to the eleventh embodiment.
Figure 43A:
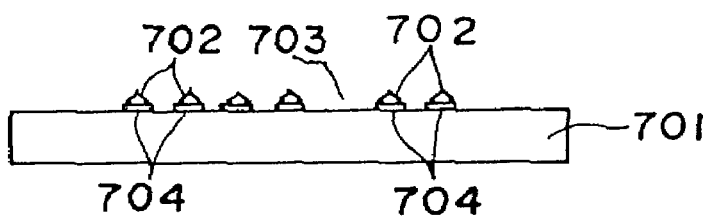
FIGS. 43A and 43B are a side view and a rear view of an IC chip prior to a bonding step of an electronic component mounting method according to a prior art example for explaining the eleventh embodiment.
Figure 43B:
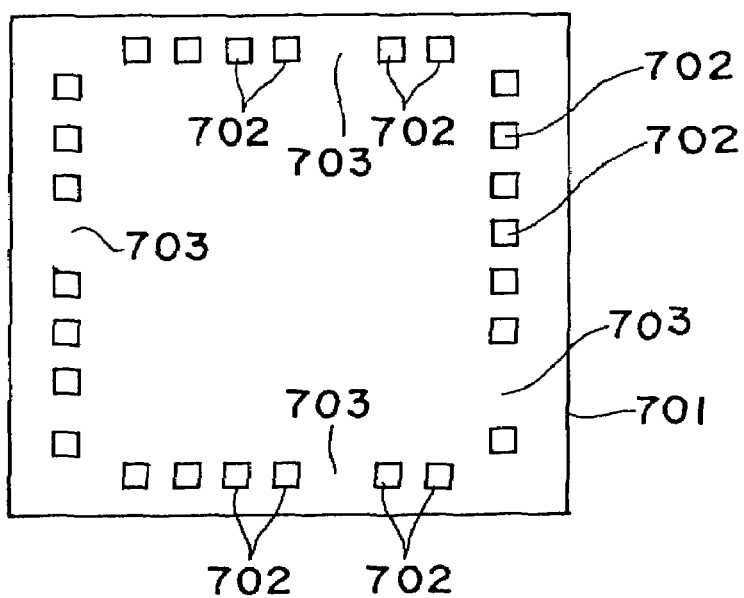
Figure 44A:
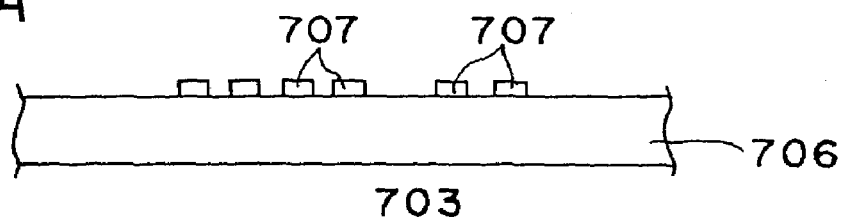
FIG. 44A is a side view of a circuit board prior to the bonding step of the electronic component mounting method according to the prior art example, following FIG. 43B.
Figure 44B:
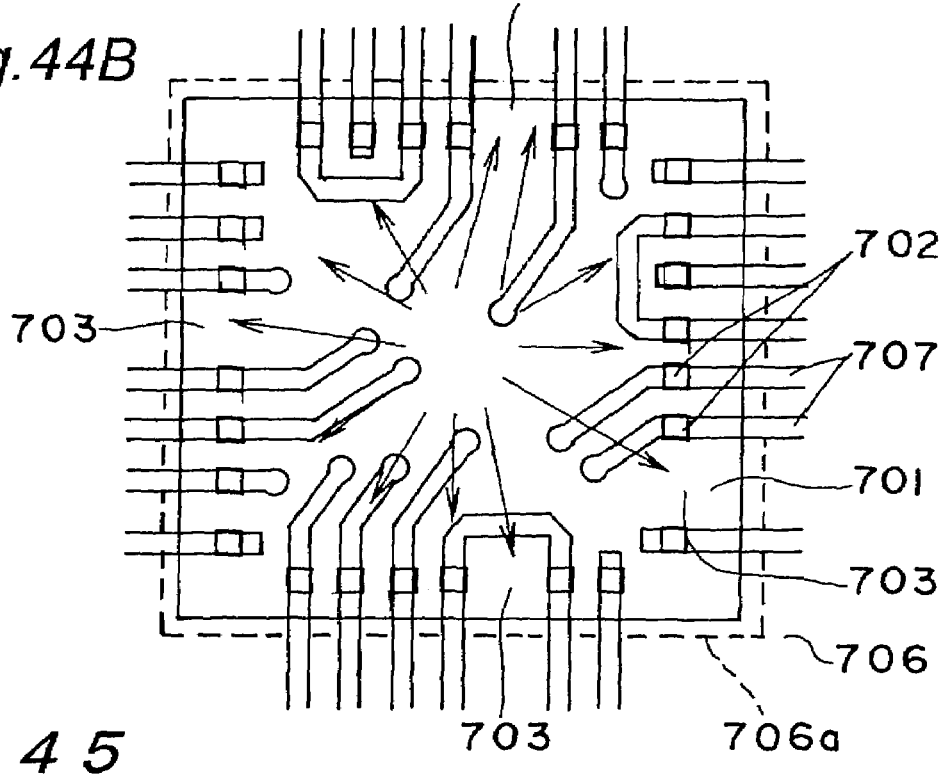
FIG. 44B is a plan view showing a flow state of a bonding material during a compression-bonding step of the prior art example in FIGS. 43A and 43B and showing movement of the bonding material on the circuit board by seeing through the IC chip.
Figure 45:
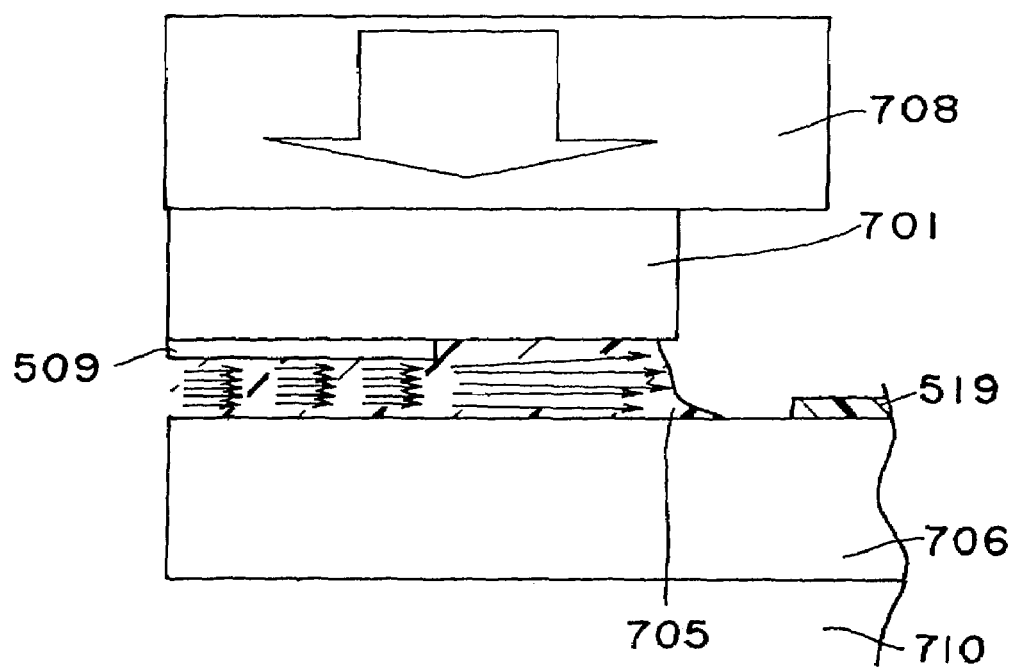
FIG. 45 is a partially enlarged and partial cross-sectional side view of the IC chip, the circuit board, and the bonding material during the compression-bonding step of the electronic component mounting method according to the prior art example, following FIG. 44B.

An IC chip mounting method and an IC chip-mounted unit manufactured by the method as an example of an electronic component mounting method and an electronic component-mounted unit manufactured by the method according to an eleventh embodiment of the present invention are explained with reference to FIGS. 40A to FIG. 45. FIGS. 40A and 40B are a side view and a rear view of an IC chip prior to a bonding step of the IC chip mounting method according to the eleventh embodiment. FIG. 41A is a side view of a circuit board prior to the bonding step, and FIG. 41B is a plan view showing a flow state of a bonding material during a compression-bonding step and showing movement of bonding material on the circuit board by seeing through the IC chip. FIG. 42 is a partially enlarged and partially cross-sectional side view of the IC chip, the circuit board, and the bonding material during the compression-bonding step. FIGS. 43A and 43B are a side view and a rear view of an IC chip prior to a bonding step of an electronic component mounting method according to a prior art example for explaining the eleventh embodiment. FIG. 44A is a side view of a circuit board prior to the bonding step of the prior art example of FIGS. 43A and 43B, and FIG. 44B is a plan view showing a flow state of a bonding material during a compression-bonding step of the prior art example of FIGS. 43A and 43B and showing movement of the bonding material on the circuit board by seeing through the IC chip. FIG. 45 is a partially enlarged and partially cross-sectional side view of the IC chip, the circuit board, and the bonding material during the compression-bonding step of the prior art example of FIGS. 43A and 43B.

In this IC chip mounting method, as shown in FIGS. 40A and 40B, a bonding surface of a quadrilateral, i.e., square or rectangular IC chip 1-2 (square IC chip 1-2 in FIGS. 40A and 40B) has an array of bumps 2, . . . , 2 which are formed at portions in vicinities of side-verge portions of individual four sides except for four corner portions of the bonding surface so as to be generally parallel to the sides and generally equidistant, wherein dummy bumps 3 as one example of a bonding-material flow regulating member are formed at sites with no bumps 2 out of the side-verge vicinities of the bonding surface of the IC chip 1-2 (sites where the bumps 2 are absent out of the vicinities of upper-and-lower two sides as well as right-and-left two sides out of the four sides of the IC chip 1-2 in FIG. 40B), so that flow of a bonding material 5 is regulated by the dummy bumps 3. On the other hand, on the board side, as shown in FIGS. 41A and 41B, a quadrilateral, i.e., square or rectangular IC chip bonding region 6a-2 (square IC chip bonding region 6a-2 in FIGS. 40A and 40B) of a circuit board 6-2 corresponding to a bonding surface of the quadrilateral, i.e., square or rectangular IC chip 1-2 (square IC chip 1-2 in FIGS. 40A and 40B) has an array of electrodes 7, . . . , 7 which are formed at portions in the vicinities of side verges of individual four sides except the four corner portions so as to be generally parallel to the sides and generally equidistant, in which dummy electrodes 313 as projective portions, which are one example of the bonding-material flow regulating member, are formed at sites with no electrodes 7 out of the vicinities of the side portions of the IC chip bonding region 6a-2 (in FIG. 41B, sites where the electrodes 7 are absent (sites where the dummy bumps 3 are formed) out of the vicinities of the upper and lower two sides out of the four sides of the IC chip bonding region 6a-2, and sites where the electrodes 7 are absent (sites where the dummy bumps 3 are formed) out of the vicinities of the right and left two sides), by which the flow of the bonding material 5 is regulated by the dummy electrodes 313.

Conventionally, as shown in FIGS. 43A, 43B, 44A and 44B, it is assumed that bumps 702, . . . , 702 are arrayed generally equidistantly on electrodes 704, . . . , 704 in the vicinities of side-verge portions of two opposing sides (upper-and-lower two sides and right-and-left two sides in FIG. 43B), respectively, of a square IC chip 701, in which arrays there are positions 703 where the bumps 702 are lacking, i.e. larger-width interval portions 703 where intervals between neighboring bumps 702, 702 are larger than the other intervals, and it is also assumed that also on the board 706 side, there are larger-width interval portions where the electrodes 707 are absent at positions corresponding to the larger-width interval positions 703 so that intervals between neighboring electrodes 707, 707 are larger than the other intervals, as shown in FIG. 44A. In a state that the bumps 702, . . . , 702 are disposed on the IC chip 701 while the electrodes 707, . . . , 707 are disposed on the board 706 as shown above, bonding material 705 is fed to the circuit board 706, and then, as shown in FIGS. 44B and 45, the bumps 702 on the electrodes 704 of the IC chip 701 and electrodes 707 of the circuit board 706 are bonded together so as to be brought into electrical contact with each other via the bonding material 705 interposed between the bonding surface of the IC chip 701, on which the bumps 702 are formed on the electrodes 704 of the bonding surface, and the IC chip bonding region 706a of the circuit board 706. By placing the circuit board 706 on a base 710, and bringing a heated pressurizing member 708 into contact with the IC chip 701 and applying pressure thereto, the IC chip 701 is compression-bonded in a heated and pressurized state, so that the bonding material 705 between the bonding surface of the IC chip 701 and the IC chip bonding region 706a of the circuit board 706 is cured. In such a case, the bonding material 705 would flow out greatly to outer peripheral portions outside the bonding surface of the IC chip 701 and the IC chip bonding region 706a of the circuit board 706, from the larger-width interval portions 703, where the bumps 702 are lacking, more than from gaps between the bumps 702, . . . , 702 arrayed generally equidistantly and larger-width interval portions, where the bumps 707 are lacking, more than from gaps between the electrodes 707, . . . , 707 arrayed generally equidistantly, with a result that density of the bonding material 705 would become lower. As a result, as shown in FIG. 45, there would be an insufficiency of a quantity of resin for sealing side faces of the IC chip 701 as well as a size decrease or complete vanishment of fillets for sealing the side faces of the IC chip 701, which might lead to occurrence of peeling between the IC chip 701 and the bonding material 705 in the peripheral portions of the IC chip bonding region 706a, or occurrence of peeling between the electrodes 707 of the board 706 and the bonding material 705.

In order to prevent such occurrence of peeling, in the eleventh embodiment, as shown in FIGS. 40A and 40B, prior to a bonding material feeding step, in an arrangement that the bumps 2, . . . , 2 are arrayed generally equidistantly in each of the vicinities of side verges of two opposing sides (upper-and-lower two sides as well as right-and-left two sides in FIG. 40B) out of the four sides of the IC chip 1-2, dummy bumps 3 are formed in the same manner as other bumps 2 at larger-width interval portions where the bumps 2 are lacking (see 703 of upper-and-lower two sides and right-and-left two sides in FIGS. 43B and 44B), that is, at positions where intervals between neighboring bumps 2, 2 are larger than the other intervals, so that the bumps 2 are arrayed generally equidistantly. As a result, the two opposing sides (upper and lower two sides in FIG. 40B) of the IC chip 1-2 are in the same state as the state that the bumps 2, . . . , 2 are arrayed generally equidistantly without lacking of the bumps 2 in each of the vicinities of the side verges of the two sides.

On the other hand, also on the board side, prior to the bonding material feeding step, as shown in FIGS. 41A and 41B, in an arrangement that the electrodes 7, . . . , 7 are arrayed generally equidistantly in each of the vicinities of side verges of mutually opposing two sides (upper-and-lower two sides as well as right-and-left two sides in FIG. 41B) out of the four sides of the IC chip bonding region 6a-2 of the circuit board 6-2, dummy electrodes 313 are formed in the same manner as other electrodes 7 at larger-width interval portions where the electrodes 7 are lacking (see 703 of upper-and-lower two sides and right-and-left two sides in FIGS. 43B and 44B), that is, at positions where intervals between neighboring electrodes 7, 7 are larger than the other intervals, so that the electrodes 7 are arrayed generally equidistantly. As a result, the two opposing sides (upper-and-lower two sides as well as right-and-left two sides in FIG. 41B) of the IC chip bonding region 6a-2 of the circuit board 6-2 are in the same state as the state that the electrodes 7, . . . , 7 are arrayed generally equidistantly without lacking of the electrodes 7 in each of the vicinities of the side verges of the individual sides.

Figure 80A:
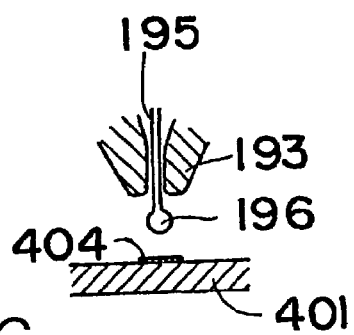
FIGS. 80A, 80B, 80C, 80D, 80E, 80F, and 80G are, respectively, explanatory views showing steps of forming bumps for an IC chip by using a wire bonder in the mounting method according to the above embodiments.
Figure 80B:
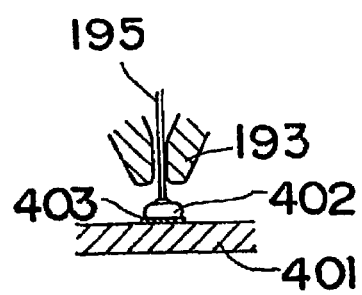
Figure 80C:
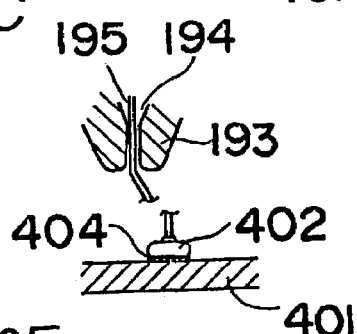
Figure 80D:
Figure 80E:
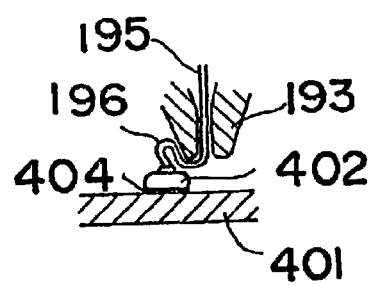
Figure 80G:
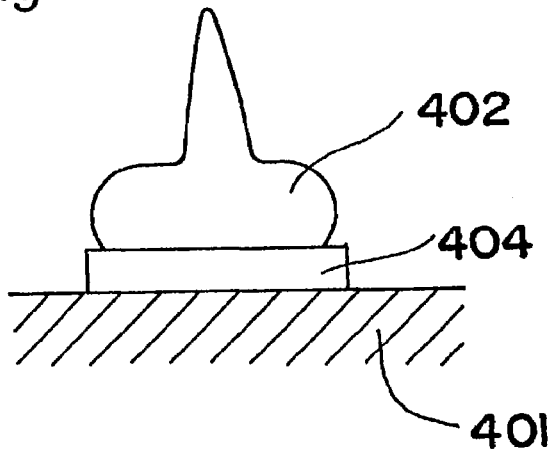
Figure 80F:
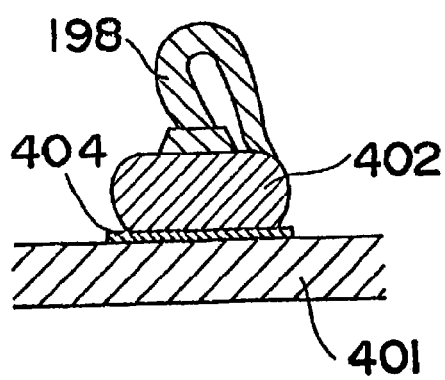

Examples of the method for forming the bumps 2 and the dummy bumps 3 include a bump forming method shown in FIGS. 80A to 80G. An example of forming respective bumps 2 and respective dummy bumps 3 on the IC chip 1-2 in FIGS. 40A and 40B is explained. With regard to an IC chip 401 equivalent to the IC chip 1-2, bumps (projection electrodes) 402 (equivalent to the bumps 2 and the dummy bumps 3) are formed on Al pad electrodes 404 (equivalent to the electrodes 4) of the IC chip 401 by wire bonding equipment through operations as shown in FIGS. 80A to 80F. More specifically, in FIG. 80A, a ball 196 is formed at a lower end of a wire 195 protruding from a holder 193. In FIG. 80B, the holder 193 holding the wire 195 is moved down, so that the ball 193 is bonded to the electrode 404 of the IC chip 401 to form a general bump 402 shape. In FIG. 80C, while the wire 195 is being fed downward, the holder 193 starts to move up. The holder 193 is moved in a generally quadrilateral loop 199 as shown in FIG. 80D, so that a curved portion 198 is formed on top of bump 402 as shown in FIG. 80E, followed by tearing of the wire from the bump, by which a bump 402 as shown in FIG. 80F is formed. Otherwise, it is also possible that the wire 195 is clamped by the holder 193 in FIG. 80B, then pulled up by moving up the holder 193, so that gold wire 195 is torn off, thereby forming a shape of the bump 402 as shown in FIG. 80G. A state that the bumps 402 are formed at the individual electrodes 404 of the IC chip 401 as described above is shown in FIG. 80B.

In the state that the bumps 2, . . . , 2 and the electrodes 7, . . . , 7 are formed as shown above, the bonding material 5 containing at least an insulative thermosetting resin is fed to at least either one of the bonding surface of the IC chip 1-2 or an IC chip bonding region 6a-2 of the circuit board 6-2 during the bonding material feeding step. As a method of feeding the bonding material 5, when the bonding material 5 is a liquid, it is applied, and, when the bonding material 5 is a solid such as a sheet, it is placed or pasted.

Examples of the bonding material include anisotropic conductive paste, sealing resin paste, and the like when it is a liquid, and sheet-like anisotropic conductive film, sealing resin film, and the like when it is a solid.

Next, during the bonding step, the bonding surface of the IC chip 1-2 is laid on the IC chip bonding region 6a-2 of the circuit board 6-2 with the bonding material 5 interposed therebetween. Then, these members are so positioned that the bumps 2 on the electrodes 4 of the IC chip 1-2 and the electrodes 7 of the circuit board 6-2 come into mutual electrical contact via the bonding material 5 interposed between the bonding surface of the IC chip 1-2, on which the bumps 2 are formed on the electrodes 4, respectively, and the IC chip bonding region 6a-2 of the circuit board 6-2. Thereafter, the two members are bonded together. This bonding step may be performed in a state that the circuit board 6-2 is placed on a base 10, or may be performed in two steps, i.e., a bonding step to be performed at a different place in a state that the IC chip 1-2 is laid on the circuit board 6-2 with the bonding material 5 interposed therebetween, and a final compression-bonding step to be subsequently performed in which the circuit board 6-2 having the IC chip 1-2 laid thereon with the bonding material 5 interposed therebetween is placed on the base 10.

Next, during a final compression-bonding step, a pressurizing member 8 is brought into contact with the IC chip 1-2, so that a pressurizing force acts from the pressurizing member 8 toward the base 10, on which the circuit board 6-2 having the IC chip 1-2 laid thereon with the bonding material 5 interposed therebetween is placed, and moreover heat of a heater contained in the pressurizing member 8 is transferred from the pressurizing member 8 to the IC chip 1-2. As a result of this, by a specified pressurizing force being exerted under application of a specified temperature, the bonding surface of the IC chip 1-2 is pressed against the IC chip bonding region 6a-2 of the circuit board 6-2, causing the bumps 2 on individual electrodes 4 of the bonding surface of the IC chip 1-2 to be put into more contact with individual electrodes 7 within the IC chip bonding region 6a-2 of the circuit board 6-2, than during the bonding step. In this state, the bonding material 5 between the bonding surface of the IC chip 1-2 and the IC chip bonding region 6a-2 of the circuit board 6-2 tends to be pressed out from central portions towards peripheral portions of the bonding surface of the IC chip 1-2. In this connection, since the dummy electrodes 3 are disposed at the larger-width where the bumps 2 are lacking and the dummy electrodes 313 are disposed at the larger-width interval portions where the electrodes 7 are lacking as described above, the bumps 2, 2, the dummy bumps 3, the electrodes 7, . . . , 7, and the dummy bumps 3 are disposed generally equidistantly in the vicinities of side verges of the individual sides of the bonding surface of the IC chip 1-2, that is, of the IC chip bonding region 6a-2 of the circuit board 6-2, uniformly among the vicinities of all the sides. Therefore, flow of the bonding material 5 from the central portions towards the peripheral portions is regulated uniformly in the vicinities of the side verges of the individual sides, as shown by arrows in FIG. 41B, so that the bonding material 5 can be prevented from flowing nonuniformly. Thus, the bonding material 5 is cured by heat, while being held generally uniformly distributed, over at least the entire bonding surface of the IC chip 1-2 and the entire IC chip bonding region 6a-2 of the circuit board 6-2, thereby achieving manufacture of an IC chip-mounted unit. That is, during this final compression-bonding step, nonuniform pressing out of the bonding material 5 from the central portion to the peripheral portions of the bonding surface of the IC chip 1-2, that is, of the IC chip bonding region 6a-2 of the board 6-2 during compression-bonding, can be regulated by the dummy bumps 3 provided on the IC chip 1-2 and the dummy electrodes 313 provided on the circuit board 6-2.

Height of each dummy bump 3 as an example of the bonding-material flow regulating member is preferably 10 to 30% of a distance between the IC chip 1-2 and the circuit board 6-2 after bonding of the IC chip 1-2 and the circuit board 6-2, and is preferably 20% as an example. As specific numerical value examples, when the height of the interval between the IC chip 1-2 and the circuit board 6-2 after bonding is 30 to 40 μm, the height of the dummy bump 3 is about 7 μm.

The dummy bumps 3 preferably have thermal resistance. For example, thermal resistance means a property of withstanding heat at 200° C. for 20 seconds when a reflow step is unnecessary, or heat at 250° C. for about 10 seconds when a reflow step is performed.

Height of the dummy electrode 313 of the circuit board 6-2 is, preferably, generally equal to the height of the electrode 7.

Furthermore, the bonding material 5 is not limited to the one constituted by only an insulative thermosetting resin, but may contain an electrically conductive material containing electrically conductive particles or inorganic fillers in the insulative resin. Even in a case where the bonding material 5 contains an electrically conductive material or inorganic fillers, flow of the resin is uniformized within the bonding surface of the IC chip 1-2 by the dummy bumps 3 and the dummy electrodes 313 during compression bonding, so that the conductive material or the inorganic fillers can be disposed uniformly. In contrast to this, without the dummy bumps 3 or the dummy electrodes 313, in a resin having inorganic fillers added thereto, nonuniform flow of the resin during compression bonding would cause the inorganic fillers to become denser or sparser, making it more likely that quality deterioration occurs due to partial differences in physical properties of the resin in some cases. In a resin having an electrically conductive material added thereto, nonuniform flow of the resin during compression bonding would cause the electrically conductive material to become denser or sparser, which might cause partial short-circuits in some cases.

In the above description, it has been described that the bumps 2 of the IC chip 1-2 and the electrodes 7 of the circuit board 6-2 are brought into contact with each other, respectively, during the bonding step. However, this is not limitative, and it is also possible that the bumps 2 of the IC chip 1-2 and the electrodes 7 of the circuit board 6-2 are not brought into contact with each other, respectively, during the bonding step, but that the bumps 2 of the IC chip 1-2 and the electrodes 7 of the circuit board 6-2 are brought into contact with each other, respectively, for the first time during the final compression-bonding step.

In this eleventh embodiment, in a case where the dummy electrodes 313 are formed at larger-width interval portions where the electrodes 7 are lacking, that is, at larger-width interval portions where the intervals between the neighboring electrodes 7, 7 are larger than the intervals between the other neighbor electrodes 7, 7, when the intervals between the neighboring electrodes 7, 7 are not necessarily generally uniform, it is allowable that the dummy electrode(s) 313 are formed only at the portion(s) where the interval between the neighboring electrodes 7, 7 exceeds a permissible value. More specifically, as shown in FIG. 79, the dummy electrode(s) 313 are disposed so that a relationship between maximum pitch Pmax and minimum pitch Pmin out of pitches between the electrodes 7, 7 of the circuit board 6-2 or pitches between the electrodes 7 and the dummy electrodes 313 satisfies that $Pmax \leq (Pmin \times 2\alpha)$, where $\alpha$ is an arbitrary value of 1 to 6, in which case the same effects as described above can be produced.

According to the eleventh embodiment, the bonding surface of the quadrilateral, i.e., square or rectangular IC chip 1-2 has an array of bumps 2, . . . , 2 generally equidistantly in vicinities of side verges of the four sides except for its four corners, in which arrangement the dummy bumps 3 are formed at sites where the bumps 2 are absent in the vicinities of the side verges of the bonding surface of the IC chip 1-2, and moreover the dummy electrodes 313 are formed at sites where the electrodes 7 are absent in the vicinities of the side verges of the individual sides of the IC chip bonding region 6a-2 of the circuit board 6-2. As a result, an array state of the bumps 2, . . . , 2 can be made generally identical among the vicinities of the side verges of the individual sides of the IC chip 1-2 and, moreover an array state of the electrodes 7, 7 can be made generally identical among the vicinities of the side verges of the individual sides of the IC chip bonding region 6a-2 of the circuit board 6-2. Thus, when the bonding material 5 between the bonding surface of the IC chip 1-2 and the IC chip bonding region 6a-2 of the circuit board 6-2 flows from the central portion to the peripheral portions during the compression-bonding step, the dummy bumps 3 and the dummy electrodes 313 function as a bonding-material flow regulating member, so that the flow of the bonding material 5 from the central portion to the peripheral portions in the vicinities of the side verges of the individual sides of the IC chip 1-2 and in the vicinities of the side verges of the individual sides of the IC chip bonding region 6a-2 of the circuit board 6-2 can be made generally uniform and, moreover distribution of the bonding material 5 within the bonding surface of the IC chip 1-2 and within the IC chip bonding region 6a-2 of the circuit board 6-2 can be made uniform, thus allowing adhesion to be improved so that reliability of bonding and sealing can be enhanced. Further, as shown in FIG. 42, as a result of achievement that distribution of the bonding material 5 within the bonding surface of the IC chip 1-2 and within the IC chip bonding region 6a-2 of the circuit board 6-2 can be made uniform, the bonding material 5 can be prevented from lowering in density, and a sufficient quantity of resin for sealing side faces of the IC chip can be fed, and moreover a size of fillets 5A for sealing the side faces of the IC chip 1-2 can be increased, so that peeling between the IC chip 1-2 and the bonding material 5 in the peripheral portions of the IC chip bonding region 6a-2 as well as peeling between the electrodes 7 of the circuit board 6-2 and the bonding material 5 can be prevented effectively. A reason why feed of a sufficient quantity of resin for sealing the side faces of the IC chip allows the fillets 5A for sealing the side faces of the IC chip 1-2 to be increased in size is that a distance between the IC chip and the board depends on a material and configuration of the bumps, and thus a sufficient and increased quantity of the bonding resin leads to an increased quantity of resin overflowing outside the IC chip during compression bonding, thereby allowing the fillets to be increased in size.

As to the dummy bumps as an example of the bonding-material flow regulating member, a position where the dummy bumps are disposed on the bonding surface of the IC chip 1-2 is not limited to the vicinities of a pair of opposing side portions as described above, and it is allowable that each dummy bump 3 is formed at a position where an interval between neighboring bumps 2, 2 is larger than the other intervals in the array of bumps 2, . . . , 2 in any one of the vicinities of the side portions, in the same manner as the other bumps 2 so that the bumps 2 are arrayed generally equidistantly.

Further, as to the dummy electrodes 313 as an example of the bonding-material flow regulating member, positions where the dummy electrodes 313 are disposed in the IC chip bonding region 6a-2 of the circuit board 6-2 are not limited to the vicinities of a pair of opposing side portions as described above, and it is allowable that each dummy electrode 313 is formed at a position where an interval between neighboring electrodes 7, 7 is larger than the other intervals in the array of electrodes 7, . . . , 7 in any one of the vicinities of the side portions, in the same manner as the other electrodes 7 so that the electrodes 7 are arrayed generally equidistantly.

Twelfth Embodiment

Figure 47:
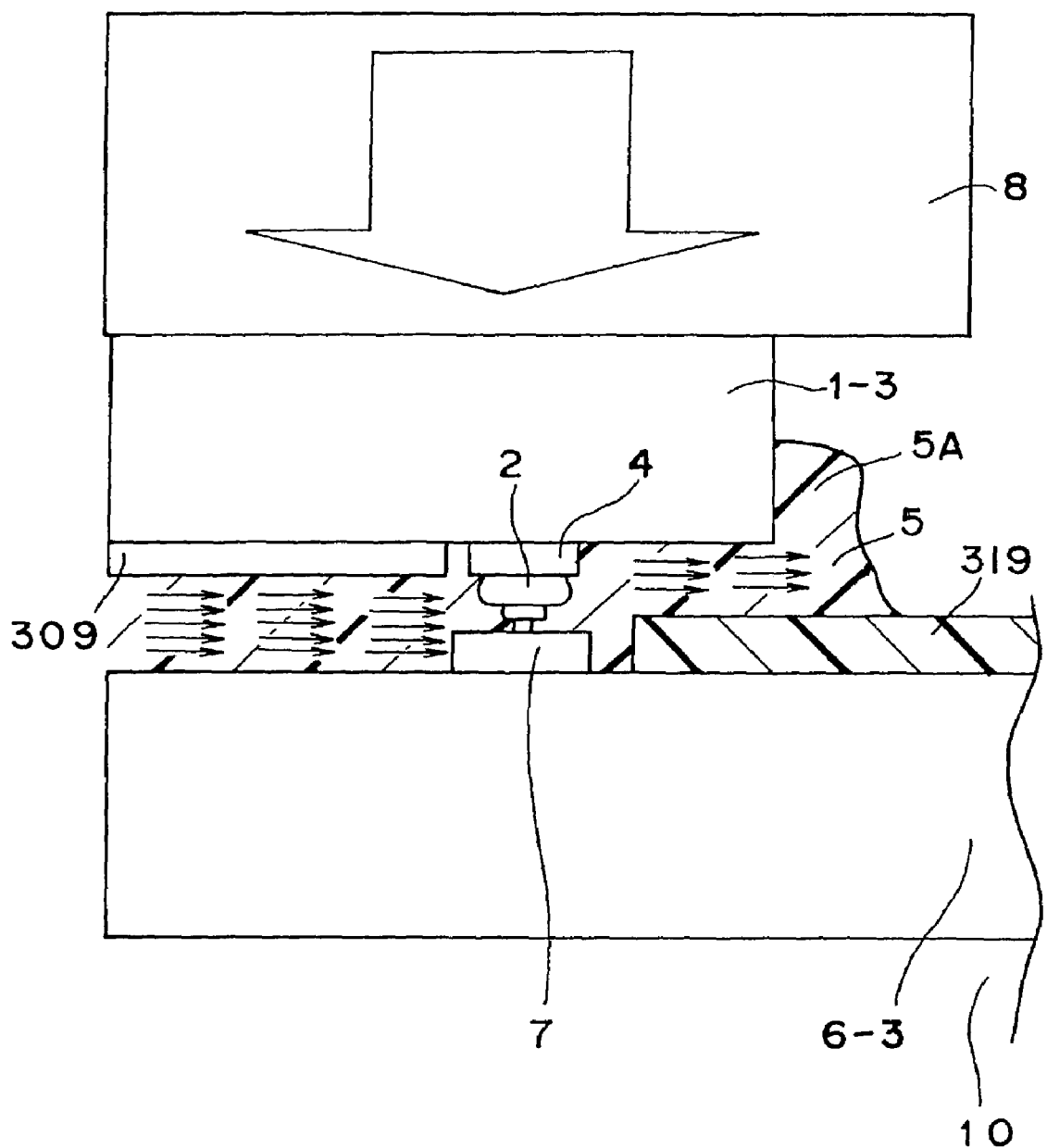
FIG. 47 is a partially enlarged and partial cross-sectional side view showing the IC chip, the circuit board, and the bonding material in the bonding step of the IC chip mounting method according to the twelfth embodiment.
Figure 48A:
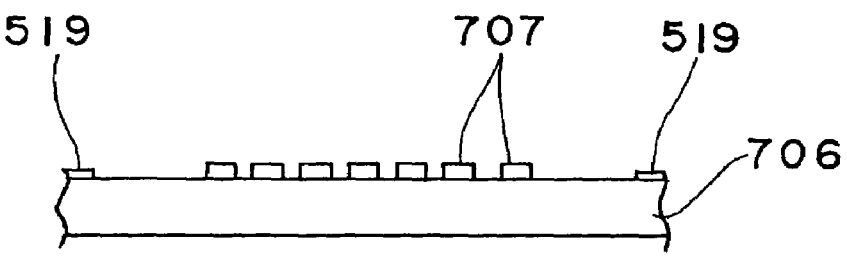
FIGS. 48A and 48B are a side view and a plan view of a circuit board prior to a bonding step of an electronic component mounting method according to a prior art example for explaining the twelfth embodiment.
Figure 48B:
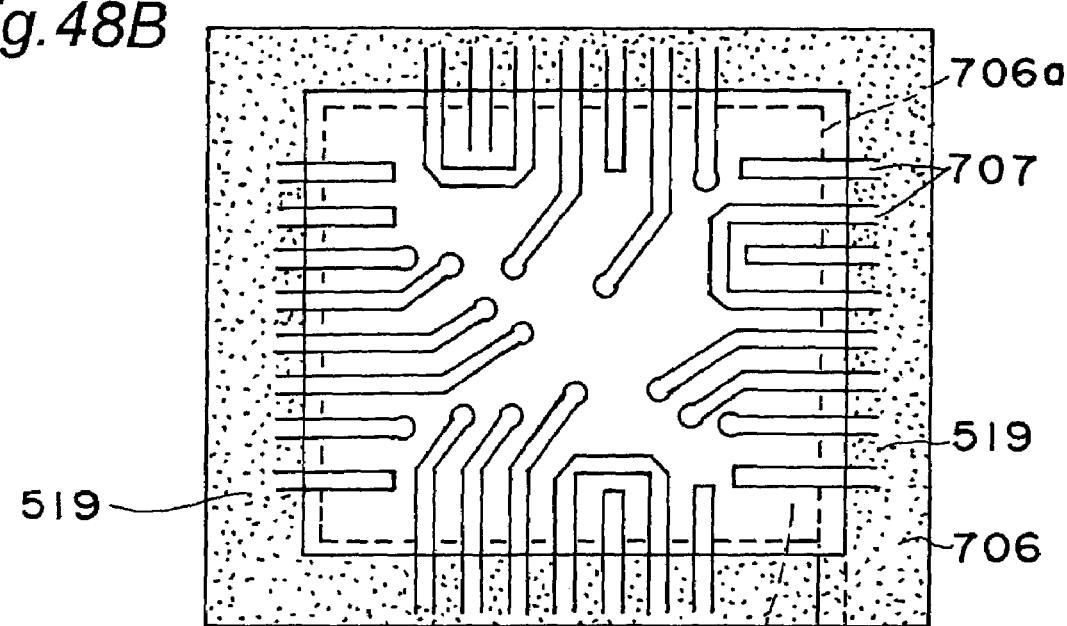
Figure 48C:
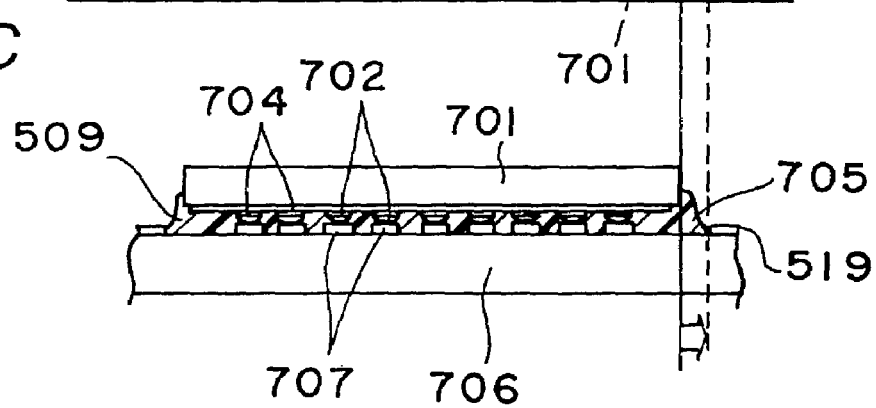
FIG. 48C is a partial cross-sectional side view of an IC chip, the circuit board, and a bonding material during a compression-bonding step of the prior art example.
Figure 49:
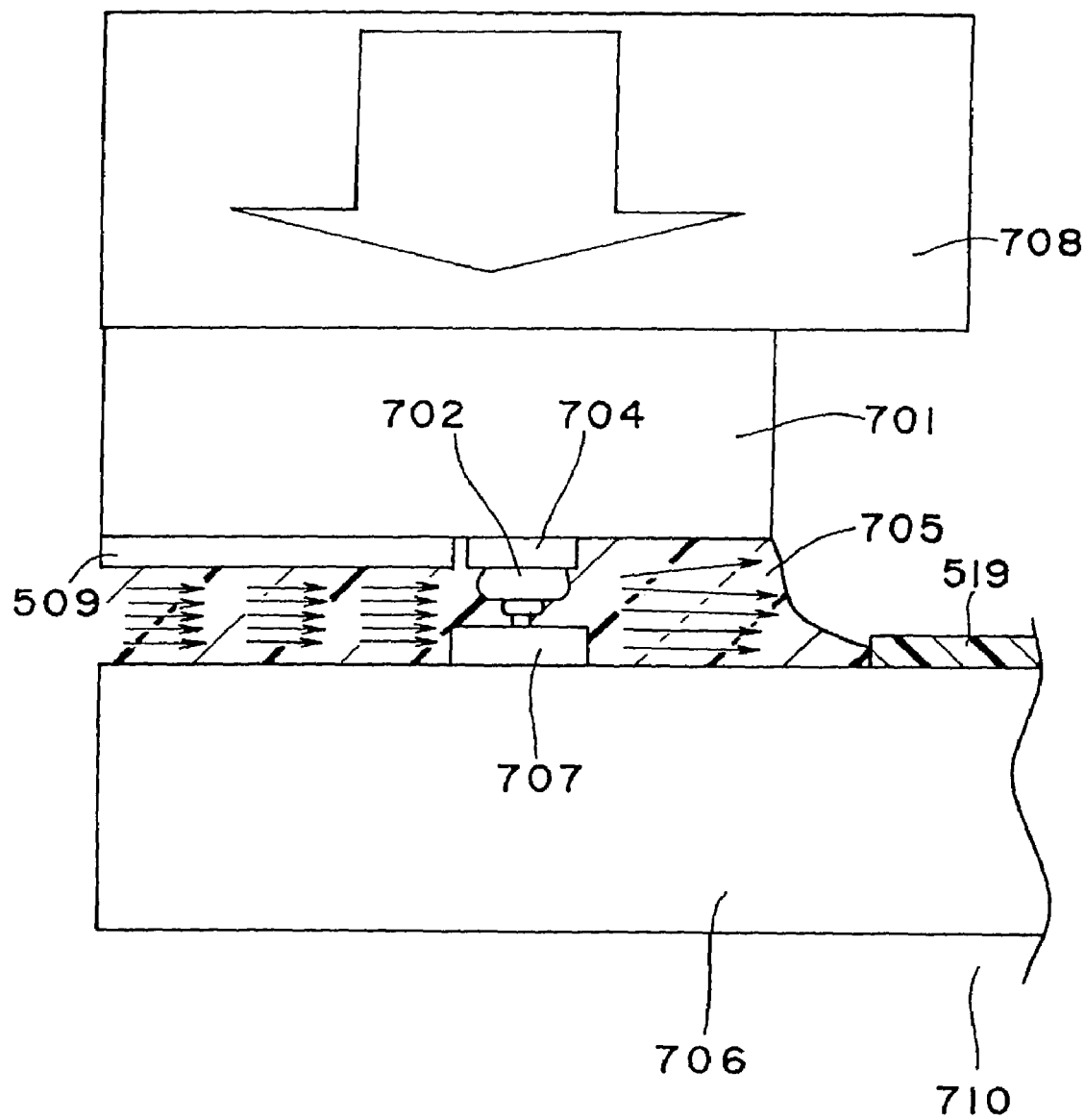
FIG. 49 is a partially enlarged and partial cross-sectional side view of the IC chip, the circuit board, and the bonding material during the compression-bonding step of the prior art example in FIG. 48.

An IC chip mounting method and an IC chip-mounted unit manufactured by the method as an example of an electronic component mounting method and an electronic component-mounted unit manufactured by the method according to a twelfth embodiment of the present invention are explained with reference to FIGS. 46A to FIG. 49. FIGS. 46A and 46B are a side view and a plan view of a circuit board prior to a bonding step of the IC chip mounting method according to the twelfth embodiment. FIGS. 46C and 47 are a partial cross-sectional side view and a partially enlarged and partial cross-sectional side view of the IC chip, a circuit board, and a bonding material during a compression-bonding step. FIGS. 48A and 48B are a side view and a plan view of a circuit board prior to a bonding step of an IC chip mounting method according to a prior art example for explaining the twelfth embodiment. FIGS. 48C and 49 are a partial cross-sectional side view and a partially enlarged and partially cross-sectional side view of an IC chip, the circuit board, and a bonding material during a compression-bonding step of the prior art example.

In the tenth and eleventh embodiments, as an example of the bonding-material flow regulating member, the dummy electrodes 313 are disposed at positions where the electrodes 7 are not disposed. However, this is not limitative. For example, a bonding surface of an IC chip 1-3 has a passivation film 309 provided thereon for protecting an active surface (wiring surface) of its bonding surface, while as shown in FIG. 46B, an organic film 319 is provided over an outer peripheral quadrilateral region of an IC chip bonding region 6a-3 of a circuit board 6-3. In this case, the organic film 319, which is solder resist as an example, is formed not only over peripheral portions outward of the IC chip bonding region 6a-3 of the circuit board 6-3 but also over a range of from the peripheral portions to portions of a quadrilateral frame region (satin region in FIG. 46B) 320 of the IC chip bonding region 6a-3 inside the individual sides and near the side-verge vicinities of the individual sides, the portions of the quadrilateral frame region 320 including portions of the electrodes 7, . . . , 7 except bonding portions with the bumps 2, . . . , 2, as well as portions of the surface of the circuit board 6-3 except the electrodes. Therefore, it is also possible that the organic film 319 provided over a range of from the outer peripheral portions of the IC chip bonding region 6a-3 to the quadrilateral frame region 320 inside the individual sides of the IC chip bonding region 6a-3 and near the side-verge portions of the individual sides functions as bonding-material flow regulating film as an example of the bonding-material flow regulating member, by which flow regulation of bonding material 5 is performed by the organic film 319. In this connection, an inorganic film instead of the organic film 319 could also produce the same effects, but inorganic films causes peeling between a sealing resin and the inorganic film under an environmental test of heat cycles or the like because of weakness of adhesion with resin, which might cause a function as a sealing resin to lower. In contrast to this, adopting the organic film 319 makes it possible to improve reliability and quality because the organic film is stronger in terms of adhesion with the sealing resin than with the inorganic film.

The organic film 319 is composed of, for example, a solder resist such as polyimide or polybenzoxazole (PBO) which functions as a heat-resistant coating that prevents electrical contact with other wiring lines or bumps or the like to hold an insulative property and protect conductors. Such an organic film 319 is spin-coated to a thickness of, for example, about 3 to 7 μm so as to be applied all over outer peripheries of the IC chip bonding region 6a-3 of the circuit board 6-3 and over the quadrilateral frame region (satin region in FIG. 46B) 320 inside the individual sides of the IC chip bonding region 6a-3 and near the individual side portions, as shown in FIG. 46B. Thereafter, bonding portions of the electrodes 7, . . . , 7 necessary for bonding with the bumps 2, . . . , 2 are removed in strip shapes so that the bonding portions are exposed. Removal regions may be either independent of one another each in strip shapes or connected so as to be formed into a frame shape. As a result of this, the organic film 319 can be formed over the outer peripheries of the IC chip bonding region 6a-3 and over the quadrilateral frame region (satin region in FIG. 46B) 320, which includes the portions of the electrodes 7, . . . , 7 except the bonding portions with the bumps 2, . . . , 2 and the portions of the surface of the circuit board 6-3 except the electrodes. The organic film 319, as shown in FIG. 47, has a function of reducing a distance between the IC chip and the board in the outer peripheral portions of the IC chip and increasing a quantity of resin in the outer peripheral portions of the IC chip. By this organic film 319, peeling at an interface between the sealing resin and the IC chip, as well as peeling at an interface between the sealing resin and the board, can both be prevented, while any voids can be prevented with an increased sealing resin density. Thus, intrusion of moisture under high-humidity environments can be prevented to the utmost, so that reliability and quality under high-temperature, high-humidity environments can be improved.

Conventionally, as shown in FIGS. 48A, 48B and 48C, it is assumed that bumps 702, . . . , 702 of a bonding surface of a square IC chip 701 are provided, a passivation film 509 (satin region in FIG. 48B) is disposed over a square region surrounded by the bumps 702, . . . , 702 on the four sides, and that an organic film 519 is disposed in a quadrilateral frame shape with specified intervals over outer peripheries of the individual sides of the IC chip bonding region 706a of the circuit board 706 to which the IC chip 701 is to be bonded. In a state that the organic film 519 is disposed around the IC chip bonding region 706a of the circuit board 706 as described above, a bonding material 705 is fed to the circuit board 706, and then the bumps 702 on the electrodes 704 of the IC chip 701 and electrodes 707 of the circuit board 706 are bonded together so as to be brought into electrical contact with each other via the bonding material 705 interposed between the bonding surface of the IC chip 701, on which the bumps 702 are formed on the electrodes 704 of the bonding surface, and the circuit board 706. By placing the circuit board 706 on a base 710, and bringing a heated pressurizing member 708 into contact with the IC chip 701 and applying pressure thereto, the IC chip 701 is compression-bonded in a heated and pressurized state, so that the bonding material 705 between the bonding surface of the IC chip 701 and the circuit board 706 is cured. In such a case, other than in the square region surrounded by the four-side bumps 702, 702 within the bonding surface of the IC chip 701 on which the passivation film 509 is disposed, gaps between the IC chip 701 and the board 706 are larger than other portions and therefore the bonding material 705 would flow at a lower flow speed at positions between the four-side bumps 702, . . . , 702 as well as at positions outward of the four-side bumps 702, . . . , 702, i.e., in peripheral portions within the IC chip bonding region 706a, where the passivation film 509 is absent on the IC chip side and the organic film 519 is absent on the board side, so that the bonding material 705 would lower in density at these portions, therefore lowering in adhesion, i.e. bonding power and sealing power, at the peripheral portions within the IC chip bonding region 706a, thus yielding occurrence of peeling. In other words, when the gaps between the IC chip 701 and the board 706 are increased other than at the other portions, a local volume between the IC chip and the board would also increase, which in turn causes a quantity of sealing resin for filling the portions to also increase. Therefore, a quantity of resin overflowing to outer peripheral portions of the IC chip would decrease at these portions, resulting in a size decrease of fillets. Such occurrence of peeling against the bonding material 705 at the peripheral portions of the bonding surface of the IC chip 701, if involved, would cause moisture to penetrate to peeled portions, which would in turn lead to occurrence of corrosion or the like of the IC chip 701 or the like due to moisture absorption.

In order to prevent such deterioration of the bonding power and the sealing power, in the twelfth embodiment, prior to a bonding material feeding step, as shown in FIGS. 46A and 46B, an organic film 319 (satin region in FIG. 46B) is disposed as a bonding-material flow regulating film, which is an example of the bonding-material flow regulating member, also over portions of the electrodes 7, . . . , 7 except the bonding portions with the bumps 2, . . . , 2 as well as over portions of the surface of the circuit board except the electrodes, in the quadrilateral region (satin region in FIG. 46B) inside the individual sides and near the side portions of the individual sides of the square IC chip bonding region 6a-3 of the circuit board 6-3. As a result of this, a flow speed at which the bonding material 5 flows in the square region surrounded by the four-side bumps 2, . . . , 2 within the bonding surface of the IC chip 1-3 on which the passivation film 309 is disposed, and a flow speed at which the bonding material 5 flows at positions outer than the four-side bumps 2, . . . , 2 where the passivation film 309 is absent on the IC chip side but where the organic film 319 is instead disposed on the board side, i.e. in somewhat inner peripheral portions of the IC chip bonding region 6a-3, become generally equal to each other, so that the bonding material 5 can be prevented from lowering in density, and therefore prevented from lowering in adhesion, i.e. bonding power and sealing power, in the somewhat inner peripheral portions of the IC chip bonding region 6a-3, i.e., in the portions inside the individual sides of the IC chip bonding region 6a-3 and near the side portions of the individual sides. As a result of this, a sufficient quantity of resin for sealing the side faces of the IC chip is fed, and the size of fillets 5A for sealing the side faces of the IC chip 1-3 can be increased, so that peeling between the IC chip 1-3 and the bonding material 5 in the peripheral portions of the IC chip bonding region 6a-3 as well as peeling between the electrodes 7 of the board 6-3 and the bonding material 5 can be prevented effectively.

In a state that the organic film 319 has been formed as shown above, during the bonding material feeding step, the bonding material 5 containing at least an insulative thermosetting resin is fed to at least either one of the bonding surface of the IC chip 1-3 or the IC chip bonding region 6a-3 of the circuit board 6-3. The method of feeding the bonding material 5 is the same as that of the tenth embodiment.

Next, during the bonding step, the bonding surface of the IC chip 1-3 is laid on the IC chip bonding region 6a-3 of the circuit board 6-3 with the bonding material 5 interposed therebetween. Then, these members are so positioned that the bumps 2 on electrodes 4 of the IC chip 1-3 and electrodes 7 of the circuit board 6-3 come into mutual electrical contact via the bonding material 5 interposed between the bonding surface of the IC chip 1-3, on which the bumps 2 are formed on the electrodes 4, respectively, and the IC chip bonding region 6a-3 of the circuit board 6-3. Thereafter, the two members are bonded together. This bonding step may be performed in a state that the circuit board 6-3 is placed on a base 10, or may be performed in two steps, i.e., a bonding step to be performed at a different place in a state that the IC chip 1-3 is laid on the circuit board 6-3 with the bonding material 5 interposed therebetween, and a final compression-bonding step to be subsequently performed in which the circuit board 6-3 having the IC chip 1-3 laid thereon with the bonding material 5 interposed therebetween is placed on the base 10.

Next, during a final compression-bonding step, a pressurizing member 8 is brought into contact with the IC chip 1-3 so that a pressurizing force acts from the pressurizing member 8 toward the base 10, on which the circuit board 6-3 having the IC chip 1-3 laid thereon with the bonding material 5 interposed therebetween is placed, and moreover, heat of a heater contained in the pressurizing member 8 is transferred from the pressurizing member 8 to the IC chip 1-3. As a result of this, by a specified pressurizing force being exerted under application of a specified temperature, the bonding surface of the IC chip 1-3 is pressed against the IC chip bonding region 6a-3 of the circuit board 6-3, causing the bumps 2 on the individual electrodes 4 of the bonding surface of the IC chip 1-3 to come into contact with the individual electrodes 7 within the IC chip bonding region 6a-3 of the circuit board 6-3. In this case, by virtue of the arrangement that the organic film 319 is disposed on both sides in a shorter direction, i.e. widthwise direction of the IC chip 1-3 with respect to the circuit board 6-3, flow resistance can be increased for the flow of the bonding material 5 from the central portion to peripheral portions of the IC chip bonding region 6a-3, so that a flow speed between the IC chip 1-3 and the circuit board 6-3 can be lowered on both sides of the array of the bumps 2, . . . , 2 as shown in FIG. 47, as compared with a case where the organic film 319 is absent. As a result, the flow of the bonding material 5 from the central portion to the peripheral portions is regulated uniformly among the vicinities of the side verges of the individual sides within the IC chip bonding region 6a-3 of the circuit board 6-3, so that the bonding material 5 can be prevented from flowing nonuniformly. Thus, the bonding material 5 is cured by heat, while being held generally uniformly distributed, over at least an entire IC chip bonding region 6a-3, thereby achieving manufacture of an IC chip-mounted unit. That is, during this final compression-bonding step, nonuniform pressing out of the bonding material 5 from the central portion to the peripheral portions of the IC chip bonding region 6a-3 during compression bonding can be regulated by the organic film 319.

In the above description, it has been described that the bumps 2 of the IC chip 1-3 and the electrodes 7 of the circuit board 6-3 are brought into contact with each other, respectively, during the bonding step. However, this is not limitative, and it is also possible that the bumps 2 of the IC chip 1-3 and the electrodes 7 of the circuit board 6-3 are not brought into contact with each other, respectively, during the bonding step, but that the bumps 2 of the IC chip 1-3 and the electrodes 7 of the circuit board 6-3 are brought into contact with each other, respectively, for the first time during the final compression-bonding step.

According to this twelfth embodiment, the organic film 319 is disposed over the outer peripheral quadrilateral region of the IC chip bonding region 6a-3 of the circuit board 6-3, by which the organic film 319 as a bonding-material flow regulating film, which is an example of the bonding-material flow regulating member, performs flow regulation of the bonding material 5. As a result of this, during the flow of the bonding material 5 between the bonding surface of the IC chip 1-3 and the IC chip bonding region 6a-3 of the circuit board 6-3 from the central portion to the peripheral portions during the compression-bonding step, the organic film 319 functions as the bonding-material flow regulating member, so that the flow speed of the bonding material 5 between the IC chip 1-3 and the circuit board 6-3 can be lowered, as shown in FIG. 47, as compared with the case where the organic film 319 is absent. Therefore, the flow of the bonding material 5 from the central portion to the peripheral portions can be made generally uniform and moreover distribution of the bonding material 5 within the bonding surface of the IC chip 1-3 can be made uniform, thus allowing adhesion to be improved so that reliability of bonding and sealing can be enhanced.

Thirteenth Embodiment

Figure 50A:
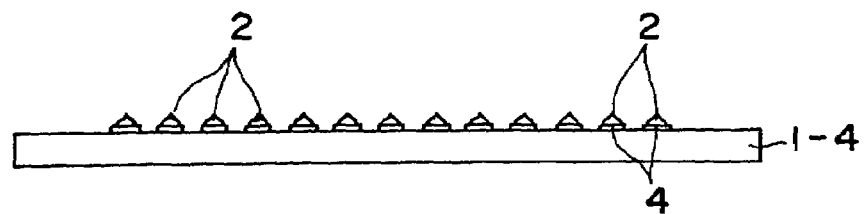
FIGS. 50A and 50B are a side view and a rear view of an IC chip prior to a bonding step of an IC chip mounting method according to a thirteenth embodiment of the present invention.
Figure 50B:
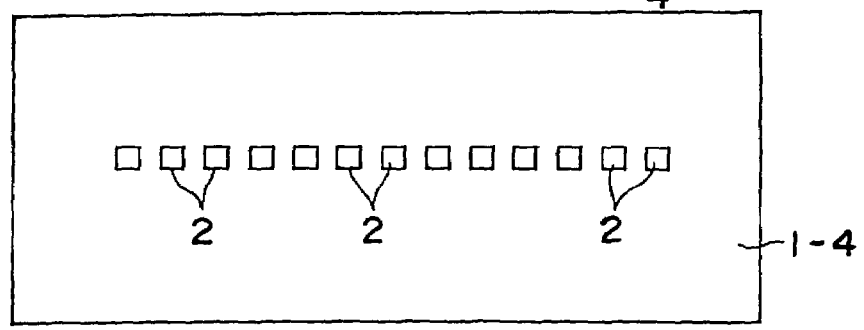
Figure 51:
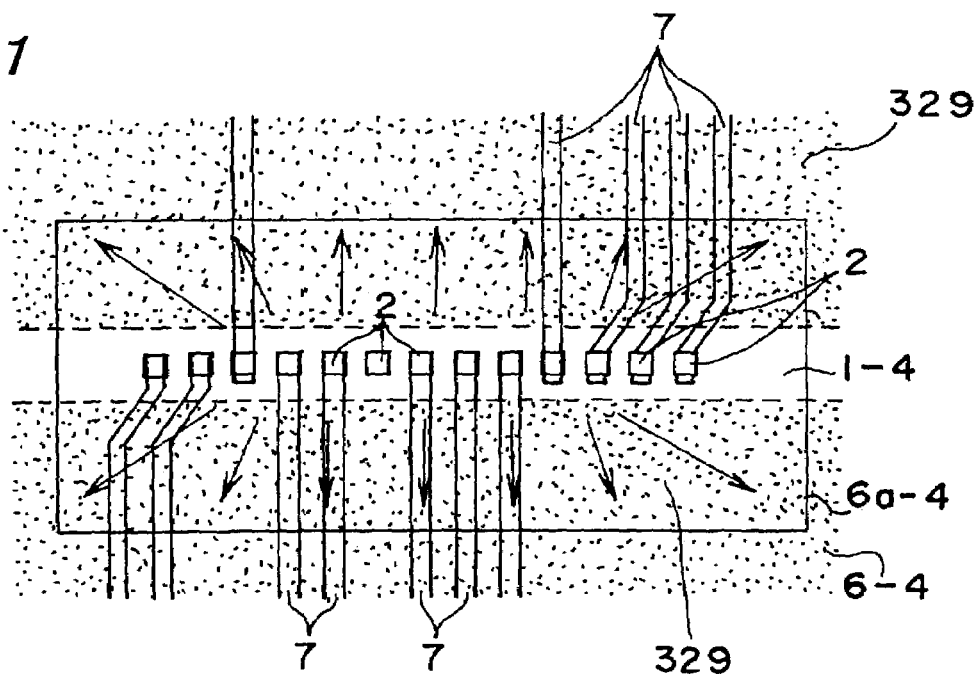
FIG. 51 is a plan view showing a flow state of a bonding material during a compression-bonding step of the IC chip mounting method according to the thirteenth embodiment and showing movement of the bonding material on a circuit board by seeing through the IC chip.
Figure 52:
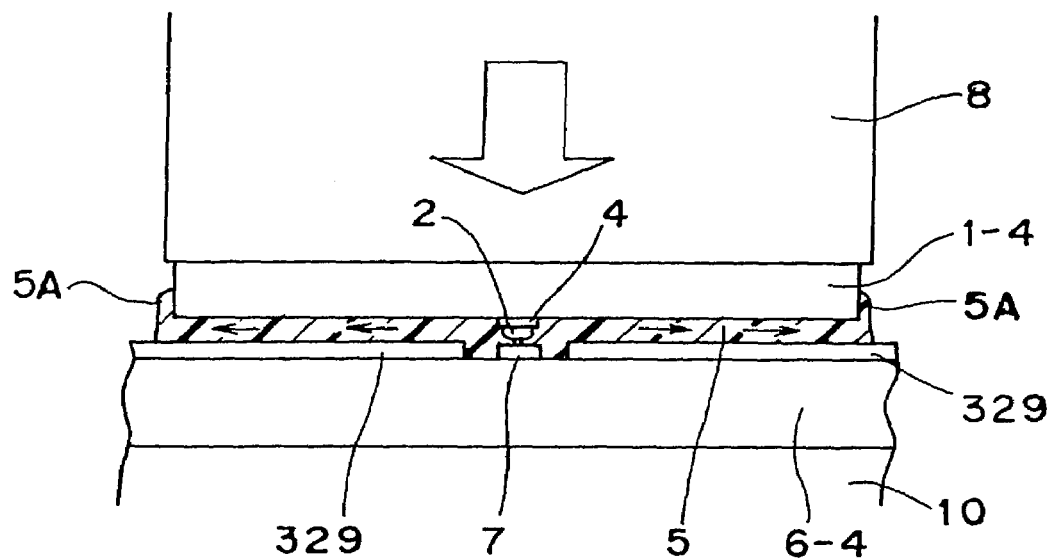
FIG. 52 is a partial cross-sectional side view showing the IC chip, the circuit board, and the bonding material during the compression-bonding step of the IC chip mounting method according to the thirteenth embodiment.
Figure 53A:
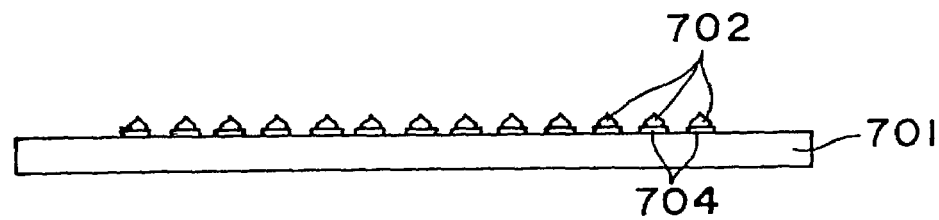
FIGS. 53A and 53B are a side view and a rear view of an IC chip prior to a bonding step of an IC chip mounting method according to a prior art example for explaining the thirteenth embodiment.
Figure 53B:
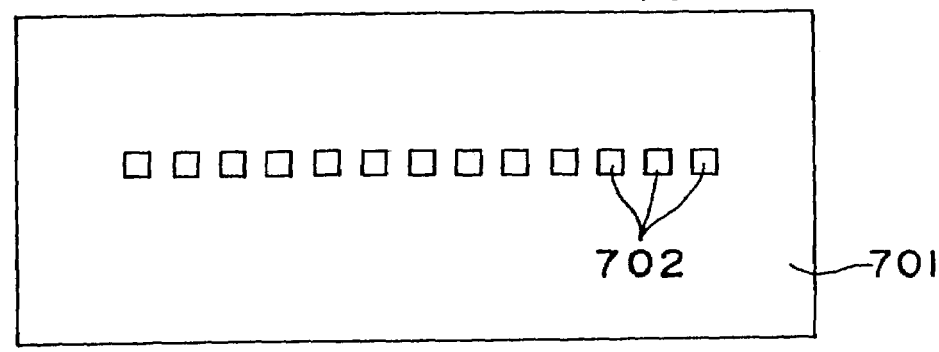
Figure 54:
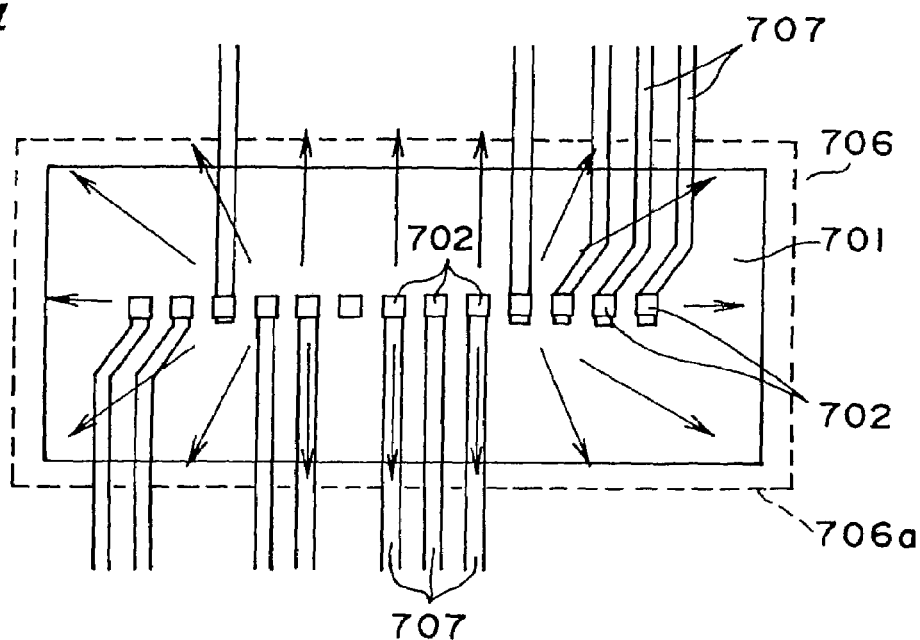
FIG. 54 is a plan view showing a flow state of a bonding material during a compression-bonding step of the prior art example in FIG. 53 and showing movement of the bonding material on a circuit board by seeing through the IC chip.
Figure 55:
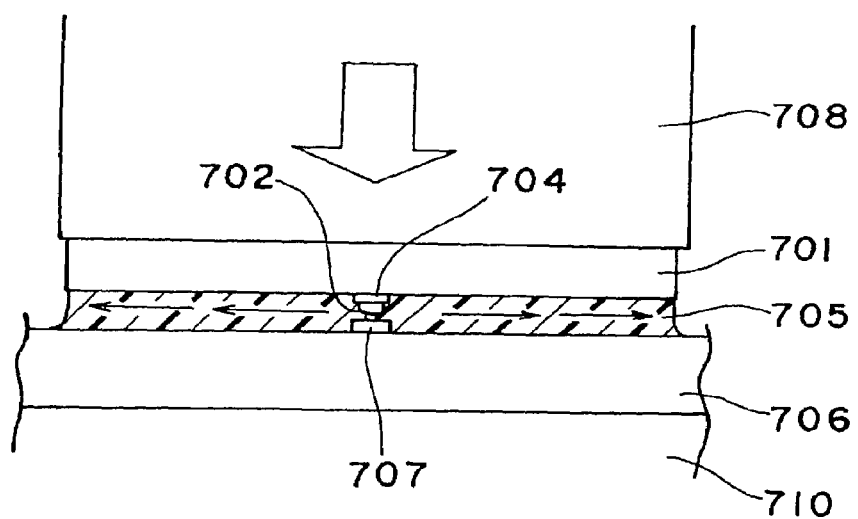
FIG. 55 is a partial cross-sectional side view of the IC chip, the circuit board, and the bonding material during the compression-bonding step of the prior art example in FIG. 53.

An IC chip mounting method and an IC chip-mounted unit manufactured by the method as an example of an electronic component mounting method and an electronic component-mounted unit manufactured by the method according to a thirteenth embodiment of the present invention are explained with reference to FIGS. 50A to 55. FIGS. 50A and 50B are a side view and a rear view of an IC chip prior to a bonding step of the IC chip mounting method according to the thirteenth embodiment. FIG. 51 is a plan view showing a flow state of a bonding material during a compression-bonding step and showing movement of the bonding material on a circuit board by seeing through the IC chip. FIG. 52 is a partial cross-sectional side view showing the IC chip, the circuit board, and the bonding material during the compression-bonding step. FIGS. 53A and 53B are a side view and a rear view of an IC chip prior to a bonding step of an IC chip mounting method according to a prior art example for explaining the thirteenth embodiment. FIG. 54 is a plan view showing a flow state of a bonding material during a compression-bonding step and showing movement of the bonding material on a circuit board by seeing through an IC chip of the prior art example. FIG. 55 is a partial cross-sectional side view of the IC chip, the circuit board, and the bonding material during the compression-bonding step of the prior art example.

In the twelfth embodiment, the organic film 319 is provided over the quadrilateral frame region 320 inside the individual sides and near the side-verge vicinities of the individual sides of a quadrilateral, i.e., square or rectangular IC chip bonding region 6a-4. However, this is not limitative. For example, in contrast to the foregoing embodiment where the IC chip 1-3 has an array of bumps 2, 2 in each of the vicinities of the side verges of the individual four sides, in the thirteenth embodiment, a bonding surface of a rectangular IC chip 1-4 as an example of the electronic component has bumps 2, . . . , 2 disposed thereon at a central portion of a shorter direction along a longitudinal direction in one array and generally equidistantly, as shown in FIGS. 50A and 50B, and moreover, an organic film 329 as an example of a bonding-material flow regulating member is disposed so as to extend to the vicinities of both sides of the one array of bumps 2, . . . , 2 as shown in FIG. 51, so that flow regulation of bonding material 5 is performed by the organic film 329.

The organic film 329 is composed of, for example, a solder resist such as polyimide or polybenzoxazole (PBO) which functions as a heat-resistant coating that prevents electrical contact with other wiring lines or bumps or the like to maintain an insulative property and protect conductors. Such an organic film 329 can be formed by spin-coating to a thickness of, for example, about 3 to 7 μm so that the coating is applied all over a range of from an outside of the IC chip bonding region 6a-4 of the circuit board 6-4 to both sides of a longitudinal central portion of the IC chip bonding region 6a-4 where electrodes 7, . . . , 7 disposed at a shorter central portion of the IC chip bonding region 6a-4 and extending in one array along the longitudinal direction and generally equidistantly are formed, with the longitudinal central portion not including the coating, as shown in FIG. 51.

Conventionally, as shown in FIGS. 53A, 53B and 54, it is assumed that a bonding surface of a rectangular IC chip 701 has bumps 702, . . . , 702 in one array extending along a longitudinal direction generally equidistantly at a central portion of a shorter direction. In a state that the bumps 702, . . . , 702 are disposed on the IC chip 701 as described above, bonding material 705 is fed to a circuit board 706, and then the bumps 702 on electrodes 704 of the IC chip 701 and electrodes 707 of the circuit board 706 are bonded together so as to be brought into electrical contact with each other via the bonding material 705 interposed between the bonding surface of the IC chip 701, on which the bumps 702 are formed on the electrodes 704 of the bonding surface of the IC chip 701, and the circuit board 706. By placing the circuit board 706 on a base 710, and bringing a heated pressurizing member 708 into contact with the IC chip 701 and applying pressure thereto, the IC chip 701 is compression-bonded in a heated and pressurized state, so that the bonding material 705 between the bonding surface of the IC chip 701 and the circuit board 706 is cured. In such a case, the bonding material 705 would move at a higher flow speed in the shorter direction, that is, in the widthwise direction with respect to the circuit board 706, on both sides of the array of the bumps 702, 702, as it is centered on the bumps 702, . . . , 702 extending in one array along the longitudinal direction at the shorter direction central portion and disposed generally equidistantly, as shown in FIG. 55. As a result, the bonding material 705 would lower in density, therefore lowering in adhesion, i.e. bonding power and sealing power, at the peripheral portions within the IC chip bonding region 706*a* other than the shorter direction central portion, thus yielding occurrence of peeling.

In order to prevent such deterioration of the bonding power and the sealing power, in the thirteenth embodiment, prior to a bonding material feeding step, as shown in FIG. 51, an organic film 329 as an example of the bonding-material flow regulating member is disposed on the bonding surface of a rectangular IC chip 1-4 over a range reaching the vicinities of the electrodes 7, . . . , 7 disposed at a shorter direction central portion of the IC chip bonding region 6*a*-4 of the circuit board 6-4 and extending in one array along the longitudinal direction and generally equidistantly, as opposed to the bumps 2, . . . , 2 extending in one array along the longitudinal direction at a shorter direction central portion and disposed generally equidistantly. As a result of this, the bonding surface of the IC chip 1-4, that is, the outer peripheries of the IC chip bonding region 6*a*-4 of the circuit board 6-4 as well as the vicinities of both sides of the shorter direction central portion of the IC chip bonding region 6*a*-4 are covered with the organic film 329, by which a gap between the bonding surface of the IC chip 1-4 and the IC chip bonding region 6*a*-4 of the circuit board 6-4 becomes narrower in the region where the organic film 329 is disposed, thus making it possible to provide a resistance to the flow of the bonding material 5 so that a distribution of the bonding material 5 within the bonding surface of the IC chip 1-4 as well as within the IC chip bonding region 6*a*-4 of the circuit board 6-4 can be made more uniform than in a case where the organic film 329 is absent. As a result of this, the bonding material 5 can be prevented from lowering in density, a sufficient quantity of resin for sealing side faces of the IC chip is fed, and a size of fillets 5A for sealing the side faces of the IC chip 1-4 can be increased, so that peeling between the IC chip 1-4 and the bonding material 5 in the peripheral portions of the IC chip bonding region 6*a*-4 as well as peeling between the electrodes 7 of the board 6-4 and the bonding material 5 can be prevented effectively.

The method by which the organic film 329 is formed is the same as the method by which the organic film 319 of the twelfth embodiment is formed.

In a state that the organic film 329 is formed as shown above, during the bonding material feeding step, a bonding material 5 containing at least an insulative thermosetting resin is fed to at least either one of the bonding surface of the IC chip 1-4 or an IC chip bonding region 6*a*-4 of the circuit board 6-4. The method of feeding the bonding material 5 is the same as in the tenth embodiment.

Next, during the bonding step, the bonding surface of the IC chip 1-4 is laid on the IC chip bonding region 6*a*-4 of the circuit board 6-4 with the bonding material 5 interposed therebetween. Then, these members are so positioned that the bumps 2 on electrodes 4 of the IC chip 1-4 and electrodes 7 of the circuit board 6-4 come into mutual electrical contact via the bonding material 5 interposed between the bonding surface of the IC chip 1-4, on which the bumps 2 are formed on the electrodes 4, respectively, and the IC chip bonding region 6*a*-4 of the circuit board 6-4. Thereafter, the two members are bonded together. This bonding step may be performed in a state that the circuit board 6-4 is placed on a base 10, or may be performed in two steps, i.e., a bonding step to be performed at a different place in a state that the IC chip 1-4 is laid on the circuit board 6-4 with the bonding material 5 interposed therebetween, and a final compression-bonding step to be subsequently performed in which the circuit board 6-4 having the IC chip 1-4 laid thereon with the bonding material 5 interposed therebetween is placed on the base 10.

Next, during a final compression-bonding step, a pressurizing member 8 is brought into contact with the IC chip 1-4, so that a pressurizing force acts from the pressurizing member 8 toward the base 10, on which the circuit board 6-4 having the IC chip 1-4 laid thereon with the bonding material 5 interposed therebetween is placed, and moreover, heat of a heater contained in the pressurizing member 8 is transferred from the pressurizing member 8 to the IC chip 1-4. As a result of this, by a specified pressurizing force being exerted under application of a specified temperature, the bonding surface of the IC chip 1-4 is pressed against the IC chip bonding region 6*a*-4 of the circuit board 6-4, causing the bumps 2 on the individual electrodes 4 of the bonding surface of the IC chip 1-4 to come into contact with the individual electrodes 7 within the IC chip bonding region 6*a*-4 of the circuit board 6-4. In this state, by virtue of the arrangement that the organic film 329 is disposed on both sides in the shorter direction, i.e. widthwise direction of the rectangular IC chip 1-4 with respect to the circuit board 6-4, flow resistance can be increased, so that the flow speed between the IC chip 1-4 and the circuit board 6-4 can be lowered on both sides of the array of the bumps 2, . . . , 2 as shown in FIG. 52, as compared with the case where the organic film 329 is absent. As a result, the flow of the bonding material 5 from the central portion to the peripheral portions is regulated uniformly among the vicinities of the side verges of the individual sides within the IC chip, bonding region 6*a*-4 of the circuit board 6-4, so that the bonding material 5 can be prevented from flowing nonuniformly. Thus, the bonding material 5 is cured by heat, while being held generally uniformly distributed, over at least an entire IC chip bonding region 6*a*-4, thereby achieving manufacture of an IC chip-mounted unit. That is, in this final compression-bonding step, nonuniform pressing out of the bonding material 5 from the central portion to the peripheral portions of the IC chip bonding region 6*a*-4 of the IC chip 1-4 during compression bonding can be regulated by the organic film 329.

In the above description, it has been described that the bumps 2 of the IC chip 1-4 and the electrodes 7 of the circuit board 6-4 are brought into contact with each other, respectively, during the bonding step. However, this is not limitative, and it is also possible that the bumps 2 of the IC chip 1-4 and the electrodes 7 of the circuit board 6-4 are not brought into contact with each other, respectively, during the bonding step, but that the bumps 2 of the IC chip 1-4 and the electrodes 7 of the circuit board 6-4 are brought into contact with each other, respectively, for the first time during the final compression-bonding step.

According to the thirteenth embodiment, since the rectangular IC chip 1-4 is supported against the circuit board 6-4 at one point in the shorter direction, i.e. in the widthwise direction in the rectangular IC chip bonding region 6a-4, and moreover since the organic film 329 is disposed on both sides thereof, a flow speed between the IC chip 1-4 and the circuit board 6-4 can be lowered on both sides of the array of the bumps 2, . . . , 2 as shown in FIG. 52, as compared with the case where the organic film 329 is absent. As a result, during the flow of the bonding material 5 between the bonding surface of the IC chip 1-4 and the IC chip bonding region 6a-4 of the circuit board 6-4 from the central portion to the peripheral portions during the compression-bonding step, the organic film 329 functions as the bonding-material flow regulating member. Therefore, the flow of the bonding material 5 from the central portion to the peripheral portions can be made generally uniform, and moreover, a distribution of the bonding material 5 within the bonding surface of the IC chip 1-4 can be made uniform, thus allowing adhesion to be improved so that reliability of the bonding and sealing can be enhanced.

Fourteenth Embodiment

Figure 56A:
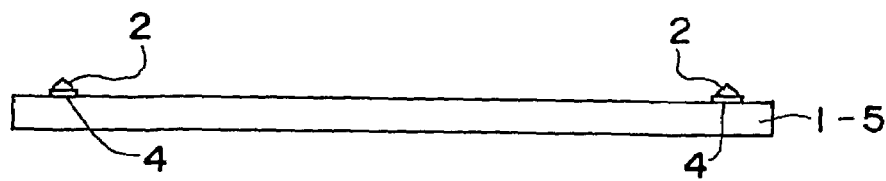
FIGS. 56A and 56B are a side view and a rear view of an IC chip prior to a bonding step of an IC chip mounting method according to a fourteenth embodiment of the present invention.
Figure 56B:
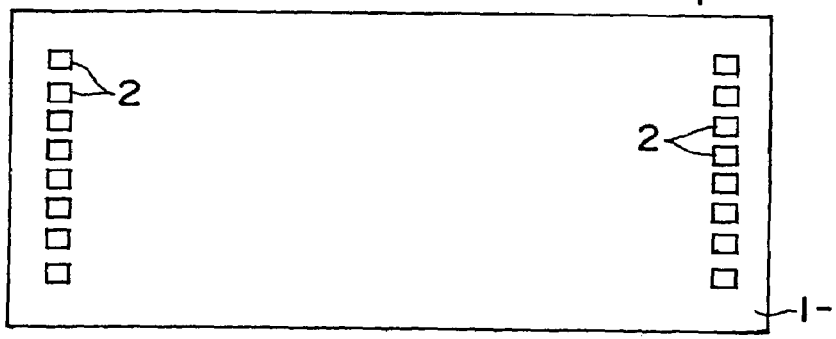
Figure 57:
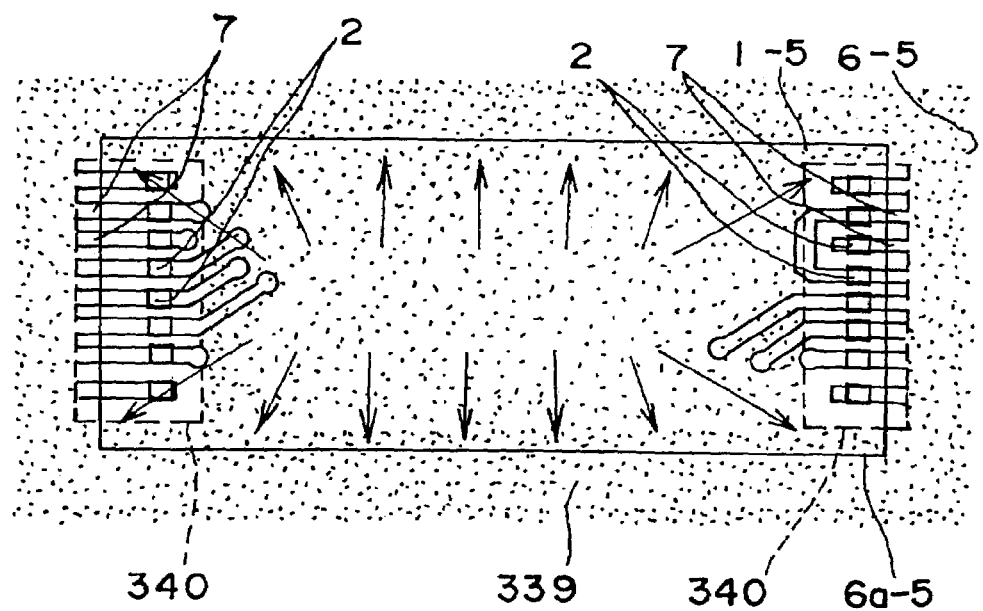
FIG. 57 is a plan view showing a flow state of a bonding material during a compression-bonding step of the IC chip mounting method according to the fourteenth embodiment and showing movement of a bonding material on a circuit board by seeing through the IC chip.
Figure 58A:
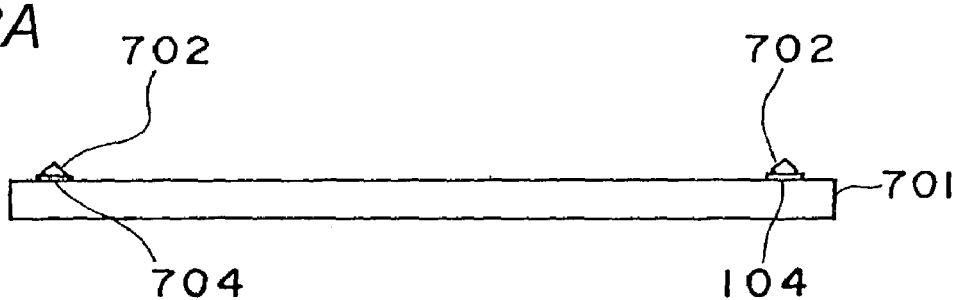
FIGS. 58A and 58B are a side view and a rear view of an IC chip prior to a bonding step of an IC chip mounting method according to a prior art example for explaining the fourteenth embodiment.
Figure 58B:
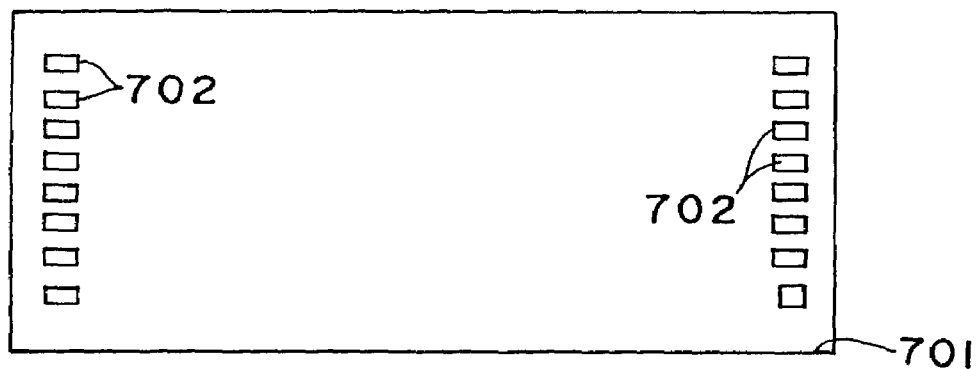
Figure 59:
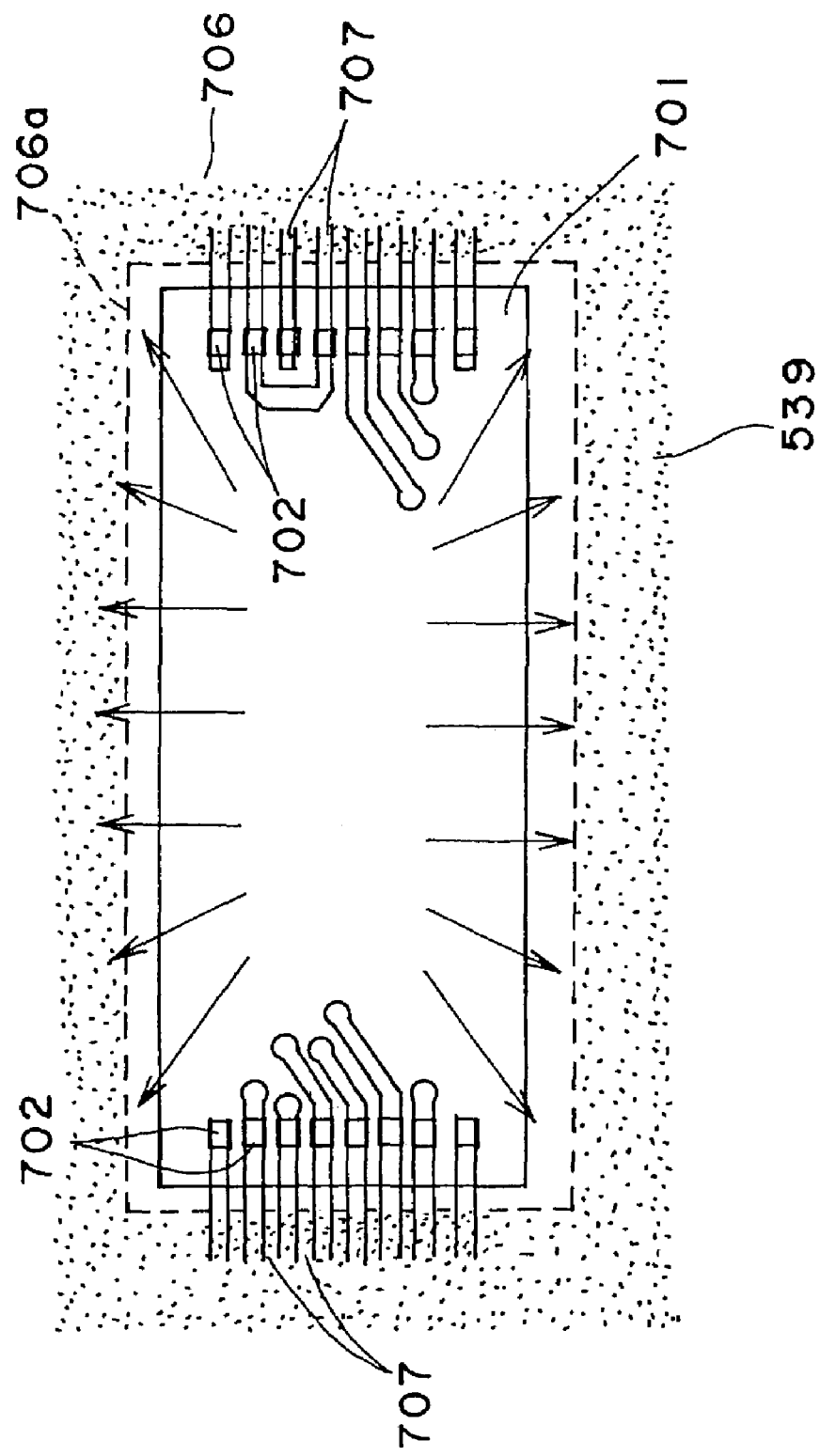
FIG. 59 is a plan view showing a flow state of a bonding material during a compression-bonding step of the prior art example in FIGS. 58A and 58B and showing movement of the bonding material on a circuit board by seeing through the IC chip.

An IC chip mounting method and an IC chip-mounted unit manufactured by the method as an example of an electronic component mounting method and an electronic component-mounted unit manufactured by the method according to a fourteenth embodiment of the present invention are explained with reference to FIGS. 56A to 59. FIGS. 56A and 56B are a side view and a rear view of an IC chip prior to a bonding step of the IC chip mounting method according to the fourteenth embodiment. FIG. 57 is a plan view showing a flow state of a bonding material during a compression-bonding step and showing movement of the bonding material on a circuit board by seeing through the IC chip. FIGS. 58A and 58B are a side view and a rear view of an IC chip prior to a bonding step of an IC chip mounting method according to a prior art example for explaining the fourteenth embodiment. FIG. 59 is a plan view showing a flow state of a bonding material during a compression-bonding step and showing movement of a bonding material on a circuit board by seeing through the IC chip of the prior art example.

In the foregoing thirteenth embodiment, it has been shown that the quadrilateral IC chip 1-5 has bumps 2, . . . , 2 disposed in one array at a central portion thereof. However, the present invention is not limited to this. For example, in the fourteenth embodiment, as shown in FIGS. 56A and 56B, a bonding surface of a rectangular IC chip 1-5 as an example of an electronic component has arrays of bumps 2, . . . , 2 which are formed only in vicinities of side verges of two opposing sides (right and left two sides in FIG. 56B) of the four sides so as to be generally parallel to the sides, respectively, and generally equidistant, in which arrangement no bumps 2 are present in vicinities of side verges of the remaining two sides (upper and lower two sides in FIG. 56B) of the bonding surface of the IC chip 1-5, and an organic film 339 as an example of a bonding-material flow regulating member is disposed generally all over regions outside and inside an IC chip bonding region 6a-5 of a circuit board 6-5 as an example of a circuit formation article, except bonding portions of electrodes 7 with the bumps 2, by which flow regulation of bonding material 5 is performed by the organic film 339.

The organic film 339 is composed of, for example, a solder resist such as polyimide or polybenzoxazole (PBO) which functions as a heat-resistant coating that prevents electrical contact with other wiring lines or bumps or the like to maintain an insulative property and protect conductors. Such an organic film 339 is spin-coated to a thickness of, for example, about 3 to 7 µm so as to be applied all over the IC chip bonding region 6a-5 of the circuit board 6-5 and over an outside thereof. Thereafter, as shown in FIG. 57, regions 340 including bonding portions of the electrodes 7, . . . , 7 necessary for bonding with the bumps 2, . . . , 2 are removed in strip shape, so that the bonding portions are exposed. Removal regions 340 may be either independent of one another each in strip shape or connected so as to be formed into a frame shape. As a result of this, the organic film 339 can be formed generally all over the regions outside and inside the IC chip bonding region 6a-5 of the circuit board 6-5 except the bonding portions of the electrodes 7 with the bumps 2.

Conventionally, as shown in FIGS. 58A and 58B, it is assumed that bumps 702, . . . , 702 are generally equidistantly arrayed on electrodes 704, . . . , 704 in vicinities of side verges of two opposing sides (right and left two sides in FIG. 58B), respectively, of a rectangular IC chip 701, while no bumps 702 are provided in vicinities of side verges of the remaining two sides (upper and lower two sides in FIG. 58B) of the bonding surface of the IC chip 701, and moreover, an organic film 539 is disposed over outer peripheral portions of an IC chip bonding region 706a of a circuit board 706. In a state that the bumps 702, . . . , 702 are disposed on the IC chip 701 as shown above, bonding material 705 is fed to the circuit board 706, and then, the bumps 702 on the electrodes 704 of the IC chip 701 and electrodes 707 of the circuit board 706 are bonded together so as to be brought into electrical contact with each other via the bonding material 705 interposed between the bonding surface of the IC chip 701, on which the bumps 702 are formed on the electrodes 704 of the bonding surface, and the IC chip bonding region 706a of the circuit board 706. By placing the circuit board 706 on a base 710, and bringing a heated pressurizing member 708 into contact with the IC chip 701 and applying pressure thereto, the IC chip 701 is compression-bonded in a heated and pressurized state, so that the bonding material 705 between the bonding surface of the IC chip 701 and the IC chip bonding region 706a of the circuit board 706 is cured. In such a case, when the bonding material 705 flows out from within the IC chip bonding region 706a of the circuit board 706 where the organic film 539 is absent, toward the outside of the IC chip bonding region 706a of the circuit board 706 where the organic film 539 is disposed, the bonding material 705 would flow out more largely in the vicinities of the side-verge portions where the bumps 702 are lacking, than in the vicinities of side-verge portions where the bumps 702, 702 arrayed generally equidistantly on the bonding surface of the IC chip 701 are disposed. As a result, a density of the bonding material 705 would become lower in central portions of the IC chip 701, so that bonding power and sealing power would be deteriorated.

In order to prevent such deterioration of the bonding power and the sealing power, in the fourteenth embodiment, prior to a bonding material feeding step, as shown in FIGS. 56A and 56B, an organic film 339 as an example of the bonding-material flow regulating member is disposed generally all over regions outside and inside the IC chip bonding region 6a-5 of the circuit board 6-5 except the bonding portions of the electrodes 7 with the bumps 2, by which flow regulation of the bonding material 5 is performed by the organic film 339. As a result of this, both in the vicinities of the side-verge portions of the two opposing sides (right-and-left shorter two sides in FIG. 56B) having the bumps 2, . . . , 2 of the rectangular IC chip 1-5 and in the vicinities of the side-verge portions of the other two opposing sides (upper-and-lower longer two sides in FIG. 56B) having no bumps 2, the organic film 339 is disposed similarly, and therefore flow resistance also becomes similar. Thus, as compared with a case where the organic film 339 is absent, flow resistance becomes higher, so that a similar flow regulation of the bonding material 5 is fulfilled.

In a state that the organic film 339 is disposed generally all over the regions outside and inside the IC chip bonding region 6a-5 of the circuit board 6-5 except the bonding portions of the electrodes 7 with the bumps 2 as shown above, during the bonding material feeding step, bonding material 5 containing at least an insulative thermosetting resin is fed to at least either one of the bonding surface of the IC chip 1-5 or the IC chip bonding region 6a-5 of the circuit board 6-5 as an example of a circuit formation article. The method of feeding the bonding material 5 is the same as in the tenth embodiment.

Next, during a bonding step, the bonding surface of the IC chip 1-5 is laid on the IC chip bonding region 6a-5 of the circuit board 6-5 with the bonding material 5 interposed therebetween. Then, these members are so positioned that the bumps 2 on electrodes 4 of the IC chip 1-5 and electrodes 7 of the circuit board 6-5 come into mutual electrical contact via the bonding material 5 interposed between the bonding surface of the IC chip 1-5, on which the bumps 2 are formed on the electrodes 4, respectively, and the IC chip bonding region 6a-5 of the circuit board 6-5. Thereafter, the two members are bonded together. This bonding step may be performed in a state that the circuit board 6-5 is placed on a base (see, for example, the base 10 of FIG. 52), or may be performed in two steps, i.e., a bonding step to be performed at a different place in a state that the IC chip 1-5 is laid on the circuit board 6-5 with the bonding material 5 interposed therebetween, and a final compression-bonding step to be subsequently performed in which the circuit board 6-5 having the IC chip 1-5 laid thereon with the bonding material 5 interposed therebetween is placed on the base.

Next, during a final compression-bonding step, a pressurizing member (see, for example, the pressurizing member 8 of FIG. 52) is brought into contact with the IC chip 1-5, so that a pressurizing force acts from the pressurizing member toward the base, on which the circuit board 6-5 having the IC chip 1-5 laid thereon with the bonding material 5 interposed therebetween is placed, and moreover, heat of a heater contained in the pressurizing member is transferred from the pressurizing member to the IC chip 1-5. As a result of this, by a specified pressurizing force being exerted under application of a specified temperature, the bonding surface of the IC chip 1-5 is pressed against the IC chip bonding region 6a-5 of the circuit board 6-5, causing the bumps 2 on individual electrodes 4 of the bonding surface of the IC chip 1-5 to come into contact with individual electrodes 7 within the IC chip bonding region 6a-5 of the circuit board 6-5. In this state, the bonding material 5 between the bonding surface of the IC chip 1-5 and the IC chip bonding region 6a-5 of the circuit board 6-5 tends to be pressed out from central portions towards peripheral portions of the bonding surface of the IC chip 1-5. In this connection, by virtue of an arrangement that the organic film 339 is disposed also on positions where the bumps 2 are lacking as described above, a flow speed becomes generally constant at any of the vicinities of the side-verge portions of the sides, in the vicinities of the side-verge portions of individual sides of the bonding surface of the IC chip 1-5. As a result, the flow of the bonding material 5 from the central portion to the peripheral portions is regulated uniformly, so that the bonding material 5 can be prevented from flowing nonuniformly. Thus, the bonding material 5 is cured by heat, while being held generally uniformly distributed, over at least an entire bonding surface of the IC chip 1-5, thereby achieving manufacture of an IC chip-mounted unit. That is, during this final compression-bonding step, nonuniform pressing out of the bonding material 5 from the central portion to the peripheral portions of the bonding surface of the IC chip 1-5 during compression bonding can be regulated by the organic film 339 provided on the IC chip 1-5.

Height of each organic film 339 as an example of the bonding-material flow regulating member, thermal resistance of the individual organic films 339, and examples of the bonding material 5, are the same as in the thirteenth embodiment.

In the above description, it has been described that the bumps 2 of the IC chip 1-5 and the electrodes 7 of the circuit board 6-5 are brought into contact with each other, respectively, during the bonding step. However, this is not limitative, and it is also possible that the bumps 2 of the IC chip 1-5 and the electrodes 7 of the circuit board 6-5 are not brought into contact with each other, respectively, during the bonding step, but that the bumps 2 of the IC chip 1-5 and the electrodes 7 of the circuit board 6-5 are brought into contact with each other, respectively, for the first time during the final compression-bonding step.

According to the fourteenth embodiment, the organic film 339 as an example of the bonding-material flow regulating member is disposed generally all over regions outside and inside the IC chip bonding region 6a-5 of the circuit board 6-5 except the bonding portions of the electrodes 7 with the bumps 2. As a result, during flow of the bonding material 5 between the bonding surface of the IC chip 1-5 and the IC chip bonding region 6a-5 of the circuit board 6-5 from the central portion to the peripheral portions during the compression-bonding step, the organic film 339 functions as the bonding-material flow regulating member. Therefore, the flow of the bonding material 5 from the central portion to the peripheral portions in the vicinities of the side-verge portions of the individual sides of the IC chip 1-5 can be made generally uniform, and moreover, a distribution of the bonding material 5 within the bonding surface of the IC chip 1-5 can be made uniform, thus allowing adhesion to be improved so that reliability of bonding and sealing can be enhanced.

Fifteenth Embodiment

Figure 60:
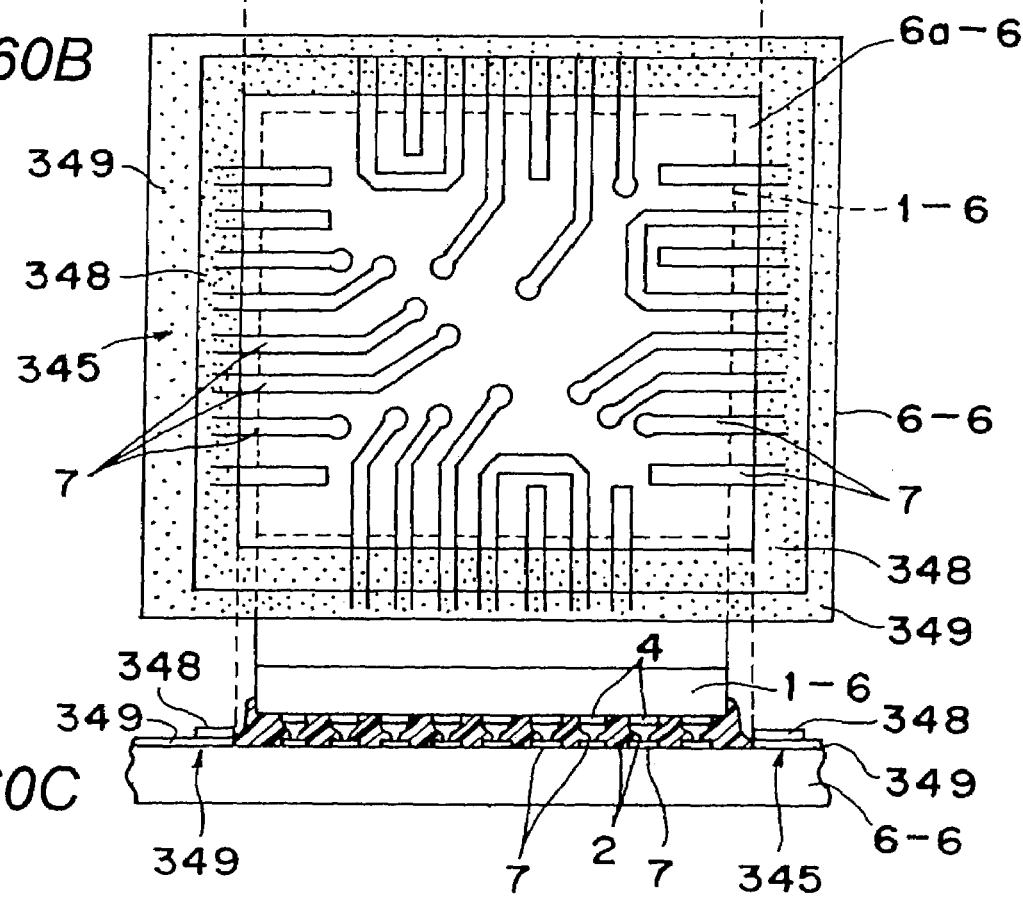
FIGS. 60A and 60B are a side view and a plan view of a circuit board prior to a bonding step of an IC chip mounting method according to a fifteenth embodiment of the present invention.
FIG. 60C is a partial cross-sectional side view and a partially enlarged and partially cross-sectional side view showing an IC chip, the circuit board, and a bonding material during a compression-bonding step.
Figure 61:
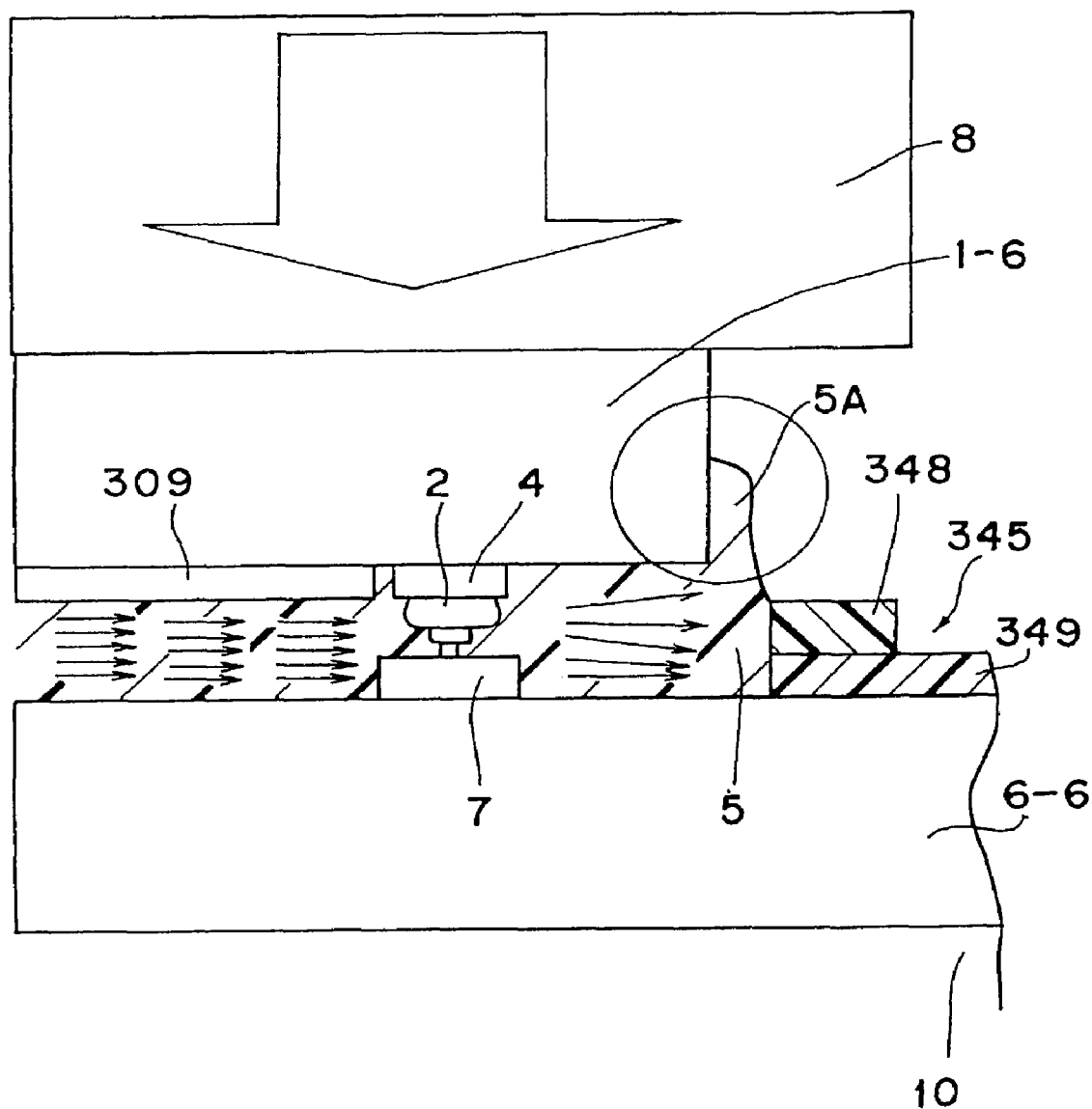
FIG. 61 is a partially enlarged and partial cross-sectional side view of the IC chip, the circuit board, and the bonding material during the compression-bonding step of the IC chip mounting method according to the fifteenth embodiment.
Figure 62A:
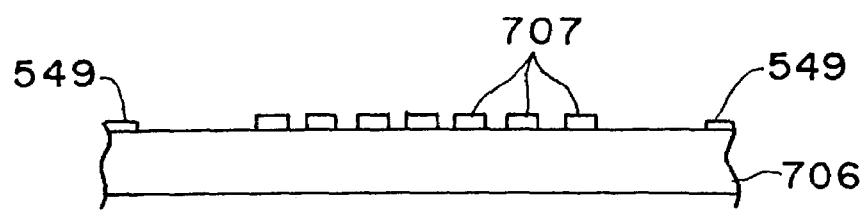
FIGS. 62A and 62B are a side view and a plan view, respectively, of a circuit board prior to a bonding step of an IC chip mounting method according to a prior art example for explaining the fifteenth embodiment.
Figure 62B:
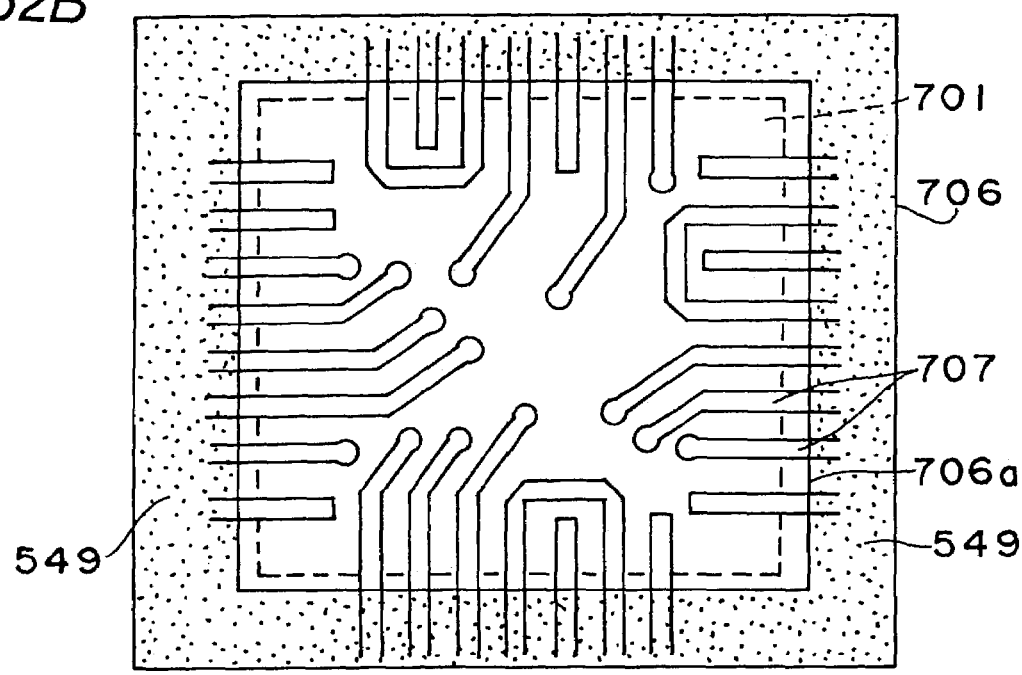
Figure 62C:
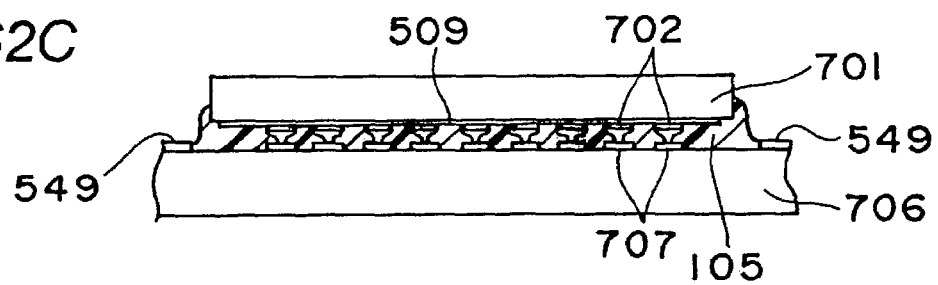
FIG. 62C is a partial cross-sectional side view of an IC chip, the circuit board, and a bonding material during a compression-bonding step of the prior art example.
Figure 63:
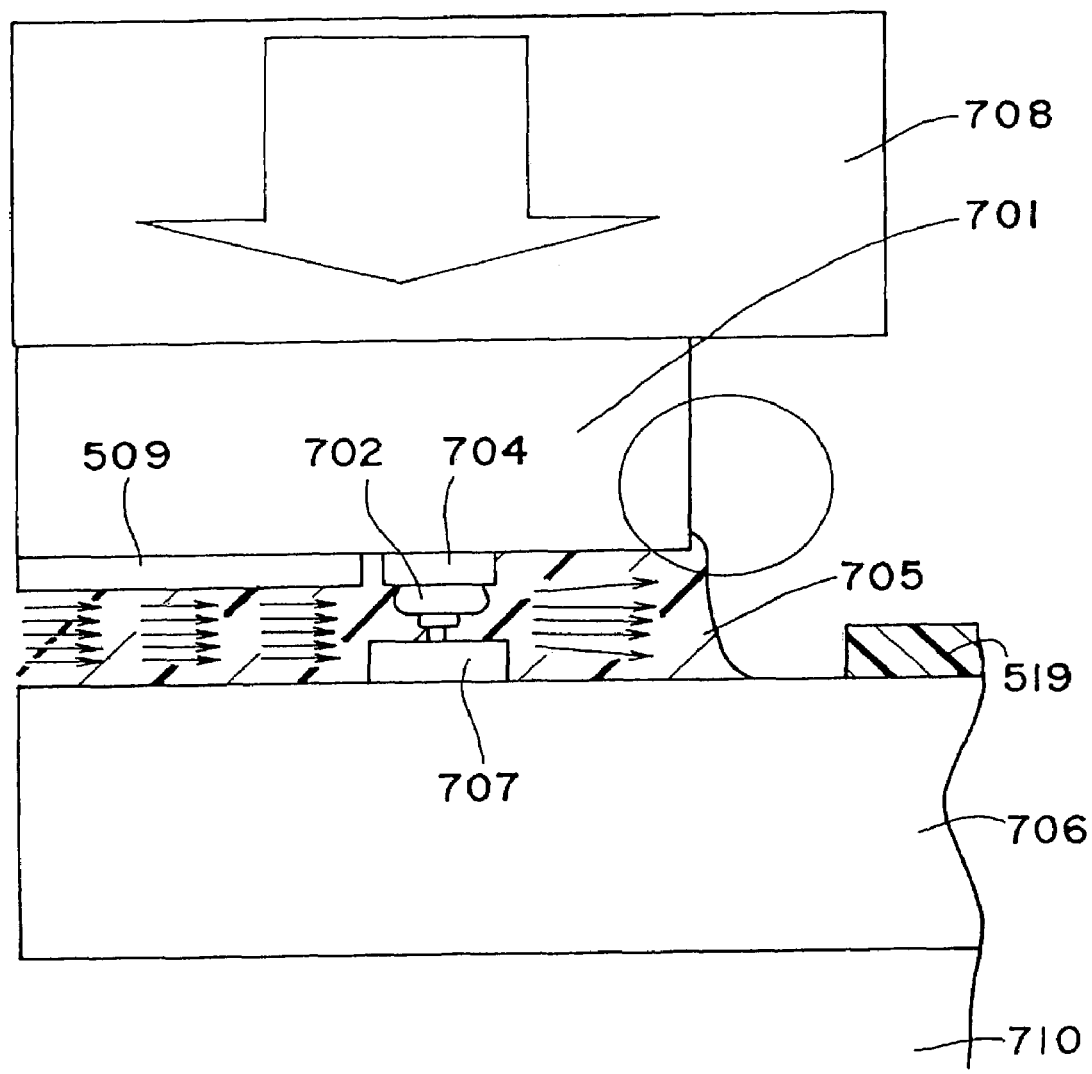
FIG. 63 is a partially enlarged and partial cross-sectional side view of the IC chip, the circuit board, and the bonding material during the compression-bonding step of the prior art example in FIGS. 62A, 62B and 62C.

An IC chip mounting method and an IC chip-mounted unit manufactured by the method as an example of an electronic component mounting method and an electronic component-mounted unit manufactured by the method according to a fifteenth embodiment of the present invention are explained with reference to FIGS. 60A to 63. FIGS. 60A and 60B are a side view and a plan view of a circuit board prior to a bonding step of the IC chip mounting method according to the fifteenth embodiment. FIGS. 60C and 61 are a partial cross-sectional side view and a partially enlarged and partially cross-sectional side view of the IC chip, a circuit board, and bonding material during a compression-bonding step. FIGS. 62A and 62B are a side view and a plan view of a circuit board prior to a bonding step of an IC chip mounting method according to a prior art example for explaining the fifteenth embodiment. FIGS. 62C and 63 are a partial cross-sectional side view and a partially enlarged and partial cross-sectional side view of an IC chip, a circuit board, and bonding material during a compression-bonding step of the prior art example.

A position where the organic film 339 as an example of the bonding-material flow regulating member is arranged is not limited to within the IC chip bonding region 6a-6 of circuit board 6-6. Instead, the organic film 339 may also be disposed outside the IC chip bonding region 6a-6 of the circuit board 6-6 as in this fifteenth embodiment. More specifically, in the fifteenth embodiment, as shown in FIGS. 60A, 60B, 60C and 61, in a bonding-material overflow region outside the IC chip bonding region 6a-6 of the circuit board 6-6 as an example of a circuit formation article, a dam portion 345 as a fillet-forming projective portion, which is formed into such a quadrilateral frame shape as to surround the IC chip bonding region 6a-6 and which largely projects from the circuit board surface, may be provided as an example of a bonding-material flow regulating member. With this arrangement, when the bonding material 5 sandwiched between the bonding surface of a square IC chip 1-6 as an example of the electronic component and the IC chip bonding region 6a-6 flows out to the outside of the IC chip bonding region 6a-6 of the circuit board 6-6 during the compression-bonding step, the bonding material 5 is generally intercepted swollenly by the dam portion 345, by which fillets 5A covering the side faces of the IC chip 1-6 are enlarged. Thus, a sealing effect of the IC chip 1-6 by the bonding material 5 that functions as a sealing resin can be improved, so that reliability can be improved.

The dam portion 345 may be formed by, for example, an organic film such as solder resist, or by dummy electrodes which are of the same composition as the electrodes 7 of the circuit board 6-6 and thicker than the electrodes 7.

The dam portion 345, when formed by the organic film, can be formed by, for example, two-layer organic films, i.e., a lower organic film 349 and an upper organic film 348. The lower organic film 349 is composed of, for example, a solder resist such as polyimide or polybenzoxazole (PBO) which functions as a heat-resistant coating that prevents electrical contact with other wiring lines or bumps or the like to maintain an insulative property and protect conductors. Such an organic film 349 is spin-coated to a thickness of, for example, about 3 to 7 μm so as to be applied in a quadrilateral frame shape outside the IC chip bonding region 6a-6 of the circuit board 6-6, as shown in FIG. 60B. Thereafter, on the organic film 349, a small-width upper organic film 348 is disposed and formed only in outer vicinities of the IC chip bonding region 6a-6. This upper organic film 348 is formed by screen printing (a combination of ordinary solder resist printing and projective-portion printing) of paste resin, or film sticking, or lamination. As for specific examples of the individual layers of the dam portion 345, if primary consideration is given to using resist material as it is, epoxy resin or urethane resin is preferable. For formation by film sticking or the like, thermoplastic resins such as PET (polyethylene terephthalate), polyethylene, or polypropylene resin, or epoxy (uncured) films are usable. In view of adhesion with a board side, epoxy resins are preferable.

Conventionally, as shown in FIGS. 62A, 62B and 62C, it is assumed that an organic film 549 is disposed in a quadrilateral frame shape in outer peripheries of IC chip bonding region 706a of circuit board 706 corresponding to square IC chip 701. In a state that the organic film 549 is disposed as described above, a bonding material 705 is fed to the circuit board 706. Thereafter, these members are bonded together so that bumps 702 on electrodes 704 of the IC chip 701 and electrodes 707 of the circuit board 706 come into mutual electrical contact via the bonding material 705 interposed between the bonding surface of the IC chip 701 and the IC chip bonding region 706a of the circuit board 706. By placing the circuit board 706 on a base 710, and bringing a heated pressurizing member 708 into contact with the IC chip 701 and applying pressure thereto, the IC chip 701 is compression-bonded in a heated and pressurized state, so that the bonding material 705 between the bonding surface of the IC chip 701 and the IC chip bonding region 706a of the circuit board 706 is cured. In such a case, when the bonding material 705 flows out from within the IC chip bonding region 706a of the circuit board 706 where the organic film 539 is absent, toward the outside of the IC chip bonding region 706a of the circuit board 706 where the organic film 549 is disposed, the bonding material 705 would flow out from between the bonding surface of the IC chip 701 and the IC chip bonding region 706a of the circuit board 706 until the bonding material 705 comes into contact with the organic film 549 disposed away from and outside the IC chip bonding region 706a. When the bonding material 705 has come into contact with the organic film 549, the bonding material 705 would be swollen so as to partly cover the side faces of the IC chip 701. However, since side faces of the IC chip 701 would be covered only partly, sealing by the bonding material 705 would be insufficient.

In order to prevent such insufficient sealing, in the fifteenth embodiment, prior to a bonding material feeding step, as shown in FIGS. 60A and 60B, a dam portion 345 formed of an organic film of solder resist or the like and largely projecting from the circuit board surface is disposed as an example of the bonding-material flow regulating member over a bonding-material overflow region outside the IC chip bonding region 6a-6 of the circuit board 6-6; that is, in a quadrilateral frame shape region spaced from the IC chip bonding region 6a-6 by a specified distance and surrounding the IC chip bonding region 6a-6, by which flow regulation of the bonding material 5 is performed by the dam portion 345. As a result of this, by virtue of an arrangement that the dam portion 345 is disposed, as compared with a conventional case where the dam portion 345 is absent or lower in height, the bonding material 5 that tends to flow out along the circuit board surface can be generally intercepted so that the bonding material 5 is swollen up by the dam portion 345. Thus, the fillets 5A can be enlarged so as to cover the side faces of the IC chip 1-6.

In a state that the dam portion 345 is disposed as described above, during the bonding material feeding step, a bonding material 5 containing at least an insulative thermosetting resin is fed to at least either one of the bonding surface of the IC chip 1-6 or the IC chip bonding region 6a-6 of the circuit board 6-6 as an example of the circuit formation article. The method of feeding the bonding material 5 is the same as in the tenth embodiment.

Next, during a bonding step, the bonding surface of the IC chip 1-6 is laid on the IC chip bonding region 6a-6 of the circuit board 6-6 with the bonding material 5 interposed therebetween. Then, these members are so positioned that the bumps 2 on electrodes 4 of the IC chip 1-6 and electrodes 7 of the circuit board 6-6 come into mutual electrical contact via the bonding material 5 interposed between the bonding surface of the IC chip 1-6, on which the bumps 2 are formed on the electrodes 4, respectively, and the IC chip bonding region 6a-6 of the circuit board 6-6. Thereafter, the two members are bonded together. This bonding step may be performed in a state that the circuit board 6-6 is placed on a base 10, or may be performed in two steps, i.e., a bonding step to be performed at a different place in a state that the IC chip 1-6 is laid on the circuit board 6-6 with the bonding material 5 interposed therebetween, and a final compression-bonding step to be subsequently performed in which the circuit board 6-6 having the IC chip 1-6 laid thereon with the bonding material 5 interposed therebetween is placed on the base 10.

Next, during a final compression-bonding step, a pressurizing member 8 is brought into contact with the IC chip 1-6, so that a pressurizing force acts from the pressurizing member 8 toward the base 10, on which the circuit board 6-6 having the IC chip 1-6 laid thereon with the bonding material 5 interposed therebetween is placed, and moreover, heat of a heater contained in the pressurizing member 8 is transferred from the pressurizing member 8 to the IC chip 1-6. As a result of this, by a specified pressurizing force being exerted under application of a specified temperature, the bonding surface of the IC chip 1-6 is pressed against the IC chip bonding region 6*a*-6 of the circuit board 6-6, causing the bumps 2 on the individual electrodes 4 of the bonding surface of the IC chip 1-6 to come into contact with the individual electrodes 7 within the IC chip bonding region 6*a*-6 of the circuit board 6-6. In this state, the bonding material 5 between the bonding surface of the IC chip 1-6 and the IC chip bonding region 6*a*-6 of the circuit board 6-6 tends to be pressed out from between the bonding surface of the IC chip 1-6 and the IC chip bonding region 6*a*-6 of the circuit board 6-6, towards the outside. In this connection, as a result of an arrangement that the bonding material 5 pressed out to flow out along the circuit board surface is intercepted by the dam portion 345 that is disposed in a quadrilateral frame shape region spaced from the IC chip bonding region 6*a*-6 by a specified distance and surrounding the IC chip bonding region 6*a*-6 as described above, the bonding material 5 is swollen up by the dam portion 345 at the side faces of the IC chip 1-6 so as to be able to cover at least about a circuit-board-side half of the side faces of the IC chip 1-6, and thereafter the bonding material 5 is cured by heat, achieving manufacture of an IC chip-mounted unit. That is, in this final compression-bonding step, large fillets 5A can be formed on the side faces of the IC chip 1-6 by the dam portion 345 provided on the IC chip 1-6, so that a sealing power of the side faces of the IC chip 1-6 can be improved.

As a height of the dam portion 345 as an example of the bonding-material flow regulating member, the dam portion 345 preferably has a thickness at least twice that of the conventional organic film 339 in order to ensure the above-described effects. Thermal resistance of the individual organic films 348, 339 constituting the dam portion 345, and examples of the bonding material 5, are the same as in the fourteenth embodiment.

In the above description, it has been described that the bumps 2 of the IC chip 1-6 and the electrodes 7 of the circuit board 6-6 are brought into contact with each other, respectively, during the bonding step. However, this is not limitative, and it is also possible that the bumps 2 of the IC chip 1-6 and the electrodes 7 of the circuit board 6-6 are not brought into contact with each other, respectively, during the bonding step, but that the bumps 2 of the IC chip 1-6 and the electrodes 7 of the circuit board 6-6 are brought into contact with each other, respectively, for the first time during the final compression-bonding step.

Although the passivation film 309 is disposed on the bonding surface of the IC chip 1-6 in FIGS. 60C and 61, this is not limitative and it is allowable that the passivation film 309 is absent.

According to the fifteenth embodiment, the dam portion 345 is disposed as an example of the bonding-material flow regulating member in a quadrilateral frame shape region spaced from the IC chip bonding region 6*a*-6 of the circuit board 6-6 by a specified distance and surrounding the IC chip bonding region 6*a*-6. As a result, during the flow of the bonding material 5 between the bonding surface of the IC chip 1-6 and the IC chip bonding region 6*a*-6 of the circuit board 6-6 toward the outside of the IC chip bonding region 6*a*-6 during the compression-bonding step, the bonding material 5 pressed out to flow out along the circuit board surface is intercepted by the dam portion 345 so as to be swollen up, so that large fillets 5A can be formed on the side faces of the IC chip 1-6. Thus, the sealing power of the side faces of the IC chip 1-6 can be improved, thereby allowing adhesion to be improved, so that reliability of bonding and sealing can be enhanced.

Sixteenth Embodiment

Figure 64A:
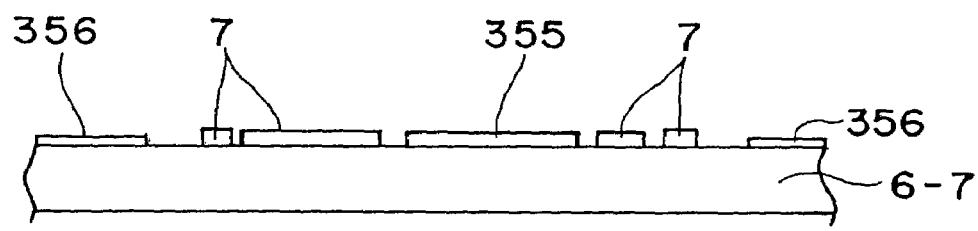
FIGS. 64A and 64B are a side view and a plan view, respectively, of a circuit board prior to a bonding step of an IC chip mounting method according to a sixteenth embodiment of the present invention.
Figure 64B:
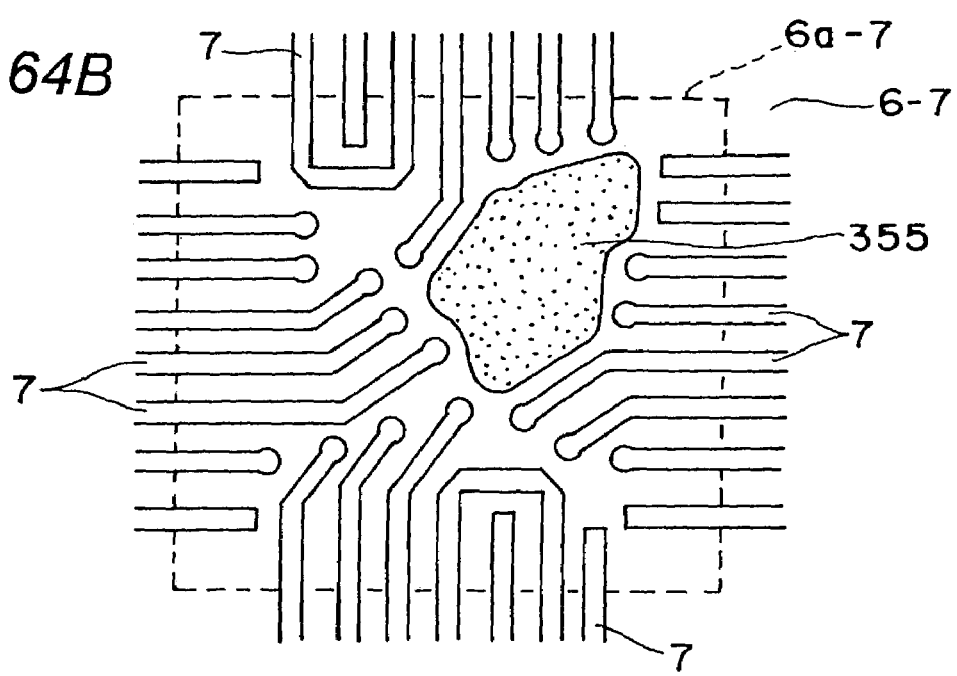
Figure 64C:
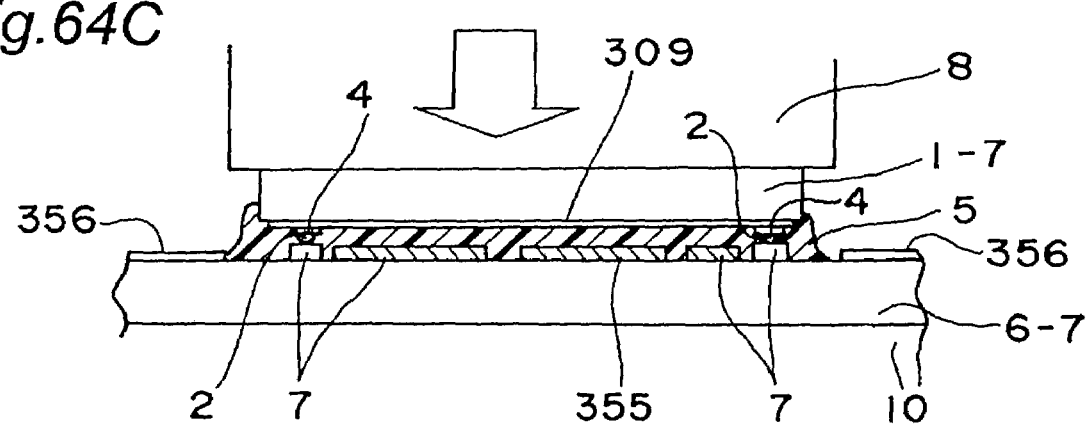
FIG. 64C is a partial cross-sectional side view of an IC chip, the circuit board, and a bonding material during a compression-bonding step.
Figure 65:
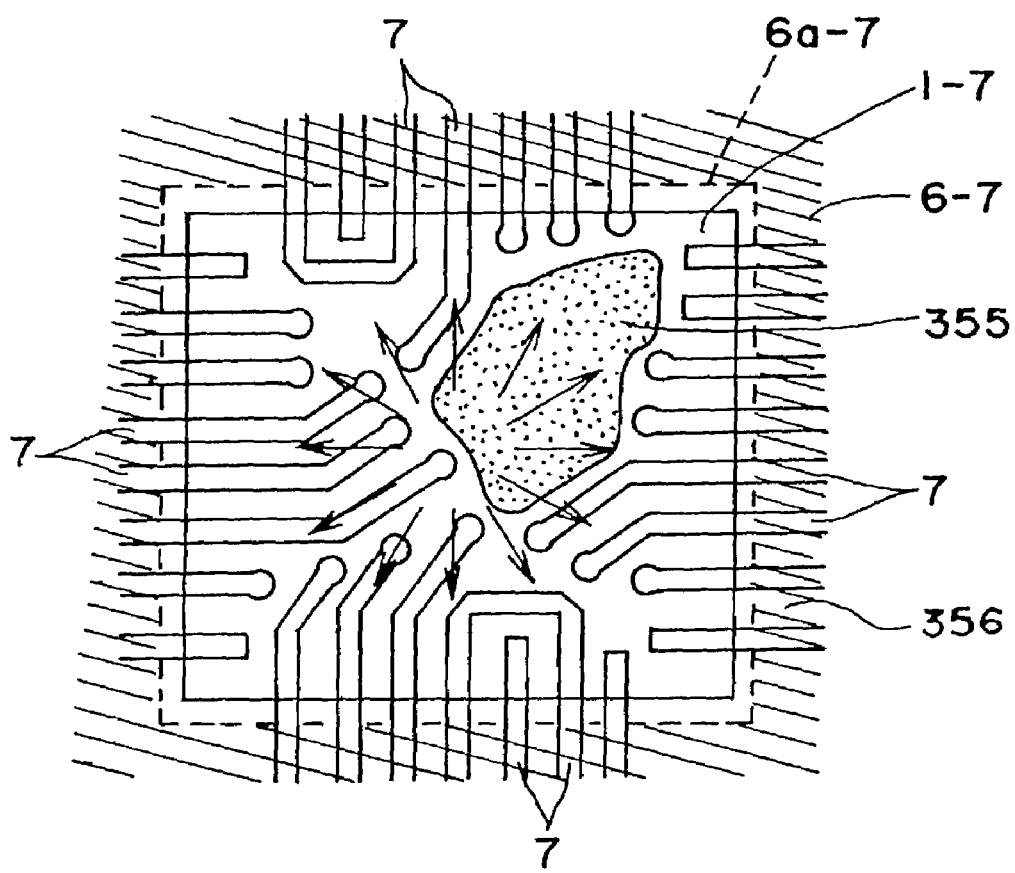
FIG. 65 is a plan view showing a flow state of the bonding material during the compression-bonding step of the sixteenth embodiment and showing movement of the bonding material on the circuit board by seeing through the IC chip.
Figure 66A:
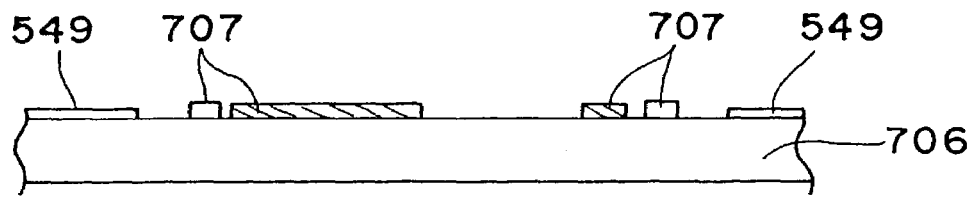
FIGS. 66A and 66B are a side view and a plan view of a circuit board prior to a bonding step of an IC chip mounting method according to a prior art example for explaining the sixteenth embodiment.
Figure 66B:
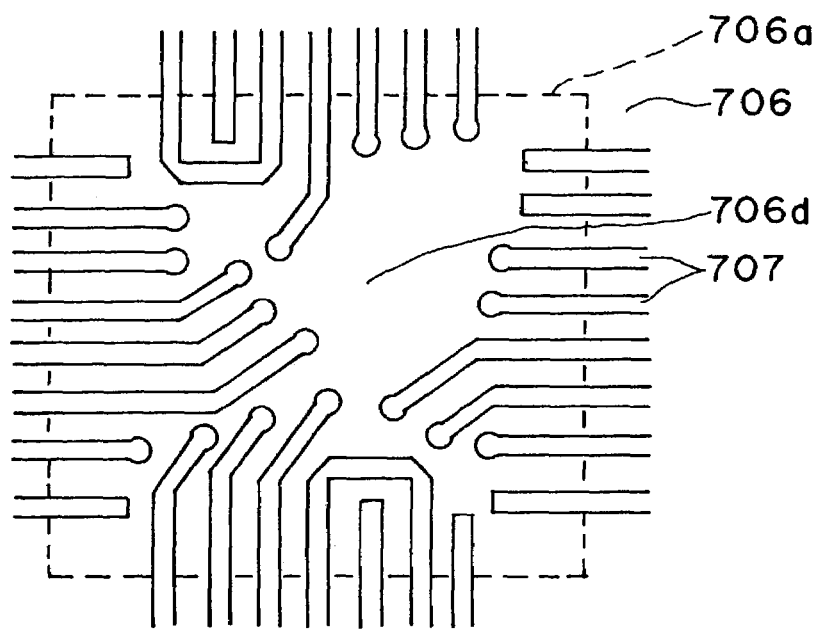
Figure 66C:
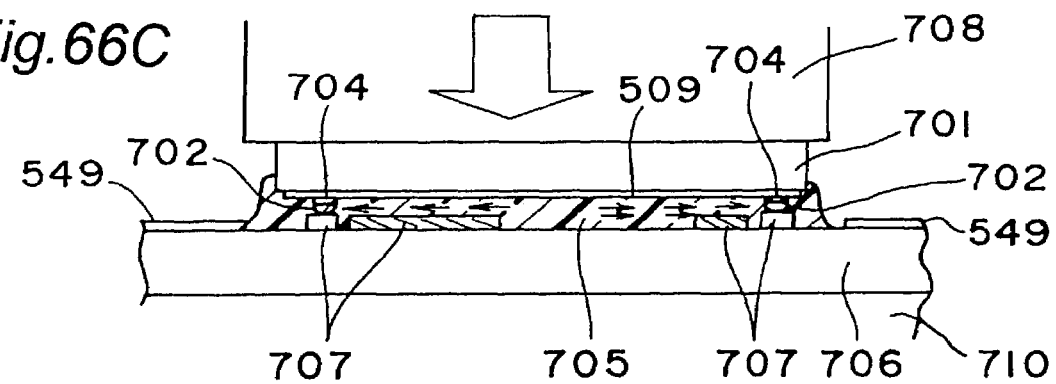
FIG. 66C is a partial cross-sectional side view of an IC chip, the circuit board, and a bonding material during a compression-bonding step of this prior art example.
Figure 67:
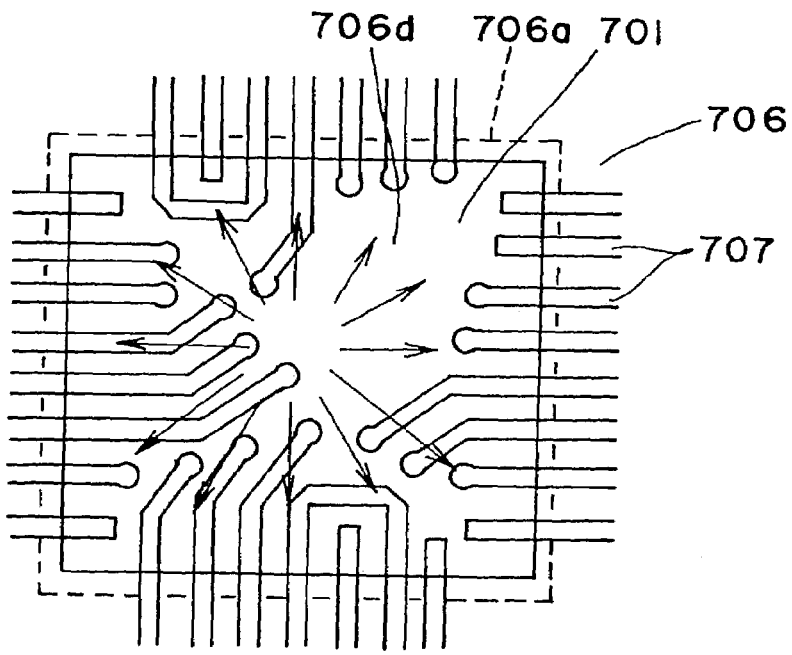
FIG. 67 is a plan view showing a flow state of the bonding material during the compression-bonding step of the prior art example in FIGS. 66A, 66B and 66C and showing movement of the bonding material on the circuit board by seeing through the IC chip.

An IC chip mounting method and an IC chip-mounted unit manufactured by the method as an example of an electronic component mounting method and an electronic component-mounted unit manufactured by the method according to a sixteenth embodiment of the present invention are explained with reference to FIGS. 64A to 67. FIGS. 64A and 64B are a side view and a plan view of a circuit board prior to a bonding step of the IC chip mounting method according to the sixteenth embodiment, and FIG. 64C is a partial cross-sectional side view of an IC chip, a circuit board, and a bonding material during a compression-bonding step. FIG. 65 is a plan view showing a flow state of the bonding material during the compression-bonding step and showing movement of the bonding material on the circuit board by seeing through the IC chip. FIGS. 66A and 66B are a side view and a plan view of a circuit board prior to a bonding step of an IC chip mounting method according to a prior art example for explaining the sixteenth embodiment, and FIG. 66C is a partial cross-sectional side view of an IC chip, a circuit board, and a bonding material during a compression-bonding step in the prior art example of FIGS. 66A and 66B. FIG. 67 is a plan view showing a flow state of the bonding material during the compression-bonding step of the prior art example of FIGS. 66A, 66B and 66C and showing movement of the bonding material on the circuit board by seeing through the IC chip.

In the sixteenth embodiment, as shown in FIG. 64B, a projective portion 355 as a bonding-material flow regulating member having a thickness generally equal to a thickness of electrodes 7 of a circuit board 6-7 as an example of a circuit formation article is provided over a region which corresponds to a bonding surface of a square IC chip 1-7 as an example of an electronic component, and which is a region having a wiring density lower than a specified value and decentered from a center within an IC chip bonding region 6*a*-7 of the circuit board 6-7 (in other words, a region where the bonding material 5 shows a nonuniform flow). This projection 355 is formed of solder resist or copper foil. As a method for forming the projective portion 355, in the case of copper foil, the projective portion 355 is formed simultaneously with wiring lines (for example, by etching of copper foil stuck to resin, or by plating onto a resin board).

In the case where solder resist is used, the projective portion 355 is, preferably, formed simultaneously with formation of solder resist onto the board.

By disposing the projective portion 355 as described above, wiring density of an electrode pattern can be made more uniform within the IC chip bonding region 6a-7 of the circuit board 6-7, so that flow of bonding material 5 serving as a sealing resin can be made more uniform. Thus, overflow quantity of the bonding material 5 that overflows outside from between the IC chip 1-7 and the circuit board 6-7 can be made more uniform, thereby allowing a more stable bonding to be achieved.

In contrast to this, conventionally, as shown in FIGS. 66A, 66B, 66C and 67, there exists a region 706d having a wiring density lower than a specified value within IC chip bonding region 706a of circuit board 706, and nonuniformity of a pattern wiring density would cause the following issues. After bonding material 705 is fed to the circuit board 706, the bonding surface of IC chip 701, on which bumps 702 are formed on electrodes 704 of the bonding surface, and the IC chip bonding region 706a of the circuit board 706 are bonded together so that the bumps 702 on the electrodes 704 of the IC chip 701 and the electrodes 707 of the circuit board 706 come into electrical contact with each other, respectively, via the bonding material 705 interposed between the bonding surface of the IC chip 701 and the IC chip bonding region 706a of the circuit board 706. By placing the circuit board 706 on a base, and bringing a heated pressurizing member into contact with the IC chip 701 and applying pressure thereto, the IC chip 701 is compression-bonded in a heated and pressurized state so that the bonding material 705 between the bonding surface of the IC chip 701 and the IC chip bonding region 706a of the circuit board 706 is cured. In such a case, when the bonding material 705 flows out from within the IC chip bonding region 706a of the circuit board 706 toward the outside, the bonding material 705 would result in a nonuniform flow, so that an overflow quantity of the bonding material 5 overflowing outside from between the IC chip 701 and the circuit board 706 would become nonuniform, thereby making it impossible to achieve a stable bonding.

In order to prevent such deterioration of bonding power and sealing power, in the sixteenth embodiment, prior to a bonding material feeding step, as shown in FIGS. 64A and 64B, the projective portion 355 as a bonding-material flow regulating member having a thickness generally equal to the thickness of the electrodes 7 of the circuit board 6-7 is provided over a region having an electrode wiring density lower than a specified value and decentered from the center within the IC chip bonding region 6a-7 of the circuit board 6-7.

In a state that the projective portion 355 is disposed as described above, during the bonding material feeding step, a bonding material 5 containing at least an insulative thermosetting resin is fed to at least either one of the bonding surface of the IC chip 1-7 or the IC chip bonding region 6a-7 of the circuit board 6-7. The method of feeding the bonding material 5 is the same as in the tenth embodiment.

Next, during a bonding step, the bonding surface of the IC chip 1-7 is laid on the IC chip bonding board 6-7 of the circuit board 6-7 with the bonding material 5 interposed therebetween. Then, these members are so positioned that the bumps 2 on electrodes 4 of the IC chip 1-7 and electrodes 7 of the circuit board 6-7 come into mutual electrical contact via the bonding material 5 interposed between the bonding surface of the IC chip 1-7, on which the bumps 2 are formed on the electrodes 4, respectively, and the IC chip bonding region 6a-7 of the circuit board 6-7. Thereafter, the two members are bonded together. This bonding step may be performed in a state that the circuit board 6-7 is placed on a base 10, or may be performed in two steps, i.e., a bonding step to be performed at a different place in a state that the IC chip 1-7 is laid on the circuit board 6-7 with the bonding material 5 interposed therebetween, and a final compression-bonding step to be subsequently performed in which the circuit board 6-7 having the IC chip 1-7 laid thereon with the bonding material 5 interposed therebetween is placed on the base 10.

Next, during a final compression-bonding step, a pressurizing member 8 is brought into contact with the IC chip 1-7, so that a pressurizing force acts from the pressurizing member 8 toward the base 10, on which the circuit board 6-7 having the IC chip 1-7 laid thereon with the bonding material 5 interposed therebetween is placed, and moreover, heat of a heater contained in the pressurizing member 8 is transferred from the pressurizing member 8 to the IC chip 1-7. As a result of this, by a specified pressurizing force being exerted under application of a specified temperature, the bonding surface of the IC chip 1-7 is pressed against the IC chip bonding region 6a-7 of the circuit board 6-7, causing the bumps 2 on the individual electrodes 4 of the bonding surface of the IC chip 1-7 to come into contact with the individual electrodes 7 within the IC chip bonding region 6a-7 of the circuit board 6-7. In this state, when the bonding material 5 flows from the central portion to peripheral portions of the IC chip bonding region 6a-7 between the bonding surface of the IC chip 1-7 and the IC chip bonding region 6a-7 of the circuit board 6-7, the electrode wiring density within the IC chip bonding board 6-7 is generally uniformized in a case where the projective portion 355 is present as shown in FIG. 65, as compared with a case where the projective portion 355 is absent, so that the bonding material 5 can be prevented from flowing nonuniformly during the flow of the bonding material 5 from the central portion toward the peripheral portions of the IC chip bonding board 6-7. Thus, the bonding material 5 is cured by heat, while being held generally uniformly distributed, over at an entire whole IC chip bonding board 6-7, thereby achieving manufacture of an IC chip-mounted unit. That is, during this final compression-bonding step, nonuniform pressing out of the bonding material 5 from the central portion to the peripheral portions of the IC chip bonding board 6-7 during compression-bonding can be regulated by the projective portion 355. In addition, examples of the bonding material 5 are the same as in the fourteenth embodiment.

In the above description, it has been described that the bumps 2 of the IC chip 1-7 and the electrodes 7 of the circuit board 6-7 are brought into contact with each other, respectively, during the bonding step. However, this is not limitative, and it is also possible that the bumps 2 of the IC chip 1-7 and the electrodes 7 of the circuit board 6-7 are not brought into contact with each other, respectively, during the bonding step, but that the bumps 2 of the IC chip 1-7 and the electrodes 7 of the circuit board 6-7 are brought into contact with each other, respectively, for the first time during the final compression-bonding step.

Although the passivation film 309 is disposed on the bonding surface of the IC chip 1-7 in FIG. 64C, this is not limitative and it is allowable that the passivation film 309 is absent. Also, although an organic film 356 similar to the conventional organic film 549 is disposed in a quadrilateral frame shape outside the IC chip bonding board 6-7 away therefrom by a specified distance, such an organic film 356 may also be absent.

According to the sixteenth embodiment, the projective portion 355 as a bonding-material flow regulating member having a thickness generally equal to the thickness of the electrodes 7 of the circuit board 6-7 is provided over a region having an electrode wiring density lower than a specified value and decentered from the center within the IC chip bonding region 6a-7 of the circuit board 6-7. As a result, pattern wiring density can be made more uniform within the IC chip bonding board 6-7 of the circuit board 6-7, so that flow of the bonding material 5 serving as a sealing resin can be made more uniform. Thus, overflow quantity of the bonding material 5 that overflows outside from between the IC chip 1-7 and the circuit board 6-7 can be made more uniform, thereby allowing a more stable bonding to be achieved.

Seventeenth Embodiment

Figure 68A:
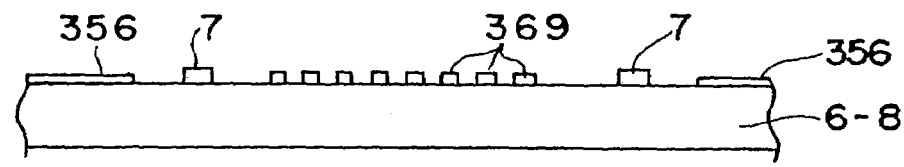
FIGS. 68A and 68B are a side view and a plan view of a circuit board prior to a bonding step of an IC chip mounting method according to a seventeenth embodiment of the present invention.
Figure 68B:
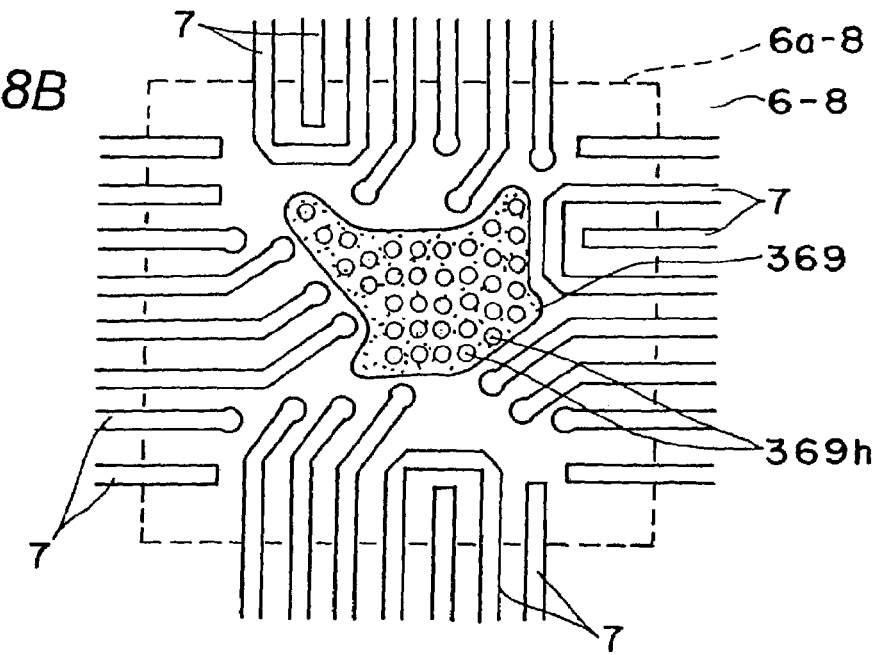
Figure 70:
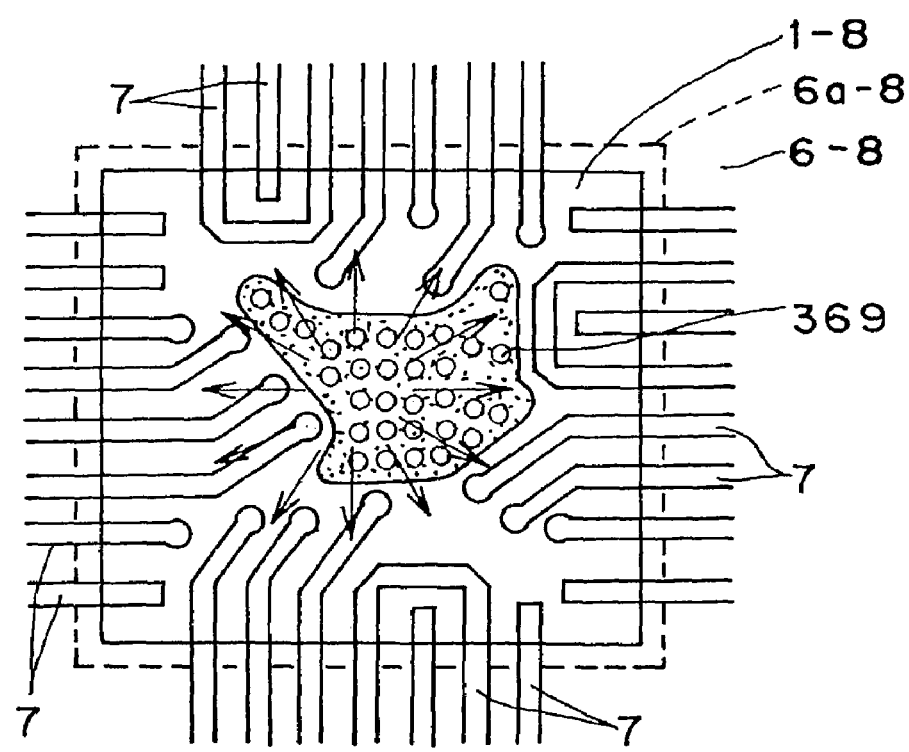
FIG. 70 is a plan view showing a flow state of the bonding material during the compression-bonding step of the seventeenth embodiment and showing movement of the bonding material on the circuit board by seeing through the IC chip.

An IC chip mounting method and an IC chip-mounted unit manufactured by the method as an example of an electronic component mounting method and an electronic component-mounted unit manufactured by the method according to a seventeenth embodiment of the present invention are explained with reference to FIGS. 68A to 72. FIGS. 68A and 68B are a side view and a plan view of a circuit board prior to a bonding step of the IC chip mounting method according to the seventeenth embodiment. FIGS. 69A and 69B are a partial cross-sectional side view and a partially enlarged and partial cross-sectional side view, respectively, of an IC chip, a circuit board, and a bonding material during a compression-bonding step. FIG. 70 is a plan view showing a flow state of the bonding material in the compression-bonding step and showing movement of the bonding material on the circuit board by seeing through the IC chip. FIGS. 71 and 72 are partially enlarged partial cross-sectional side views of an IC chip, a circuit board, and a bonding material during a compression-bonding step of an IC chip mounting method according to a comparative example for explaining the sixteenth embodiment.

The seventeenth embodiment is intended to improve adhesion between a bonding material 5 and a board 6-8 at the projective portion 355 formed of solder resist or copper foil of the sixteenth embodiment. That is, in a case where such a projective portion 355 as in the sixteenth embodiment is formed by the same composition as the electrodes 7 as an example, the projective portion 355 between the bonding material 5 and the board 6 in the state that the IC chip 1 and the board 6 have been bonded with the bonding material 5 has a disposition of an Au layer 355a, an Ni layer 355b, and a Cu layer 355c in an order from a bonding material side as shown in FIGS. 71 and 72, where the Cu layer 355c is in contact with the board 6 and adhesion between the bonding material 5 and the Au layer 355a is weak, so that there is a possibility that such a separated portion as indicated by 395 might occur therebetween.

Accordingly, in this seventeenth embodiment, a meshed electrode 369 is used as an example of a bonding-material flow regulating member instead of the projective portion 355. That is, within an IC chip bonding region 6a-8 of a circuit board 6-8 as an example of a circuit formation article, over a region having a wiring density lower than a specified value and decentered from a center, is provided the meshed electrode 369 as an example of the bonding-material flow regulating member of the circuit board 6-8. This meshed electrode 369 can be formed by meshing an electrode made of, for example, gold, so as to be highly adhesive with the bonding material 5 by virtue of an anchor effect to the bonding material 5 of sealing resin.

As described above, according to the seventeenth embodiment, by disposing the meshed electrode 369, wiring density of the electrode pattern within the IC chip bonding region 6a-8 of the circuit board 6-8 can be made more uniform, so that flow of the bonding material 5 can be made more uniform. Thus, an overflow quantity of the bonding material 5 that overflows outside from between the bonding surface of a square IC chip 1-8 as an example of an electronic component and the IC chip bonding region 6a-8 of the circuit board 6-8 can be made more uniform, thereby allowing a more stable connection to be achieved. Furthermore, in addition to the above effects, the board 6-8 is exposed at through hole portions 369h, . . . , 369h constituting a mesh of the meshed electrode 369, which allows the bonding material 5 disposed on the meshed electrode 369 to penetrate through the through hole portions 369h, . . . , 369h, thus making direct contact with the board 6-8. As a result, the bonding material 5 is bonded in direct close contact with the board 6-8 at the through hole portions 369h, . . . , 369h of the meshed electrode 369, so that adhesion between the bonding material 5 and the board 6-8 can be improved.

Eighteenth Embodiment

An IC chip mounting method and an IC chip-mounted unit manufactured by the method as an example of an electronic component mounting method and an electronic component-mounted unit manufactured by the method according to an eighteenth embodiment of the present invention are explained with reference to FIGS. 73A to 74B. FIGS. 73A and 73B are a side view and a plan view of a circuit board prior to a bonding step of the IC chip mounting method according to the eighteenth embodiment of the present invention. FIGS. 74A and 74B are a partial cross-sectional side view and a partially enlarged and partial cross-sectional side view of an IC chip, a circuit board, and a bonding material during a compression-bonding step.

The eighteenth embodiment is intended to improve adhesion between the bonding material 5 and the projective portion 355, with regard to the projective portion 355 formed of solder resist or copper foil of the sixteenth embodiment. That is, after a projective portion 355 as shown in the sixteenth embodiment is formed, an organic film 339 as an example of a bonding-material flow regulating member is disposed generally all over regions outside and inside an IC chip bonding region 6a-9 of a board 6-9, except regions 340 which include the projective portion 355 and bonding portions of the electrodes 7 necessary for the bonding with the bumps 2, by which flow regulation of the bonding material 5 is performed by the organic film 339. Therefore, in this eighteenth embodiment, both the projective portion 355 and the organic film 339 function as an example of a bonding-material flow regulating member.

The organic film 339, which is similar to the organic film 339 employed in the fourteenth embodiment, is composed of, for example, a solder resist such as polyimide or polybenzoxazole (PBO) which functions as a heat-resistant coating that prevents electrical contact with other wiring lines or bumps or the like to maintain an insulative property and protect conductors. Such an organic film 339 is spin-coated to a thickness of, for example, about 3 to 7 μm so as to be applied all over on and outside IC chip bonding region 6a-9 of the circuit board 6-9. Thereafter, as shown in FIGS. 73A and 73B, the regions 340 including the bonding portions of the electrodes 7, . . . , 7 necessary for the bonding with the bumps 2, ..., 2 are removed in strip shape, so that the bonding portions are exposed. Removal regions 340 may be either independent of one another each in strip shape or connected so as to be formed into a frame shape. As a result of this, the organic film 339 is formed generally all over regions outside and inside the IC chip bonding region 6a-9 of the board 6-9 including the projective portion 355, except the bonding portions of the electrodes 7 necessary for the bonding with the bumps 2.

According to the eighteenth embodiment, as described above, the organic film 339 is disposed generally all over regions outside and inside the IC chip bonding region 6a-9 of the circuit board 6-9 including the projective portion 355, except the bonding portions of the electrodes 7 with the bumps 2. As a result, during the flow of the bonding material 5 between the bonding surface of the IC chip 1-9 and the IC chip bonding region 6a-9 of the circuit board 6-9 from the central portion to the peripheral portions during a compression-bonding step, the organic film 339 functions as the bonding-material flow regulating member. Therefore, the flow of the bonding material 5 from the central portion to the peripheral portions in the vicinities of the side-verge portions of individual sides of the IC chip 1-9 can be made generally uniform, and moreover, a distribution of the bonding material 5 within the bonding surface of the IC chip 1-9 can be made uniform, thus allowing adhesion to be improved so that reliability of bonding and sealing can be enhanced.

Nineteenth Embodiment

Figure 75:
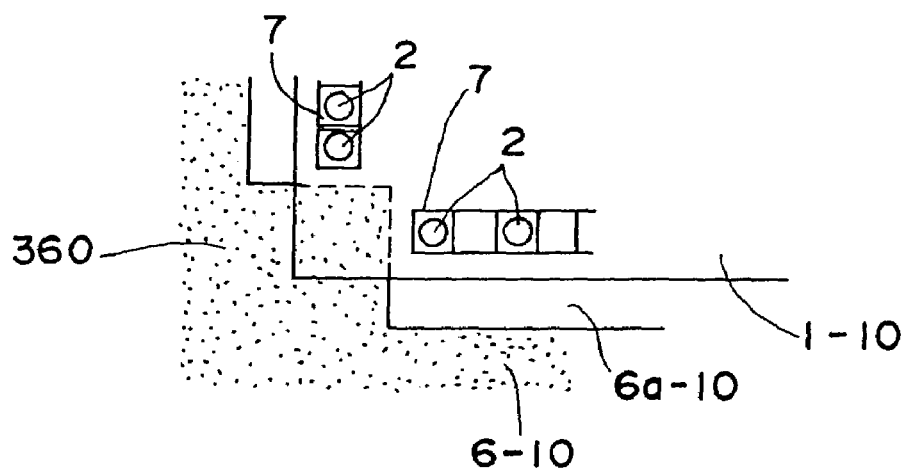
FIG. 75 is a plan view of a circuit board prior to a bonding step of an IC chip mounting method according to a nineteenth embodiment of the present invention.
Figure 76:
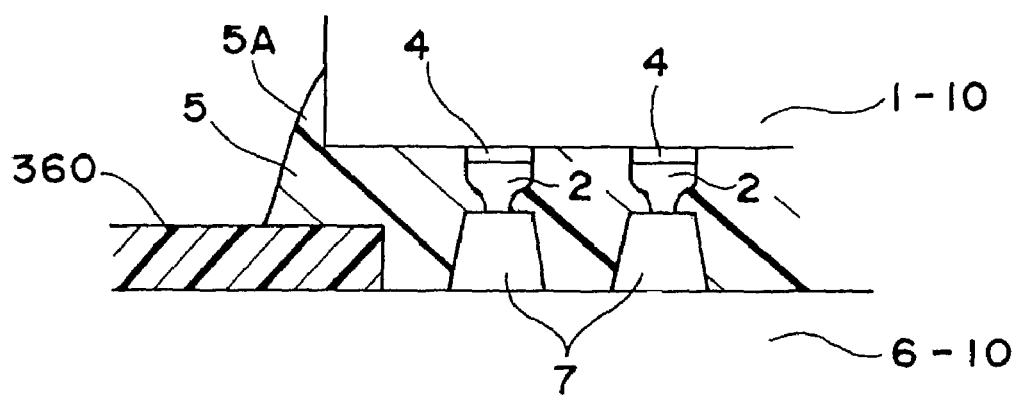
FIG. 76 is a partially enlarged and partial cross-sectional side view of an IC chip, the circuit board, and a bonding material during a compression-bonding step of the IC chip mounting method according to the nineteenth embodiment.
Figure 77:
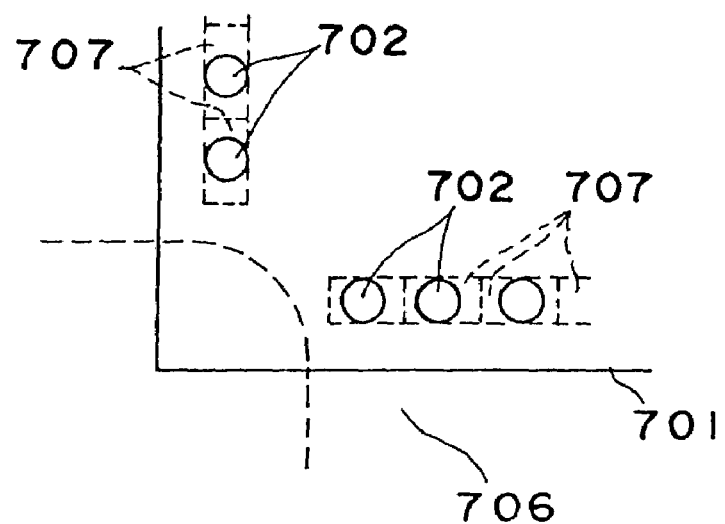
FIG. 77 is a plan view of a circuit board prior to a bonding step of an IC chip mounting method according to a prior art example for explaining the nineteenth embodiment.
Figure 78:
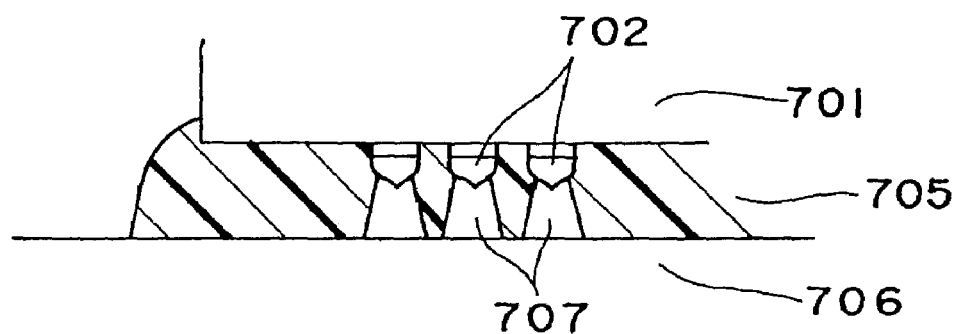
FIG. 78 is a partially enlarged and partial cross-sectional side view of an IC chip, the circuit board, and a bonding material during a compression-bonding step of the prior art example in FIG. 77.

An IC chip mounting method and an IC chip-mounted unit manufactured by the method as an example of an electronic component mounting method and an electronic component-mounted unit manufactured by the method according to a nineteenth embodiment of the present invention are explained with reference to FIGS. 75 to 78. FIG. 75 is a plan view of a circuit board prior to a bonding step of the IC chip mounting method according to the nineteenth embodiment. FIG. 76 is a partially enlarged and partial cross-sectional side view of an IC chip, a circuit board, and a bonding material during a compression-bonding step. FIG. 77 is a plan view of a circuit board prior to a bonding step of an IC chip mounting method according to a prior art example for explaining the nineteenth embodiment. FIG. 78 is a partially enlarged and partial cross-sectional side view of an IC chip, the circuit board, and a bonding material during a compression-bonding step of the prior art example.

In the tenth embodiment, a singularity or plurality of dummy electrodes 303 are disposed in the vicinities of individual corner portions of a square IC chip 1-10 where the electrodes 7 are absent. However, as the nineteenth embodiment, it is also possible that an organic film 360 is disposed as an example of the bonding-material flow regulating member, instead of the dummy electrodes 303, so that the same working effects as the tenth embodiment can be produced.

More specifically, as shown in FIG. 75, with use of a sheet material as an example of bonding material 5, an organic film 360 as an example of the bonding-material flow regulating member is disposed so as to cover all vicinities of individual corner portions, where the electrodes 7 are not disposed, of a square IC chip bonding region 6a-10 of a circuit board 6-10 as an example of a circuit formation article, corresponding to the bonding surface of an IC chip 1-10 as an example of an electronic component, by which flow regulation of the bonding material 5 is performed by the organic film 360.

The organic film 360 may be disposed only at corner portions, or disposed in a quadrilateral frame shape by disposing organic films 360 at individual corner portions and connecting them one with another.

Conventionally, as shown in FIGS. 77 and 78, bonding material 705 would flow out at a higher flow speed from positions where electrodes 707 are lacking, i.e. individual corner-portion vicinities, of IC chip bonding region 706a of circuit board 706, along the board to the outside of IC chip bonding region 706a. As a result, the bonding material 705 would lower in density, thereby causing an insufficiency of a quantity of resin for sealing side faces of the IC chip 701 as well as a decrease of size of fillets for sealing the side faces of the IC chip 701, which might lead to occurrence of peeling between the IC chip 701 and the bonding material 705 in the peripheral portions of the IC chip bonding region, or occurrence of peeling between the electrodes 707 of the circuit board 706 and the bonding material 705.

In contrast to this, in the nineteenth embodiment, the organic film 360 as an example of the bonding-material flow regulating member is disposed so as to cover all the vicinities of individual corner portions, where the electrodes 7 are not disposed, of the IC chip bonding region 6a-10, by which the above-described issue can be solved.

According to the nineteenth embodiment, while the square IC chip bonding region 6a-10 of the circuit board 6-10 has an array of electrodes 7, ..., 7 generally equidistantly spaced in each of the vicinities of side verges of the four sides except the corner portions of the four sides, the organic film 360 is disposed at corner portions where the electrodes 7 are absent in the vicinities of the side verges of the IC chip bonding region 6a-10 of the circuit board 6-10. As a result, when the bonding material 5 between the bonding region of the IC chip 1-10 and the IC chip bonding region 6a-10 of the circuit board 6-10 flows from the central portion to the corner portions of the peripheral portions during a compression-bonding step, the organic film 360 functions as a bonding-material flow regulating member even at the corner portions where the electrodes 7 are absent, so that flow speed SP1 in the central portion of the IC chip bonding region 6a-10 of the board 6-10 and flow speed SP2 in the peripheral portions of the IC chip bonding region 6a-10 of the board 6-10 become generally equal to each other. Thus, the flow of the bonding material 5 from the central portion to the corner portions of the peripheral portions in the vicinities of the side verges of the individual sides as well as the vicinities of the corner portions in the IC chip bonding region 6a-10 can be made generally uniform, and moreover, a distribution of the bonding material 5 within the bonding surface of the IC chip 1-10, i.e., within the IC chip bonding region 6a-10 of the circuit board 6-10 can be made uniform, and furthermore, the flow of the bonding material 5 along the circuit board surface is intercepted by the organic film 360 so as to be swollen up at the individual corner portions, so that fillets 5A covering side faces of the IC chip 1-10 can be formed. As a result of achievement that the distribution of the bonding material 5 within the bonding surface of the IC chip 1-10 as well as within the IC chip bonding region 6a-10 of the circuit board 6-10 can be made uniform as described above, the bonding material 5 can be prevented from lowering in density, and therefore, adhesion between the IC chip 1-10 and the bonding material 5 in the central portion and peripheral portions, particularly corner portions, of the IC chip bonding region 6a-10 is increased, and moreover, adhesion between the electrodes 7 or organic film 360 of the board 6-10 and the bonding material 5 is increased, so that the peeling described above can be prevented, and that reliability of bonding and sealing can be enhanced.

It the above-described tenth to nineteenth embodiments, for the bumps 2, in addition to the method of preliminarily leveling the bumps into uniform height before putting them into contact with the individual electrodes 7 of the circuit board, also adoptable is a mounting method of the so-called non-stud bump (NSD) type in which the bumps 2 are not preliminarily leveled but put into contact with the individual electrodes 7 of the circuit board and leveling is performed with the electrodes 7. This non-stud bump (NSD) type mounting method is explained below.

A mounting method of an IC chip (typically denoted by 401, hereinafter) onto a circuit board (typically denoted by 406, hereinafter) in each of the foregoing embodiments is described with reference to FIGS. 81A to 84C.

With regard to the IC chip 401 of FIG. 81A, bumps (projection electrodes) (typically denoted by 402, hereinafter) are formed on Al pad electrodes (typically denoted by 404, hereinafter) of the IC chip 401 by wire bonding equipment through operations as shown in FIGS. 80A to 80F. More specifically, in FIG. 80A, a ball 196 is formed at a lower end of a wire 195 protruding from a holder 193. In FIG. 80B, the holder 193 holding the wire 195 is moved down, so that the ball 193 is bonded to the electrode 404 of the IC chip 401 to form a general bump shape. In FIG. 80C, while the wire 195 is being fed downward, the holder 193 starts to move up. The holder 193 is moved to a generally quadrilateral loop 199 as shown in FIG. 80D, so that a curved portion 198 is formed on top of the bump shape as shown in FIG. 80E, followed by tearing off the wire, by which a bump 402 as shown in FIG. 80F is formed. Otherwise, it is also possible that the wire 195 is clamped by the holder 193 in FIG. 80B, then pulled up by moving up the holder 193, so that gold wire 195 is torn off, thereby forming a shape of the bump 402 as shown in FIG. 80G. A state that bumps 402 are formed at individual electrodes 404 of the IC chip 401 as described above is shown in FIG. 81B. As an example, respective dummy bumps are formed in the same way as the bumps 402.

Next, on electrodes 407 of a circuit board 406 shown in FIG. 81C, is placed a thermosetting resin sheet (typically denoted by 405, hereinafter) as an example of bonding material cut into a size slightly larger than a size of the IC chip 401 as shown in FIG. 81D. Then, by a sticking tool 408A heated to, for example, 80 to 120° C., the thermosetting resin sheet 405 as a concrete example of the bonding material is stuck onto the electrodes 407 of the board 406 with a pressure of, for example, about 49 to 98 N (5-10 kgf/cm$^2$). Subsequently, a separator 405a removably disposed on one side of the thermosetting resin sheet 405 facing the tool 408A is separated from the sheet, whereby a preparation step of the board 406 is completed. This separator 405a is purposed to prevent the thermosetting resin sheet 405 from sticking to the tool 408A. In this case, the thermosetting resin sheet 405 is preferably provided by those which contain silica or other inorganic fillers (e.g., epoxy resin, phenol resin, polyimide, and the like) or which do not contain any inorganic filler (e.g., epoxy resin, phenol resin, polyimide, and the like), and moreover, which have such a thermal resistance as to withstand high temperatures during a later reflow step (e.g., such a thermal resistance as to withstand 240° C. for 10 seconds).

Figure 82F:
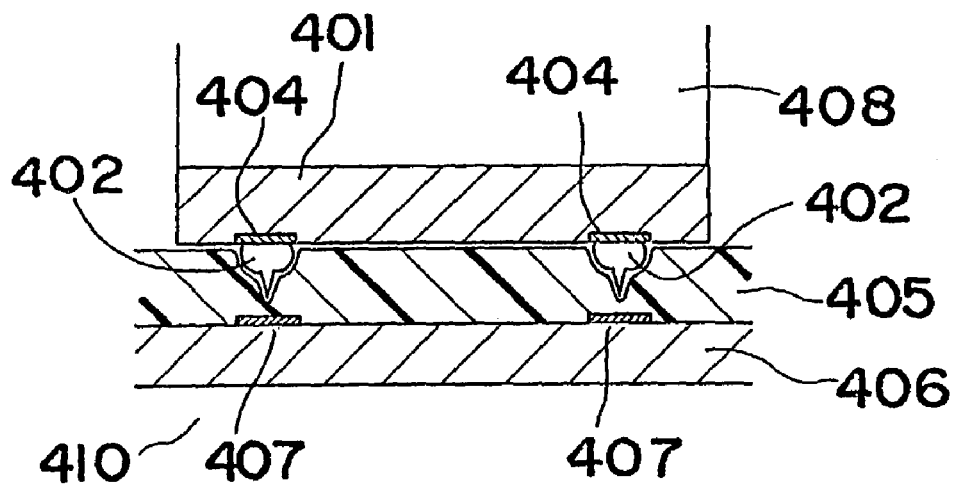
FIGS. 82F and 82G are, respectively, explanatory views showing the IC chip mounting method according to the above embodiments, following FIG. 60C.
Figure 84A:
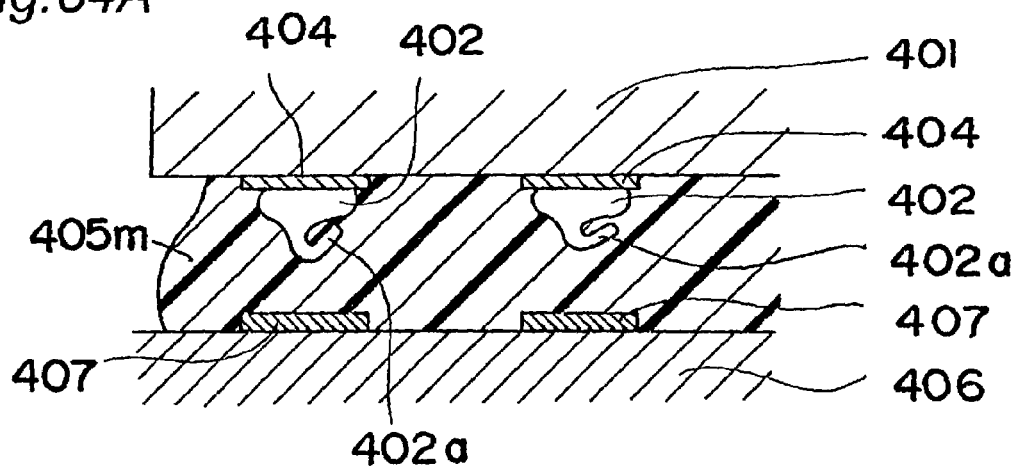
FIGS. 84A, 84B and 84C are, respectively, explanatory views showing a step of bonding the circuit board and the IC chip in the mounting method according to the above embodiments.
Figure 84B:
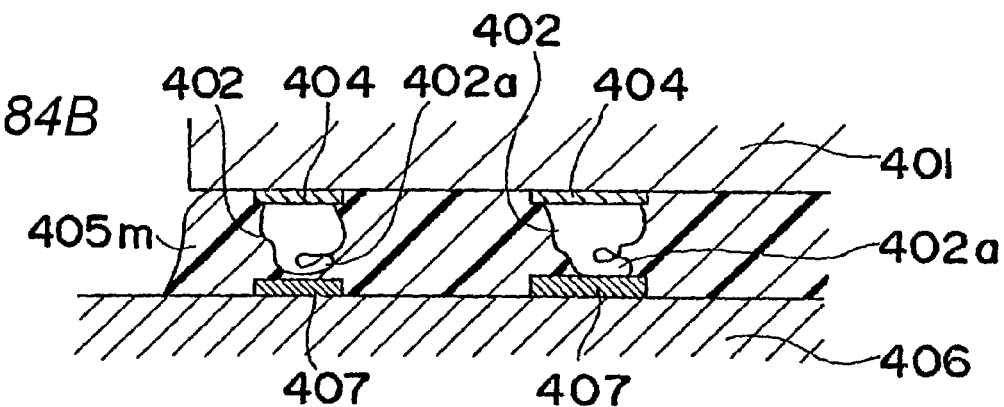
Figure 84C:
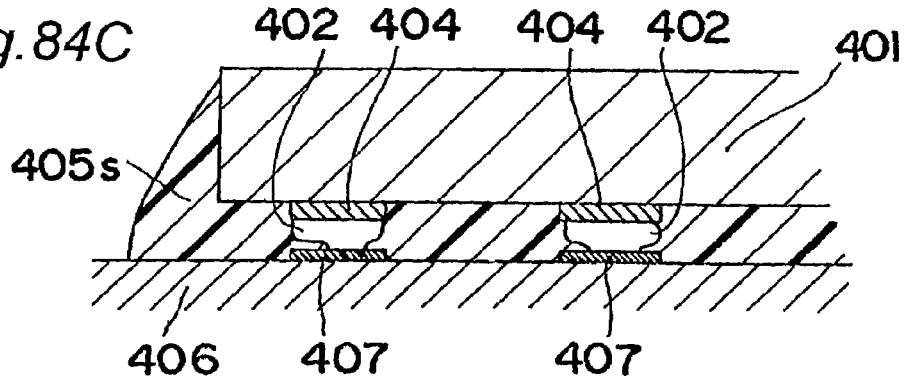

Next, as shown in FIGS. 81E and 82F, the IC chip 401, on which the bumps 402 have been formed on the electrodes 404 in a preceding step, is positioned and then pressed onto the electrodes 407 of the board 406 prepared in a preceding step corresponding to the electrodes 404 of the IC chip 401, with a heated bonding tool 408. In this process, the bumps 402 are increasingly pressed at their head portions 402a on the electrodes 407 of the board 406 while being deformed as shown in FIGS. 84A to 84B, where a load to be applied to the bump 402 side via the IC chip 401, although differing depending on a diameter of the bumps 402, needs to be such a level that the head portions 402a of the bumps 402, which are bent so as to be overlapped, are necessarily deformed as shown in FIG. 84C. This load needs to be at least 196 mN (20 gf). An upper limit of the load is set to such a level that the IC chip 401, the bumps 402, the circuit board 406, and the like are not damaged. A maximum load, in some cases, may be over 980 mN (100 gf). It is noted that reference numerals 405m and 405s denote melted thermosetting resin resulting from melting of the thermosetting resin sheet 405 by heat of the bonding tool 408, and heat-cured resin after the melting, respectively.

In addition, two steps comprising a positioning step for positioning the IC chip 401, on which the bumps 402 have been formed on the electrodes 404 in the preceding step, onto the electrodes 407 of the board 406 prepared in the preceding step corresponding to the electrodes 404 of the IC chip 401, with the bonding tool 408 heated by a built-in heater such as a ceramic heater or a pulse heater, and a step for performing a press-bonding process after the positioning step, may be performed with one positioning and press-bonding device. However, it is also allowed to employ different devices, for example, to perform the positioning step by a positioning device and perform the press-bonding step by a bonding device with a view to improving productivity by simultaneously performing positioning work and press-bonding work for cases where a multiplicity of boards are continuously produced.

In this case, as an example, a glass-fabric laminated epoxy board (glass epoxy board), a glass-fabric laminated polyimide resin board, or the like is used as the circuit board 406. These boards 406 have undergone occurrence of warpage or waviness caused by heat history, cutting, and machining, thus not being necessarily completely plane. Therefore, after warpage of the circuit board 406 is corrected as appropriate, heat of, for example, 140 to 230° C. is applied to the thermosetting resin sheet 405 interposed between the IC chip 401 and the circuit board 406 for, for example, a few to 20 seconds, by which the thermosetting resin sheet 405 is cured. In this process, at the beginning, the thermosetting resin forming the thermosetting resin sheet 405 flows and seals the IC chip 401 up to its edges. Also, because of its being a resin, the thermosetting resin, when heated, naturally softens in earlier stages, thereby yielding such a fluidity as flowing to the edges. Due to a volume of the thermosetting resin set larger than a volume of space between the IC chip 401 and the circuit board, the thermosetting resin flows out of this space, thus enabled to produce a sealing effect. In this process, flow regulation is effected by the bonding-material flow regulating member of the foregoing embodiments, as appropriate.

Figure 82G:
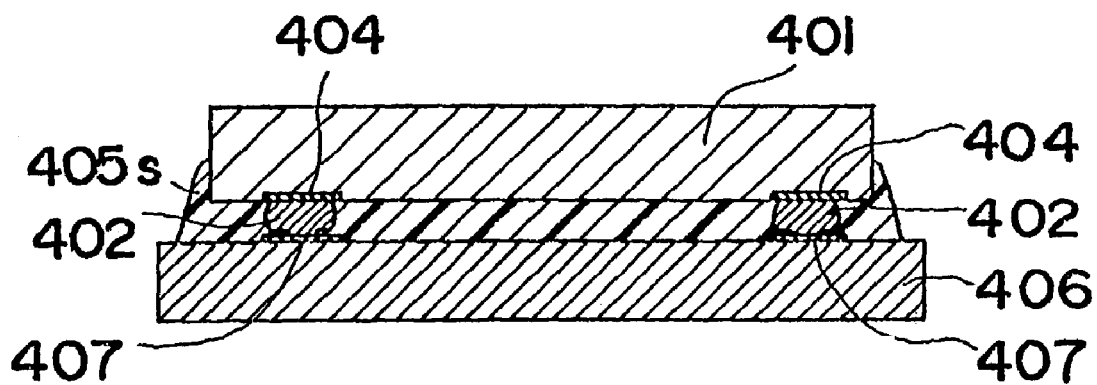

Thereafter, the heated tool 408 is moved up, with a result that there is no heating source. Therefore, a temperature of the IC chip 401 and the thermosetting resin sheet 405 abruptly lowers, so that the thermosetting resin sheet 405 loses its fluidity, causing the IC chip 401 to be fixed onto the circuit board 406 by the cured thermosetting resin 405s as shown in FIG. 82G and FIG. 84C. Further, when the circuit board 406 side is preparatorily heated by a stage 410, it becomes allowable to set a lower temperature for the bonding tool 408.

Figure 83H:
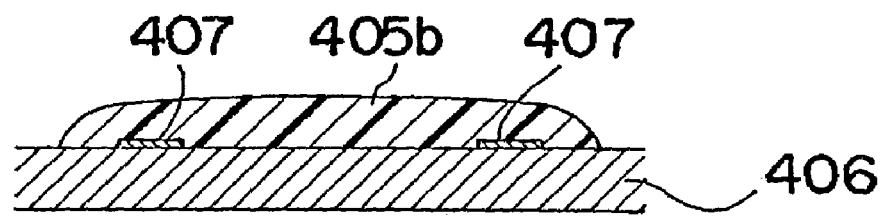
FIGS. 83H, 83I and 83J are, respectively, explanatory views showing the IC chip mounting method according to the above embodiments, following FIG. 61.

Furthermore, instead of sticking the thermosetting resin sheet 405, a thermosetting adhesive 405b may be applied by dispensing or the like, or printed, or transferred onto the circuit board 406 as shown in FIG. 83H. When the thermosetting adhesive 405b is used, basically, the same steps as those with the thermosetting resin sheet 405 used are performed. When the thermosetting resin sheet 405 is used, there are such advantages as an easiness of handling by virtue of its being a solid, and moreover a capability of being formed of high molecules by virtue of its including no liquid components, so that the thermosetting resin sheet 405 can easily be formed so as to have a high glass transition point. In contrast to this, when the thermosetting adhesive 405b is used, the thermosetting adhesive 405b can be applied, printed, or transferred to an arbitrary position of the circuit board 406 and at an arbitrary size.

Also, anisotropic conductive film (ACF) may be used instead of thermosetting resin, and further, more preferably, using conductive particles of gold-plated nickel powder as conductive particles contained in the anisotropic conductive film allows a connection resistance between the electrodes 407 and the bumps 402 to be lowered.

Figure 83I:
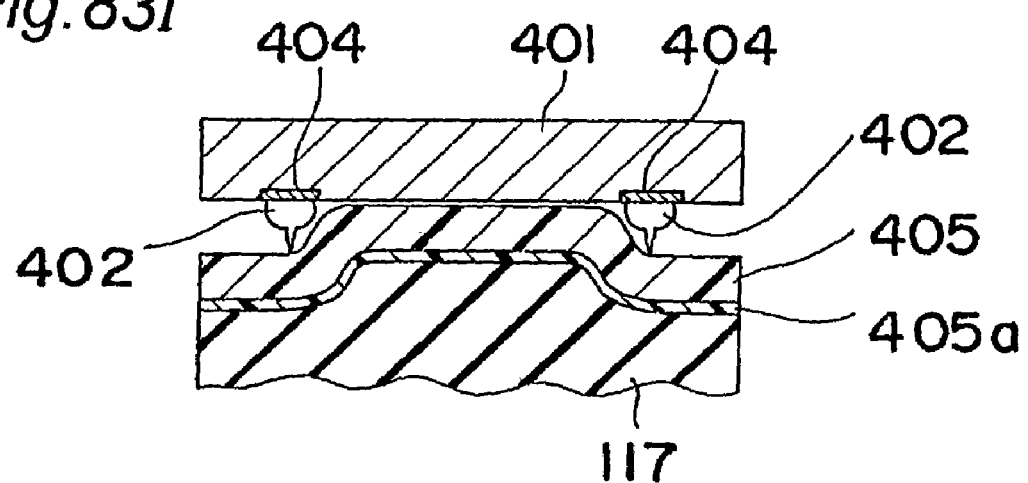
Figure 83J:
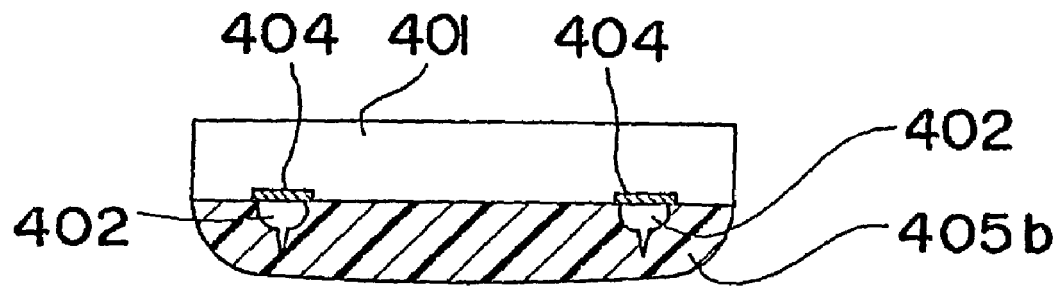

In addition, in FIGS. 81A to 81G, it has been described that the thermosetting resin sheet 405 is formed on the circuit board 406 side. In FIG. 83H, it has been described that the thermosetting adhesive 405b is formed on the circuit board 406 side. However, this is not limitative, and the thermosetting resin sheet 405 or the thermosetting adhesive 405b may also be formed on the IC chip 401 side as shown in FIG. 83I or FIG. 83J. In this case, particularly with use of the thermosetting resin sheet 405, it is allowable to press the IC chip 401 against a rubber or other elastic member 117 together with a separator 405a which is removably disposed on the circuit board side of the thermosetting resin sheet 405, so that the thermosetting resin sheet 405 is stuck to the IC chip 401 along a configuration of the bumps 402.

In such a non-stud bump (NSD) type mounting method, since top end portions of the bumps are crushed on the electrodes of the circuit board, respectively, a quantity of pushing the IC chip (pressurization extent) against the circuit board is increased. Then, power for driving the bonding material into a flow toward the peripheral portions of the bonding surface of the IC chip is increased, so that a flow regulation function for the bonding material by the bonding-material flow regulating member such as the dummy bumps, the projective portion, or the organic film acts more effectively, wherein a regulation effect is even larger in the NSB (non-stud bump) method.

As an example, in the non-stud bump (NSD) type mounting method, when bumps having a diameter of, for example, 75 µm are crushed by being pressed against electrodes of a circuit board for obtainment of their electrical bonding, the bumps are crushed so as to be shortened by 35 µm in their height. In this process, since pressing an IC chip toward the circuit board would cause bonding material to be largely pushed out from therebetween, outflow of the bonding material is regulated by a bonding-material flow regulating member, by which the bonding material can effectively be prevented from lowering in density in a central portion of the IC chip. Thus, in the non-stud bump type mounting method like this, suppression power for the outflow of the bonding material can largely be expected.

In addition, in the eleventh embodiment, indeed the bumps 2 and the dummy bumps 3 are preferably generally identical in configuration with each other with a view to performing a generally uniform flow regulation of the bonding material. However, this is not limitative, and the bumps and the dummy bumps may be formed into different configurations or heights within permissible ranges. Also, the bumps and the dummy bumps may be different in material.

Also, in the eleventh embodiment, description has been made primarily of a case where the intervals between bump 2 and bump 2, or the intervals between bump 2 and dummy bump 3, or the intervals between dummy bump 3 and dummy bump 3 are generally uniform. However, this is not limitative, and the intervals may be nonuniform within a permissible range. In this case, the dummy bump(s) are disposed at portion(s) outside the permissible range.

Further, in the tenth and eleventh embodiments, indeed the electrodes 72 and the dummy electrodes 303 or 313 are preferably generally identical in configuration with each other with a view to performing a generally uniform flow regulation of the bonding material. However, this is not limitative, and the electrodes and the dummy electrodes may be formed into different configurations or heights within permissible ranges. Also, the electrodes 7 and the dummy electrodes 303 or 313 may be different in material.

Also, in the tenth and eleventh embodiments, description has been made primarily of a case where the intervals between electrode 7 and electrode 7, or the intervals between electrode 7 and dummy electrode 303 or 313, or the intervals between dummy electrode 303 or 313 and dummy electrode 303 or 313 are generally uniform. However, this is not limitative, and the intervals may be nonuniform within a permissible range. In this case, the dummy electrodes 303 or 313 are disposed at portions outside the permissible range.

Figure 85A:
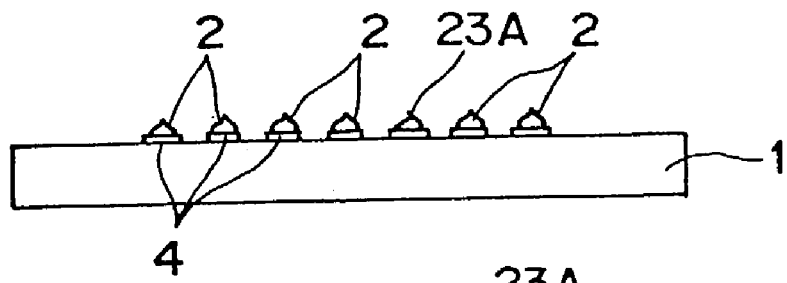
FIGS. 85A and 85B are a side view and a plan view, respectively, of an IC chip prior to a bonding step of an IC chip mounting method according to a modification of the eleventh embodiment of the present invention.
Figure 85B:
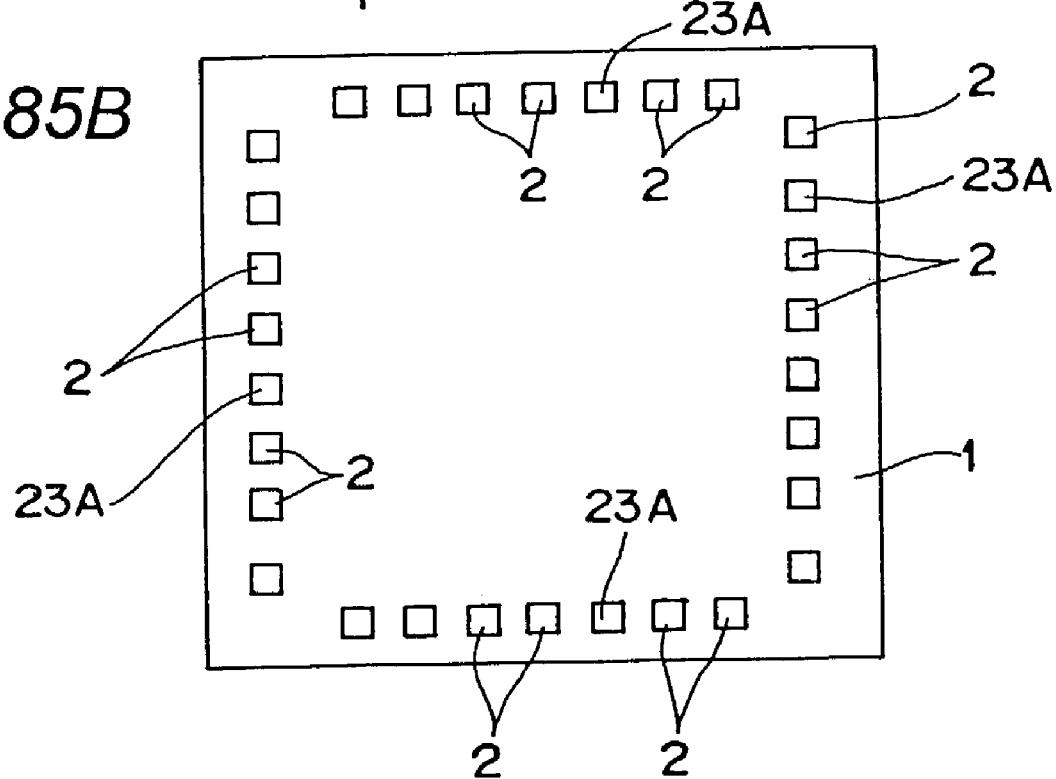

The eleventh embodiment has been described for a case where as the bonding-material flow regulating member, the dummy bumps 3 are formed on the electrodes 4 of the IC chip. However, the present invention is not limited to this, and it is also possible that dummy-bump-like protruding portions 23A generally equal in height to the dummy bumps are formed directly on the IC chip by printing or dispensing of resin paste or the like as shown in FIGS. 85A and 85B.

Further, although the bumps 2 are formed on the electrodes 4 of the bonding surface of the electronic component, convex-shaped electrodes may be formed instead of the bumps 2 on the electrodes 4 of the bonding surface of the electronic component so as to be projecting therefrom.

In addition, in the foregoing individual embodiments, in a case where the bonding material 5 overflowing from between the IC chip and the circuit board is subject to flow regulation by the bonding-material flow regulating member so that the fillets 5A, which are swollen portions against the side faces of the IC chip, are increased, the bonding material 5 can be swollen up so as to cover the side faces of the IC chip for about a half of their thickness from the board side. More specifically, in the conventional case, although the bonding material is subject to the flow regulation at portions where the bumps or passivation film is disposed, the bonding material is not subject to such a regulation at portions where the bumps or passivation film is not disposed, so that fillets could not be made large, wherein, for example, given a thickness of 0.4 mm of the IC chip, up to only about 0.1 mm of fillets could be formed. However, in the foregoing embodiments, by subjection of the bonding material 5 to the flow regulation as described above, for example, given a thickness of 0.4 mm of the IC chip, fillets are formed to a height of 0.2 to 0.3 mm, thus making it possible to enlarge the fillets 5A. Consequently, when the fillets are small, moisture intrusion paths would more likely be formed at an interface between the IC chip and the bonding material or between the board and the bonding material, and moreover, the paths would be short in length, poor in moisture-resistance reliability, and weak to warpage of the board during a heat cycle. However, as a result of enlarged fillets 5A, moisture intrusion paths would hardly be formed at the interface between the IC chip and the bonding material 5 or between the circuit board and the bonding material 5, and moreover, those paths can be elongated, thus providing a better moisture-resistance reliability and a strength against warpage of the board due to heat during a heat cycle of, for example, −65° C. to 150° C.

In addition, among the foregoing embodiments, even in the embodiments in which the dummy bumps are not disposed, disposition of the dummy bumps allows flow of the bonding resin to be uniformized over an entire IC chip.

Furthermore, the foregoing various embodiments, when combined with one another thereamong in arbitrary combinations, can be made to produce their individual effects.

In the present invention, for bonding of an electronic component, such as an IC chip, to a circuit formation article, such as a circuit board, via a bonding material by pressing the electronic component against the circuit formation article with a pressing force, since a bonding-material flow regulating member is disposed at portions where a quantity of bonding material flowing out from gaps between neighboring bumps surpasses a permissible level, flow of the bonding material between the electronic component and the circuit formation article during their bonding is regulated by the bonding-material flow regulating member, so that a quantity of the bonding material flowing out from gaps between the bonding-material flow regulating member and its neighboring bumps becomes under the permissible level. Therefore, as a whole, the quantity of the bonding material flowing out from the gaps between neighboring bumps of the electronic component can be made generally uniform. Consequently, the flow of the bonding material from the central portion to the peripheral portions of the bonding surface of the electronic component can be made generally uniform, and moreover, distribution of the bonding material within the bonding surface of the electronic component can be made uniform, thus allowing adhesion power to be improved, so that reliability of bonding and sealing can be enhanced.

According to one aspect of the present invention, on a bonding surface of an electronic component such as a square or rectangular IC chip, an array of bumps are provided in the vicinities of side-verge portions of the individual four sides except the four corner portions of the bonding surface, and a bonding-material flow regulating member, for example, dummy bumps are disposed at sites where the bumps are absent in the vicinities of the side-verge portions of the bonding surface of the electronic component. In this case, an array state of the bumps can be made generally identical among the vicinities of the side-verge portions of the individual sides of the electronic component, and, when the bonding material between the bonding surface of the electronic component and the electronic-component bonding region of the circuit formation article flows from the central portion to peripheral portions during compression bonding, the dummy bumps function as a bonding-material flow regulating member, so that the flow of the bonding material from the central portion to the peripheral portions can be made generally uniform, and moreover, distribution of the bonding material within the bonding surface of the electronic component can be made uniform. Thus, adhesion power can be improved and reliability of bonding and sealing can be enhanced.

According to another aspect of the present invention, on a bonding surface of an electronic component such as a rectangular IC chip, an array of bumps are provided in the vicinities of side-verge portions of the four sides except the four corner portions of the bonding surface, and a bonding-material flow regulating member, for example, dummy bumps are formed at sites where the bumps are absent in the vicinities of the side-verge portions of the bonding surface of the electronic component. In this case, an array state of the bumps can be made generally identical among the vicinities of the side-verge portions of the individual sides of the electronic component, and, when the bonding material between the bonding surface of the electronic component and the electronic-component bonding region of the circuit formation article flows from the central portion to the peripheral portions during compression bonding, the dummy bumps function as a bonding-material flow regulating member, so that the flow of the bonding material from the central portion to the peripheral portions can be made generally uniform, and moreover, distribution of the bonding material within the bonding surface of the electronic component can be made uniform. Thus, adhesion power can be improved and reliability of bonding and sealing can be enhanced.

According to another aspect of the present invention, on a bonding surface of a square electronic component, an array of bumps are provided in the vicinities of side-verge portions of the individual four sides except the four corner portions of the bonding surface, and a bonding-material flow regulating member, for example, dummy bumps are formed at sites where the bumps are absent in the vicinities of the side-verge portions of the bonding surface of the electronic component. In this case, an array state of the bumps can be made generally identical among the vicinities of the side-verge portions of the individual sides of the electronic component and the vicinities of its corner portions, and, when the bonding material between the bonding surface of the electronic component and the electronic-component bonding region of the circuit formation article flows from the central portion to the peripheral portions during the compression bonding, the dummy bumps function as a bonding-material flow regulating member, so that the flow of the bonding material from the central portion to the peripheral portions can be made generally uniform, and moreover, distribution of the bonding material within the bonding surface of the electronic component can be made uniform. Thus, adhesion power can be improved and reliability of bonding and sealing can be enhanced.

According to another aspect of the present invention, on a bonding surface of a rectangular electronic component, an array of bumps are provided in the vicinities of side-verge portions of the individual four sides except the four corner portions of the bonding surface, and a bonding-material flow regulating member, for example, dummy bumps are formed at sites where the bumps are absent in the vicinities of the side-verge portions of the bonding surface of the electronic component. In this case, an array state of the bumps can be made generally identical among the vicinities of the side-verge portions of the individual sides of the electronic component and the vicinities of its corner portions, and, when the bonding material between the bonding surface of the electronic component and the electronic-component bonding region of the circuit formation article flows from the central portion to the peripheral portions during the compression bonding, the dummy bumps function as a bonding-material flow regulating member, so that the flow of the bonding material from the central portion to the peripheral portions can be made generally uniform, and moreover, distribution of the bonding material within the bonding surface of the electronic component can be made uniform. Thus, adhesion power can be improved and reliability of bonding and sealing can be enhanced.

According to another aspect of the present invention, in a case where one array of a plurality of bumps are formed at a center of the quadrilateral bonding surface of the electronic component, a dummy bump(s) as a bonding-material flow regulating member provided at a corner portion(s) where the bump(s) are absent is disposed. In this case, the electronic component is supported against the circuit formation article at three points in the shorter direction, i.e. in the widthwise direction, so that bonding power can be generally equally balanced between the electronic component and the circuit formation article on both sides of the array of the bumps. Thus, the electronic component can be prevented from inclining with respect to the circuit formation article, and hence the gap between the electronic component and the circuit formation article can be made generally uniform on both sides of the array of the bumps. Therefore, when the bonding material between the bonding surface of the electronic component and the electronic-component bonding region of the circuit formation article flows from the central portion to the peripheral portions during the compression bonding, the dummy bump functions as a bonding-material flow regulating member, so that the flow of the bonding material from the central portion to the peripheral portions can be made generally uniform, and moreover, distribution of the bonding material within the bonding surface of the electronic component can be made uniform. Thus, adhesion power can be improved and reliability of bonding and sealing can be enhanced.

According to another aspect of the present invention, not only a passivation film is disposed over a square region surrounded by bumps disposed in one array and generally equidistantly in each of vicinities of the individual side verges of the bonding surface of an electronic component, but also a bonding-material flow regulating member, for example, an auxiliary passivation film is disposed at positions outer than the four-side bumps, i.e., in peripheral portions of the bonding surface. In this case, a flow speed at which the bonding material flows in the square region and a flow speed at which the bonding material flows in the peripheral portions become generally equal to each other, so that the bonding material can be prevented from lowering in density, and therefore prevented from lowering in adhesion, i.e. bonding power and sealing power, in the peripheral portions of the bonding surface, and from occurrence of peeling, which in turn prevents corrosion or the like of the IC chip or the like due to moisture absorption as a result of penetration of moisture. Thus, it becomes implementable to achieve a uniform distribution of the bonding material within the bonding surface of the electronic component, thereby allowing adhesion to be improved, so that reliability of bonding and sealing can be enhanced.

Also, in a case where the dummy bump(s) are formed at larger-width interval portion(s) where the bump(s) are lacking, that is, at larger-width interval portion(s) where the interval(s) between neighboring bumps are larger than the intervals between the other neighboring bumps, when the intervals between neighboring bumps are not necessarily generally uniform, it is allowable that the dummy bump(s) are formed only at the portion(s) where the interval between neighboring bumps exceeds a permissible value. More specifically, as shown in FIG. 26, the dummy bumps are disposed so that a relationship between the maximum pitch Pmax and the minimum pitch Pmin out of pitches between the bumps of the electronic component or pitches between the bumps and the dummy bumps satisfies that Pmax≦(Pmin×2α), where α is an arbitrary value of 1 to 6, in which case the same effects as described above can be produced.

Further, according to another aspect of the present invention, not only the passivation film is disposed over the square region surrounded by the bumps disposed in one array and generally equidistantly in each of the vicinities of the individual side verges of the bonding surface of the electronic component, but also the bonding-material flow regulating member, for example, generally quadrilateral auxiliary passivation film is disposed at positions outward of the four-side bumps, i.e., at the corner portions of the peripheral portions of the bonding surface. In this case, a flow speed at which the bonding material flows in the square region and a flow speed at which the bonding material flows at the corner portions of the peripheral portions become generally equal to each other, so that the bonding material can be prevented from lowering in density, and therefore prevented from lowering in adhesion, i.e. bonding power and sealing power, at the corner portions of the peripheral portions of the bonding surface, and from occurrence of peeling, which in turn prevents corrosion or the like of the electronic component or the like due to moisture absorption as a result of penetration of moisture. Thus, it becomes implementable to achieve a uniform distribution of the bonding material within the bonding surface of the electronic component, thereby allowing adhesion to be improved, so that reliability of bonding and sealing can be enhanced.

Also, according to another aspect of the present invention, not only the passivation film is disposed over the square region surrounded by the bumps disposed in one array and generally equidistantly in each of the vicinities of the individual side verges of the bonding surface of the electronic component, but also the bonding-material flow regulating member, for example, generally quadrilateral auxiliary passivation films are disposed at positions outward of the four-side bumps, i.e., in the peripheral portions and the corner portions of the bonding surface. In this case, a flow speed at which the bonding material flows in the square region and a flow speed at which the bonding material flows at the peripheral portions and the corner portions become generally equal to each other, so that the bonding material can be prevented from lowering in density, and therefore prevented from lowering in adhesion, i.e. bonding power and sealing power, in the peripheral portions and the corner portions of the bonding surface, and from occurrence of peeling, which in turn prevents corrosion or the like of the electronic component or the like due to moisture absorption as a result of penetration of moisture. Thus, it becomes implementable to achieve a uniform distribution of the bonding material within the bonding surface of the electronic component, thereby allowing adhesion to be improved, so that reliability of bonding and sealing can be enhanced.

Also, according to another aspect of the present invention, not only the passivation film is disposed over the square region surrounded by the bumps disposed in one array and generally equidistantly in each of vicinities of the individual side verges of the bonding surface of the electronic component, but also the bonding-material flow regulating member, for example, auxiliary passivation film is disposed at positions outer than the four-side bumps, i.e., in the peripheral portions and the corner portions of the bonding surface as well as at the portions between neighboring bumps. In this case, a flow speed at which the bonding material flows in the square region and a flow speed at which the bonding material flows in the peripheral portions and the corner portions as well as at the portions between the neighboring bumps becomes generally equal to each other, so that the bonding material can be prevented from lowering in density, and therefore prevented from lowering in adhesion, i.e. bonding power and sealing power, in the peripheral portions and the corner portions of the bonding surface as well as at the portions between the neighboring bumps, and from occurrence of peeling, which in turn prevents corrosion or the like of the electronic component or the like due to moisture absorption as a result of penetration of moisture contents. Thus, it becomes implementable to achieve a uniform distribution of the bonding material within the bonding surface of the electronic component, thereby allowing adhesion to be improved, so that reliability of bonding and sealing can be enhanced.

In the electronic component-mounted unit manufactured by the method according to each of the foregoing embodiments, or in the electronic component-mounted unit equipped with the bonding-material flow regulating member described in each of the foregoing embodiments, while a uniform distribution of the bonding material within the bonding surface of the electronic component is achieved by the bonding-material flow regulating member, the electronic component and the circuit formation article are bonded together, and sealed, in close contact with each other by the bonding material. Thus, the electronic component-mounted unit can be enhanced in reliability of bonding and sealing, and hence be high in quality.

According to the present invention, for the bonding of an electronic component, such as a quadrilateral, i.e., square or rectangular IC chip, to a circuit formation article, such as a circuit board, via a bonding material by pressing the electronic component against the circuit formation article with a pressing force, since the bonding-material flow regulating member is disposed at portions where the bonding material would flow out nonuniformly, the flow of the bonding material between the electronic component and the circuit formation article during a bonding process therebetween is regulated by the bonding-material flow regulating member. Thus, the flow of the bonding material from the central portion to the peripheral portions of the electronic-component bonding region can be made generally uniform, and moreover, distribution of the bonding material within the bonding surface of the electronic component can be made uniform, thus allowing adhesion power to be improved so that reliability of bonding and sealing can be enhanced.

More specifically, according to one aspect of the present invention, the electronic-component bonding region of the circuit formation article is quadrilateral shaped, a plurality of bumps are formed on each of two pairs of opposing sides in a quadrilateral electronic-component bonding region, and projective portions, which are provided at corner portions of the electronic-component bonding region of the circuit formation article corresponding to the corner portions where bumps are absent and which do not need electrical bonding are formed. In this case, in one case where the projective portions are dummy electrodes, an array state of the electrodes can be made generally identical among the vicinities of the side verges of the individual sides of the electronic component as well as in the corner portions. In another case where the projective portions are provided by an organic film, the projective portions of the organic film substituting for the electrodes can be disposed in the vicinities of the side verges of the individual sides of the electronic component as well as in the vicinities of the individual corner portions. As a result of this, when the bonding material between the bonding region of the electronic component and the electronic-component bonding region of the circuit formation article flows from the central portion to the corner portions of the peripheral portions during compression bonding, the projective portions function as the bonding-material flow regulating member, so that a flow speed in the central portion of the electronic-component bonding region of the circuit formation article and a flow speed in the peripheral portions of the electronic-component bonding region of the circuit formation article become generally equal to each other. Thus, flow of the bonding material from the central portion to the corner portions of the peripheral portions in the vicinities of the side verges of the individual sides as well as the vicinities of the corner portions in the electronic-component bonding region can be made generally uniform, and moreover, distribution of the bonding material within the bonding surface of the electronic component, i.e., within the electronic-component bonding region of the circuit formation article can be made uniform. As a result of the achievement that the distribution of the bonding material within the bonding surface of the electronic component as well as within the electronic-component bonding region of the circuit formation article can be made uniform as described above, the bonding material can be prevented from lowering in density, and therefore adhesion between the electronic component and the bonding material in the central portion and the peripheral portions, particularly the corner portions, of the electronic-component bonding region is increased, and moreover, adhesion between the electrodes or the projective portions of the circuit formation article and the bonding material is increased, so that a peeling described above can be prevented, and that reliability of bonding and sealing can be enhanced.

Also, according to another aspect of the present invention, on a quadrilateral, i.e., square or rectangular bonding surface of an electronic component, an array of electrodes are provided generally equidistantly in each of the vicinities of side verges of the four sides except the corner portions of the four corners, dummy bumps are formed at the portions where the bumps are absent in the vicinities of the side verges of the bonding surface of the electronic component, and moreover, dummy electrodes are formed at portions in the vicinities of side-verge portions of the individual sides of the electronic-component bonding region of the circuit formation article where electrodes are absent. In this case, an array state of the bumps can be made generally identical among the vicinities of the side verges of the individual sides of the electronic component, and moreover, an array state of the electrodes can be made generally identical among the vicinities of the side verges of the individual sides of the electronic-component bonding region of the circuit formation article. As a result of this, when bonding material between the bonding surface of the electronic component and the electronic-component bonding region of the circuit formation article flows from the central portion to the peripheral portions during compression bonding, the dummy bumps and the dummy electrodes function as the bonding-material flow regulating members, so that the flow of the bonding material from the central portion to the peripheral portions in the vicinities of the side verges of the individual sides of the electronic component as well as in the vicinities of the side verges of the individual sides of the electronic-component bonding region of the circuit formation article can be made generally uniform, and moreover, distribution of the bonding material within the bonding surface of the electronic component as well as within the electronic-component bonding region of the circuit formation article can be made uniform, thus allowing adhesion power to be improved so that reliability of bonding and sealing can be enhanced. Further, as a result of the achievement that the distribution of the bonding material within the bonding surface of the electronic component as well as within the electronic-component bonding region of the circuit formation article can be made uniform, the bonding material can be prevented from lowering in density, a sufficient quantity of resin for sealing the side faces of the electronic component is fed, and the size of the fillets for sealing the side faces of the electronic component can be increased, so that peeling between the electronic component and the bonding material in the peripheral portions of the electronic-component bonding region, as well as peeling between the electrodes of the circuit formation article and the bonding material, can be prevented effectively.

Also, according to another aspect of the present invention, an organic film is disposed outside the electronic-component bonding region of the circuit formation article and in the peripheral portions of the electronic-component bonding region. In this case, the organic film can fulfill flow regulation of a bonding material as a bonding-material flow regulating film which is one example of the bonding-material flow regulating member. As a result of this, during flow of the bonding material between the bonding surface of the electronic component and the electronic-component bonding region of the circuit formation article from the central portion to the peripheral portions during compression bonding, the organic film functions as the bonding-material flow regulating member, so that a flow speed of the bonding material between the electronic component and the circuit formation article can be lowered, as compared with a case where the organic film is absent. Therefore, the flow of the bonding material from the central portion to the peripheral portions can be made generally uniform, and moreover, distribution of the bonding material within the bonding surface of the electronic component can be made uniform, thus allowing adhesion to be improved, so that reliability of bonding and sealing can be enhanced.

Also, according to another aspect of the present invention, the electronic-component bonding region of the circuit formation article is quadrilateral shaped, one array of a plurality of bumps is formed at a center of the quadrilateral electronic-component bonding region, the electronic component is supported at one point against the circuit formation article in a shorter direction, i.e., in the widthwise direction, and moreover, an organic film is disposed on both sides thereof. In this case, a flow speed of the bonding material between the electronic component and the circuit formation article can be lowered on both sides of the array of bumps, as compared with a case where the organic film is absent. As a result, during flow of the bonding material between the bonding surface of the electronic component and the electronic-component bonding region of the circuit formation article from the central portion to the peripheral portions during compression bonding, the organic film functions as the bonding-material flow regulating member, so that flow of the bonding material from the central portion to the peripheral portions can be made generally uniform, and moreover, distribution of the bonding material within the bonding surface of the electronic component can be made uniform, thus allowing adhesion to be improved, so that reliability of bonding and sealing can be enhanced.

Also, according to another aspect of the present invention, an organic film as an example of the bonding-material flow regulating member is disposed generally all over regions outside and inside the electronic-component bonding region of the circuit formation article except the bonding portions of the electrodes with the bumps. In this case, during flow of the bonding material between the bonding surface of the electronic component and the electronic-component bonding region of the circuit formation article from the central portion to the peripheral portions in the compression bonding, the organic film functions as the bonding-material flow regulating member, so that the flow of the bonding material from the central portion to the peripheral portions in the vicinities of the side-verge portions of the individual sides of the electronic component can be made generally uniform, and moreover, distribution of the bonding material within the bonding surface of the electronic component can be made uniform, thus allowing adhesion to be improved, so that reliability of bonding and sealing can be enhanced.

Also, according to another aspect of the present invention, a fillet-forming projective portion is disposed as an example of the bonding-material flow regulating member in a quadrilateral frame-shaped region which surrounds the electronic-component bonding region, with a specified distance apart from the electronic-component bonding region of the circuit formation article. In this case, during the flow of the bonding material between the bonding surface of the electronic component and the electronic-component bonding region of the circuit formation article to the outside of the electronic-component bonding region during compression bonding, the bonding material pressed out to flow out along the circuit board surface is intercepted by the fillet-forming projective portion so as to be swollen up, so that large fillets can be formed on the side faces of the electronic component. Thus, a sealing power of the side faces of the electronic component can be improved, thereby allowing adhesion to be improved, so that reliability of bonding and sealing can be enhanced.

Also, according to another aspect of the present invention, a projective portion as a bonding-material flow regulating member having a thickness generally equal to the thickness of the electrodes of the circuit formation article is provided over a region where the bonding material shows nonuniform flow out of the electronic-component bonding region of the circuit formation article, for example, a region having an electrode wiring density lower than a specified value and decentered from the center within the electronic-component bonding region. In this case, pattern wiring density can be made more uniform within the electronic-component bonding region of the circuit formation article, so that the flow of the bonding material can be made more uniform. Thus, overflow quantity of the bonding material that overflows outside from between the electronic component and the circuit formation article can be made more uniform, thereby allowing a more stable bonding to be achieved. Further, when the fillet-forming projective portion is made up of more than one layer of film and formed of solder resist, a high adhesion property with the fillet-forming resin can be obtained, so that the sealing power is further improved.

Also, according to another aspect of the present invention, a meshed electrode or an electrode having through holes is disposed as the projective portion. In this case, wiring density of the electrode pattern within the electronic-component bonding region of the circuit formation article can be made more uniform, so that the flow of the bonding material can be made more uniform. Thus, overflow quantity of the bonding material that overflows outside from between the bonding surface of a square electronic component as an example of the electronic component and the electronic-component bonding region of the circuit formation article can be made more uniform, thereby allowing a more stable connection to be achieved. Furthermore, in addition to the above effects, the circuit formation article is exposed at through hole portions constituting the mesh of the electrode or at the through holes, which allows the bonding material disposed on the meshed electrode to penetrate the through hole portions or the through holes, thus making direct contact with the circuit formation article. As a result, the bonding material is bonded in direct close contact with the circuit formation article at the through hole portions of the electrode or at the through holes, so that adhesion between the bonding material and the circuit formation article can be improved.

Also, according to another aspect of the present invention, the organic film is disposed generally all over regions outside and inside the electronic-component bonding region of the circuit formation article including the projective portion, except the bonding portions of the electrodes with the bumps. In this case, during the flow of the bonding material between the bonding surface of the electronic component and the electronic-component bonding region of the circuit formation article from the central portion to the peripheral portions during compression bonding, the organic film functions as the bonding-material flow regulating member. Therefore, the flow of the bonding material from the central portion to the peripheral portions in the vicinities of the side-verge portions of the individual sides of the electronic component can be made generally uniform, and moreover, distribution of the bonding material within the bonding surface of the electronic component can be made uniform, thus allowing adhesion to be improved, so that, reliability of, bonding and, sealing can be enhanced.

Also, according to another aspect of the present invention, while the square electronic-component bonding region of the circuit formation article has an array of electrodes generally equidistantly spaced in each of the vicinities of side verges of the four sides except the corner portions of the four corners, the organic film is disposed at the corner portions where the electrodes are absent in the vicinities of the side verges of the electronic-component bonding region of the circuit formation article. In this case, when the bonding material between the bonding region of the electronic component and the electronic-component bonding region of the circuit formation article flows from the central portion to the corner portions of the peripheral portions during compression bonding, the organic film functions as a bonding-material flow regulating member even at the corner portions where the electrodes are absent, so that the flow speed in the central portion of the electronic-component bonding region of the circuit formation article and the flow speed in the peripheral portions of the electronic-component bonding region of the circuit formation article become generally equal to each other. Thus, the flow of the bonding material from the central portion to the corner portions of the peripheral portions in the vicinities of the side verges of the individual sides as well as the vicinities of the corner portions in the electronic-component bonding region can be made generally uniform, and moreover, distribution of the bonding material within the bonding surface of the electronic component, i.e., within the electronic-component bonding region of the circuit formation article can be made uniform, and furthermore the flow of the bonding material along the circuit board surface is intercepted by the organic film so as to be swollen up at the individual corner portions, so that fillets covering the side faces of the electronic component can be formed. As a result of the achievement that the distribution of the bonding material within the bonding surface of the electronic component as well as within the electronic-component bonding region of the circuit formation article can be made uniform, the bonding material can be prevented from lowering in density, and therefore, adhesion between the electronic component and the bonding material in the central portion and the peripheral portions, particularly the corner portions, of the electronic-component bonding region is increased, and moreover, adhesion between the electrodes or organic film of the circuit formation article and the bonding material is increased, so that peeling can be prevented, and that reliability of bonding and sealing can be enhanced.

Furthermore, in the electronic component-mounted unit manufactured by the method according to each of the above aspects, or in the electronic component-mounted unit equipped with the bonding-material flow regulating member described in each of the above aspects, while nonuniform flow of the bonding material is regulated by the bonding-material flow regulating member, so that a uniform distribution of the bonding material within the electronic-component bonding region is achieved, the electronic component and the circuit formation article are bonded together, and sealed, in close contact with each other by the bonding material. Thus, the electronic component-mounted unit can be enhanced in reliability of bonding and sealing, and hence be high in quality.

Furthermore, the foregoing various embodiments, when combined with one another thereamong in arbitrary combinations as required, can be made to produce their individual effects.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. An electronic component-mounted unit comprising:
   an electronic component bonded to a circuit formation article with interposition of a bonding material containing resin, said electronic component including a bonding surface having electrodes thereon, with bumps on said electrodes being in electrical contact with electrodes of an electronic-component bonding region of said circuit formation article,
   wherein provided on said bonding surface is a bonding-material flow regulating member for regulating flow of said bonding material toward a peripheral portion of said bonding surface during compression bonding of said electronic component to said circuit formation article, and
   wherein said bumps and said bonding-material flow regulating member are of the same material and configuration such that during the compression bonding of said electronic component to said circuit formation article bonding material overflowing from between said electronic component and said circuit formation article is subject to a similar flow regulation at a portion where said bonding-material flow regulating member is present and portions where said bumps are present.

2. The electronic component-mounted unit according to claim 1, wherein said bonding-material flow regulating member comprises a dummy bump provided at a portion of said bonding surface where an interval of neighboring ones of said bumps is larger than intervals of other neighboring ones of said bumps.

3. The electronic component-mounted unit according to claim 2, wherein
said dummy bump is in contact with only one of said electronic component and said circuit formation article.

4. The electronic component-mounted unit according to claim 1, wherein
said bonding surface comprises a quadrilateral bonding surface,
said bumps are in two arrays at two opposing sides, respectively, of said quadrilateral bonding surface, and
said bonding-material flow regulating member comprises dummy bumps in two arrays at the other two opposing two sides, respectively, of said quadrilateral bonding surface.

5. The electronic component-mounted unit according to claim 4, wherein
said dummy bumps are in contact with only one of said electronic component and said circuit formation article.

6. The electronic component-mounted unit according to claim 1, wherein
said bonding surface comprises a quadrilateral bonding surface,
said bumps are in four arrays at four sides, respectively, of said quadrilateral bonding surface, and
said bonding-material flow regulating member comprises a dummy bump at each corner portion of said quadrilateral bonding surface.

7. The electronic component-mounted unit according to claim 6, wherein
said dummy bump at said each corner portion is in contact with only one of said electronic component and said circuit formation article.

8. The electronic component-mounted unit according to claim 1, wherein
said bonding surface comprises a quadrilateral bonding surface,
said bumps are in one array at a center of said quadrilateral bonding surface, and
said bonding-material flow regulating member comprises a dummy bump at each corner portion of said quadrilateral bonding surface.

9. The electronic component-mounted unit according to claim 8, wherein
said dummy bump at said each corner portion is in contact with only one of said electronic component and said circuit formation article.

10. The electronic component-mounted unit according to claim 1, wherein
said bonding-material flow regulating member comprises a dummy bump provided so that a maximum pitch Pmax and a minimum pitch Pmin, out of pitches between said bumps, including pitches between said dummy bump and adjacent ones of said bumps, satisfies the relationship of $Pmax \leq (Pmin \times 2\alpha)$, where $\alpha$ is an arbitrary value of from 1 to 6.

11. The electronic component-mounted unit according to claim 10, wherein
said dummy bump is in contact with only one of said electronic component and said circuit formation article.

12. The electronic component-mounted unit according to claim 1, wherein said bonding-material flow regulating member is in contact with only one of said electronic component and said circuit formation article.

13. The electronic component-mounted unit according to claim 1, wherein the similar flow regulation of the overflowing bonding material at the portion where said bonding-material flow regulating member is present and the portions where said bumps are present, resulting from said bumps and said bonding-material flow regulating member being of the same material and configuration, results in the overflowing bonding material extending along a side of said electronic component in a thickness direction of said electronic component for a dimension greater than a corresponding dimension for which the overflowing bonding material would extend absent said bonding-material flow regulating member.

14. An electronic component comprising:
bumps on electrodes on a bonding surface; and
a bonding-material flow regulating member on said bonding surface for, during compression bonding of said electronic component to a circuit formation article with interposition of a bonding material containing resin, regulating flow of the bonding material toward peripheral portions of said bonding surface in a state that said bumps are in electrical contact with electrodes of the circuit formation article,
wherein said bumps and said bonding-material flow regulating member are of the same material and configuration such that during the compression bonding of said electronic component to the circuit formation article bonding material overflowing from between said electronic component and the circuit formation article is subject to a similar flow regulation at a portion where said bonding-material flow regulating member is present and portions where said bumps are present.

15. The electronic component according to claim 14, wherein
said bonding-material flow regulating member comprises a dummy bump provided at a portion of said bonding surface where an interval of neighboring ones of said bumps is larger than intervals of other neighboring ones of said bumps.

16. The electronic component according to claim 14, wherein the similar flow regulation of the overflowing bonding material at the portion where said bonding-material flow regulating member is present and the portions where said bumps are present, resulting from said bumps and said bonding-material flow regulating member being of the same material and configuration, results in the overflowing bonding material extending along a side of said electronic component in a thickness direction of said electronic component for a dimension greater than a corresponding dimension for which the overflowing bonding material would extend absent said bonding-material flow regulating member.

17. An electronic component-mounted unit comprising:
an electronic component bonded to a circuit formation article with interposition of a bonding material containing resin, said electronic component including a bonding surface having electrodes thereon, with bumps on said electrodes being in electrical contact with electrodes of an electronic-component bonding region of said circuit formation article,
wherein provided at a location, where said bonding material flows out non-uniformly over said electronic-component bonding region during compression bonding of said electronic component to said circuit formation article, is a bonding-material flow regulating member for regulating flow of said bonding material toward a peripheral portion of said electronic-component bonding region during compression bonding of said electronic component to said circuit formation article such that bonding material overflowing from between said electronic component and said circuit formation article extends along a side of said electronic component in a thickness direction of said electronic component for a dimension greater than a corresponding dimension for which this overflowing bonding material would extend absent said bonding-material flow regulating member, and wherein said bonding-material flow regulating member comprises an organic film outside said electronic-component bonding region and at the peripheral portion of said electronic-component bonding region.

18. An electronic component-mounted unit comprising:

an electronic component bonded to a circuit formation article with interposition of a bonding material containing resin, said electronic component including a bonding surface having electrodes thereon, with bumps on said electrodes being in electrical contact with electrodes of an electronic-component bonding region of said circuit formation article, wherein provided at a location, where said bonding material flows out non-uniformly over said electronic-component bonding region during bonding of said electronic component to said circuit formation article, is a mesh-like dummy electrode, not involved in electrical connection of said electronic-component bonding region and generally equal in thickness to said electrodes of said electronic-component bonding region, for regulating flow of said bonding material toward a peripheral portion of said electronic-component bonding region during bonding of said electronic component to said circuit formation article.

19. An electronic component-mounted unit comprising:

an electronic component bonded to a circuit formation article with interposition of a bonding material containing resin, said electronic component including a bonding surface having electrodes thereon, with bumps on said electrodes being in electrical contact with electrodes of an electronic-component bonding region of said circuit formation article, wherein provided at a location, where said bonding material flows out non-uniformly over said electronic-component bonding region during bonding of said electronic component to said circuit formation article, is a dummy electrode, not involved in electrical connection of said electronic-component bonding region and generally equal in thickness to said electrodes of said electronic-component bonding region, for regulating flow of said bonding material toward a peripheral portion of said electronic-component bonding region during bonding of said electronic component to said circuit formation article, with said dummy electrode having a through hole which allows said bonding material to pass therethrough during the bonding of said electronic component to said circuit formation article.

* * * * *